(12) United States Patent
Kim et al.

(10) Patent No.: US 8,224,299 B2
(45) Date of Patent: Jul. 17, 2012

(54) METHOD OF CONTROLLING AND APPARATUS OF RECEIVING MOBILE SERVICE DATA

(75) Inventors: Jin Woo Kim, Seoul (KR); In Hwan Choi, Gyeonggi-do (KR); Kook Yeon Kwak, Gyeonggi-do (KR); Jong Moon Kim, Gyeonggi-do (KR); Won Gyu Song, Seoul (KR); Hyoung Gon Lee, Seoul (KR); Byoung Gill Kim, Seoul (KR); Eun Hyung Cho, Seoul (KR)

(73) Assignee: LG Electronics Inc., Seoul (KR)

( * ) Notice: Subject to any disclaimer, the term of this patent is extended or adjusted under 35 U.S.C. 154(b) by 854 days.

(21) Appl. No.: 12/102,596

(22) Filed: Apr. 14, 2008

(65) Prior Publication Data

US 2008/0320528 A1      Dec. 25, 2008

Related U.S. Application Data

(60) Provisional application No. 60/912,114, filed on Apr. 16, 2007, provisional application No. 60/947,984, filed on Jul. 4, 2007.

(30) Foreign Application Priority Data

Apr. 14, 2007    (KR) ................. 10-2007-0036702

(51) Int. Cl.
   *H04M 3/42*    (2006.01)

(52) U.S. Cl. ............. 455/414.1; 455/456.2; 455/59
(58) Field of Classification Search .... 455/414.1–414.4, 455/456.1–456.4, 59–61
See application file for complete search history.

(56) References Cited

U.S. PATENT DOCUMENTS

| | | | |
|---|---|---|---|
| 7,773,935 B2 * | 8/2010 | Koga et al. | 455/3.01 |
| 2003/0152107 A1 * | 8/2003 | Pekonen | 370/473 |
| 2004/0009371 A1 * | 1/2004 | Sakagami et al. | 428/694 R |
| 2006/0015914 A1 | 1/2006 | Lee | |
| 2007/0071110 A1 | 3/2007 | Choi et al. | |
| 2007/0140292 A1 * | 6/2007 | Sestok et al. | 370/465 |

FOREIGN PATENT DOCUMENTS

| | | |
|---|---|---|
| JP | 2004-214829 | 7/2004 |
| KR | 10-2006-0117484 | 11/2006 |

* cited by examiner

*Primary Examiner* — Christian Hannon

(74) *Attorney, Agent, or Firm* — Lee, Hong, Degerman, Kang & Waimey

(57) ABSTRACT

A data transmission system for minimizing the number of errors during Tx/Rx times of mobile service data under mobile environments, and a data processing method for the same are disclosed. The system additionally codes the mobile service data, and transmits the resultant coded mobile service data. As a result, the mobile service data has a strong resistance to noise and channel variation, and can quickly cope with the rapid channel variation.

19 Claims, 97 Drawing Sheets

FIG. 25

| Syntax | No. of Bits | Format |
|---|---|---|
| event_information_table_section() { | | |
|     table_id | 8 | 0xCB |
|     section_syntax_indicator | 1 | '1' |
|     private_indicator | 1 | '1' |
|     reserved | 2 | '11' |
|     section_length | 12 | uimsbf |
|     source_id | 16 | uimsbf |
|     reserved | 2 | '11' |
|     version_number | 5 | uimsbf |
|     current_next_indicator | 1 | '1' |
|     section_number | 8 | uimsbf |
|     last_section_number | 8 | uimsbf |
|     protocol_version | 8 | uimsbf |
|     num_events_in_section | 8 | uimsbf |
|     for(j=0; j<num_events_in_section; j++) { | | |
|         reserved | 2 | '11' |
|         event_id | 14 | uimsbf |
|         start_time | 32 | uimsbf |
|         reserved | 2 | '11' |
|         ETM_lacation | 2 | uimsbf |
|         length_in_seconds | 20 | uimsbf |
|         title_length | 8 | uimsbf |
|         title_text() | var | |
|         reserved | 4 | '1111' |
|         descriptors_length | 12 | |
|         for(i=0; i<N; i++) { | | |
|             descriptor() | | |
|         } | | |
|     } | | |
|     CRC | 32 | rpchof |
| } | | |

FIG. 26A

| Syntax | No. of Bits | Format |
|---|---|---|
| system_time_table_section() { | | |
|     table_id | 8 | 0xCD |
|     section_syntax_indicator | 1 | '1' |
|     private_indicator | 1 | '1' |
|     reserved | 2 | '11' |
|     section_length | 12 | uimsbf |
|     table_id_extension | 16 | 0x0000 |
|     reserved | 2 | '11' |
|     version_number | 5 | '00000' |
|     current_next_indicator | 1 | '1' |
|     section_number | 8 | 0x00 |
|     last_section_number | 8 | 0x00 |
|     protocol_version | 8 | uimsbf |
|     system_time | 32 | uimsbf |
|     GPS_UTC_offset | 8 | uimsbf |
|     daylight_savings | 16 | uimsbf |
|     for(i=0; i<N; i++) { | | |
|         local_time_offset_descriptor() | | |
|     } | | |
|     CRC | 32 | rpchof |
| } | | |

FIG. 26B

| Syntax | No. of Bits | Format |
|---|---|---|
| local_time_offset_descriptor() | | |
|     descriptor_tag | 8 | uimsbf |
|     descriptor_length | 8 | uimsbf |
|     for(i=0; i<N; i++) { | | |
|         country_code | 24 | bslbf |
|         country_region_id | 6 | bslbf |
|         reserved | 1 | bslbf |
|         local_time_offset_polarity | 1 | bslbf |
|         local_time_offset | 16 | bslbf |
|         time_of_change | 40 | bslbf |
|         next_time_offset | 16 | bslbf |
|     } | | |
| } | | |

FIG. 26C

| Syntax | No. of Bits | Format |
|---|---|---|
| local_time_table_section() { | | |
|    table_id | 8 | 0xCD |
|    section_syntax_indicator | 1 | '1' |
|    private_indicator | 1 | '1' |
|    reserved | 2 | '11' |
|    section_length | 12 | uimsbf |
|    table_id_extension | 16 | 0x0000 |
|    reserved | 2 | '11' |
|    version_number | 5 | '00000' |
|    current_next_indicator | 1 | '1' |
|    section_number | 8 | 0x00 |
|    last_section_number | 8 | 0x00 |
|    protocol_version | 8 | uimsbf |
|    country_code | 24 | bslbf |
|    country_region_id | 6 | bslbf |
|    reserved | 1 | bslbf |
|    local_time_offset_polarity | 1 | bslbf |
|    local_time_offset | 16 | bslbf |
|    time_of_change | 40 | bslbf |
|    next_time_offset | 16 | bslbf |
|    for(i=0; i<N;i++) { | | |
|       descriptor() | | |
|    } | | |
|    CRC | 32 | rpchof |
| } | | |

FIG. 27

Current time 17:19 (assumption)

| | 17:00 | 18:00 | 19:00 | 20:00 | 21:00 | 22:00 | 23:00 | 0:00 | 1:00 | 2:00 | 3:00 | 4:00 |
|---|---|---|---|---|---|---|---|---|---|---|---|---|
| 51-1 | 1-A | | 1-B | 1-C | 1-D | | 1-E | | | | | |
| 51-2 | 2-A | 2-B | 2-C | | 2-D | | 2-E | | | 2-F | | 2-G |
| 51-3 | | | 3-A | | 3-B | | | 3-C | | | | 3-D |
| 51-100 | | | | | | | | | | | | |

FIG. 29

| Programme Guide | | | | | | | | |
|---|---|---|---|---|---|---|---|---|
| ⌷ CBBC Channel | | | | | | | 14:35 | 3 Apr |
| Today 10 Apr | Wed 11 Apr | Thur 12 Apr | Fri 13 Apr | Sat 14 Apr | Sun 15 Apr | Mon 16 Apr | Tues 17 Apr | |
| ALL | 11 Apr | | | | | | | |
| | 14:30 | | 15:00 | | 15:30 | | | |
| 6. CBBC Channel | The Tr.. | Story of Tra.. | | ⏲ Animadness.. | | | ▶ | |
| 1. BBC ONE | Mona The Va.. | | The Wild | Thor The Wild Tho.. | | | ▶ | |
| 2. BBC TWO | ⏲ Racing | | A BBC News Sp.. | BBC News | | | ▶ | |
| 3. BBC THREE | This is BBC TH | | Welcome Welcome To.. | | | | ▶ | |
| 4. BBC NEWS 24 | BBC | | BBC News | | BBC News | | ▶ | |
| 5. BBCi | BBC i | | Racing News | | Welcome To | | ▶ | |
| 7. BBC1 London | Racing | | BBC TH | ⏲ The Wild Thorr.. | | | ▶ | |

Tv/Radio    ○ Favorite    ○ Pr. Change    ○ Information
○ Mode    ○ Date    ○ Manual Timer    ○ Timer List

FIG. 31

| | | |
|---|---|---|
| Programme Guide | | |
| 🖂 CBBC Channel | | 14:35  3 Apr |

| ALL | NOW | NEXT |
|---|---|---|
| 6. CBBC Channel | Mona The Vampire | The Wild Thornberrys |
| 1. BBC ONE | Racing From Aintree | BBC News Special |
| 2. BBC TWO | This is BBC THREE | Welcome To BBC TH.. |
| 3. BBC THREE | BBC News | BBC News |
| 4. BBC NEWS 24 | BBC i | BBC i |
| 5. BBCi | The Story Of Tracy.. | Animadness |
| 7. BBC1 London | BBC News | BBC News |

| | | | |
|---|---|---|---|
| Tv/Radio | ○ Favorite | ○ Pr. Change | ○ Information |
| ○ Mode | ○ Date | ○ Manual Timer | ○ Timer List |

FIG. 32

| Programme Guide | | | |
|---|---|---|---|
| 📺 CBBC Channel | | | 14:35  3 Apr |
| CUSTOM | 1 BBC ONE WA.. | 2 BBC 2W | 7 BBC THREE |
| 02:35 Mon 22 | BBC News 24 | | |
| 06:00 Mon 22 | Breakfast | | |
| 09:30 Mon 22 | Now You're Talking! | | |
| 10:00 Mon 22 | Money Spinners | | |
| 11:00 Mon 22 | Hot Houses | | |
| 11:30 Mon 22 | Bargain Hunt | | |

Tv/Radio ○ Favorite ○ Pr. Change ○ Information
○ Mode ○ Date ○ Manual Timer ○ Timer List

FIG. 36B

| Reserved recording | | | | | |
|---|---|---|---|---|---|
| 2007/04/09 01:54 PM | | | | | |
| Input | CH | Start date | Start time | Record length | Repeat |
| DTV | 6-1 | 04/09(MON) | 01:56 PM | 30 minutes | Once |

⌂ Home  ○ Move  ○ Correct  ○ Confirm            ○ Exit

FIG. 38B

| Reserved list | Page 1/2 | The number of programs 1/7 | | |
|---|---|---|---|---|
| Reserved recording | Mabi's interesting Earth travel 2007/04/09 01:52 PM<br>DTV 10-1<br>04. 09. 2007.(MON) 02:23 PM~02:46 PM (23minutes)<br><br>⊗ Recording reserved   ○ Once | | | |
| | Title | | Mabi's interesting Earth travel<br>02:23 PM ~ 02:46 PM | |
| | Mabi's interesting Earth travel | EBS | Correct ⊙ | |
| | Strong beard and indolent village | EBS | Delete<br>All Delete<br>Close | |
| | Mottled KongKong (HD) | EBS DTV | 04/09(MON) | |
| | Fart captain PungPung (Rebroadcast) | EBS DTV | 04/09(MON) | |
| | Let's make? (Rebroadcast) | EBS DTV | 04/09(MON) | |
| | Bangul and soap | EBS DTV | 04/09(MON) | |

⌂ Home  ○ Move  ○ Correct/Reserved-recording  ○ Page shift  ○ Exit

| | Now Watchable | | | |
|---|---|---|---|---|
| | Title | Genre | Rating | Remaining time |
| Communication | Program1 | Drama | ⑮ | 28' |
| Mobile | Program2 | Drama | ⑲ | 30' |
| Wireless Internet | Program3 | Sports | ⑮ | 45' |
| Communication | Program4 | News | ⑮ | 15' |
| Searching | | arranging | | ㄱ~ㅎ |

FIG. 45

| Record list | Page 1/3 | ☑ No selection |
|---|---|---|

External storage medium part1

Remaining storage capacity 0MB

Internal storage medium
External storage medium

☐ TEST F01F01 04/04(TUE) [New] 00:01
☐ TEST F01F02 02/02(THU) [Complete] 21:59
☐ TEST F01F03 05/05(FRI) [New] 00:02
☐ TEST F01F04 01/01(SUN) [New] 00:01
☐ TEST F01F05 03/03(FRI) [New] 00:01
☐ TEST F01F06 06/06(TUE) [Part] 00:01
☐ TEST F01F07 07/07(FRI) [New] 00:01
☐ TEST F01F08 08/08(TUE) [New] 00:01
☐ TEST F01F09 09/09(SAT) [New] 00:02
☐ TEST F01F10 10/10(TUE) [New] 00:02

⌂ Home  ○ Move  ○ File menu  ○ Page shift  ○ Selection  ○ Exit

FIG. 50A

| 1 | 2 | 3 | 4 | 5 | 6 | 7 | 8 | 9 | 10 | 11 |
|---|---|---|---|---|---|---|---|---|----|----|
| A | V | V | V | A | D | D | D | A | D  | V  |

FIG. 50B

| Time Stamp | 1 | 2 | 3 | 4 | 5 | 9 | 11 |
|---|---|---|---|---|---|---|---|
| Stored data | A | V | V | V | A | A | V |

FIG. 50C

| 1 | 2 | 3 | 4 | 5 | 6 | 7 | 8 | 9 | 10 | 11 |
|---|---|---|---|---|---|---|---|---|----|----|
| A | V | V | V | A | N | N | N | A | N  | V  |

FIG. 61
| No. | Name | Time | Information | Thumb nail |
|-----|------|------|-------------|------------|
| <Book Mark List> ||||||
| 1 | BM_1 | 01:02:11 | Title Section |  |
| 2 | BM_2 | 01:22:03 | Title Section |  |
| 3 | BM_3 | 02:22:11 | Title Section |  |
▲▼ Selection   ● Play Sound information window
Or control window Repetitive setup window Control information window
Or control window (touch screen)

METHOD OF CONTROLLING AND APPARATUS OF RECEIVING MOBILE SERVICE DATA

This application claims the benefit of the Korean Patent Application No. 10-2007-0036702, filed on Apr. 14, 2007, which is hereby incorporated by reference as if fully set forth herein. Also, this application claims the benefit of U.S. Provisional Application No. 60/912,114, filed on Apr. 16, 2007, which is hereby incorporated by reference. This application also claims the benefit of U.S. Provisional Application No. 60/947,984, filed on Jul. 4, 2007, which is hereby incorporated by reference.

BACKGROUND OF THE INVENTION

1. Field of the Invention

The present invention relates to a method and apparatus for transmitting/receiving mobile service data and controlling the received mobile service data.

2. Discussion of the Related Art

The Vestigial Sideband (VSB) transmission mode, which is adopted as the standard for digital broadcasting in North America and the Republic of Korea, is a system using a single carrier method. Therefore, the receiving performance of the receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to an apparatus for receiving mobile service data and a method for controlling the same that substantially obviates one or more problems due to limitations and disadvantages of the related art.

An object of the present invention is to provide a an apparatus for receiving mobile service data and a method for controlling the same which has very strong resistance to noise and channel variation under a mobile environment.

Another object of the present invention is to provide an apparatus for receiving mobile service data and a method for controlling the same which additionally encodes mobile service data and transmits the encoded mobile service data to a mobile reception system, thereby improving a reception (Rx) performance of the mobile reception system.

Another object of the present invention is to provide an apparatus for receiving mobile service data and a method for controlling the same which inserts known data recognized by an agreement between a transmission end and a reception end into a predetermined area of a data region, and transmits electronic program information, thereby improving a reception (Rx) performance of the mobile reception system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for controlling mobile service data comprises: receiving coded mobile service data; demodulating received mobile service data; and storing the demodulated mobile service data, and at the same time reproducing the stored mobile service data.

In another aspect of the present invention, there is provided an apparatus for receiving mobile service data comprising: a signal receiver for receiving coded mobile service data; a demodulator for demodulating received mobile service data; and a controller for storing the demodulated mobile service data, and at the same time controlling a playback of the stored mobile service data.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 25 is a structural diagram illustrating a bit stream syntax associated with an Event Information Table (EIT) including electronic program information according to the present invention;

FIG. 26A is a structural diagram illustrating a syntax structure associated with a table indicating current time information according to the present invention;

FIG. 26B is a structural diagram illustrating a local time offset descriptor syntax according to the present invention;

FIG. 26C is a structural diagram illustrating a syntax associated with a local time offset table according to the present invention;

FIG. 27 shows a display format of an Electronic Program Guide (EPG) according to the present invention;

FIG. 29 shows an output format of an Electronic Program Guide (EPG) according to another embodiment of the present invention;

FIG. 31 shows another output format of an Electronic Program Guide (EPG) according to another embodiment of the present invention;

FIG. 32 shows another output format of an Electronic Program Guide (EPG) according to another embodiment of the present invention;

FIG. 36B shows another record setup image displayed on a program guide according to another embodiment of the present invention;

FIG. 45 shows an example of the stored list according to the present invention;

FIG. 50A to FIG. 50C show a variety of examples for storing a program and storing the stored program according to the present invention;

FIG. 61 is a conceptual diagram illustrating an example for displaying at least one bookmark of FIG. 60 according to the present invention;

DETAILED DESCRIPTION OF THE INVENTION

Figure 1:
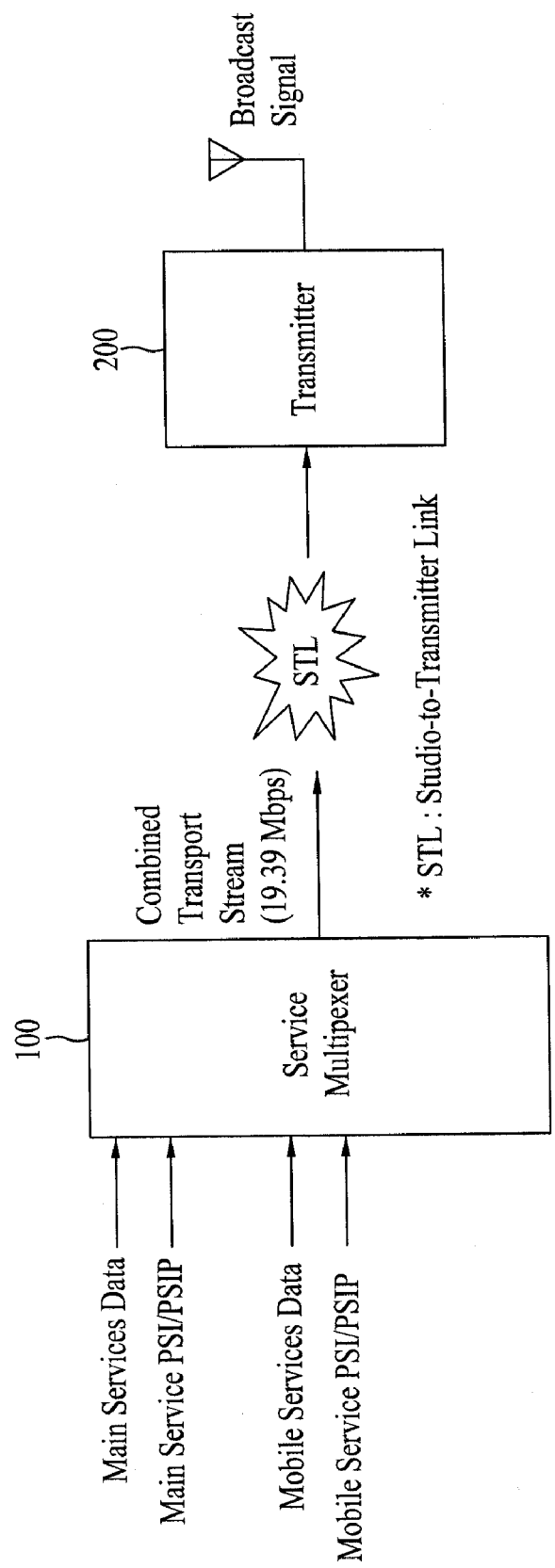
FIG. 1 illustrates a block diagram showing a general structure of a digital broadcasting system according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system. Additionally, in the present invention, mobile service data may include at least one of mobile service data, pedestrian service data, and handheld service data, and are collectively referred to as mobile service data for simplicity. Herein, the mobile service data not only correspond to mobile/pedestrian/handheld service data (M/P/H service data) but may also include any type of service data with mobile or portable characteristics. Therefore, the mobile service data according to the present invention are not limited only to the M/P/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be serviced as the main service data.

Also, a data service using the mobile service data may include weather forecast services, traffic information services, stock information services, viewer participation quiz programs, real-time polls & surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

Electronic program information is information of the mobile service data. In this case, the electronic program information may be program information associated with a channel and time of A/V data contained in the mobile service data, or may also be channel- and time-information associated with either data broadcasting or software updating. However, it should be noted that the above-mentioned examples are disclosed for only illustrative purposes. Needless to say, the above-mentioned electronic program information of the present invention includes all information including the above-mentioned mobile service data description.

The electronic program information contained in the PSI/PSIP data is transmitted to a destination. If there is a specific table equipped with program information in the PSIP/PSI table, a transmitter may include electronic program information in all kinds of tables, and transmit the resultant table including the electronic program information.

A receiver may extract program information from all kinds of tables, and provide a user with the program information. In an embodiment of the present invention, the receiver extracts the program information from an Event Information Table (EIT) or a Virtual Channel Table (VCT), and provide the user with the extracted program information.

If an unexpected error occurs while the transmitter transmits electronic program information to the receiver, the receiver may not transmit the program information to the user, or may transmit wrong information to the user. Therefore, there is needed a system capable of transmitting the electronic program information from the transmitter to the receiver under a mobile reception environment.

A transmission system according to the present invention has no influence on a conventional reception system while the conventional reception system receives main service data. Namely, the transmission system is backward compatible with the reception system. And, the transmission system multiplexes main service data and mobile service data in the same physical channel, and transmits the multiplexed data.

The transmission system according to the present invention additionally encodes mobile service data and electronic program information, inserts known data pre-recognized by an agreement between the transmission/reception ends into the encoded result, and transmits the inserted result.

In the case of using the above-mentioned transmission system, the reception system can receive mobile service data while in motion, and can stably receive the mobile service data irrespective of a distortion or noise of a channel.

General Description of a Transmitting System

FIG. 1 illustrates a block diagram showing a general structure of a transmitting system according to an embodiment of the present invention. Herein, the transmitting includes a service multiplexer 100 and a transmitter 200. Herein, the service multiplexer 100 is located in the studio of each broadcast station, and the transmitter 200 is located in a site placed at a predetermined distance from the studio. The transmitter 200 may be located in a plurality of different locations. Also, for example, the plurality of transmitters may share the same frequency. And, in this case, the plurality of transmitters receives the same signal. Accordingly, in the receiving system, a channel equalizer may compensate signal distortion, which is caused by a reflected wave, so as to recover the original signal. In another example, the plurality of transmitters may have different frequencies with respect to the same channel.

A variety of methods may be used for data communication each of the transmitters, which are located in remote positions, and the service multiplexer. For example, an interface standard such as a synchronous serial interface for transport of MPEG-2 data (SMPTE-310M). In the SMPTE-310M interface standard, a constant data rate is decided as an output data rate of the service multiplexer. For example, in case of the BVSB mode, the output data rate is 19.39 Mbps, and, in case of the 16 VSB mode, the output data rate is 38.78 Mbps. Furthermore, in the conventional 8 VSB mode transmitting system, a transport stream (TS) packet having a data rate of approximately 19.39 Mbps may be transmitted through a single physical channel. Also, in the transmitting system according to the present invention provided with backward compatibility with the conventional transmitting system, additional encoding is performed on the mobile service data. Thereafter, the additionally encoded mobile service data are multiplexed with the main service data to a TS packet form, which is then transmitted. At this point, the data rate of the multiplexed TS packet is approximately 19.39 Mbps.

At this point, the service multiplexer 100 receives at least one type of mobile service data and program specific information (PSI)/program and system information protocol (PSIP) table data for each mobile service and encapsulates the received data to each transport stream (TS) packet. Also, the service multiplexer 100 receives at least one type of main service data and PSI/PSIP table data for each main service so as to encapsulate the received data to a TS packet. Subsequently, the TS packets are multiplexed according to a predetermined multiplexing rule and outputs the multiplexed packets to the transmitter 200.

Service Multiplexer

Figure 2:
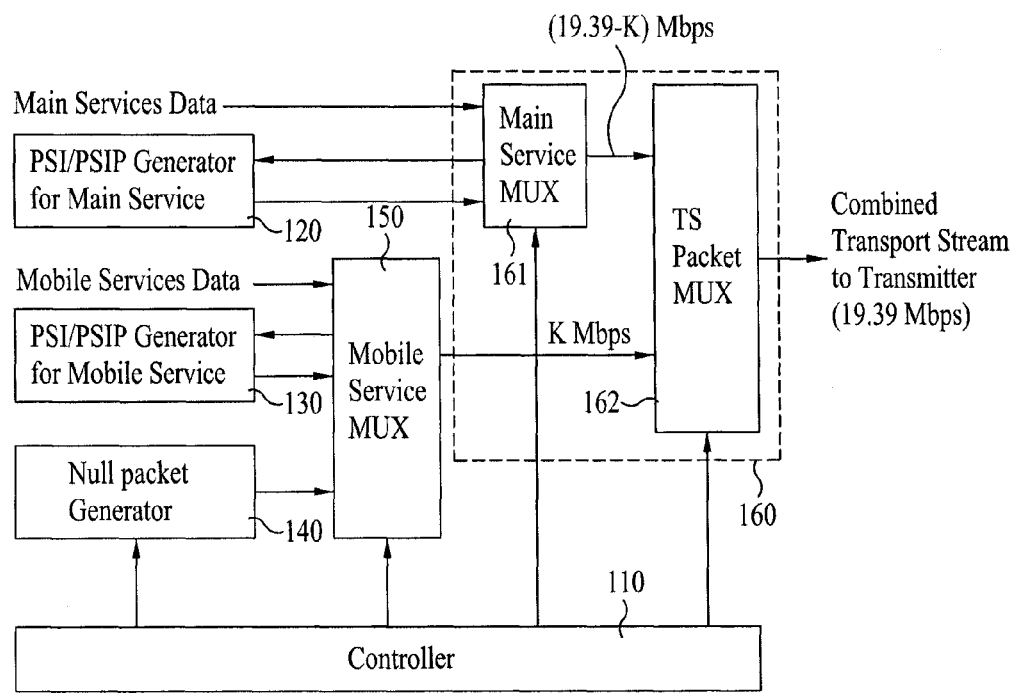
FIG. 2 illustrates a block diagram showing an example of a service multiplexer of FIG. 1.

FIG. 2 illustrates a block diagram showing an example of the service multiplexer. The service multiplexer includes a controller 110 for controlling the overall operations of the service multiplexer, a PSI/PSIP generator 120 for the main service, a PSI/PSIP generator 130 for the mobile service, a null packet generator 140, a mobile service multiplexer 150, and a transport multiplexer 160. The transport multiplexer 160 may include a main service multiplexer 161 and a transport stream (TS) packet multiplexer 162. Referring to FIG. 2, at least one type of compression encoded main service data and the PSI/PSIP table data generated from the PSI/PSIP generator 120 for the main service are inputted to the main service multiplexer 161 of the transport multiplexer 160. The main service multiplexer 161 encapsulates each of the inputted main service data and PSI/PSIP table data to MPEG-2 TS packet forms. Then, the MPEG-2 TS packets are multiplexed and outputted to the TS packet multiplexer 162. Herein, the data packet being outputted from the main service multiplexer 161 will be referred to as a main service data packet for simplicity.

Thereafter, at least one type of the compression encoded mobile service data and the PSI/PSIP table data generated from the PSI/PSIP generator 130 for the mobile service are inputted to the mobile service multiplexer 150. The mobile service multiplexer 150 encapsulates each of the inputted mobile service data and PSI/PSIP table data to MPEG-2 TS packet forms. Then, the MPEG-2 TS packets are multiplexed and outputted to the TS packet multiplexer 162. Herein, the data packet being outputted from the mobile service multiplexer 150 will be referred to as a mobile service data packet for simplicity. At this point, the transmitter 200 requires identification information in order to identify and process the main service data packet and the mobile service data packet. Herein, the identification information may use values pre-decided in accordance with an agreement between the transmitting system and the receiving system, or may be configured of a separate set of data, or may modify predetermined location value with in the corresponding data packet. As an example of the present invention, a different packet identifier (PID) may be assigned to identify each of the main service data packet and the mobile service data packet.

In another example, by modifying a synchronization data byte within a header of the mobile service data, the service data packet may be identified by using the synchronization data byte value of the corresponding service data packet. For example, the synchronization byte of the main service data packet directly outputs the value decided by the ISO/IEC13818-1 standard (i.e., 0x47) without any modification. The synchronization byte of the mobile service data packet modifies and outputs the value, thereby identifying the main service data packet and the mobile service data packet. Conversely, the synchronization byte of the main service data packet is modified and outputted, whereas the synchronization byte of the mobile service data packet is directly outputted without being modified, thereby enabling the main service data packet and the mobile service data packet to be identified.

A plurality of methods may be applied in the method of modifying the synchronization byte. For example, each bit of the synchronization byte may be inversed, or only a portion of the synchronization byte may be inversed. As described above, any type of identification information may be used to identify the main service data packet and the mobile service data packet. Therefore, the scope of the present invention is not limited only to the example set forth in the description of the present invention.

Meanwhile, a transport multiplexer used in the conventional digital broadcasting system may be used as the transport multiplexer 160 according to the present invention. More specifically, in order to multiplex the mobile service data and the main service data and to transmit the multiplexed data, the data rate of the main service is limited to a data rate of (19.39-K) Mbps. Then, K Mbps, which corresponds to the remaining data rate, is assigned as the data rate of the mobile service. Thus, the transport multiplexer which is already being used may be used as it is without any modification. Herein, the transport multiplexer 160 multiplexes the main service data packet being outputted from the main service multiplexer 161 and the mobile service data packet being outputted from the mobile service multiplexer 150. Thereafter, the transport multiplexer 160 transmits the multiplexed data packets to the transmitter 200.

However, in some cases, the output data rate of the mobile service multiplexer 150 may not be equal to K Mbps. In this case, the mobile service multiplexer 150 multiplexes and outputs null data packets generated from the null packet generator 140 so that the output data rate can reach K Mbps. More specifically, in order to match the output data rate of the mobile service multiplexer 150 to a constant data rate, the null packet generator 140 generates null data packets, which are then outputted to the mobile service multiplexer 150. For example, when the service multiplexer 100 assigns K Mbps of the 19.39 Mbps to the mobile service data, and when the remaining (19.39-K) Mbps is, therefore, assigned to the main service data, the data rate of the mobile service data that are multiplexed by the service multiplexer 100 actually becomes lower than K Mbps. This is because, in case of the mobile service data, the pre-processor of the transmitting system performs additional encoding, thereby increasing the amount of data. Eventually, the data rate of the mobile service data, which may be transmitted from the service multiplexer 100, becomes smaller than K Mbps.

For example, since the pre-processor of the transmitter performs an encoding process on the mobile service data at a coding rate of at least ½, the amount of the data outputted from the pre-processor is increased to more than twice the amount of the data initially inputted to the pre-processor. Therefore, the sum of the data rate of the main service data and the data rate of the mobile service data, both being multiplexed by the service multiplexer 100, becomes either equal to or smaller than 19.39 Mbps. Therefore, in order to match the data rate of the data that are finally outputted from the service multiplexer 100 to a constant data rate (e.g., 19.39 Mbps), an amount of null data packets corresponding to the amount of lacking data rate is generated from the null packet generator 140 and outputted to the mobile service multiplexer 150.

Accordingly, the mobile service multiplexer 150 encapsulates each of the mobile service data and the PSI/PSIP table data that are being inputted to a MPEG-2 TS packet form. Then, the above-described TS packets are multiplexed with the null data packets and, then, outputted to the TS packet multiplexer 162. Thereafter, the TS packet multiplexer 162 multiplexes the main service data packet being outputted from the main service multiplexer 161 and the mobile service data packet being outputted from the mobile service multiplexer 150 and transmits the multiplexed data packets to the transmitter 200 at a data rate of 19.39 Mbps.

According to an embodiment of the present invention, the mobile service multiplexer 150 receives the null data packets. However, this is merely exemplary and does not limit the scope of the present invention. In other words, according to another embodiment of the present invention, the TS packet multiplexer 162 may receive the null data packets, so as to match the data rate of the finally outputted data to a constant data rate. Herein, the output path and multiplexing rule of the null data packet is controlled by the controller 110. The controller 110 controls the multiplexing processed performed by the mobile service multiplexer 150, the main service multiplexer 161 of the transport multiplexer 160, and the TS packet multiplexer 162, and also controls the null data packet generation of the null packet generator 140. At this point, the transmitter 200 discards the null data packets transmitted from the service multiplexer 100 instead of transmitting the null data packets.

Further, in order to allow the transmitter 200 to discard the null data packets transmitted from the service multiplexer 100 instead of transmitting them, identification information for identifying the null data packet is required. Herein, the identification information may use values pre-decided in accordance with an agreement between the transmitting system and the receiving system. For example, the value of the synchronization byte within the header of the null data packet may be modified so as to be used as the identification information. Alternatively, a transport_error_indicator flag may also be used as the identification information.

In the description of the present invention, an example of using the transport_error_indicator flag as the identification information will be given to describe an embodiment of the present invention. In this case, the transport_error_indicator flag of the null data packet is set to '1', and the transport_error_indicator flag of the remaining data packets are reset to '0', so as to identify the null data packet. More specifically, when the null packet generator 140 generates the null data packets, if the transport_error_indicator flag from the header field of the null data packet is set to '1' and then transmitted, the null data packet may be identified and, therefore, be discarded. In the present invention, any type of identification information for identifying the null data packets may be used. Therefore, the scope of the present invention is not limited only to the examples set forth in the description of the present invention.

According to another embodiment of the present invention, a transmission parameter may be included in at least a portion of the null data packet, or at least one table or an operations and maintenance (OM) packet (or OMP) of the PSI/PSIP table for the mobile service. In this case, the transmitter 200 extracts the transmission parameter and outputs the extracted transmission parameter to the corresponding block and also transmits the extracted parameter to the receiving system if required. More specifically, a packet referred to as an OMP is defined for the purpose of operating and managing the transmitting system. For example, the OMP is configured in accordance with the MPEG-2 TS packet format, and the corresponding PID is given the value of 0x1FFA. The OMP is configured of a 4-byte header and a 184-byte payload. Herein, among the 184 bytes, the first byte corresponds to an OM_type field, which indicates the type of the OM packet.

In the present invention, the transmission parameter may be transmitted in the form of an OMP. And, in this case, among the values of the reserved fields within the OM_type field, a pre-arranged value is used, thereby indicating that the transmission parameter is being transmitted to the transmitter 200 in the form of an OMP. More specifically, the transmitter 200 may find (or identify) the OMP by referring to the PID. Also, by parsing the OM_type field within the OMP, the transmitter 200 can verify whether a transmission parameter is included after the OM_type field of the corresponding packet. The transmission parameter corresponds to supplemental data required for processing mobile service data from the transmitting system and the receiving system.

Herein, the transmission parameter may include data group information, region information within the data group, RS frame information, super frame information, burst information, turbo code information, and RS code information. The burst information may include burst size information, burst period information, and time information to next burst. The burst period signifies the period at which the burst transmitting the same mobile service is repeated. The data group includes a plurality of mobile service data packets, and a plurality of such data groups is gathered (or grouped) to form a burst. A burst section signifies the beginning of a current burst to the beginning of a next burst. Herein, the burst section is classified as a section that includes the data group (also referred to as a burst-on section), and a section that does not include the data group (also referred to as a burst-off section). A burst-on section is configured of a plurality of fields, wherein one field includes one data group.

The transmission parameter may also include information on how signals of a symbol domain are encoded in order to transmit the mobile service data, and multiplexing information on how the main service data and the mobile service data or various types of mobile service data are multiplexed. The information included in the transmission parameter is merely exemplary to facilitate the understanding of the present invention. And, the adding and deleting of the information included in the transmission parameter may be easily modified and changed by anyone skilled in the art. Therefore, the present invention is not limited to the examples proposed in the description set forth herein. Furthermore, the transmission parameters may be provided from the service multiplexer 100 to the transmitter 200. Alternatively, the transmission parameters may also be set up by an internal controller (not shown) within the transmitter 200 or received from an external source.

Transmitter

Figure 3:
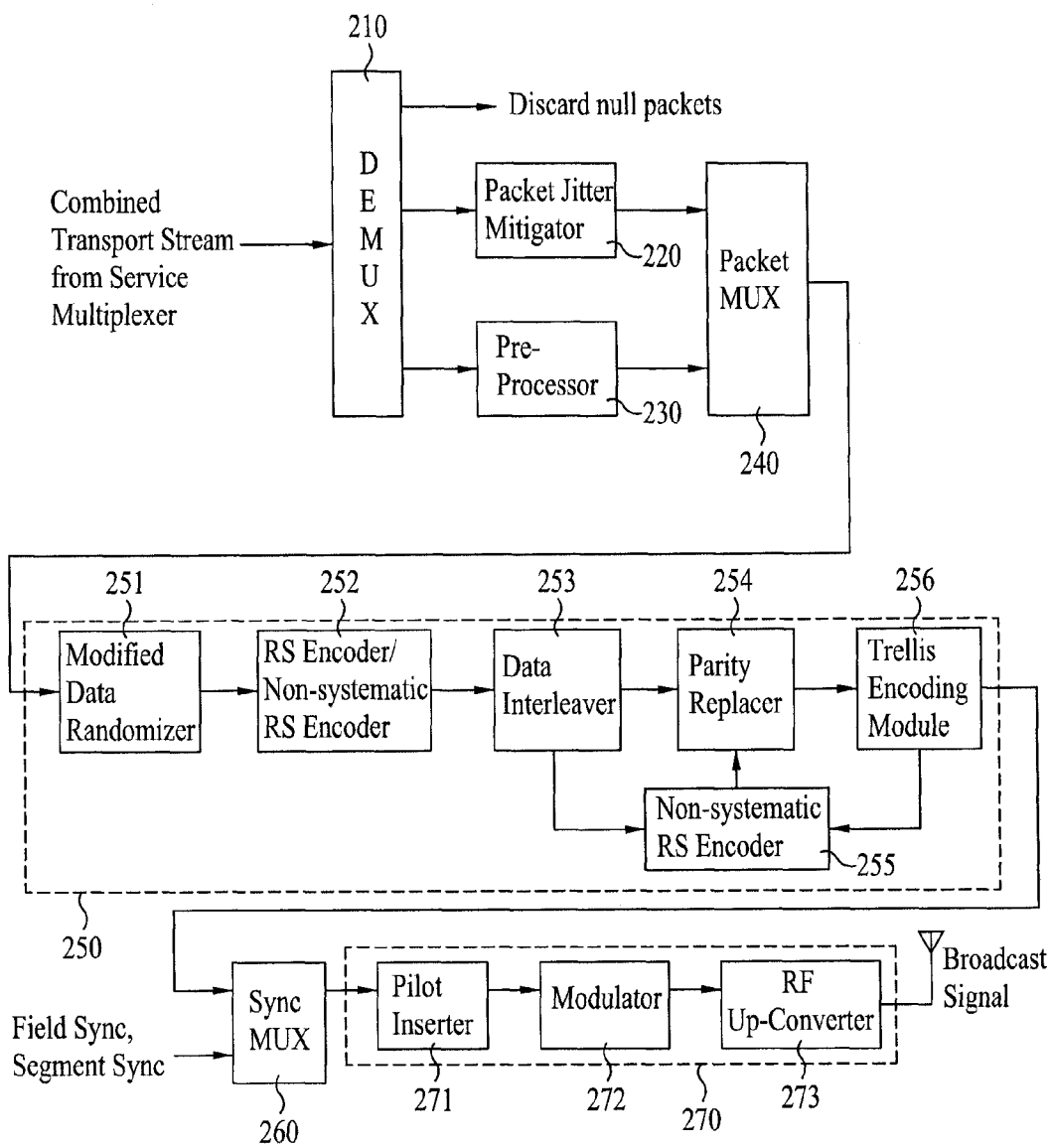
FIG. 3 illustrates a block diagram showing an example of a transmitter of FIG. 1.

FIG. 3 illustrates a block diagram showing an example of the transmitter 200 according to an embodiment of the present invention. Herein, the transmitter 200 includes a demultiplexer 210, a packet jitter mitigator 220, a pre-processor 230, a packet multiplexer 240, a post-processor 250, a synchronization (sync) multiplexer 260, and a transmission unit 270. Herein, when a data packet is received from the service multiplexer 100, the demultiplexer 210 should identify whether the received data packet corresponds to a main service data packet, a mobile service data packet, or a null data packet. For example, the demultiplexer 210 uses the PID within the received data packet so as to identify the main service data packet and the mobile service data packet. Then, the demultiplexer 210 uses a transport_error_indicator field to identify the null data packet. The main service data packet identified by the demultiplexer 210 is outputted to the packet jitter mitigator 220, the mobile service data packet is outputted to the pre-processor 230, and the null data packet is discarded. If a transmission parameter is included in the null data packet, then the transmission parameter is first extracted and outputted to the corresponding block. Thereafter, the null data packet is discarded.

The pre-processor 230 performs an additional encoding process of the mobile service data included in the service data packet, which is demultiplexed and outputted from the demultiplexer 210. The pre-processor 230 also performs a process of configuring a data group so that the data group may be positioned at a specific place in accordance with the purpose of the data, which are to be transmitted on a transmission frame. This is to enable the mobile service data to respond swiftly and strongly against noise and channel changes. The pre-processor 230 may also refer to the transmission parameter when performing the additional encoding process. Also, the pre-processor 230 groups a plurality of mobile service data packets to configure a data group. Thereafter, known data, mobile service data, RS parity data, and MPEG header are allocated to pre-determined areas within the data group.

Pre-Processor within Transmitter

Figure 4:
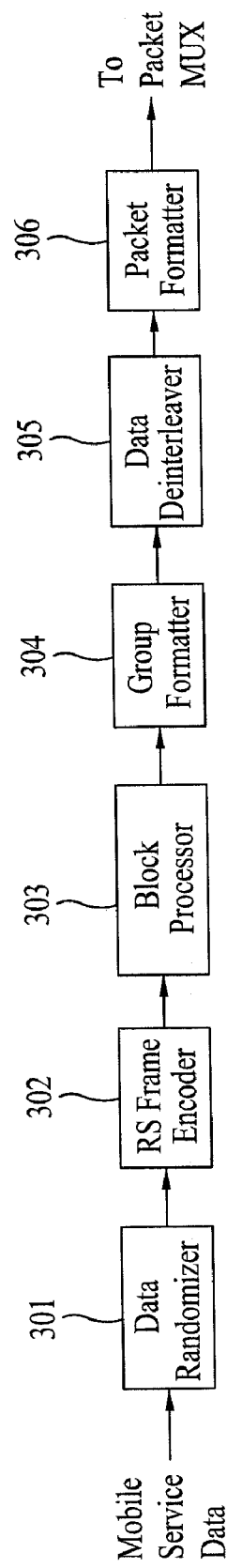
FIG. 4 illustrates a block diagram showing an example of a pre-processor of FIG. 3.

FIG. 4 illustrates a block diagram showing an example of the pre-processor 230 according to the present invention. The pre-processor 230 includes a data randomizer 301, a RS frame encoder 302, a block processor 303, a group formatter 304, a data deinterleaver 305, a packet formatter 306. The data randomizer 301 within the above-described pre-processor 230 randomizes the mobile service data packet including the mobile service data that is inputted through the demultiplexer 210. Then, the data randomizer 301 outputs the randomized mobile service data packet to the RS frame encoder 302. At this point, since the data randomizer 301 performs the randomizing process on the mobile service data, the randomizing process that is to be performed by the data randomizer 251 of the post-processor 250 on the mobile service data may be omitted. The data randomizer 301 may also discard the synchronization byte within the mobile service data packet and perform the randomizing process. This is an option that may be chosen by the system designer. In the example given in the present invention, the randomizing process is performed without discarding the synchronization byte within the mobile service data packet.

The RS frame encoder 302 groups a plurality of mobile the synchronization byte within the mobile service data packets that is randomized and inputted, so as to create a RS frame. Then, the RS frame encoder 302 performs at least one of an error correction encoding process and an error detection encoding process in RS frame units. Accordingly, robustness may be provided to the mobile service data, thereby scattering group error that may occur during changes in a frequency environment, thereby enabling the enhanced data to respond to the frequency environment, which is extremely vulnerable and liable to frequent changes. Also, the RS frame encoder 302 groups a plurality of RS frame so as to create a super frame, thereby performing a row permutation process in super frame units. The row permutation process may also be referred to as a row interleaving process. Hereinafter, the process will be referred to as row permutation for simplicity.

More specifically, when the RS frame encoder 302 performs the process of permuting each row of the super frame in accordance with a pre-determined rule, the position of the rows within the super frame before and after the row permutation process is changed. If the row permutation process is performed by super frame units, and even though the section having a plurality of errors occurring therein becomes very long, and even though the number of errors included in the RS frame, which is to be decoded, exceeds the extent of being able to be corrected, the errors become dispersed within the entire super frame. Thus, the decoding ability is even more enhanced as compared to a single RS frame.

At this point, as an example of the present invention, RS-encoding is applied for the error correction encoding process, and a cyclic redundancy check (CRC) encoding is applied for the error detection process. When performing the RS-encoding, parity data that are used for the error correction are generated. And, when performing the CRC encoding, CRC data that are used for the error detection are generated. The RS encoding is one of forward error correction (FEC) methods. The FEC corresponds to a technique for compensating errors that occur during the transmission process. The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability of the receiving system. Herein, the RS frame encoder 302 refers to a pre-determined transmission parameter and/or the transmission parameter provided from the service multiplexer 100 so as to perform operations including RS frame configuration, RS encoding, CRC encoding, super frame configuration, and row permutation in super frame units.

Pre-Processor within RS Frame Encoder

Figure 5:
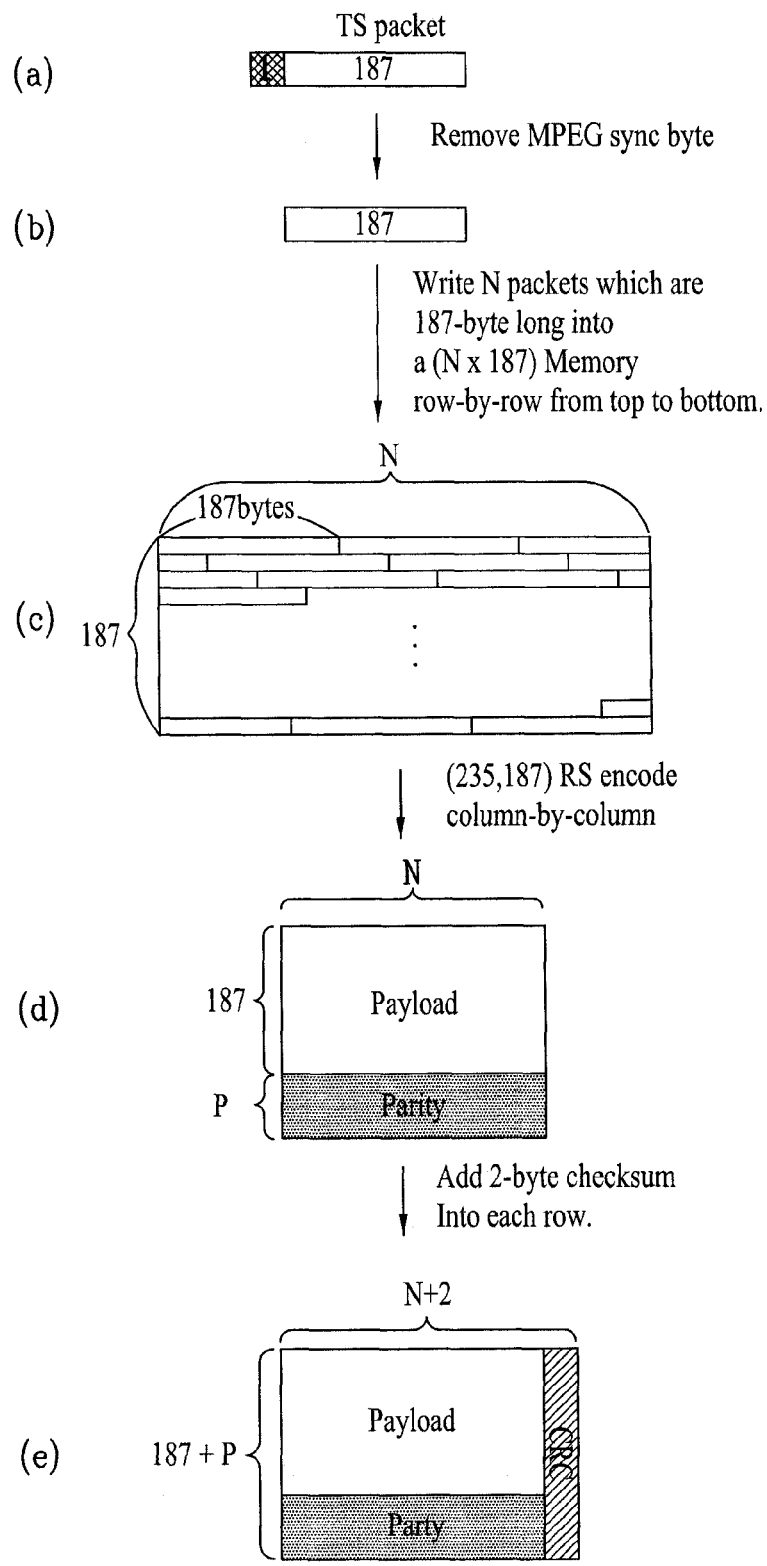
FIG. 5(a) to FIG. 5(e) illustrate error correction encoding and error detection encoding processed according to an embodiment of the present invention.

FIG. 5(*a*) to FIG. 5(*e*) illustrate error correction encoding and error detection encoding processed according to an embodiment of the present invention. More specifically, the RS frame encoder 302 first divides the inputted mobile service data bytes to units of a predetermined length. The predetermined length is decided by the system designer. And, in the example of the present invention, the predetermined length is equal to 187 bytes, and, therefore, the 187-byte unit will be referred to as a packet for simplicity. For example, when the mobile service data that are being inputted, as shown in FIG. 5(*a*), correspond to a MPEG transport packet stream configured of 188-byte units, the first synchronization byte is removed, as shown in FIG. 5(*b*), so as to configure a 187-byte unit. Herein, the synchronization byte is removed because each mobile service data packet has the same value.

Herein, the process of removing the synchronization byte may be performed during a randomizing process of the data randomizer 301 in an earlier process. In this case, the process of the removing the synchronization byte by the RS frame encoder 302 may be omitted. Moreover, when adding synchronization bytes from the receiving system, the process may be performed by the data derandomizer instead of the RS frame decoder. Therefore, if a removable fixed byte (e.g., synchronization byte) does not exist within the mobile service data packet that is being inputted to the RS frame encoder 302, or if the mobile service data that are being inputted are not configured in a packet format, the mobile service data that are being inputted are divided into 187-byte units, thereby configuring a packet for each 187-byte unit.

Subsequently, as shown in FIG. 5(*c*), N number of packets configured of 187 bytes is grouped to configure a RS frame. At this point, the RS frame is configured as a RS frame having the size of N(row)*187(column) bytes, in which 187-byte packets are sequentially inputted in a row direction. In order to simplify the description of the present invention, the RS frame configured as described above will also be referred to as a first RS frame. More specifically, only pure mobile service data are included in the first RS frame, which is the same as the structure configured of 187 N-byte rows. Thereafter, the mobile service data within the RS frame are divided into an equal size. Then, when the divided mobile service data are transmitted in the same order as the input order for configuring the RS frame, and when one or more errors have occurred at a particular point during the transmitting/receiving process, the errors are clustered (or gathered) within the RS frame as well. In this case, the receiving system uses a RS erasure decoding method when performing error correction decoding, thereby enhancing the error correction ability. At this point, the N number of columns within the N number of RS frame includes 187 bytes, as shown in FIG. 5(*c*).

In this case, a (Nc,Kc)-RS encoding process is performed on each column, so as to generate Nc−Kc(=P) number of parity bytes. Then, the newly generated P number of parity bytes is added after the very last byte of the corresponding column, thereby creating a column of (187+P) bytes. Herein, as shown in FIG. 5(*c*), Kc is equal to 187 (i.e., Kc=187), and Nc is equal to 187+P (i.e., Nc=187+P). For example, when P is equal to 48, (235,187)-RS encoding process is performed so as to create a column of 235 bytes. When such RS encoding process is performed on all N number of columns, as shown in FIG. 5(*c*), a RS frame having the size of N(row)*(187+P) (column) bytes may be created, as shown in FIG. 5(*d*). In order to simplify the description of the present invention, the RS frame having the RS parity inserted therein will be referred to as s second RS frame. More specifically, the second RS frame having the structure of (187+P) rows configured of N bytes may be configured.

As shown in FIG. 5(*c*) or FIG. 5(*d*), each row of the RS frame is configured of N bytes. However, depending upon channel conditions between the transmitting system and the receiving system, error may be included in the RS frame. When errors occur as described above, CRC data (or CRC code or CRC checksum) may be used on each row unit in order to verify whether error exists in each row unit. The RS frame encoder 302 may perform CRC encoding on the mobile service data being RS encoded so as to create (or generate) the CRC data. The CRC data being generated by CRC encoding may be used to indicate whether the mobile service data have been damaged while being transmitted through the channel.

The present invention may also use different error detection encoding methods other than the CRC encoding method. Alternatively, the present invention may use the error correction encoding method to enhance the overall error correction ability of the receiving system. FIG. 5(*e*) illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 1 below corresponds to an exemplary equation for generating a 2-byte CRC checksum for each row being configured of N number of bytes.

$$g(x)=x^{16}+x^{12}+x^{5}+1 \quad \text{Equation 1}$$

The process of adding a 2-byte checksum in each row is only exemplary. Therefore, the present invention is not limited only to the example proposed in the description set forth herein. In order to simplify the understanding of the present invention, the RS frame having the RS parity and CRC checksum added therein will hereinafter be referred to as a third RS frame. More specifically, the third RS frame corresponds to (187+P) number of rows each configured of (N+2) number of bytes. As described above, when the process of RS encoding and CRC encoding are completed, the (N*187)-byte RS frame is expanded to a (N+2)*(187+P)-byte RS frame. Furthermore, the RS frame that is expanded, as shown in FIG. 5(e), is inputted to the block processor 303.

As described above, the mobile service data encoded by the RS frame encoder 302 are inputted to the block processor 303. The block processor 303 then encodes the inputted mobile service data at a coding rate of G/H (wherein, G is smaller than H (i.e., G<H)) and then outputted to the group formatter 304. More specifically, the block processor 303 divides the mobile service data being inputted in byte units into bit units. Then, the G number of bits is encoded to H number of bits. Thereafter, the encoded bits are converted back to byte units and then outputted. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). Hereinafter, the former coding rate will be referred to as a coding rate of ½ (½-rate coding), and the latter coding rate will be referred to as a coding rate of ¼ (¼-rate coding), for simplicity.

Herein, when using the ¼ coding rate, the coding efficiency is greater than when using the ½ coding rate, and may, therefore, provide greater and enhanced error correction ability. For such reason, when it is assumed that the data encoded at a ¼ coding rate in the group formatter 304, which is located near the end portion of the system, are allocated to an area in which the receiving performance may be deteriorated, and that the data encoded at a ½ coding rate are allocated to an area having excellent receiving performance, the difference in performance may be reduced. At this point, the block processor 303 may also receive signaling information including transmission parameters. Herein, the signaling information may also be processed with either ½-rate coding or ¼-rate coding as in the step of processing mobile service data. Thereafter, the signaling information is also considered the same as the mobile service data and processed accordingly.

Meanwhile, the group formatter inserts mobile service data that are outputted from the block processor 303 in corresponding areas within a data group, which is configured in accordance with a pre-defined rule. Also, with respect to the data deinterleaving process, each place holder or known data (or known data place holders) are also inserted in corresponding areas within the data group. At this point, the data group may be divided into at least one hierarchical area. Herein, the type of mobile service data being inserted in each area may vary depending upon the characteristics of each hierarchical area. Additionally, each area may, for example, be divided based upon the receiving performance within the data group. Furthermore, one data group may be configured to include a set of field synchronization data.

Figure 6A:
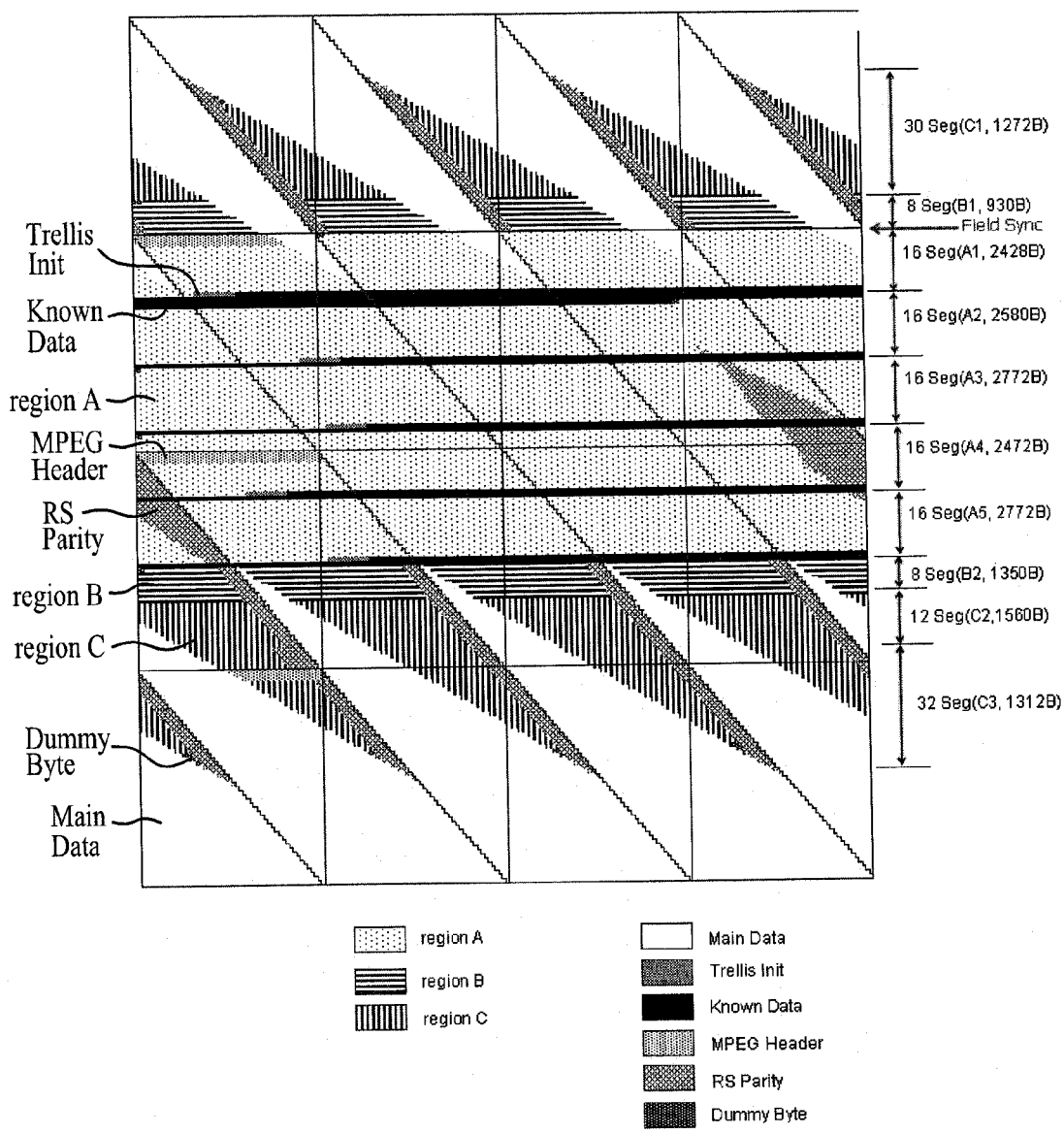
FIG. 6A and FIG. 6B illustrate data configuration before and after a data deinterleaver in a digital broadcast transmitting system according to the present invention.
Figure 6B:
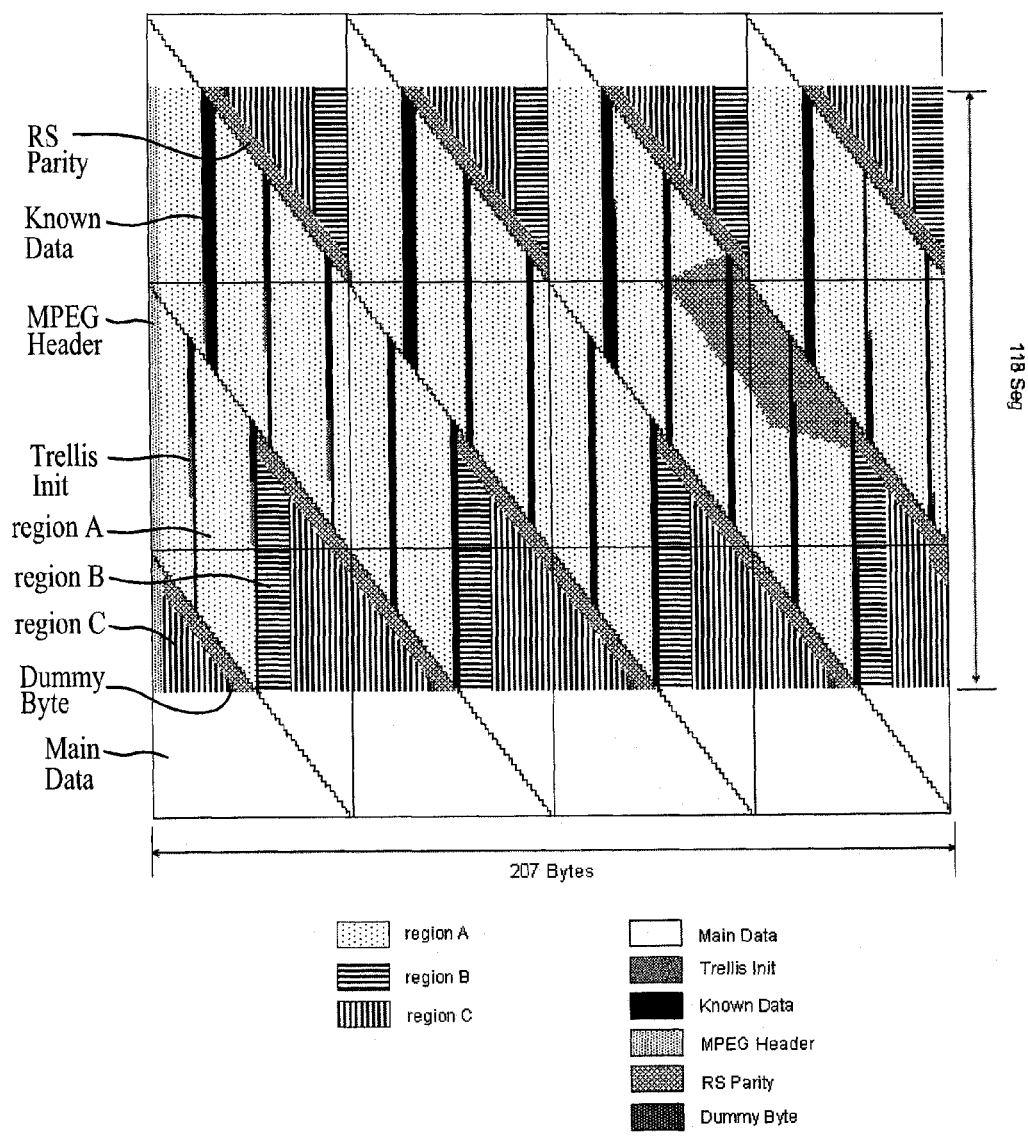

In an example given in the present invention, a data group is divided into A, B, and C regions in a data configuration prior to data deinterleaving. At this point, the group formatter 304 allocates the mobile service data, which are inputted after being RS encoded and block encoded, to each of the corresponding regions by referring to the transmission parameter. FIG. 6A illustrates an alignment of data after being data interleaved and identified, and FIG. 6B illustrates an alignment of data before being data interleaved and identified. More specifically, a data structure identical to that shown in FIG. 6A is transmitted to a receiving system. Also, the data group configured to have the same structure as the data structure shown in FIG. 6A is inputted to the data deinterleaver 305.

As described above, FIG. 6A illustrates a data structure prior to data deinterleaving that is divided into 3 regions, such as region A, region B, and region C. Also, in the present invention, each of the regions A to C is further divided into a plurality of regions. Referring to FIG. 6A, region A is divided into 5 regions (A1 to A5), region B is divided into 2 regions (B1 and B2), and region C is divided into 3 regions (C1 to C3). Herein, regions A to C are identified as regions having similar receiving performances within the data group. Herein, the type of mobile service data, which are inputted, may also vary depending upon the characteristic of each region.

In the example of the present invention, the data structure is divided into regions A to C based upon the level of interference of the main service data. Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, and when consecutively long known data are to be periodically inserted in the mobile service data, the known data having a predetermined length may be periodically inserted in the region having no interference from the main service data (e.g., region A). However, due to interference from the main service data, it is difficult to periodically insert known data and also to insert consecutively long known data to a region having interference from the main service data (e.g., region B and region C).

Hereinafter, examples of allocating data to region A (A1 to A5), region B (B1 and B2), and region C (C1 to C3) will now be described in detail with reference to FIG. 6A. The data group size, the number of hierarchically divided regions within the data group and the size of each region, and the number of mobile service data bytes that can be inserted in each hierarchically divided region of FIG. 6A are merely examples given to facilitate the understanding of the present invention. Herein, the group formatter 304 creates a data group including places in which field synchronization data bytes are to be inserted, so as to create the data group that will hereinafter be described in detail.

More specifically, region A is a region within the data group in which a long known data sequence may be periodically inserted, and in which includes regions wherein the main service data are not mixed (e.g., A1 to A5). Also, region A includes a region (e.g., A1) located between a field synchronization region and the region in which the first known data sequence is to be inserted. The field synchronization region has the length of one segment (i.e., 832 symbols) existing in an ATSC system.

For example, referring to FIG. 6A, 2428 bytes of the mobile service data may be inserted in region A1, 2580 bytes may be inserted in region A2, 2772 bytes may be inserted in region A3, 2472 bytes may be inserted in region A4, and 2772 bytes may be inserted in region A5. Herein, trellis initialization data or known data, MPEG header, and RS parity are not included in the mobile service data. As described above, when region A includes a known data sequence at both ends, the receiving system uses channel information that can obtain known data or field synchronization data, so as to perform equalization, thereby providing enforced equalization performance.

Also, region B includes a region located within 8 segments at the beginning of a field synchronization region within the data group (chronologically placed before region A1) (e.g., region B1), and a region located within 8 segments behind the very last known data sequence which is inserted in the data group (e.g., region B2). For example, 930 bytes of the mobile service data may be inserted in the region B1, and 1350 bytes may be inserted in region B2. Similarly, trellis initialization data or known data, MPEG header, and RS parity are not included in the mobile service data. In case of region B, the receiving system may perform equalization by using channel information obtained from the field synchronization region. Alternatively, the receiving system may also perform equalization by using channel information that may be obtained from the last known data sequence, thereby enabling the system to respond to the channel changes.

Region C includes a region located within 30 segments including and preceding the $9^{th}$ segment of the field synchronization region (chronologically located before region A) (e.g., region C1), a region located within 12 segments including and following the $9^{th}$ segment of the very last known data sequence within the data group (chronologically located after region A) (e.g., region C2), and a region located in 32 segments after the region C2 (e.g., region C3). For example, 1272 bytes of the mobile service data may be inserted in the region C1, 1560 bytes may be inserted in region C2, and 1312 bytes may be inserted in region C3. Similarly, trellis initialization data or known data, MPEG header, and RS parity are not included in the mobile service data. Herein, region C (e.g., region C1) is located chronologically earlier than (or before) region A.

Since region C (e.g., region C1) is located further apart from the field synchronization region which corresponds to the closest known data region, the receiving system may use the channel information obtained from the field synchronization data when performing channel equalization. Alternatively, the receiving system may also use the most recent channel information of a previous data group. Furthermore, in region C (e.g., region C2 and region C3) located before region A, the receiving system may use the channel information obtained from the last known data sequence to perform equalization. However, when the channels are subject to fast and frequent changes, the equalization may not be performed perfectly. Therefore, the equalization performance of region C may be deteriorated as compared to that of region B.

When it is assumed that the data group is allocated with a plurality of hierarchically divided regions, as described above, the block processor 303 may encode the mobile service data, which are to be inserted to each region based upon the characteristic of each hierarchical region, at a different coding rate. For example, the block processor 303 may encode the mobile service data, which are to be inserted in regions A1 to A5 of region A, at a coding rate of ½. Then, the group formatter 304 may insert the ½-rate encoded mobile service data to regions A1 to A5.

The block processor 303 may encode the mobile service data, which are to be inserted in regions B1 and B2 of region B, at a coding rate of ¼ having higher error correction ability as compared to the ½-coding rate. Then, the group formatter 304 inserts the ¼-rate coded mobile service data in region B1 and region B2. Furthermore, the block processor 303 may encode the mobile service data, which are to be inserted in regions C1 to C3 of region C, at a coding rate of ¼ or a coding rate having higher error correction ability than the ¼-coding rate. Then, the group formatter 304 may either insert the encoded mobile service data to regions C1 to C3, as described above, or leave the data in a reserved region for future usage.

In addition, the group formatter 304 also inserts supplemental data, such as signaling information that notifies the overall transmission information, other than the mobile service data in the data group. Also, apart from the encoded mobile service data outputted from the block processor 303, the group formatter 304 also inserts MPEG header place holders, non-systematic RS parity place holders, main service data place holders, which are related to data deinterleaving in a later process, as shown in FIG. 6A. Herein, the main service data place holders are inserted because the mobile service data bytes and the main service data bytes are alternately mixed with one another in regions B and C based upon the input of the data deinterleaver, as shown in FIG. 6A. For example, based upon the data outputted after data deinterleaving, the place holder for the MPEG header may be allocated at the very beginning of each packet.

Furthermore, the group formatter 304 either inserts known data generated in accordance with a pre-determined method or inserts known data place holders for inserting the known data in a later process. Additionally, place holders for initializing the trellis encoding module 256 are also inserted in the corresponding regions. For example, the initialization data place holders may be inserted in the beginning of the known data sequence. Herein, the size of the mobile service data that can be inserted in a data group may vary in accordance with the sizes of the trellis initialization place holders or known data (or known data place holders), MPEG header place holders, and RS parity place holders.

The output of the group formatter 304 is inputted to the data deinterleaver 305. And, the data deinterleaver 305 deinterleaves data by performing an inverse process of the data interleaver on the data and place holders within the data group, which are then outputted to the packet formatter 306. More specifically, when the data and place holders within the data group configured, as shown in FIG. 6A, are deinterleaved by the data deinterleaver 305, the data group being outputted to the packet formatter 306 is configured to have the structure shown in FIG. 6B.

The packet formatter 306 removes the main service data place holders and the RS parity place holders that were allocated for the deinterleaving process from the deinterleaved data being inputted. Then, the packet formatter 306 groups the remaining portion and replaces the 4-byte MPEG header place holder with an MPEG header having a null packet PID (or an unused PID from the main service data packet). Also, when the group formatter 304 inserts known data place holders, the packet formatter 306 may insert actual known data in the known data place holders, or may directly output the known data place holders without any modification in order to make replacement insertion in a later process. Thereafter, the packet formatter 306 identifies the data within the packet-formatted data group, as described above, as a 188-byte unit mobile service data packet (i.e., MPEG TS packet), which is then provided to the packet multiplexer 240.

The packet multiplexer 240 multiplexes the mobile service data packet outputted from the pre-processor 230 and the main service data packet outputted from the packet jitter mitigator 220 in accordance with a pre-defined multiplexing method. Then, the packet multiplexer 240 outputs the multiplexed data packets to the data randomizer 251 of the post-processor 250. Herein, the multiplexing method may vary in accordance with various variables of the system design. One of the multiplexing methods of the packet formatter 240 consists of providing a burst section along a time axis, and, then, transmitting a plurality of data groups during a burst-on section within the burst section, and transmitting only the main service data during the burst-off section within the burst section. Herein, the burst section indicates the section starting from the beginning of the current burst until the beginning of the next burst.

At this point, the main service data may be transmitted during the burst-on section. The packet multiplexer 240 refers to the transmission parameter, such as information on the burst size or the burst period, so as to be informed of the number of data groups and the period of the data groups included in a single burst. Herein, the mobile service data and the main service data may co-exist in the burst-on section, and only the main service data may exist in the burst-off section. Therefore, a main data service section transmitting the main service data may exist in both burst-on and burst-off sections. At this point, the main data service section within the burst-on section and the number of main data service packets included in the burst-off section may either be different from one another or be the same.

When the mobile service data are transmitted in a burst structure, in the receiving system receiving only the mobile service data turns the power on only during the burst section, thereby receiving the corresponding data. Alternatively, in the section transmitting only the main service data, the power is turned off so that the main service data are not received in this section. Thus, the power consumption of the receiving system may be reduced.

Detailed Embodiments of the RS Frame Structure and Packet Multiplexing

Hereinafter, detailed embodiments of the pre-processor 230 and the packet multiplexer 240 will now be described. According to an embodiment of the present invention, the N value corresponding to the length of a row, which is included in the RS frame that is configured by the RS frame encoder 302, is set to 538. Accordingly, the RS frame encoder 302 receives 538 transport stream (TS) packets so as to configure a first RS frame having the size of 538*187 bytes. Thereafter, as described above, the first RS frame is processed with a (235,187)-RS encoding process so as to configure a second RS frame having the size of 538*235 bytes. Finally, the second RS frame is processed with generating a 16-bit checksum so as to configure a third RS frame having the sizes of 540*235.

Meanwhile, as shown in FIG. 6A, the sum of the number of bytes of regions A1 to A5 of region A, in which ½-rate encoded mobile service data are to be inserted, among the plurality of regions within the data group is equal to 13024 bytes (=2428+2580+2772+2472+2772 bytes). Herein, the number of byte prior to performing the ½-rate encoding process is equal to 6512 (=13024/2). On the other hand, the sum of the number of bytes of regions B1 and B2 of region B, in which ¼-rate encoded mobile service data are to be inserted, among the plurality of regions within the data group is equal to 2280 bytes (=930+1350 bytes). Herein, the number of byte prior to performing the ¼-rate encoding process is equal to 570 (=2280/4).

In other words, when 7082 bytes of mobile service data are inputted to the block processor 303, 6512 byte are expanded to 13024 bytes by being ½-rate encoded, and 570 bytes are expanded to 2280 bytes by being ¼-rate encoded. Thereafter, the block processor 303 inserts the mobile service data expanded to 13024 bytes in regions A1 to A5 of region A and, also, inserts the mobile service data expanded to 2280 bytes in regions B1 and B2 of region B. Herein, the 7082 bytes of mobile service data being inputted to the block processor 303 may be divided into an output of the RS frame encoder 302 and signaling information. In the present invention, among the 7082 bytes of mobile service data, 7050 bytes correspond to the output of the RS frame encoder 302, and the remaining 32 bytes correspond to the signaling information data. Then, ½-rate encoding or ¼-rate encoding is performed on the corresponding data bytes.

Meanwhile, a RS frame being processed with RS encoding and CRC encoding from the RS frame encoder 302 is configured of 540*235 bytes, in other words, 126900 bytes. The 126900 bytes are divided by 7050-byte units along the time axis, so as to produce 18 7050-byte units. Thereafter, a 32-byte unit of signaling information data is added to the 7050-byte unit mobile service data being outputted from the RS frame encoder 302. Subsequently, the RS frame encoder 302 performs ½-rate encoding or ¼-rate encoding on the corresponding data bytes, which are then outputted to the group formatter 304. Accordingly, the group formatter 304 inserts the ½-rate encoded data in region A and the ¼-rate encoded data in region B.

The process of deciding an N value that is required for configuring the RS frame from the RS frame encoder 302 will now be described in detail. More specifically, the size of the final RS frame (i.e., the third RS frame), which is RS encoded and CRC encoded from the RS frame encoder 302, which corresponds to (N+2)*235 bytes should be allocated to X number of groups, wherein X is an integer. Herein, in a single data group, 7050 data bytes prior to being encoded are allocated. Therefore, if the (N+2)*235 bytes are set to be the exact multiple of 7050(=30*235), the output data of the RS frame encoder 302 may be efficiently allocated to the data group. According to an embodiment of the present invention, the value of N is decided so that (N+2) becomes a multiple of 30. For example, in the present invention, N is equal to 538, and (N+2)(=540) divided by 30 is equal to 18. This indicates that the mobile service data within one RS frame are processed with either ½-rate encoding or ¼-rate encoding. The encoded mobile service data are then allocated to 18 data groups.

Figure 7:
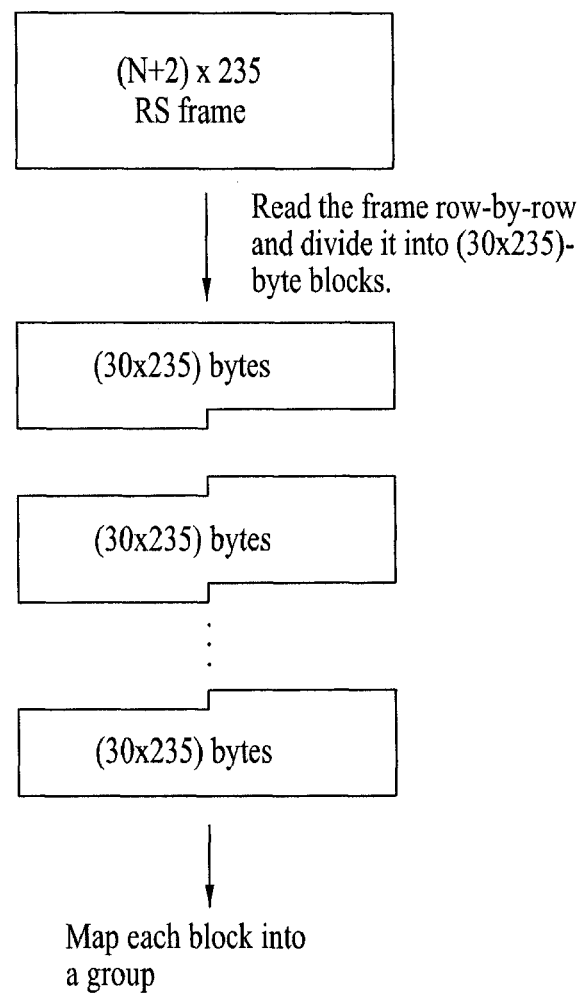
FIG. 7 illustrates a process of dividing a RS frame for configuring a data group according to the present invention.

FIG. 7 illustrates a process of dividing the RS frame according to the present invention. More specifically, the RS frame having the size of (N+2)*235 is divided into 30*235 byte blocks. Then, the divided blocks are mapped to a single group. In other words, the data of a block having the size of 30*235 bytes are processed with one of a ½-rate encoding process and a ¼-rate encoding process and are, then, inserted in a data group. Thereafter, the data group having corresponding data and place holders inserted in each hierarchical region divided by the group formatter 304 passes through the data deinterleaver 305 and the packet formatter 306 so as to be inputted to the packet multiplexer 240.

Figure 8:
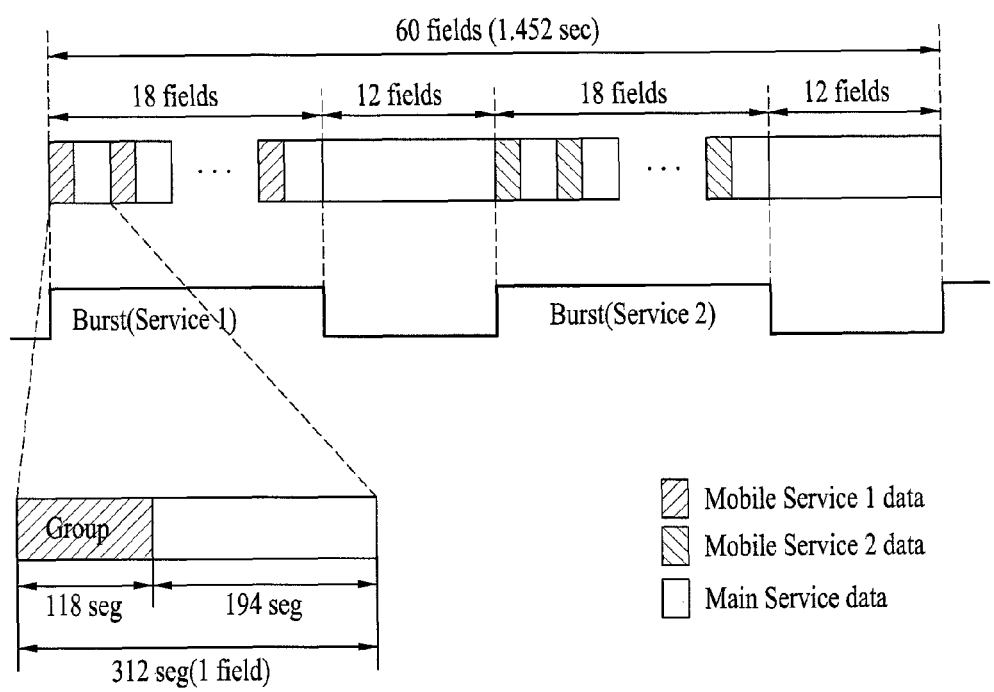
FIG. 8 illustrates exemplary operations of a packet multiplexer for transmitting the data group according to the present invention.

FIG. 8 illustrates exemplary operations of a packet multiplexer for transmitting the data group according to the present invention. More specifically, the packet multiplexer 240 multiplexes a field including a data group, in which the mobile service data and main service data are mixed with one another, and a field including only the main service data. Thereafter, the packet multiplexer 240 outputs the multiplexed fields to the data randomizer 251. At this point, in order to transmit the RS frame having the size of 540*235 bytes, 18 data groups should be transmitted. Herein, each data group includes field synchronization data, as shown in FIG. 6A. Therefore, the 18 data groups are transmitted during 18 field sections, and the section during which the 18 data groups are being transmitted corresponds to the burst-on section.

In each field within the burst-on section, a data group including field synchronization data is multiplexed with main service data, which are then outputted. For example, in the embodiment of the present invention, in each field within the burst-on section, a data group having the size of 118 segments is multiplexed with a set of main service data having the size of 194 segments. Referring to FIG. 8, during the burst-on section (i.e., during the 18 field sections), a field including 18 data groups is transmitted. Then, during the burst-off section that follows (i.e., during the 12 field sections), a field consisting only of the main service data is transmitted. Subsequently, during a subsequent burst-on section, 18 fields including 18 data groups are transmitted. And, during the following burst-off section, 12 fields consisting only of the main service data are transmitted.

Furthermore, in the present invention, the same type of data service may be provided in the first burst-on section including the first 18 data groups and in the second burst-on section including the next 18 data groups. Alternatively, different types of data service may be provided in each burst-on section. For example, when it is assumed that different data service types are provided to each of the first burst-on section and the second burst-on section, and that the receiving system wishes to receive only one type of data service, the receiving system turns the power on only during the corresponding burst-on section including the desired data service type so as to receive the corresponding 18 data fields. Then, the receiving system turns the power off during the remaining 42 field sections so as to prevent other data service types from being received. Thus, the amount of power consumption of the receiving system may be reduced. In addition, the receiving system according to the present invention is advantageous in that one RS frame may be configured from the 18 data groups that are received during a single burst-on section.

According to the present invention, the number of data groups included in a burst-on section may vary based upon the size of the RS frame, and the size of the RS frame varies in accordance with the value N. More specifically, by adjusting the value N, the number of data groups within the burst section may be adjusted. Herein, in an example of the present invention, the (235,187)-RS encoding process adjusts the value N during a fixed state. Furthermore, the size of the mobile service data that can be inserted in the data group may vary based upon the sizes of the trellis initialization data or known data, the MPEG header, and the RS parity, which are inserted in the corresponding data group.

Meanwhile, since a data group including mobile service data in-between the data bytes of the main service data during the packet multiplexing process, the shifting of the chronological position (or place) of the main service data packet becomes relative. Also, a system object decoder (i.e., MPEG decoder) for processing the main service data of the receiving system, receives and decodes only the main service data and recognizes the mobile service data packet as a null data packet. Therefore, when the system object decoder of the receiving system receives a main service data packet that is multiplexed with the data group, a packet jitter occurs.

At this point, since a multiple-level buffer for the video data exists in the system object decoder and the size of the buffer is relatively large, the packet jitter generated from the packet multiplexer 240 does not cause any serious problem in case of the video data. However, since the size of the buffer for the audio data is relatively small, the packet jitter may cause considerable problem. More specifically, due to the packet jitter, an overflow or underflow may occur in the buffer for the main service data of the receiving system (e.g., the buffer for the audio data). Therefore, the packet jitter mitigator 220 re-adjusts the relative position of the main service data packet so that the overflow or underflow does not occur in the system object decoder.

In the present invention, examples of repositioning places for the audio data packets within the main service data in order to minimize the influence on the operations of the audio buffer will be described in detail. The packet jitter mitigator 220 repositions the audio data packets in the main service data section so that the audio data packets of the main service data can be as equally and uniformly aligned and positioned as possible. The standard for repositioning the audio data packets in the main service data performed by the packet jitter mitigator 220 will now be described. Herein, it is assumed that the packet jitter mitigator 220 knows the same multiplexing information as that of the packet multiplexer 240, which is placed further behind the packet jitter mitigator 220.

Firstly, if one audio data packet exists in the main service data section (e.g., the main service data section positioned between two data groups) within the burst-on section, the audio data packet is positioned at the very beginning of the main service data section. Alternatively, if two audio data packets exist in the corresponding data section, one audio data packet is positioned at the very beginning and the other audio data packet is positioned at the very end of the main service data section. Further, if more than three audio data packets exist, one audio data packet is positioned at the very beginning of the main service data section, another is positioned at the very end of the main service data section, and the remaining audio data packets are equally positioned between the first and last audio data packets. Secondly, during the main service data section placed immediately before the beginning of a burst-on section (i.e., during a burst-off section), the audio data packet is placed at the very end of the corresponding section.

Thirdly, during a main service data section within the burst-off section after the burst-on section, the audio data packet is positioned at the very end of the main service data section. Finally, the data packets other than audio data packets are positioned in accordance with the inputted order in vacant spaces (i.e., spaces that are not designated for the audio data packets). Meanwhile, when the positions of the main service data packets are relatively re-adjusted, associated program clock reference (PCR) values may also be modified accordingly. The PCR value corresponds to a time reference value for synchronizing the time of the MPEG decoder. Herein, the PCR value is inserted in a specific region of a TS packet and then transmitted.

In the example of the present invention, the packet jitter mitigator 220 also performs the operation of modifying the PCR value. The output of the packet jitter mitigator 220 is inputted to the packet multiplexer 240. As described above, the packet multiplexer 240 multiplexes the main service data packet outputted from the packet jitter mitigator 220 with the mobile service data packet outputted from the pre-processor 230 into a burst structure in accordance with a pre-determined multiplexing rule. Then, the packet multiplexer 240 outputs the multiplexed data packets to the data randomizer 251 of the post-processor 250.

If the inputted data correspond to the main service data packet, the data randomizer 251 performs the same randomizing process as that of the conventional randomizer. More specifically, the synchronization byte within the main service data packet is deleted. Then, the remaining 187 data bytes are randomized by using a pseudo random byte generated from the data randomizer 251. Thereafter, the randomized data are outputted to the RS encoder/non-systematic RS encoder 252.

On the other hand, if the inputted data correspond to the mobile service data packet, the data randomizer 251 may randomize only a portion of the data packet. For example, if it is assumed that a randomizing process has already been performed in advance on the mobile service data packet by the pre-processor 230, the data randomizer 251 deletes the synchronization byte from the 4-byte MPEG header included in the mobile service data packet and, then, performs the randomizing process only on the remaining 3 data bytes of the MPEG header. Thereafter, the randomized data bytes are outputted to the RS encoder/non-systematic RS encoder 252. More specifically, the randomizing process is not performed on the remaining portion of the mobile service data excluding the MPEG header. In other words, the remaining portion of the mobile service data packet is directly outputted to the RS encoder/non-systematic RS encoder 252 without being randomized. Also, the data randomizer 251 may or may not perform a randomizing process on the known data (or known data place holders) and the initialization data place holders included in the mobile service data packet.

The RS encoder/non-systematic RS encoder 252 performs an RS encoding process on the data being randomized by the data randomizer 251 or on the data bypassing the data randomizer 251, so as to add 20 bytes of RS parity data. Thereafter, the processed data are outputted to the data interleaver 253. Herein, if the inputted data correspond to the main service data packet, the RS encoder/non-systematic RS encoder 252 performs the same systematic RS encoding process as that of the conventional broadcasting system, thereby adding the 20-byte RS parity data at the end of the 187-byte data. Alternatively, if the inputted data correspond to the mobile service data packet, the RS encoder/non-systematic RS encoder 252 performs a non-systematic RS encoding process. At this point, the 20-byte RS parity data obtained from the non-systematic RS encoding process are inserted in a pre-decided parity byte place within the mobile service data packet.

The data interleaver 253 corresponds to a byte unit convolutional interleaver. The output of the data interleaver 253 is inputted to the parity replacer 254 and to the non-systematic RS encoder 255. Meanwhile, a process of initializing a memory within the trellis encoding module 256 is primarily required in order to decide the output data of the trellis encoding module 256, which is located after the parity replacer 254, as the known data pre-defined according to an agreement between the receiving system and the transmitting system. More specifically, the memory of the trellis encoding module 256 should first be initialized before the received known data sequence is trellis-encoded. At this point, the beginning portion of the known data sequence that is received corresponds to the initialization data place holder and not to the actual known data. Herein, the initialization data place holder has been included in the data by the group formatter within the pre-processor 230 in an earlier process. Therefore, the process of generating initialization data and replacing the initialization data place holder of the corresponding memory with the generated initialization data are required to be performed immediately before the inputted known data sequence is trellis-encoded.

Additionally, a value of the trellis memory initialization data is decided and generated based upon a memory status of the trellis encoding module 256. Further, due to the newly replaced initialization data, a process of newly calculating the RS parity and replacing the RS parity, which is outputted from the data interleaver 253, with the newly calculated RS parity is required. Therefore, the non-systematic RS encoder 255 receives the mobile service data packet including the initialization data place holders, which are to be replaced with the actual initialization data, from the data interleaver 253 and also receives the initialization data from the trellis encoding module 256.

Among the inputted mobile service data packet, the initialization data place holders are replaced with the initialization data, and the RS parity data that are added to the mobile service data packet are removed and processed with non-systematic RS encoding. Thereafter, the new RS parity obtained by performing the non-systematic RS encoding process is outputted to the parity replacer 255. Accordingly, the parity replacer 255 selects the output of the data interleaver 253 as the data within the mobile service data packet, and the parity replacer 255 selects the output of the non-systematic RS encoder 255 as the RS parity. The selected data are then outputted to the trellis encoding module 256.

Meanwhile, if the main service data packet is inputted or if the mobile service data packet, which does not include any initialization data place holders that are to be replaced, is inputted, the parity replacer 254 selects the data and RS parity that are outputted from the data interleaver 253. Then, the parity replacer 254 directly outputs the selected data to the trellis encoding module 256 without any modification. The trellis encoding module 256 converts the byte-unit data to symbol units and performs a 12-way interleaving process so as to trellis-encode the received data. Thereafter, the processed data are outputted to the synchronization multiplexer 260.

The synchronization multiplexer 260 inserts a field synchronization signal and a segment synchronization signal to the data outputted from the trellis encoding module 256 and, then, outputs the processed data to the pilot inserter 271 of the transmission unit 270. Herein, the data having a pilot inserted therein by the pilot inserter 271 are modulated by the modulator 272 in accordance with a pre-determined modulating method (e.g., a VSB method). Thereafter, the modulated data are transmitted to each receiving system though the radio frequency (RF) up-converter 273.

Block Processor

Figure 9:
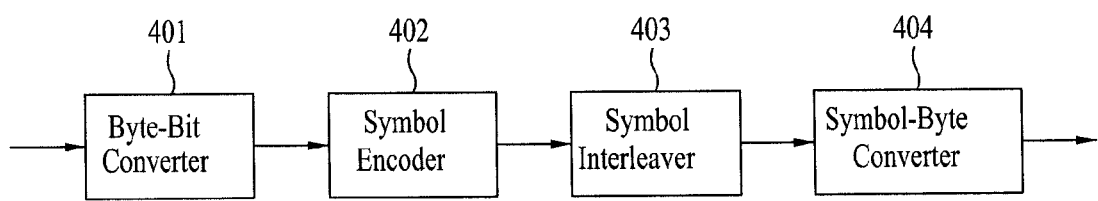
FIG. 9 illustrates a block diagram showing a structure of a block processor according to the present invention.

FIG. 9 illustrates a block diagram showing a structure of a block processor according to the present invention. Herein, the block processor includes a byte-bit converter 401, a symbol encoder 402, a symbol interleaver 403, and a symbol-byte converter 404. The byte-bit converter 401 divides the mobile service data bytes that are inputted from the RS frame encoder 112 into bits, which are then outputted to the symbol encoder 402. The byte-bit converter 401 may also receive signaling information including transmission parameters. The signaling information data bytes are also divided into bits so as to be outputted to the symbol encoder 402. Herein, the signaling information including transmission parameters may be processed with the same data processing step as that of the mobile service data. More specifically, the signaling information may be inputted to the block processor 303 by passing through the data randomizer 301 and the RS frame encoder 302. Alternatively, the signaling information may also be directly outputted to the block processor 303 without passing though the data randomizer 301 and the RS frame encoder 302.

The symbol encoder 402 corresponds to a G/H-rate encoder encoding the inputted data from G bits to H bits and outputting the data encoded at the coding rate of G/H. According to the embodiment of the present invention, it is assumed that the symbol encoder 402 performs either a coding rate of ½ (also referred to as a ½-rate encoding process) or an encoding process at a coding rate of ¼ (also referred to as a ¼-rate encoding process). The symbol encoder 402 performs one of ½-rate encoding and ¼-rate encoding on the inputted mobile service data and signaling information. Thereafter, the signaling information is also recognized as the mobile service data and processed accordingly.

In case of performing the ½-rate coding process, the symbol encoder 402 receives 1 bit and encodes the received 1 bit to 2 bits (i.e., 1 symbol). Then, the symbol encoder 402 outputs the processed 2 bits (or 1 symbol). On the other hand, in case of performing the ¼-rate encoding process, the symbol encoder 402 receives 1 bit and encodes the received 1 bit to 4 bits (i.e., 2 symbols). Then, the symbol encoder 402 outputs the processed 4 bits (or 2 symbols).

Figure 10:
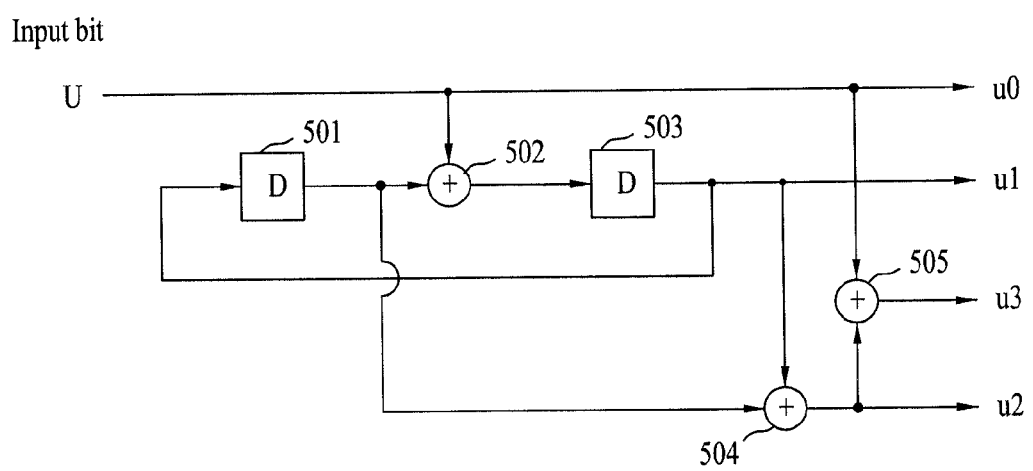
FIG. 10 illustrates a detailed block diagram of a symbol encoder shown in FIG. 9.

FIG. 10 illustrates a detailed block diagram of the symbol encoder 402 shown in FIG. 9. The symbol encoder 402 includes two delay units 501 and 503 and three adders 502, 504, and 505. Herein, the symbol encoder 402 encodes an input data bit U and outputs the coded bit U to 4 bits (u0 to u4). At this point, the data bit U is directly outputted as uppermost bit u0 and simultaneously encoded as lower bit u1u2u3 and then outputted. More specifically, the input data bit U is directly outputted as the uppermost bit u0 and simultaneously outputted to the first and third adders 502 and 505. The first adder 502 adds the input data bit U and the output bit of the first delay unit 501 and, then, outputs the added bit to the second delay unit 503. Then, the data bit delayed by a predetermined time (e.g., by 1 clock) in the second delay unit 503 is outputted as lower bit u1 and simultaneously fed-back to the first delay unit 501. The first delay unit 501 delays the data bit fed-back from the second delay unit 503 by a pre-determined time (e.g., by 1 clock). Then, the first delay unit 501 outputs the delayed data bit to the first adder 502 and the second adder 504. The second adder 504 adds the data bits outputted from the first and second delay units 501 and 503 as a lower bit u2. The third adder 505 adds the input data bit U and the output of the second delay unit 503 and outputs the added data bit as a lower bit u3.

At this point, if the input data bit U corresponds to data encoded at a ½-coding rate, the symbol encoder 402 configures a symbol with u1u0 bits from the 4 output bits u0u1u2u3. Then, the symbol encoder 402 outputs the newly configured symbol. Alternatively, if the input data bit U corresponds to data encoded at a ¼-coding rate, the symbol encoder 402 configures and outputs a symbol with bits u1u0 and, then, configures and outputs another symbol with bits u2u3. According to another embodiment of the present invention, if the input data bit U corresponds to data encoded at a ¼-coding rate, the symbol encoder 402 may also configure and output a symbol with bits u1u0, and then repeat the process once again and output the corresponding bits. According to yet another embodiment of the present invention, the symbol encoder outputs all four output bits U u0u1u2u3. Then, when using the ½-coding rate, the symbol interleaver 403 located behind the symbol encoder 402 selects only the symbol configured of bits u1u0 from the four output bits u0u1u2u3. Alternatively, when using the ¼-coding rate, the symbol interleaver 403 may select the symbol configured of bits u1u0 and then select another symbol configured of bits u2u3. According to another embodiment, when using the ¼-coding rate, the symbol interleaver 403 may repeatedly select the symbol configured of bits u1u0.

The output of the symbol encoder 402 is inputted to the symbol interleaver 403. Then, the symbol interleaver 403 performs block interleaving in symbol units on the data outputted from the symbol encoder 402. Any interleaver performing structural rearrangement (or realignment) may be applied as the symbol interleaver 403 of the block processor. However, in the present invention, a variable length symbol interleaver that can be applied even when a plurality of lengths is provided for the symbol, so that its order may be rearranged, may also be used.

Figure 11:
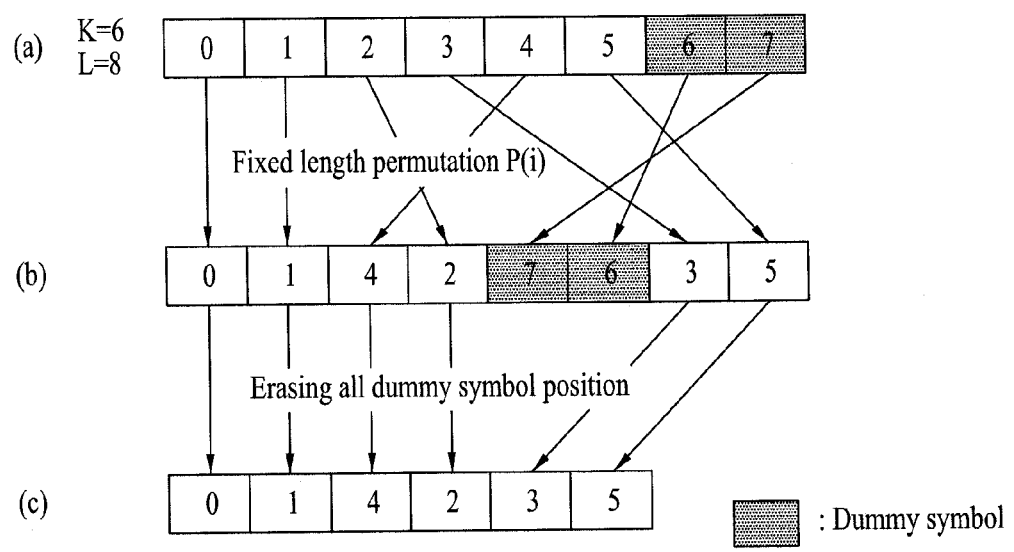
FIG. 11(a) to FIG. 11(c) illustrate a variable length interleaving process of a symbol interleaver shown in FIG. 9.

FIG. 11 illustrates a symbol interleaver according to an embodiment of the present invention. Herein, the symbol interleaver according to the embodiment of the present invention corresponds to a variable length symbol interleaver that may be applied even when a plurality of lengths is provided for the symbol, so that its order may be rearranged. Particularly, FIG. 11 illustrates an example of the symbol interleaver when K=6 and L=8. Herein, K indicates a number of symbols that are outputted for symbol interleaving from the symbol encoder 402. And, L represents a number of symbols that are actually interleaved by the symbol interleaver 403.

In the present invention, the symbol intereleaver 403 should satisfy the conditions of L=$2^n$ (wherein n is an integer) and of L≧K. If there is a difference in value between K and L, (L−K) number of null (or dummy) symbols is added, thereby creating an interleaving pattern. Therefore, K becomes a block size of the actual symbols that are inputted to the symbol interleaver 403 in order to be interleaved. L becomes an interleaving unit when the interleaving process is performed by an interleaving pattern created from the symbol interleaver 403. The example of what is described above is illustrated in FIG. 11.

More specifically, FIG. 11(*a*) to FIG. 11(*c*) illustrate a variable length interleaving process of a symbol interleaver shown in FIG. 9. The number of symbols outputted from the symbol encoder 402 in order to be interleaved is equal to 6 (i.e., K=6). In other words, 6 symbols are outputted from the symbol encoder 402 in order to be interleaved. And, the actual interleaving unit (L) is equal to 8 symbols. Therefore, as shown in FIG. 11(*a*), 2 symbols are added to the null (or dummy) symbol, thereby creating the interleaving pattern. Equation 2 shown below described the process of sequentially receiving K number of symbols, the order of which is to be rearranged, and obtaining an L value satisfying the conditions of L=$2^n$ (wherein n is an integer) and of L≧K, thereby creating the interleaving so as to realign (or rearrange) the symbol order.

In relation to all places, wherein 0≦i≦L−1, $$P(i)=\{S\times i\times(i+1)/2\} \bmod L \qquad \text{Equation 2}$$

Herein, L≧K, L=$2^n$, and n and S are integers. Referring to FIG. 11, it is assumed that S is equal to 89, and that L is equal to 8, and FIG. 11 illustrates the created interleaving pattern and an example of the interleaving process. As shown in FIG. 11(*b*), the order of K number of input symbols and (L−K) number of null symbols is rearranged by using the above-mentioned Equation 2. Then, as shown in FIG. 11(*c*), the null byte places are removed, so as to rearrange the order, by using Equation 3 shown below. Thereafter, the symbol that is interleaved by the rearranged order is then outputted to the symbol-byte converter.

$$\text{if } P(i)>K-1, \text{ then } P(i) \text{ place is removed and rearranged} \qquad \text{Equation 3}$$

Subsequently, the symbol-byte converter 404 converts to bytes the mobile service data symbols, having the rearranging of the symbol order completed and then outputted in accordance with the rearranged order, and thereafter outputs the converted bytes to the group formatter 304.

Figure 12A:
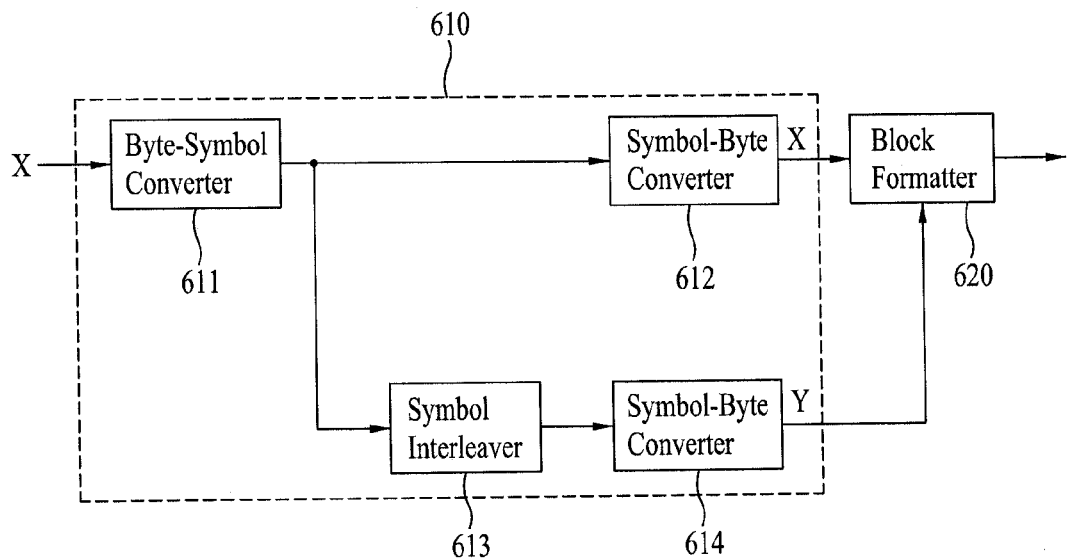
FIG. 12A and FIG. 12B illustrate block diagrams showing structures of a block processor according to another embodiment of the present invention.

FIG. 12A illustrates a block diagram showing the structure of a block processor according to another embodiment of the present invention. Herein, the block processor includes an interleaving unit 610 and a block formatter 620. The interleaving unit 610 may include a byte-symbol converter 611, a symbol-byte converter 612, a symbol interleaver 613, and a symbol-byte converter 614. Herein, the symbol interleaver 613 may also be referred to as a block interleaver.

The byte-symbol converter 611 of the interleaving unit 610 converts the mobile service data X outputted in byte units from the RS frame encoder 302 to symbol units. Then, the byte-symbol converter 611 outputs the converted mobile service data symbols to the symbol-byte converter 612 and the symbol interleaver 613. More specifically, the byte-symbol converter 611 converts each 2 bits of the inputted mobile service data byte (=8 bits) to 1 symbol and outputs the converted symbols. This is because the input data of the trellis encoding module 256 consist of symbol units configured of 2 bits. The relationship between the block processor 303 and the trellis encoding module 256 will be described in detail in a later process. At this point, the byte-symbol converter 611 may also receive signaling information including transmission parameters. Furthermore, the signaling information bytes may also be divided into symbol units and then outputted to the symbol-byte converter 612 and the symbol interleaver 613.

Figure 12B:
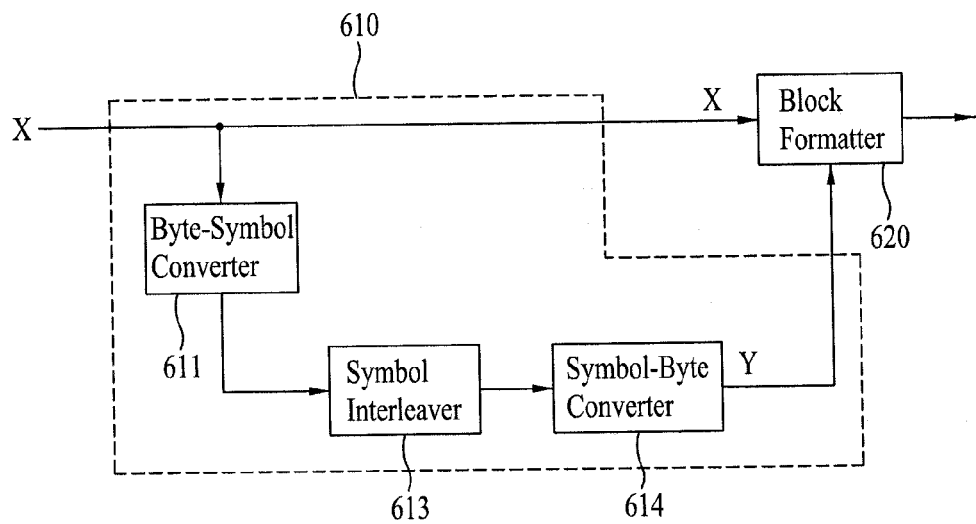

The symbol-byte converter 612 groups 4 symbols outputted from the byte-symbol converter 611 so as to configure a byte. Thereafter, the converted data bytes are outputted to the block formatter 620. Herein, each of the symbol-byte converter 612 and the byte-symbol converter 611 respectively performs an inverse process on one another. Therefore, the yield of these two blocks is offset. Accordingly, as shown in FIG. 12B, the input data X bypass the byte-symbol converter 611 and the symbol-byte converter 612 and are directly inputted to the block formatter 620. More specifically, the interleaving unit 610 of FIG. 12B has a structure equivalent to that of the interleaving unit shown in FIG. 12A. Therefore, the same reference numerals will be used in FIG. 12A and FIG. 12B.

The symbol interleaver 613 performs block interleaving in symbol units on the data that are outputted from the byte-symbol converter 611. Subsequently, the symbol interleaver 613 outputs the interleaved data to the symbol-byte converter 614. Herein, any type of interleaver that can rearrange the structural order may be used as the symbol interleaver 613 of the present invention. In the example given in the present invention, a variable length interleaver that may be applied for symbols having a wide range of lengths, the order of which is to be rearranged. For example, the symbol interleaver of FIG. 11 may also be used in the block processor shown in FIG. 12A and FIG. 12B.

Figure 13:
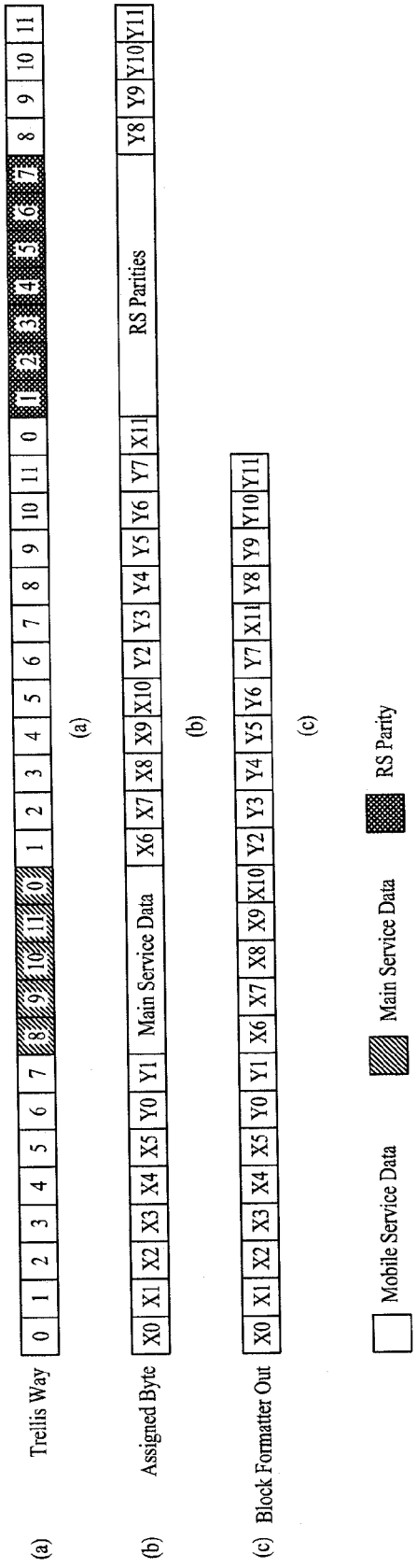
FIG. 13(a) to FIG. 13(c) illustrate block encoding and trellis encoding processes according to the present invention.

The symbol-byte converter 614 outputs the symbols having the rearranging of the symbol order completed, in accordance with the rearranged order. Thereafter, the symbols are grouped to be configured in byte units, which are then outputted to the block formatter 620. More specifically, the symbol-byte converter 614 groups 4 symbols outputted from the symbol interleaver 613 so as to configure a data byte. As shown in FIG. 13, the block formatter 620 performs the process of aligning the output of each symbol-byte converter 612 and 614 within the block in accordance with a set standard. Herein, the block formatter 620 operates in association with the trellis encoding module 256.

More specifically, the block formatter 620 decides the output order of the mobile service data outputted from each symbol-byte converter 612 and 614 while taking into consideration the place (or order) of the data excluding the mobile service data that are being inputted, wherein the mobile service data include main service data, known data, RS parity data, and MPEG header data.

Figure 14:
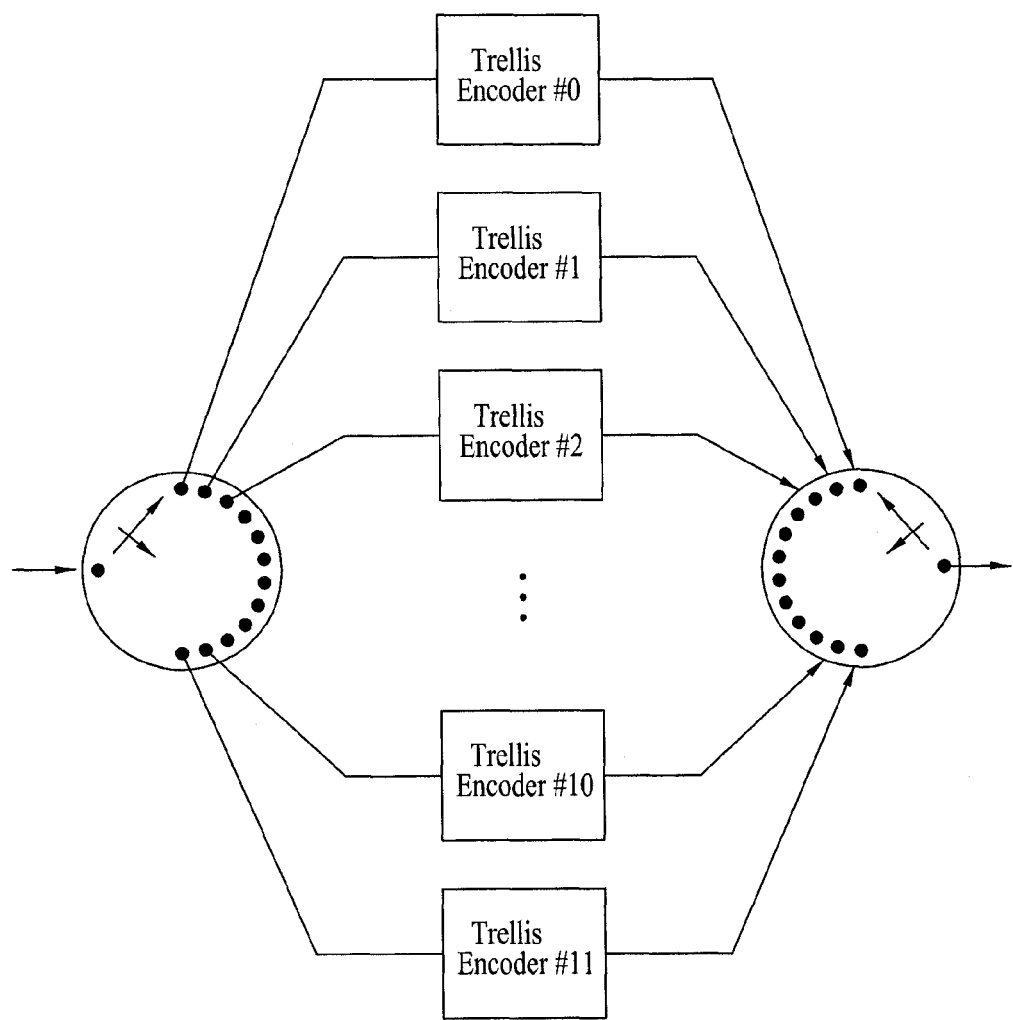
FIG. 14 illustrates a block diagram showing a trellis encoding module according to the present invention.

According to the embodiment of the present invention, the trellis encoding module 256 is provided with 12 trellis encoders. FIG. 14 illustrates a block diagram showing the trellis encoding module 256 according to the present invention. In the example shown in FIG. 14, 12 identical trellis encoders are combined to the interleaver in order to disperse noise. Herein, each trellis encoder may be provided with a pre-coder.

Figure 15A:
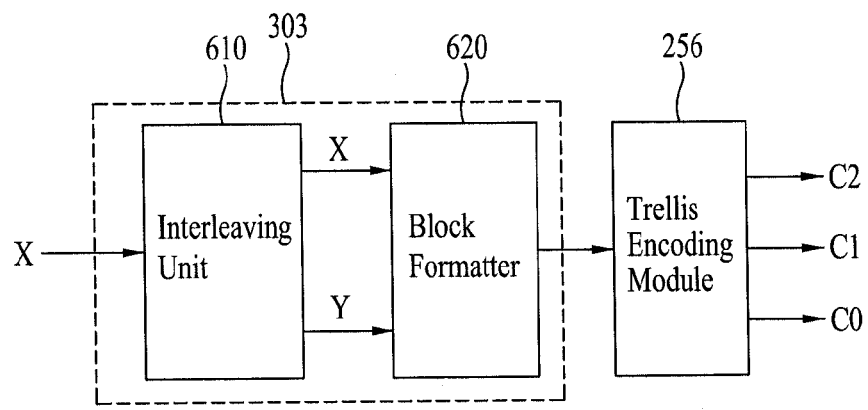
FIG. 15A and FIG. 15B a block processor and a trellis encoding module connected to one another according to the present invention.
Figure 15B:
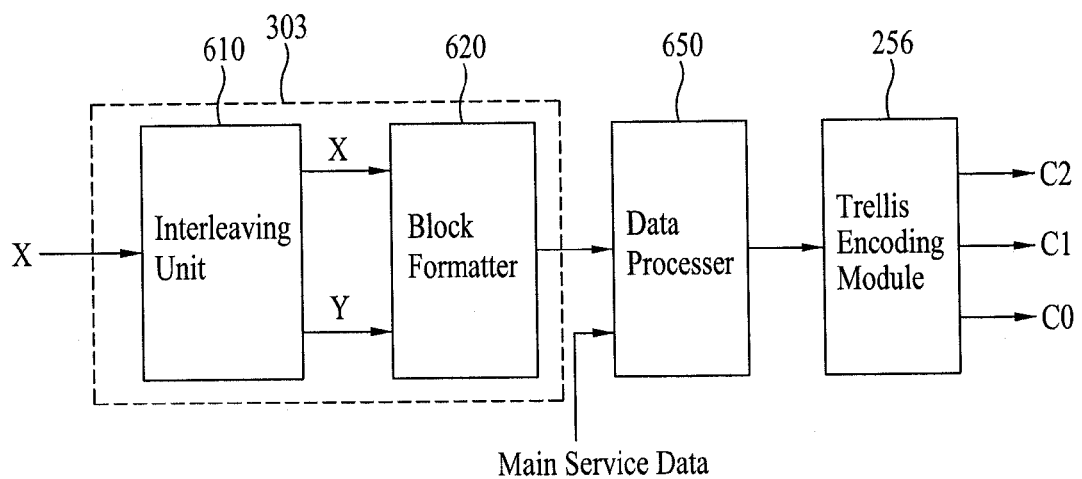

FIG. 15A illustrates the block processor 303 being concatenated with the trellis encoding module 256. In the transmitting system, a plurality of blocks actually exists between the pre-processor 230 including the block processor 303 and the trellis encoding module 256, as shown in FIG. 3. Conversely, the receiving system considers the pre-processor 230 to be concatenated with the trellis encoding module 256, thereby performing the decoding process accordingly. However, the data excluding the mobile service data that are being inputted to the trellis encoding module 256, wherein the mobile service data include main service data, known data, RS parity data, and MPEG header data, correspond to data that are added to the blocks existing between the block processor 303 and the trellis encoding module 256. FIG. 15B illustrates an example of a data processor 650 being positioned between the block processor 303 and the trellis encoding module 256, while taking the above-described instance into consideration.

Herein, when the interleaving unit 610 of the block processor 303 performs a ½-rate encoding process, the interleaving unit 610 may be configured as shown in FIG. 12A (or FIG. 12B). Referring to FIG. 3, for example, the data processor 650 may include a group formatter 304, a data deinterleaver 305, a packet formatter 306, a packet multiplexer 240, and a post-processor 250, wherein the post-processor 250 includes a data randomizer 251, a RS encoder/non-systematic RS encoder 252, a data interleaver 253, a parity replacer 254, and a non-systematic RS encoder 255.

At this point, the trellis encoding module 256 symbolizes the data that are being inputted so as to divide the symbolized data and to send the divided data to each trellis encoder in accordance with a pre-defined method. Herein, one byte is converted into 4 symbols, each being configured of 2 bits. Also, the symbols created from the single data byte are all transmitted to the same trellis encoder. Accordingly, each trellis encoder pre-codes an upper bit of the input symbol, which is then outputted as the uppermost output bit C2. Alternatively, each trellis encoder trellis-encodes a lower bit of the input symbol, which is then outputted as two output bits C1 and C0. The block formatter 620 is controlled so that the data byte outputted from each symbol-byte converter can be transmitted to different trellis encoders.

Hereinafter, the operation of the block formatter 620 will now be described in detail with reference to FIG. 9 to FIG. 12. Referring to FIG. 12A, for example, the data byte outputted from the symbol-byte converter 612 and the data byte outputted from the symbol-byte converter 614 are inputted to different trellis encoders of the trellis encoding module 256 in accordance with the control of the block formatter 620. Hereinafter, the data byte outputted from the symbol-byte converter 612 will be referred to as X, and the data byte outputted from the symbol-byte converter 614 will be referred to as Y, for simplicity. Referring to FIG. 13(*a*), each number (i.e., 0 to 11) indicates the first to twelfth trellis encoders of the trellis encoding module 256, respectively.

In addition, the output order of both symbol-byte converters are arranged (or aligned) so that the data bytes outputted from the symbol-byte converter 612 are respectively inputted to the $0^{th}$ to $5^{th}$ trellis encoders (0 to 5) of the trellis encoding module 256, and that the data bytes outputted from the symbol-byte converter 614 are respectively inputted to the $6^{th}$ to $11^{th}$ trellis encoders (6 to 11) of the trellis encoding module 256. Herein, the trellis encoders having the data bytes outputted from the symbol-byte converter 612 allocated therein, and the trellis encoders having the data bytes outputted from the symbol-byte converter 614 allocated therein are merely examples given to simplify the understanding of the present invention. Furthermore, according to an embodiment of the present invention, and assuming that the input data of the block processor 303 correspond to a block configured of 12 bytes, the symbol-byte converter 612 outputs 12 data bytes from X0 to X11, and the symbol-byte converter 614 outputs 12 data bytes from Y0 to Y11.

FIG. 13(*b*) illustrates an example of data being inputted to the trellis encoding module 256. Particularly, FIG. 13(*b*) illustrates an example of not only the mobile service data but also the main service data and RS parity data being inputted to the trellis encoding module 256, so as to be distributed to each trellis encoder. More specifically, the mobile service data outputted from the block processor 303 pass through the group formatter 304, from which the mobile service data are mixed with the main service data and RS parity data and then outputted, as shown in FIG. 13(*a*). Accordingly, each data byte is respectively inputted to the trellis encoders in accordance with the positions (or places) within the data group after being data-interleaved.

Herein, when the output data bytes X and Y of the symbol-byte converters 612 and 614 are allocated to each respective trellis encoder, the input of each trellis encoder may be configured as shown in FIG. 13(*b*). More specifically, referring to FIG. 13(*b*), the six mobile service data bytes (X0 to X5) outputted from the symbol-byte converter 612 are sequentially allocated (or distributed) to the first to sixth trellis encoders (0 to 5) of the trellis encoding module 256. Also, the 2 mobile service data bytes Y0 and Y1 outputted from the symbol-byte converter 614 are sequentially allocated to the $7^{th}$ and $8^{th}$ trellis encoders (6 and 7) of the trellis encoding module 256. Thereafter, among the 5 main service data bytes, 4 data bytes are sequentially allocated to the $9^{th}$ and $12^{th}$ trellis encoders (8 to 11) of the trellis encoding module 256. Finally, the remaining 1 byte of the main service data byte is allocated once again to the first trellis encoder (0).

It is assumed that the mobile service data, the main service data, and the RS parity data are allocated to each trellis encoder, as shown in FIG. 13(*b*). It is also assumed that, as described above, the input of the block processor 303 is configured of 12 bytes, and that 12 bytes from X0 to X11 are outputted from the symbol-byte converter 612, and that 12 bytes from Y0 to Y11 are outputted from the symbol-byte converter 614. In this case, as shown in FIG. 13(*c*), the block formatter 620 arranges the data bytes that are to be outputted from the symbol-byte converters 612 and 614 by the order of X0 to X5, Y0, Y1, X6 to X10, Y2 to Y7, X11, and Y8 to Y11. More specifically, the trellis encoder that is to perform the encoding process is decided based upon the position (or place) within the transmission frame in which each data byte is inserted. At this point, not only the mobile service data but also the main service data, the MPEG header data, and the RS parity data are also inputted to the trellis encoding module 256. Herein, it is assumed that, in order to perform the above-described operation, the block formatter 620 is informed of (or knows) the information on the data group format after the data-interleaving process.

Figure 16:
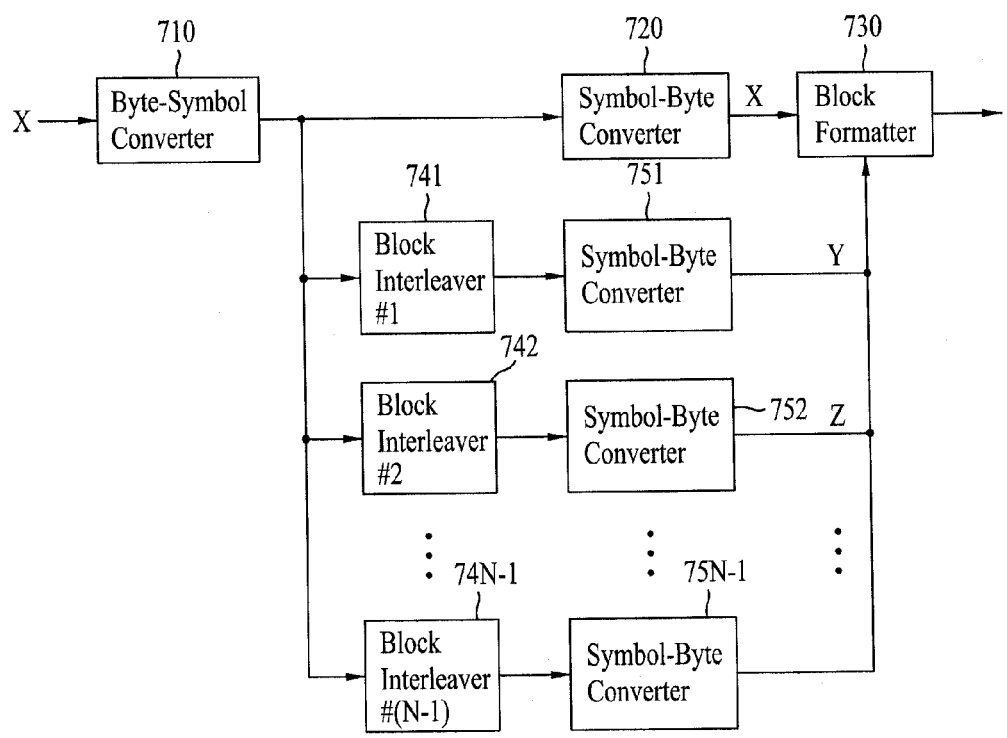
FIG. 16 illustrates a block processor according to another embodiment of the present invention.

FIG. 16 illustrates a block diagram of the block processor performing an encoding process at a coding rate of 1/N according to an embodiment of the present invention. Herein, the block processor includes (N−1) number of symbol interleavers 741 to 74N−1, which are configured in a parallel structure. More specifically, the block processor having the coding rate of 1/N consists of a total of N number of branches (or paths) including a branch (or path), which is directly transmitted to the block formatter 730. In addition, the symbol interleaver 741 to 74N−1 of each branch may each be configured of a different symbol interleaver. Furthermore, (N−1) number of symbol-byte converter 751 to 75N−1 each corresponding to each (N−1) number of symbol interleavers 741 to 74N−1 may be included at the end of each symbol interleaver, respectively. Herein, the output data of the (N−1) number of symbol-byte converter 751 to 75N−1 are also inputted to the block formatter 730.

In the example of the present invention, N is equal to or smaller than 12. If N is equal to 12, the block formatter 730 may align the output data so that the output byte of the $12^{th}$ symbol-byte converter 75N−1 is inputted to the $12^{th}$ trellis encoder. Alternatively, if N is equal to 3, the block formatter 730 may arranged the output order, so that the data bytes outputted from the symbol-byte converter 720 are inputted to the $1^{st}$ to $4^{th}$ trellis encoders of the trellis encoding module 256, and that the data bytes outputted from the symbol-byte converter 751 are inputted to the $5^{th}$ to $8^{th}$ trellis encoders, and that the data bytes outputted from the symbol-byte converter 752 are inputted to the $9^{th}$ to $12^{th}$ trellis encoders. At this point, the order of the data bytes outputted from each symbol-byte converter may vary in accordance with the position within the data group of the data other than the mobile service data, which are mixed with the mobile service data that are outputted from each symbol-byte converter.

Figure 17:
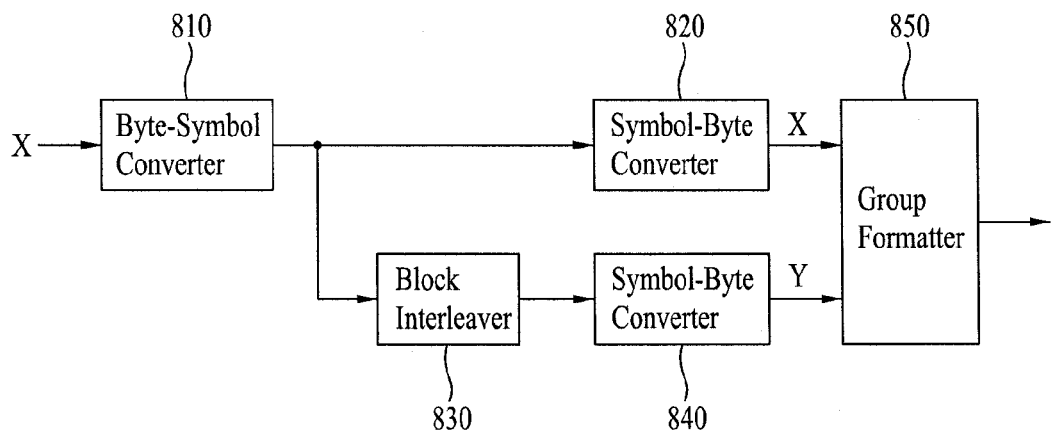
FIG. 17 illustrates a block processor according to yet another embodiment of the present invention.

FIG. 17 illustrates a detailed block diagram showing the structure of a block processor according to another embodiment of the present invention. Herein, the block formatter is removed from the block processor so that the operation of the block formatter may be performed by a group formatter. More specifically, the block processor of FIG. 17 may include a byte-symbol converter 810, symbol-byte converters 820 and 840, and a symbol interleaver 830. In this case, the output of each symbol-byte converter 820 and 840 is inputted to the group formatter 850.

Also, the block processor may obtain a desired coding rate by adding symbol interleavers and symbol-byte converters. If the system designer wishes a coding rate of 1/N, the block processor needs to be provided with a total of N number of branches (or paths) including a branch (or path), which is directly transmitted to the block formatter 850, and (N−1) number of symbol interleavers and symbol-byte converters configured in a parallel structure with (N−1) number of branches. At this point, the group formatter 850 inserts place holders ensuring the positions (or places) for the MPEG header, the non-systematic RS parity, and the main service data. And, at the same time, the group formatter 850 positions the data bytes outputted from each branch of the block processor.

The number of trellis encoders, the number of symbol-byte converters, and the number of symbol interleavers proposed in the present invention are merely exemplary. And, therefore, the corresponding numbers do not limit the spirit or scope of the present invention. It is apparent to those skilled in the art that the type and position of each data byte being allocated to each trellis encoder of the trellis encoding module 256 may vary in accordance with the data group format. Therefore, the present invention should not be understood merely by the examples given in the description set forth herein. The mobile service data that are encoded at a coding rate of 1/N and outputted from the block processor 303 are inputted to the group formatter 304. Herein, in the example of the present invention, the order of the output data outputted from the block formatter of the block processor 303 are aligned and outputted in accordance with the position of the data bytes within the data group.

Signaling Information Processing

The transmitter 200 according to the present invention may insert transmission parameters by using a plurality of methods and in a plurality of positions (or places), which are then transmitted to the receiving system. For simplicity, the definition of a transmission parameter that is to be transmitted from the transmitter to the receiving system will now be described. The transmission parameter includes data group information, region information within a data group, the number of RS frames configuring a super frame (i.e., a super frame size (SFS)), the number of RS parity data bytes (P) for each column within the RS frame, whether or not a checksum, which is added to determine the presence of an error in a row direction within the RS frame, has been used, the type and size of the checksum if the checksum is used (presently, 2 bytes are added to the CRC), the number of data groups configuring one RS frame—since the RS frame is transmitted to one burst section, the number of data groups configuring the one RS frame is identical to the number of data groups within one burst (i.e., burst size (BS)), a turbo code mode, and a RS code mode.

Also, the transmission parameter required for receiving a burst includes a burst period—herein, one burst period corresponds to a value obtained by counting the number of fields starting from the beginning of a current burst until the beginning of a next burst, a positioning order of the RS frames that are currently being transmitted within a super frame (i.e., a permuted frame index (PFI)) or a positioning order of groups that are currently being transmitted within a RS frame (burst) (i.e., a group index (GI)), and a burst size. Depending upon the method of managing a burst, the transmission parameter also includes the number of fields remaining until the beginning of the next burst (i.e., time to next burst (TNB)). And, by transmitting such information as the transmission parameter, each data group being transmitted to the receiving system may indicate a relative distance (or number of fields) between a current position and the beginning of a next burst.

The information included in the transmission parameter corresponds to examples given to facilitate the understanding of the present invention. Therefore, the proposed examples do not limit the scope or spirit of the present invention and may be easily varied or modified by anyone skilled in the art. According to the first embodiment of the present invention, the transmission parameter may be inserted by allocating a predetermined region of the mobile service data packet or the data group. In this case, the receiving system performs synchronization and equalization on a received signal, which is then decoded by symbol units. Thereafter, the packet deformatter may separate the mobile service data and the transmission parameter so as to detect the transmission parameter. According to the first embodiment, the transmission parameter may be inserted from the group formatter 304 and then transmitted.

According to the second embodiment of the present invention, the transmission parameter may be multiplexed with another type of data. For example, when known data are multiplexed with the mobile service data, a transmission parameter may be inserted, instead of the known data, in a place (or position) where a known data byte is to be inserted. Alternatively, the transmission parameter may be mixed with the known data and then inserted in the place where the known data byte is to be inserted. According to the second embodiment, the transmission parameter may be inserted from the group formatter 304 or from the packet formatter 306 and then transmitted.

According to a third embodiment of the present invention, the transmission parameter may be inserted by allocating a portion of a reserved region within a field synchronization segment of a transmission frame. In this case, since the receiving system may perform decoding on a receiving signal by symbol units before detecting the transmission parameter, the transmission parameter having information on the processing methods of the block processor 303 and the group formatter 304 may be inserted in a reserved field of a field synchronization signal. More specifically, the receiving system obtains field synchronization by using a field synchronization segment so as to detect the transmission parameter from a pre-decided position. According to the third embodiment, the transmission parameter may be inserted from the synchronization multiplexer 240 and then transmitted.

According to the fourth embodiment of the present invention, the transmission parameter may be inserted in a layer (or hierarchical region) higher than a transport stream (TS) packet. In this case, the receiving system should be able to receive a signal and process the received signal to a layer higher than the TS packet in advance. At this point, the transmission parameter may be used to certify the transmission parameter of a currently received signal and to provide the transmission parameter of a signal that is to be received in a later process.

In the present invention, the variety of transmission parameters associated with the transmission signal may be inserted and transmitted by using the above-described methods according to the first to fourth embodiment of the present invention. At this point, the transmission parameter may be inserted and transmitted by using only one of the four embodiments described above, or by using a selection of the above-described embodiments, or by using all of the above-described embodiments. Furthermore, the information included in the transmission parameter may be duplicated and inserted in each embodiment. Alternatively, only the required information may be inserted in the corresponding position of the corresponding embodiment and then transmitted. Furthermore, in order to ensure robustness of the transmission parameter, a block encoding process of a short cycle (or period) may be performed on the transmission parameter and, then, inserted in a corresponding region. The method for performing a short-period block encoding process on the transmission parameter may include, for example, Kerdock encoding, BCH encoding, RS encoding, and repetition encoding of the transmission parameter. Also, a combination of a plurality of block encoding methods may also be performed on the transmission parameter.

The transmission parameters may be grouped to create a block code of a small size, so as to be inserted in a byte place allocated within the data group for signaling and then transmitted. However, in this case, the block code passes through the block decoded from the receiving end so as to obtain a transmission parameter value. Therefore, the transmission parameters of the turbo code mode and the RS code mode, which are required for block decoding, should first be obtained. Accordingly, the transmission parameters associated with a particular mode may be inserted in a specific section of a known data region. And, in this case, a correlation of with a symbol may be used for a faster decoding process. The receiving system refers to the correlation between each sequence and the currently received sequences, thereby determining the encoding mode and the combination mode.

Meanwhile, when the transmission parameter is inserted in the field synchronization segment region or the known data region and then transmitted, and when the transmission parameter has passed through the transmission channel, the reliability of the transmission parameter is deteriorated. Therefore, one of a plurality of pre-defined patterns may also be inserted in accordance with the corresponding transmission parameter. Herein, the receiving system performs a correlation calculation between the received signal and the pre-defined patterns so as to recognize the transmission parameter. For example, it is assumed that a burst including 5 data groups is pre-decided as pattern A based upon an agreement between the transmitting system and the receiving system. In this case, the transmitting system inserts and transmits pattern A, when the number of groups within the burst is equal to 5. Thereafter, the receiving system calculates a correlation between the received data and a plurality of reference patterns including pattern A, which was created in advance. At this point, if the correlation value between the received data and pattern A is the greatest, the received data indicates the corresponding parameter, and most particularly, the number of groups within the burst. At this point, the number of groups may be acknowledged as 5. Hereinafter, the process of inserting and transmitting the transmission parameter will now be described according to first, second, and third embodiments of the present invention.

First Embodiment

Figure 18:
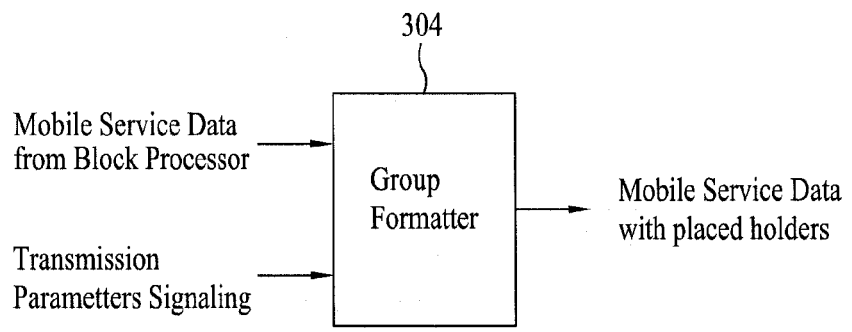
FIG. 18 illustrates an example of a group formatter inserting and transmitting a transmission parameter.

FIG. 18 illustrates a schematic diagram of the group formatter 304 receiving the transmission parameter and inserting the received transmission parameter in region A of the data group according to the present invention. Herein, the group formatter 304 receives mobile service data from the block processor 303. Conversely, the transmission parameter is processed with at least one of a data randomizing process, a RS frame encoding process, and a block processing process, and may then be inputted to the group formatter 304. Alternatively, the transmission parameter may be directly inputted to the group formatter 304 without being processed with any of the above-mentioned processes. In addition, the transmission parameter may be provided from the service multiplexer 100. Alternatively, the transmission parameter may also be generated and provided from within the transmitter 200. The transmission parameter may also include information required by the receiving system in order to receive and process the data included in the data group. For example, the transmission parameter may include data group information, and multiplexing information.

The group formatter 304 inserts the mobile service data and transmission parameter which are to be inputted to corresponding regions within the data group in accordance with a rule for configuring a data group. For example, the transmission parameter passes through a block encoding process of a short period and is, then, inserted in region A of the data group. Particularly, the transmission parameter may be inserted in a pre-arranged and arbitrary position (or place) within region A. If it is assumed that the transmission parameter has been block encoded by the block processor 303, the block processor 303 performs the same data processing operation as the mobile service data, more specifically, either a ½-rate encoding or ¼-rate encoding process on the signaling information including the transmission parameter. Thereafter, the block processor 303 outputs the processed transmission parameter to the group formatter 304. Thereafter, the signaling information is also recognized as the mobile service data and processed accordingly.

Figure 19:
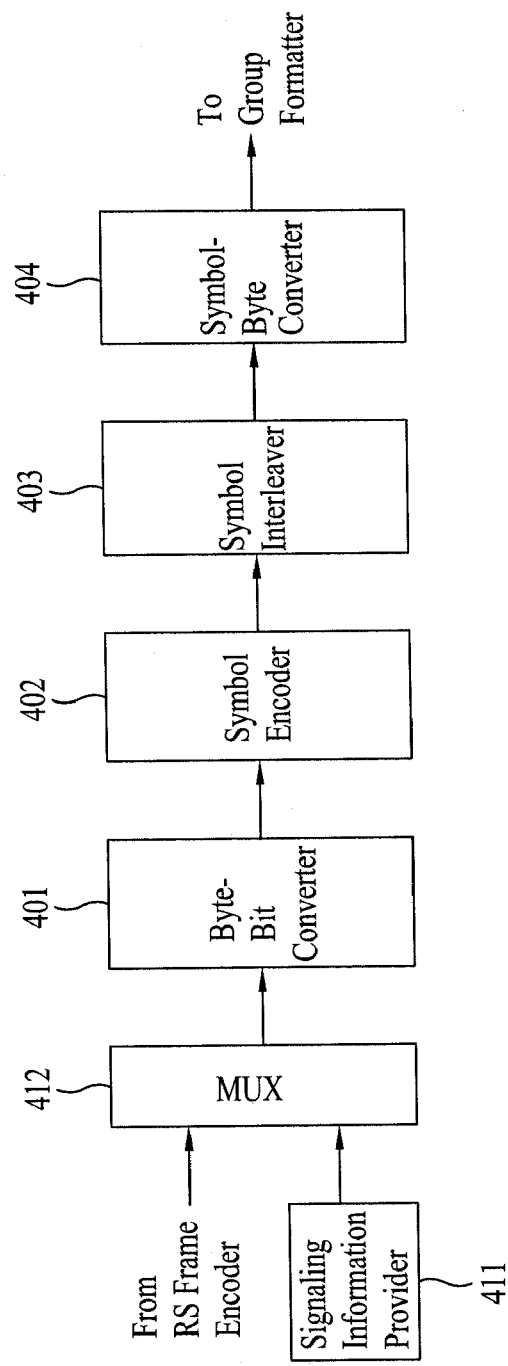
FIG. 19 illustrates an example of a block processor inserting and transmitting a transmission parameter.

FIG. 19 illustrates a block diagram showing an example of the block processor receiving the transmission parameter and processing the received transmission parameter with the same process as the mobile service data. Particularly, FIG. 19 illustrates an example showing the structure of FIG. 9 further including a signaling information provider 411 and multiplexer 412. More specifically, the signaling information provider 411 outputs the signaling information including the transmission parameter to the multiplexer 412. The multiplexer 412 multiplexes the signaling information and the output of the RS frame encoder 302. Then, the multiplexer 412 outputs the multiplexed data to the byte-bit converter 401.

The byte-bit converter 401 divides the mobile service data bytes or signaling information byte outputted from the multiplexer 412 into bits, which are then outputted to the symbol encoder 402. The subsequent operations are identical to those described in FIG. 9. Therefore, a detailed description of the same will be omitted for simplicity. If any of the detailed structures of the block processor 303 shown in FIG. 12, FIG. 15, FIG. 16, and FIG. 17, the signaling information provider 411 and the multiplexer 412 may be provided behind the byte-symbol converter.

Second Embodiment

Meanwhile, when known data generated from the group formatter in accordance with a pre-decided rule are inserted in a corresponding region within the data group, a transmission parameter may be inserted in at least a portion of a region, where known data may be inserted, instead of the known data. For example, when a long known data sequence is inserted at the beginning of region A within the data group, a transmission parameter may be inserted in at least a portion of the beginning of region A instead of the known data. A portion of the known data sequence that is inserted in the remaining portion of region A, excluding the portion in which the transmission parameter is inserted, may be used to detect a starting point of the data group by the receiving system. Alternatively, another portion of region A may be used for channel equalization by the receiving system.

In addition, when the transmission parameter is inserted in the known data region instead of the actual known data. The transmission parameter may be block encoded in short periods and then inserted. Also, as described above, the transmission parameter may also be inserted based upon a pre-defined pattern in accordance with the transmission parameter. If the group formatter 304 inserts known data place holders in a region within the data group, wherein known data may be inserted, instead of the actual known data, the transmission parameter may be inserted by the packet formatter 306. More specifically, when the group formatter 304 inserts the known data place holders, the packet formatter 306 may insert the known data instead of the known data place holders. Alternatively, when the group formatter 304 inserts the known data, the known data may be directly outputted without modification.

Figure 20:
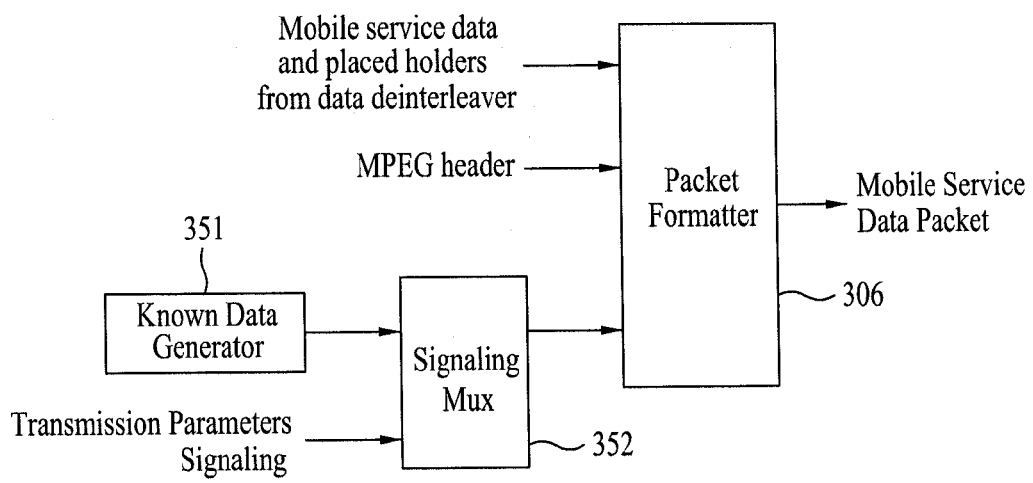
FIG. 20 illustrates an example of a packet formatter inserting and transmitting a transmission parameter.

FIG. 20 illustrates a block diagram showing the structure of a packet formatter 306 being expanded so that the packet formatter 306 can insert the transmission parameter according to an embodiment of the present invention. More specifically, the structure of the packet formatter 306 further includes a known data generator 351 and a signaling multiplexer 352. Herein, the transmission parameter that is inputted to the signaling multiplexer 352 may include information on the length of a current burst, information indicating a starting point of a next burst, positions in which the groups within the burst exist and the lengths of the groups, information on the time from the current group and the next group within the burst, and information on known data.

The signaling multiplexer 352 selects one of the transmission parameter and the known data generated from the known data generator 351 and, then, outputs the selected data to the packet formatter 306. The packet formatter 306 inserts the known data or transmission parameter outputted from the signaling multiplexer 352 into the known data place holders outputted from the data interleaver 305. Then, the packet formatter 306 outputs the processed data. More specifically, the packet formatter 306 inserts a transmission parameter in at least a portion of the known data region instead of the known data, which is then outputted. For example, when a known data place holder is inserted at a beginning portion of region A within the data group, a transmission parameter may be inserted in a portion of the known data place holder instead of the actual known data.

Also, when the transmission parameter is inserted in the known data place holder instead of the known data, the transmission parameter may be block encoded in short periods and inserted. Alternatively, a pre-defined pattern may be inserted in accordance with the transmission parameter. More specifically, the signaling multiplexer 352 multiplexes the known data and the transmission parameter (or the pattern defined by the transmission parameter) so as to configure a new known data sequence. Then, the signaling multiplexer 352 outputs the newly configured known data sequence to the packet formatter 306. The packet formatter 306 deletes the main service data place holder and RS parity place holder from the output of the data interleaver 305, and creates a mobile service data packet of 188 bytes by using the mobile service data, MPEG header, and the output of the signaling multiplexer. Then, the packet formatter 306 outputs the newly created mobile service data packet to the packet multiplexer 240.

In this case, the region A of each data group has a different known data pattern. Therefore, the receiving system separates only the symbol in a pre-arranged section of the known data sequence and recognizes the separated symbol as the transmission parameter. Herein, depending upon the design of the transmitting system, the known data may be inserted in different blocks, such as the packet formatter 306, the group formatter 304, or the block processor 303. Therefore, a transmission parameter may be inserted instead of the known data in the block wherein the known data are to be inserted.

According to the second embodiment of the present invention, a transmission parameter including information on the processing method of the block processor 303 may be inserted in a portion of the known data region and then transmitted. In this case, a symbol processing method and position of the symbol for the actual transmission parameter symbol are already decided. Also, the position of the transmission parameter symbol should be positioned so as to be transmitted or received earlier than any other data symbols that are to be decoded. Accordingly, the receiving system may detect the transmission symbol before the data symbol decoding process, so as to use the detected transmission symbol for the decoding process.

Third Embodiment

Figure 21:
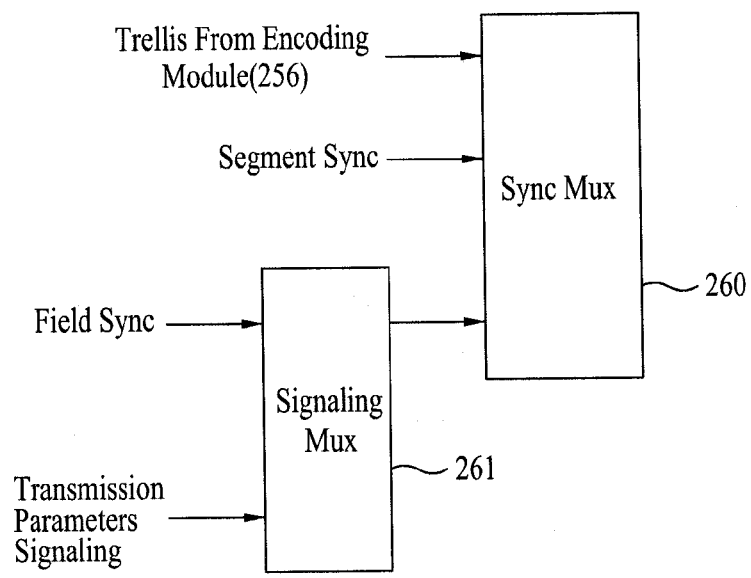
FIG. 21 illustrates an example for inserting and transmitting the transmission parameter in a field synchronization segment area.

Meanwhile, the transmission parameter may also be inserted in the field synchronization segment region and then transmitted. FIG. 21 illustrates a block diagram showing the synchronization multiplexer being expanded in order to allow the transmission parameter to be inserted in the field synchronization segment region. Herein, a signaling multiplexer 261 is further included in the synchronization multiplexer 260. The transmission parameter of the general VSB method is configured of 2 fields. More specifically, each field is configured of one field synchronization segment and 312 data segments. Herein, the first 4 symbols of a data segment correspond to the segment synchronization portion, and the first data segment of each field corresponds to the field synchronization portion.

One field synchronization signal is configured to have the length of one data segment. The data segment synchronization pattern exists in the first 4 symbols, which are then followed by pseudo random sequences PN 511, PN 63, PN 63, and PN 63. The next 24 symbols include information associated with the VSB mode. Additionally, the 24 symbols that include information associated with the VSB mode are followed by the remaining 104 symbols, which are reserved symbols. Herein, the last 12 symbols of a previous segment are copied and positioned as the last 12 symbols in the reserved region. In other words, only the 92 symbols in the field synchronization segment are the symbols that correspond to the actual reserved region.

Therefore, the signaling multiplexer 261 multiplexes the transmission parameter with an already-existing field synchronization segment symbol, so that the transmission parameter can be inserted in the reserved region of the field synchronization segment. Then, the signaling multiplexer 261 outputs the multiplexed transmission parameter to the synchronization multiplexer 260. The synchronization multiplexer 260 multiplexes the segment synchronization symbol, the data symbols, and the new field synchronization segment outputted from the signaling multiplexer 261, thereby configuring a new transmission frame. The transmission frame including the field synchronization segment, wherein the transmission parameter is inserted, is outputted to the transmission unit 270. At this point, the reserved region within the field synchronization segment for inserting the transmission parameter may correspond to a portion of or the entire 92 symbols of the reserved region. Herein, the transmission parameter being inserted in the reserved region may, for example, include information identifying the transmission parameter as the main service data, the mobile service data, or a different type of mobile service data.

If the information on the processing method of the block processor 303 is transmitted as a portion of the transmission parameter, and when the receiving system wishes to perform a decoding process corresponding to the block processor 303, the receiving system should be informed of such information on the block processing method in order to perform the decoding process. Therefore, the information on the processing method of the block processor 303 should already be known prior to the block decoding process. Accordingly, as described in the third embodiment of the present invention, when the transmission parameter having the information on the processing method of the block processor 303 (and/or the group formatter 304) is inserted in the reserved region of the field synchronization signal and then transmitted, the receiving system is capable of detecting the transmission parameter prior to performing the block decoding process on the received signal.

Receiving System

Figure 22:
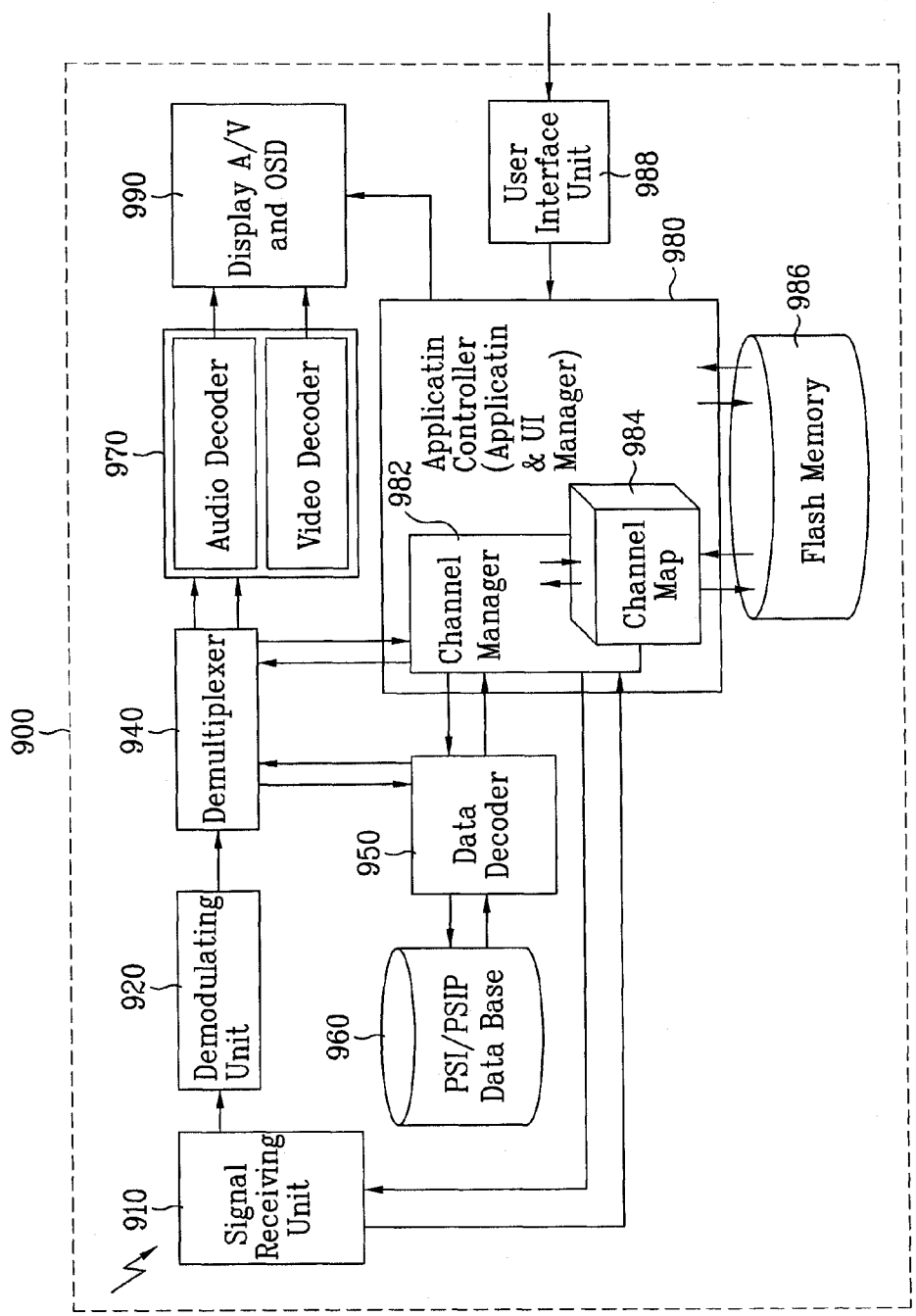
FIG. 22 illustrates a block diagram showing a structure of a digital broadcast receiving system according to the present invention.

FIG. 22 is a block diagram illustrating a mobile service data receiving apparatus for processing mobile service data and electronic program information upon receiving mobile service data packet.

Referring to FIG. 22, broadcast receiver 900 for receiving mobile service data according to an embodiment of the present invention includes a signal receiving unit 910, a demodulating unit 920, a demultiplexer 940, a data decoder 950, a PSI/PSIP database 960, an A/V decoder 970, a controller (also called an application & UI manager) 980, a channel manager 982, a channel map 984, a flash memory 986, a user interface unit 988, a display unit 990, a storage unit 1000, a peripheral-device connection interface unit 1100, and a thumbnail decoder 1200, etc. In this case, according to an embodiment of the present invention, the data decoder 950 may be a PSI/PSIP decoder, so that the PSI/PSIP decoder will hereinafter be used instead of the data decoder for the convenience of description and better understanding of the present invention.

For example, the above-mentioned broadcast receiver 900 may be a digital television (DTV) capable of receiving digital broadcast data, a mobile digital broadcast receiver, etc.

The signal receiving unit 910 receives a frequency of a specific channel, and outputs it.

The signal receiving unit 910 can receive mobile service data packet and main service data packet. In other words, the signal receiving unit 910 can selectively receive multiplexed main service data packet and multiplexed mobile service data packet. In this case, the aforementioned selective reception is as follows. For example, if it is assumed that the mobile service data packet and the main service data packet are multiplexed in a burst structure including a burst-on section and a burst-off section, and are then transmitted, the signal receiving unit 910 receives the mobile service data packet during the burst-on section. In this case, the burst-on section may include not only the mobile service data packet but also some parts of the main service data packet.

In other words, only the main service data packet may be transmitted during the burst-off section, and both the mobile service data packet and the main service data packet may be transmitted during the burst-on section. Thereafter, the signal receiving unit 910 divides the received data of the burst-on section into mobile service data packet and main service data packet.

In this case, the received broadcast signal includes a Program and System Information/Program and System Information Protocol (PSI/PSIP) table.

Specifically, the PSI/PSI table includes an Event Information Table (EIT) and a Virtual Channel Table (VCT).

In the meantime, the signal receiving unit 910 may be controlled by the channel manager 982.

The signal receiving unit 910 records the result of the received digital broadcast signal in the channel manager 982.

The demodulating unit 920 demodulates the reception (Rx) signal of the signal receiving unit 910, and divides the Rx signal into mobile service data packet and main service data packet. The demodulating unit 920 performs inverse processing of the transmission end's process which has been executed to improve a Rx performance of mobile service data. The signal processing of the demodulating unit 920 will be described later with reference to FIG. 23.

The demultiplexer 940 receives the demodulated signal from the demodulating unit 920, and performs demultiplexing on the received signal, so that it outputs main service data, PSI/PSIP table data associated with the main service data, mobile service data, and PSI/PSIP table data with the mobile service data. The mobile service data and associated PSI/PSIP table data will hereinafter be described using the mobile broadcast receiver as an example.

The demultiplexing of mobile audio data and mobile video data from among mobile service data may be controlled by the channel manager 982. The demultiplexing of the PSI/PSIP table may be controlled by the PSI/PSIP decoder 950.

The demultiplexed PSI/PSIP table is transmitted to the PSI/PSIP decoder 950. The demultiplexed mobile audio data and the demultiplexed video data are transmitted to the A/V decoder 970. The A/V decoder 970 includes an audio decoder and a video decoder. The audio decoder decodes the received audio data using an audio decoding algorithm, and the video decoder decodes the received video data using a video decoding algorithm.

The PSI/PSIP decoder 950 performs parsing the PSI/PSIP section constructing the table, and records electronic program information in the PSI/PSIP database 960. In this case, the PSI/PSIP decoder may be an example of the data decoder.

The channel manager 982 transmits a request for receiving a channel-associated information table by referring to the channel map 984, and receives a response to the request.

In this case, the PSI/PSIP decoder 950 controls the demultiplexing of the channel-associated information table, and transmits the A/V and data PID list to the channel manager 982.

The channel manager 982 directly controls the multiplexer 940 using the above transmitted A/V PID, so that it controls the A/V decoder 970.

The controller 980 controls a Graphical User Interface (GUI) for displaying status information of the above receiving system on the OSD (On Screen Display).

Particularly, according to the present invention, the demultiplexer 940 demultiplexes the EIT, and transmits the demultiplexed result to the PSI/PSIP decoder 950.

The above-mentioned process for decoding the electronic program information from a table including program information can be readily understood, and a detailed description thereof will hereinafter be described with reference to FIG. 25. The table including the program information will hereinafter be described using the EIT as an example.

The PSI/PSIP decoder 950 detects the EIT and acquires information of mobile service data and program information of the inventive mobile service data.

For example, if the broadcast receiver 900 receives an EPG service request from a user, the channel manager 982 gains access to the PSI/PSIP decoder 950, and receives information associated with the request.

The controller 980 controls the display unit 990, and transmits mobile service data and electronic program information associated with the mobile service data. For example, the electronic program information may be an Electronic Program Guide (EPG). In other words, the controller 980 collects the electronic program information, and controls the EPG information applied to the display unit 990 using the collected electronic program information.

The controller 980 controls all parts of the storing/reproducing of the received mobile service data. If a storage selection signal is entered, the controller 980 stores data or signals in the storage unit 1000 of the receiver, or stores the data or signals in an external storage unit connected to a peripheral-device connection interface unit 1100.

If a playback selection signal is entered, the controller 980 reads mobile service data from the storage unit 1000 of the receiver 900 or the external storage unit connected to the peripheral-device connection interface unit 1100, and reproduces the read mobile service data.

The user interface unit 988 receives a user's selection signal. For example, the user interface unit 988 may receive an EPG function call signal, or receive a signal for selecting a detailed function from among the EPG display.

The display unit 990 outputs not only mobile service data but also electronic program information associated with the mobile service data. In this case, the mobile service data and the electronic program information associated with the mobile service data may be displayed separately from each other, or may also be displayed at the same time.

The storage unit 1000 contained in the receiver stores the received mobile service data or PSI/PSIP information of the mobile service data. As the aforementioned mobile service data, the output data of the demodulating unit 920 may be stored, the output data of the demultiplexer 940 may be stored, or the decoded output of the A/V decoder 970 may be stored. This storage unit 1000 may be selectively present in the receiver.

The peripheral-device connection interface unit 1100 is a connection path to the external storage unit such that the received mobile service data can be stored in the external storage unit. This peripheral-device connection interface unit 1100 can be selectively present in the receiver.

The thumbnail image decoder 1200 decodes a thumbnail image in which a specific frame of video data is represented by a small-sized image less than an original size. In this case, the thumbnail image decoder 1200 receives the output data of the A/V decoder 970, decodes the thumbnail image, and stores the decoded thumbnail image in the storage unit 1000. The thumbnail image decoder will be described later with reference to FIG. 50.

Figure 23:
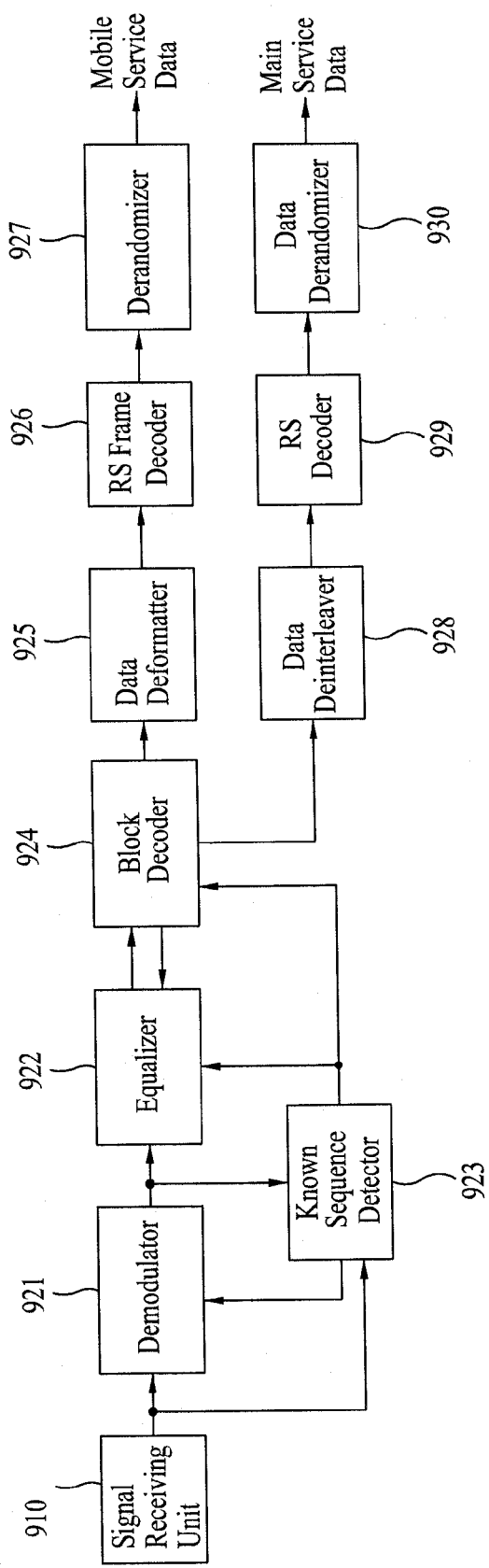
FIG. 23 is a block diagram illustrating a reception system according to the present invention.

FIG. 23 is a block diagram illustrating the demodulating unit of FIG. 22 according to the present invention.

Referring to FIG. 23, the demodulating unit recovers a carrier synchronization, a frame synchronization, and performs a channel equalization using known data, so that it improves a Rx performance. In this case, it should be noted that the known data has been inserted into the mobile service data section by the transmission system, and then the transmission system has transmitted the inserted result.

The demodulating unit 920 includes a demodulator 921, an equalizer 922, a known sequence detector 923, a block decoder 924, a data deformatter 925, a RS-frame decoder 926, a derandomizer 927, a data deinterleaver 928, a RS decoder 929, a data derandomizer 930, etc.

For the convenience of description, the data deformatter 925, the RS frame decoder 926, and the derandomizer 927 are hereinafter referred to as a mobile service data processor. The data deinterleaver 928, the RS decoder 929, and the data derandomizer 930 are hereinafter referred to as a main service data processor.

For example, provided that the reception system is a broadcast receiving system capable of outputting only mobile service data other than main service data, the demodulating unit 920 according to the present invention may include only the mobile service data processor (i.e., the data deformatter 925, the RS frame decoder 926, and the derandomizer 927) other than the main service data processor (i.e., the data deinterleaver 928, the RS decoder 929, and the data derandomizer 930).

And, provided that the reception system is a system capable of outputting both the main service data and the mobile service data, the demodulating unit 920 according to the present invention may include both the mobile service data processor (i.e., the data deformatter 925, the RS frame decoder 926, and the derandomizer 927) and the main service data processor (i.e., the data deinterleaver 928, the RS decoder 929, and the data derandomizer 930).

In this case, mobile service data and electronic program information associated with the mobile service data are simultaneously processed by the demodulating unit 920.

In more detail, the signal receiving unit 910 receives a frequency of a specific channel, converts the received frequency into an Intermediate Frequency (IF) signal, and outputs the converted result to the demodulator 921 and the known sequence detector 923.

The demodulator 921 receives the IF signal from the demodulator 921, performs an automatic gain control, a carrier recovery, and a timing recovery on the received IF signal to create a baseband signal, and outputs the baseband signal to the equalizer 922 and the known sequence detector 923.

The equalizer 922 compensates for channel distortion contained in the demodulated signal, and outputs the compensated result to the block decoder 924.

At this point, the known sequence detector 923 detects the known sequence place inserted by the transmitting end from the input/output data of the demodulator 921 (i.e., the data prior to the demodulation process or the data after the demodulation process). Thereafter, the place information along with the symbol sequence of the known data, which are generated from the detected place, is outputted to the demodulator 921 and the equalizer 922. Also, the known sequence detector 923 outputs a set of information to the block decoder 924. This set of information is used to allow the block decoder 924 of the receiving system to identify the mobile service data that are processed with additional encoding from the transmitting system and the main service data that are not processed with additional encoding. In addition, although the connection status is not shown in FIG. 23, the information detected from the known sequence detector 923 may be used throughout the entire receiving system and may also be used in the data deformatter 925 and the RS frame decoder 926. The demodulator 921 uses the known data symbol sequence during the timing and/or carrier recovery, thereby enhancing the demodulating performance. Similarly, the equalizer 922 uses the known data so as to enhance the equalizing performance. Moreover, the decoding result of the block decoder 924 may be fed-back to the equalizer 922, thereby enhancing the equalizing performance.

The equalizer 922 may perform channel equalization by using a plurality of methods. An example of estimating a channel impulse response (CIR) so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Herein, the data group that is inputted for the equalization process is divided into regions A to C, as shown in FIG. 6A. More specifically, in the example of the present invention, each region A, B, and C are further divided into regions A1 to A5, regions B1 and B2, and regions C1 to C3, respectively. Referring to FIG. 6A, the CIR that is estimated from the field synchronization data in the data structure is referred to as CIR_FS. Alternatively, the CIRs that are estimated from each of the 5 known data sequences existing in region A are sequentially referred to as CIR_N0, CIR_N1, CIR_N2, CIR_N3, and CIR_N4.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(A) of a function F(x) at a particular point A and a value F(B) of the function F(x) at another particular point B are known, interpolation refers to estimating a function value of a point within the section between points A and B. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(A) of a function F(x) at a particular point A and a value F(B) of the function F(x) at another particular point B are known, extrapolation refers to estimating a function value of a point outside of the section between points A and B. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

More specifically, in case of region C1, any one of the CIR_N4 estimated from a previous data group, the CIR_FS estimated from the current data group that is to be processed with channel equalization, and a new CIR generated by extrapolating the CIR_FS of the current data group and the CIR_N0 may be used to perform channel equalization. Alternatively, in case of region B1, a variety of methods may be applied as described in the case for region C1. For example, a new CIR created by linearly extrapolating the CIR_FS estimated from the current data group and the CIR_N0 may be used to perform channel equalization. Also, the CIR_FS estimated from the current data group may also be used to perform channel equalization. Finally, in case of region A1, a new CIR may be created by interpolating the CIR_FS estimated from the current data group and CIR_N0, which is then used to perform channel equalization. Furthermore, any one of the CIR_FS estimated from the current data group and CIR_N0 may be used to perform channel equalization.

In case of regions A2 to A5, CIR_N(i−1) estimated from the current data group and CIR_N(i) may be interpolated to create a new CIR and use the newly created CIR to perform channel equalization. Also, any one of the CIR_N(i−1) estimated from the current data group and the CIR_N(i) may be used to perform channel equalization. Alternatively, in case of regions B2, C2, and C3, CIR_N3 and CIR_N4 both estimated from the current data group may be extrapolated to create a new CIR, which is then used to perform the channel equalization process. Furthermore, the CIR_N4 estimated from the current data group may be used to perform the channel equalization process. Accordingly, an optimum performance may be obtained when performing channel equalization on the data inserted in the data group. The methods of obtaining the CIRs required for performing the channel equalization process in each region within the data group, as described above, are merely examples given to facilitate the understanding of the present invention. A wider range of methods may also be used herein. And, therefore, the present invention will not only be limited to the examples given in the description set forth herein.

Meanwhile, if the data being inputted to the block decoder 924 after being channel equalized from the equalizer 922 correspond to the mobile service data having additional encoding and trellis encoding performed thereon by the transmitting system, trellis decoding and additional decoding processes are performed on the inputted data as inverse processes of the transmitting system. Alternatively, if the data being inputted to the block decoder 924 correspond to the main service data having only trellis encoding performed thereon, and not the additional encoding, only the trellis decoding process is performed on the inputted data as the inverse process of the transmitting system.

The data group decoded by the block decoder 924 is inputted to the data deformatter 925, and the main service data are inputted to the data deinterleaver 928. According to another embodiment, the main data may also bypass the block decoder 924 so as to be directly inputted to the data deinterleaver 928. In this case, a trellis decoder for the main service data should be provided before the data deinterleaver 928. When the block decoder 924 outputs the data group to the data deformatter 925, the known data, trellis initialization data, and MPEG header, which are inserted in the data group, and the RS parity, which is added by the RS encoder/non-systematic RS encoder or non-systematic RS encoder of the transmitting system, are removed. Then, the processed data are outputted to the data deformatter 925. Herein, the removal of the data may be performed before the block decoding process, or may be performed during or after the block decoding process. If the transmitting system includes signaling information in the data group upon transmission, the signaling information is outputted to the data deformatter 925.

More specifically, if the inputted data correspond to the main service data, the block decoder 924 performs Viterbi decoding on the inputted data so as to output a hard decision value or to perform a hard-decision on a soft decision value, thereby outputting the result. Meanwhile, if the inputted data correspond to the mobile service data, the block decoder 924 outputs a hard decision value or a soft decision value with respect to the inputted mobile service data. In other words, if the inputted data correspond to the mobile service data, the block decoder 924 performs a decoding process on the data encoded by the block processor and trellis encoding module of the transmitting system.

At this point, the RS frame encoder of the pre-processor included in the transmitting system may be viewed as an external code. And, the block processor and the trellis encoder may be viewed as an internal code. In order to maximize the performance of the external code when decoding such concatenated codes, the decoder of the internal code should output a soft decision value. Therefore, the block decoder 924 may output a hard decision value on the mobile service data. However, when required, it may be more preferable for the block decoder 924 to output a soft decision value.

Meanwhile, the data deinterleaver 928, the RS decoder 929, and the derandomizer 930 are blocks required for receiving the main service data. Therefore, the above-mentioned blocks may not be required in the structure of a receiving system that only receives the mobile service data. The data deinterleaver 928 performs an inverse process of the data interleaver included in the transmitting system. In other words, the data deinterleaver 928 deinterleaves the main service data outputted from the block decoder 924 and outputs the deinterleaved main service data to the RS decoder 929.

The RS decoder 929 performs a systematic RS decoding process on the deinterleaved data and outputs the processed data to the derandomizer 930. The derandomizer 930 receives the output of the RS decoder 929 and generates a pseudo random data byte identical to that of the randomizer included in the transmitting system. Thereafter, the derandomizer 930 performs a bitwise exclusive OR (XOR) operation on the generated pseudo random data byte, thereby inserting the MPEG synchronization bytes to the beginning of each packet so as to output the data in 188-byte main service data packet units.

Meanwhile, the data being outputted from the block decoder 924 to the data deformatter 925 are inputted in the form of a data group. At this point, the data deformatter 925 already knows the structure of the data that are to be inputted and is, therefore, capable of identifying the signaling information, which includes the system information, and the mobile service data from the data group. Thereafter, the data deformatter 925 outputs the identified signaling information to a block for processing signaling information (not shown) and outputs the identified mobile service data to the RS frame decoder 926. More specifically, the RS frame decoder 926 receives only the RS encoded and CRC encoded mobile service data that are transmitted from the data deformatter 925.

The RS frame encoder 926 performs an inverse process of the RS frame encoder included in the transmitting system so as to correct the error within the RS frame. Then, the RS frame decoder 926 adds the 1-byte MPEG synchronization service data packet, which had been removed during the RS frame encoding process, to the error-corrected mobile service data packet. Thereafter, the processed data packet is outputted to the derandomizer 927. The operation of the RS frame decoder 926 will be described in detail in a later process. The derandomizer 927 performs a derandomizing process, which corresponds to the inverse process of the randomizer included in the transmitting system, on the received mobile service data. Thereafter, the derandomized data are outputted, thereby obtaining the mobile service data transmitted from the transmitting system. Hereinafter, detailed operations of the RS frame decoder 926 will now be described.

Figure 24:
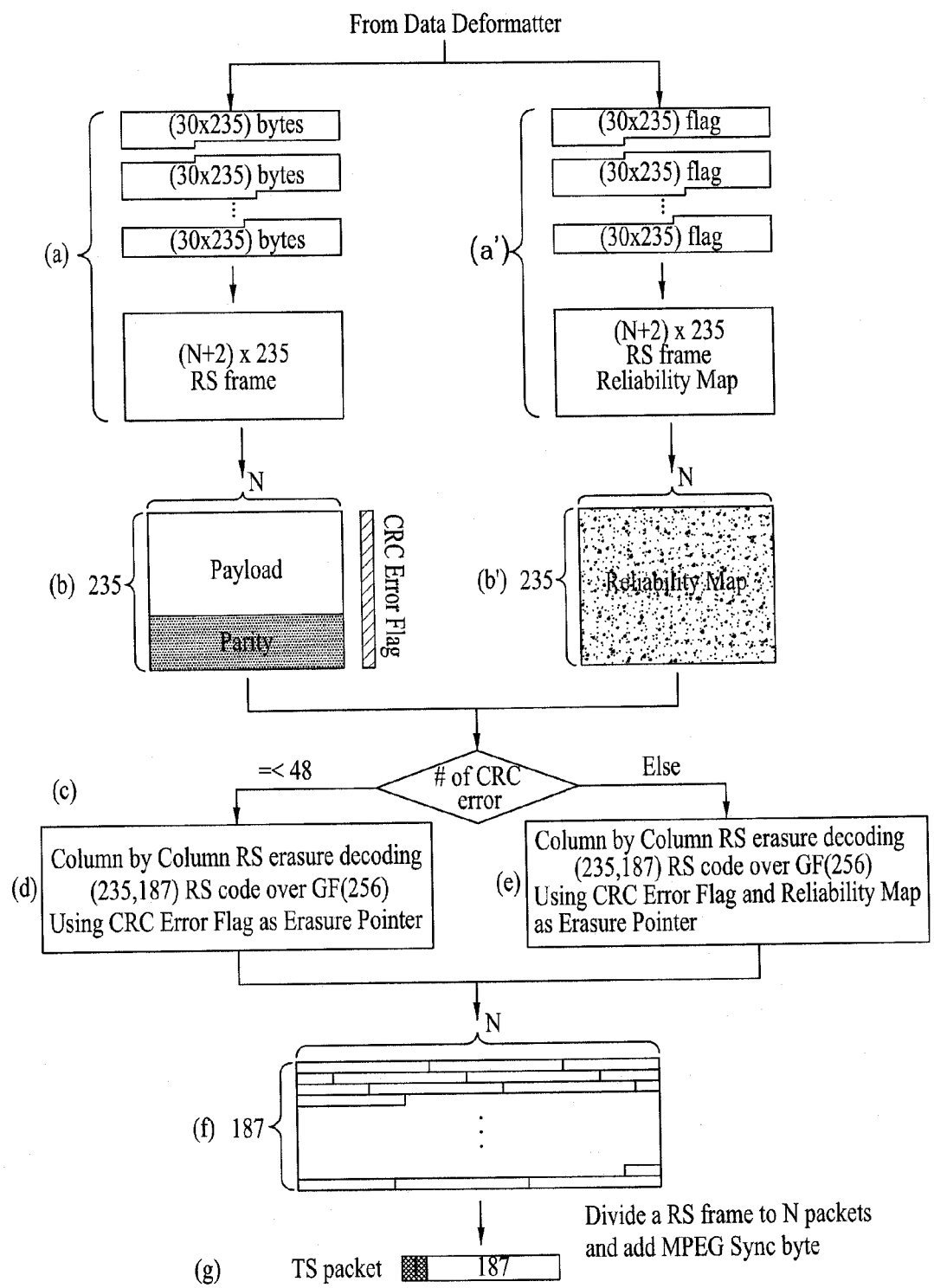
FIG. 24 is a conceptual diagram illustrating an exemplary error correction decoding process according to the present invention.

FIG. 24 illustrates a series of exemplary step of an error correction decoding process of the RS frame decoder 926 according to the present invention. More specifically, the RS frame decoder 926 groups mobile service data bytes received from the data deformatter 925 so as to configure an RS frame. The mobile service data correspond to data RS encoded and CRC encoded from the transmitting system. FIG. 24(*a*) illustrates an example of configuring the RS frame. More specifically, the transmitting system divided the RS frame having the size of (N+2)*235 to 30*235 byte blocks. When it is assumed that each of the divided mobile service data byte blocks is inserted in each data group and then transmitted, the receiving system also groups the 30*235 mobile service data byte blocks respectively inserted in each data group, thereby configuring an RS frame having the size of (N+2)*235. For example, when it is assumed that an RS frame is divided into 18 30*235 byte blocks and transmitted from a burst section, the receiving system also groups the mobile service data bytes of 18 data groups within the corresponding burst section, so as to configure the RS frame. Furthermore, when it is assumed that N is equal to 538 (i.e., N=538), the RS frame decoder 926 may group the mobile service data bytes within the 18 data groups included in a burst so as to configure a RS frame having the size of 540*235 bytes.

Herein, when it is assumed that the block decoder 924 outputs a soft decision value for the decoding result, the RS frame decoder 926 may decide the '0' and '1' of the corresponding bit by using the codes of the soft decision value. 8 bits that are each decided as described above are grouped to create 1 data byte. If the above-described process is performed on all soft decision values of the 18 data groups included in a single burst, the RS frame having the size of 540*235 bytes may be configured. Additionally, the present invention uses the soft decision value not only to configure the RS frame but also to configure a reliability map. Herein, the reliability map indicates the reliability of the corresponding data byte, which is configured by grouping 8 bits, the 8 bits being decided by the codes of the soft decision value.

For example, when the absolute value of the soft decision value exceeds a pre-determined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure 1 data byte, is determined to be unreliable, the corresponding data byte is marked on the reliability map as an unreliable data byte.

Herein, determining the reliability of 1 data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the 1 data byte are determined to be reliable (i.e., when the absolute value of the soft decision values of all 8 bits included in the 1 data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of 540*235 bytes, the reliability map is also configured to have the size of 540*235 bytes. FIG. 24(*a'*) illustrates the process steps of configuring the reliability map according to the present invention. Meanwhile, if a RS frame is configured to have the size of (N+2)*235 bytes, the RS frame decoder 926 performs a CRC syndrome checking process on the corresponding RS frame, thereby verifying whether any error has occurred in each row. Subsequently, as shown in FIG. 24(*b*), a 2-byte checksum is removed to configure an RS frame having the size of N*235 bytes. Herein, the presence (or existence) of an error is indicated on an error flag corresponding to each row. Similarly, since the portion of the reliability map corresponding to the CRC checksum has hardly any applicability, this portion is removed so that only N*235 number of the reliability information bytes remain, as shown in FIG. 24(*b'*).

After performing the CRC syndrome checking process, the RS frame decoder 926 performs RS decoding in a column direction. Herein, a RS erasure correction process may be performed in accordance with the number of CRC error flags. More specifically, as shown in FIG. 24(*c*), the CRC error flag corresponding to each row within the RS frame is verified. Thereafter, the RS frame decoder 926 determines whether the number of rows having a CRC error occurring therein is equal to or smaller than the maximum number of errors on which the RS erasure correction may be performed, when performing the RS decoding process in a column direction. The maximum number of errors corresponds to a number of parity bytes inserted when performing the RS encoding process. In the embodiment of the present invention, it is assumed that 48 parity bytes have been added to each column.

If the number of rows having the CRC errors occurring therein is smaller than or equal to the maximum number of errors (i.e., 48 errors according to this embodiment) that can be corrected by the RS erasure decoding process, a (235,187)-RS erasure decoding process is performed in a column direction on the RS frame having 235 N-byte rows, as shown in FIG. 24(d). Thereafter, as shown in FIG. 24(f), the 48-byte parity data that have been added at the end of each column are removed. Conversely, however, if the number of rows having the CRC errors occurring therein is greater than the maximum number of errors (i.e., 48 errors) that can be corrected by the RS erasure decoding process, the RS erasure decoding process cannot be performed. In this case, the error may be corrected by performing a general RS decoding process. In addition, the reliability map, which has been created based upon the soft decision value along with the RS frame, may be used to further enhance the error correction ability (or performance) of the present invention.

More specifically, the RS frame decoder 926 compares the absolute value of the soft decision value of the block decoder 924 with the pre-determined threshold value, so as to determine the reliability of the bit value decided by the code of the corresponding soft decision value. Also, 8 bits, each being determined by the code of the soft decision value, are grouped to form 1 data byte. Accordingly, the reliability information on this 1 data byte is indicated on the reliability map. Therefore, as shown in FIG. 24(e), even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points. Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column.

More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column. For example, it is assumed that the number of rows having CRC errors included therein within the RS frame is greater than 48. And, it is also assumed that the number of erasure points decided based upon the reliability information of the reliability map is indicated as 40 erasure points in the first column and as 50 erasure points in the second column. In this case, a (235,187)-RS erasure decoding process is performed on the first column. Alternatively, a (235,187)-RS decoding process is performed on the second column. When error correction decoding is performed on all column directions within the RS frame by using the above-described process, the 48-byte parity data which were added at the end of each column are removed, as shown in FIG. 24(f).

As described above, even though the total number of CRC errors corresponding to each row within the RS frame is greater than the maximum number of errors that can be corrected by the RS erasure decoding process, when the number of bytes determined to have a low reliability level, based upon the reliability information on the reliability map within a particular column, while performing error correction decoding on the particular column. Herein, the difference between the general RS decoding process and the RS erasure decoding process is the number of errors that can be corrected. More specifically, when performing the general RS decoding process, the number of errors corresponding to half of the number of parity bytes (i.e., (number of parity bytes)/2) that are inserted during the RS encoding process may be error corrected (e.g., 24 errors may be corrected). Alternatively, when performing the RS erasure decoding process, the number of errors corresponding to the number of parity bytes that are inserted during the RS encoding process may be error corrected (e.g., 48 errors may be corrected).

After performing the error correction decoding process, as described above, a RS frame configured of 187 N-byte rows (or packets) maybe obtained, as shown in FIG. 24(f). Furthermore, the RS frame having the size of N*187 bytes is sequentially outputted in N number of 187-byte units. Herein, as shown in FIG. 24(g), the 1-byte MPEG synchronization byte that was removed by the transmitting system is added at the end of each 187-byte packet, thereby outputting 188-byte mobile service data packets.

Embodiments illustrating application examples of the mobile service data packet processed/generated from the above-mentioned reception system will hereinafter be described. The present invention will disclose a method for extracting electronic program information from the PSI/PSIP information associated with the mobile service data formed by the demultiplexed mobile service packet, and employing the extracted information.

FIG. 25 is a structural diagram illustrating a bit stream syntax associated with an Event Information Table (EIT) section including electronic program information according to the present invention. At least one EIT section forms a single EIT.

A method for defining electronic program information associated with mobile service data using the EIT section will hereinafter be described with reference to FIG. 25. The EIT provides detailed information of an event contained in a virtual channel. The virtual channel is identified by a source identification field, and each event is identified by a unique identifier, such that the EIT provides the above-mentioned detailed information.

The Event Information Table (EIT) is one of tables of the PSIP including a title, start time, and duration of at least one event of the virtual channel. As can be seen from FIG. 25, the EIT section includes a plurality of fields.

The "table_id" field is composed of 8 bits, and has the value of "0xCB", such that a corresponding section belongs to the EIT.

The "section_syntax_indicator" field includes a single bit, and is set to the value of "1".

The "private_indicator" field is composed of a single bit (i.e., a 1-bit field), and is set to the value of "1".

The "source_id" field is an identifier for identifying a virtual channel carrying an event generated in a corresponding section.

The "version_number" field is an EIT entity version. In an embodiment of the present invention, event change information contained in an EIT which has a new version number in association with a conventional version number is recognized as the latest change information.

The "current_next_indicator" field indicates whether event information contained in a corresponding EIT is current information or future information.

The "num_event" field indicates the number of events contained in a channel having the above-mentioned source ID. Namely, an event loop is located under the "num_event" field, and the event loop is repeated several times corresponding to the number of events.

The above-mentioned EIT section field is commonly applied to at least one event contained in a single EIT section.

The "for(j=0; j<num_events_in_section;j++){ }" loop describes characteristics of individual events. The following fields are fields indicating detailed information of individual events. Therefore, the following fields are individually applied to corresponding events described in the EIT section.

The "event_id" field contained in the event loop identifies individual events. Event ID's numerals are considered to be some parts of an event "ETM_ID" (identifier for event Extended Text Message).

The "start_time" field indicates a start time of an event. Therefore, program's start time information provided from electronic program information is collected from the "start_time" field.

The "length_in_seconds" field indicates a duration time of an event. Therefore, program's end time information provided from electronic program information is collected from "length_in_seconds" field. Namely, a value of the "start_time" field and a value of the "length_in_seconds" field are summed up, such that the end time information can be collected.

The "title_text( )" field may be used to indicate a title of a broadcast program.

FIG. 26A is a structural diagram illustrating a syntax structure associated with a table indicating current time information according to the present invention. The present invention can use all kinds of tables indicating current time information. However, for the convenience of description, the present invention will use only a System Time Table (STT) as an example of the current time information table. The current time information is some parts of electronic program information, and is received as mobile service data packet according to the above-mentioned transmission/reception (Tx/Rx) scheme.

The current time information receives/detects a table including current time information such as a System Time Table (STT). And, the current time may be entered by a user. In other words, a user may enter the current time on the OSD, or the reception system detects the current time from the table including the current time information, and establishes the detected current time.

In this case, there may be a difference between an absolute time (e.g., Universal Time Coordinated (UTC) or Greenwich Sidereal Time (GST)) and a regional time. In this case, this difference may be corrected by a local time. This regional type may be set in a broadcast receiver by a user.

In the case of the mobile broadcast receiver, a region may be frequently changed to another region. In this case, the user must newly establish a region whenever a current region is changed to another region, resulting in greater inconvenience of use. Therefore, the present invention includes region information (or local time) in a table indicating electronic program information, and transmits the resultant table.

In this case, although the region information may be inserted into any table including any table including the electronic program information, it is assumed that the region information contained in the STT is transmitted to the receiver, and the receiver receives this information and establishes the local time. In this case, the absolute time information and the region information may be transmitted on a single table (See FIG. 26A and FIG. 26B), and may also be transmitted using an additional table (See FIG. 26C) including only region information.

In FIG. 26A, the "table_id" field in the STT section is composed of 8 bits, and has the value of "0xCD". In this case, the receiver determines that a corresponding section belongs to a System Time Table (STT).

The "section_syntax_indicator" field includes a single bit, and is set to the value of "1".

The "private_indicator" field is composed of a single bit (i.e., a 1-bit field), and is set to the value of "1".

The "current_next_indicator" field indicates whether time information contained in a corresponding sTT section is current information or future information.

The "system_time" field is composed of 32 bits, and indicates a current time in units of seconds from a Universal Time Coordinated (UTC) of a reference time.

The "GPS_UTC_offset" field is composed of 8 bits, and indicates a value for correcting a difference between the GPS time and the UTC time.

The "Daylight_saving" field is composed of 16 bits, and determines whether a daylight-saving time control is applied or not. And, the "Daylight_saving" field indicates a date and time at which the daylight-saving time is applied.

The offset information from among the inventive regional information may be contained in a reserved filed of the STT, or may be added as a new descriptor to the reserved descriptor.

FIG. 26B is a structural diagram illustrating a local time offset descriptor syntax according to the present invention.

Referring to FIG. 26B, the local time offset descriptor corrects an offset related to the absolute time, and indicates region information for establishing a local time for each reception (Rx) region.

The local time offset descriptor includes the "descriptor_tag" field and the "descriptor_length" field. The "descriptor_tag" field identifies a descriptor in the STT, and the "descriptor_length" field indicates the length of a local time descriptor.

The "for(i=0, i<N; i++){ }" loop indicates detailed region information.

The "country_code" field is composed of 24 bits, and identifies individual countries for receiving broadcast data according to individual country code values.

The "country_region_id" field is composed of 6 bits, and different times may be applied to individual regions of a single country, so that the "country_region_id" field identifies a broadcast Rx region according to a country region ID field value.

The reserved field is composed of a single bit (i.e., 1 bit), and has no function for future use. In other words, if a specific value for identifying a time must be added in the future, a corresponding value may be inserted into this reserved field.

The "local_time_offset" field is composed of 40 bits, and determines a time offset value from the UTC using the received country code and the received country region ID value.

The "local_time_offset_polarity" field is composed of a single bit (1 bit), and determines a sign of the local time offset. In other words, the The "local_time_offset_polarity" field indicates whether the offset correction is positive(+) or negative(−) on the basis of the UTC.

The "time_of_change" field is composed of 4 bits, and indicates a date and time of the time change using the MJT and the UTC.

The "next_time_offset" field is composed of 16 bits. If the time change from the UTC occurs, the "next_time_offset" field indicates the next offset time.

In this case, the local time offset descriptor may include the above-mentioned all fields, or may also include only a minimum number of values required for correcting the local time. For example, if the local time offset descriptor includes a country code field and a country region ID field, and is then transmitted to the receiver, the receiver can correct the local time offset on the condition that it has recognized a offset correction value of a region code.

And, if the local time offset descriptor does not transmit the country code field and the country region ID field, includes the local time offset field and the local time offset polarity field and the resultant the local time offset descriptor is transmitted to the receiver, the receiver can correct the local time using an offset value although it does not know detailed region information.

FIG. 26C is a structural diagram illustrating a syntax associated with a Local Time Table (LTT) section according to the present invention. In other words, region information including a local time may be contained as a descriptor type in the STT as shown in FIG. 26B, or may be transmitted to an additional table (e.g., LTT).

Referring to FIG. 26C, the LTT section syntax selectively includes the "country_code" field, the "country_region_id" field, the "local_time_offset" field, and the "local_time_offset_polarity" field of FIG. 26B. If necessary, the LTT section syntax may further include the reserved field.

The fields of FIG. 26C are the same as those of FIG. 25 to FIG. 26B.

According to a method for detecting the PSIP information and displaying current time information on the EPG, the present invention may combine standard time information and region information set in the broadcast receiver set, and may display the current time information on the EPG according to the combined result. Otherwise, the present invention receives the standard time information and the local time information at the same time, and automatically combines/establishes a current time according to a local time of a Rx region.

The receiver outputs the information collected from the table including the above-mentioned program information to various EPG ways. A variety of EPG display formats will hereinafter be described with reference to the annexed drawings. For the convenience of description and better understanding of the present invention, the mobile service data is referred to as a program.

FIG. 27 shows a display format of an Electronic Program Guide (EPG) according to the present invention.

Referring to FIG. 27, the EPG shows mobile service data broadcast from a virtual channel, i.e., time-flow information of an event. Information displayed on the EOG is extracted from the table including the electronic program information.

For example, FIG. 27 is a program schedule guide from 17:00 o'clock to 04:00 o'clock of broadcast programs of four virtual channels (i.e., minor channel Nos. "1", "2", "3", and "100") in a physical channel (i.e., a major channel No. 51).

The above-mentioned program schedule guide may also be called an electronic program guide (EPG).

"1-A", "1-B", ..., "1-E" indicate titles of programs to be broadcasted from the "51-1" channel.

"2-A", ..., "3-D" indicate titles of programs of corresponding virtual channels.

Referring to an upper left part of FIG. 27, a circle-end arrow indicates a current time. As described above, the current time is collected and controlled.

Referring to an upper part of FIG. 27, a sharp-end arrow indicates a time zone of an event contained in a single EIT-k from among EIT-k (k=0~127).

For example, 8 absolute times are contained in 24 hours of a day, i.e., "0:00" o'clock, "3:00" o'clock, "6:00" o'clock, "9:00" o'clock, "12:00" o'clock, "15:00" o'clock, "18:00" o'clock, and "21:00" o'clock.

If a current time "17:19" o'clock is used as a reference time, a broadcast channel is "51-1" and "51-2".

The above-mentioned channels are considered to be active virtual channels. If a current time reaches 1:00 o'clock AM, there is no broadcast program, so that the "51-1" channel is changed to an inactive channel.

The "51-3" channel may be considered to be an inactive channel over which the "3-A" broadcast program will be broadcast from 19:00 o'clock.

In the meantime, empty spaces among the "3-A", "3-B", "3-C", and "3-D" broadcast programs indicate advertisement broadcast program and others.

The "51-100" channel shows a data broadcast dedicated channel having no A/V data. The mobile service data includes A/V data and other service data, so that the A/V data and other information may be simultaneously displayed on the EPG.

The aforementioned data on EPG is an event contained in the BIT of the PSIP, and may include a variety of information (e.g., event title data, event start time data, event duration data, caption data, and rating data)

As described above, the EPG includes a first zone on a horizontal axis and a second zone on a vertical axis. One of the horizontal and vertical axes includes channel information, and the other one includes time information. Program information is located at a crossing point between the channel-information axis and the time-information axis.

The EPG may be displayed in various ways. For example, the EPG may be displayed in grid type, 8-days type, now-and-next type, and single type methods. The above-mentioned display format modes may be changed as necessary.

A predetermined transparency can be applied to an output mode of all windows contained in a program guide. In other words, if a program guide is displayed while a user views a program, and the program guide is displayed on the display screen of the viewing program, the program guide is displayed on a semitransparent window, so that the user can view a background screen. In this case, the window's transparency may be adjusted by the user.

Figure 28:
FIG. 28 shows an output format of an Electronic Program Guide (EPG) according to an embodiment of the present invention.

FIG. 28 shows an output format of an Electronic Program Guide (EPG) according to an embodiment of the present invention.

Referring to FIG. 28, the EPG has a two-dimensional structure composed of a horizontal axis and a vertical axis. One of the horizontal and vertical axes includes channel information, and the other one of the vertical axes includes time information. In this case, the channel information may be located on the vertical axis, and the time information may be located on the horizontal axis, and vice versa. And, a title of a program which is received at a corresponding time of a corresponding channel is displayed at a crossing point between the horizontal axis and the vertical axis.

In other words, several electronic program information units are received and stored in the memory. In association with several channels, program schedule information of individual time zones is configured in the form of a list, and is then transmitted to the display. The above-mentioned description will be called a grid-type EPG.

The length of a cell at which the program title is located is proportional to the time. In other words, the program's start time information and the program's end time information are collected, the collected information is controlled to be displayed according to time information on a time axis. According to the above-mentioned embodiment, the length of each cell at which the program title is located is changed according to individual programs. In the meantime, due to a short duration of the program, the length of cell may be insufficient to display the program title. In this case, the program title may be denoted by reducing a font size, only some parts of the program title may be denoted using an ellipsis ( . . . ), or scroll or direction keys are provided on the EPG, so that blind text data can be displayed on the EPG. And, a text sliding function may also be provided to the above-mentioned grid-type EPG.

Next, embodiments of functions for use in the grid-type EPG will hereinafter be described. The following applicable functions irrespective of EPG-type embodiments can also be applied to EPG formats of other output types.

An input-type indication cell indicates that a current-selected input signal is one of various input types, for example, a TV signal, an audio signal, a data signal, or a software update signal.

A channel list cell indicates at least one of a channel name, a channel name, and a channel logo, so that it indicates information of a channel on which a program title is loaded. The number of channels is at least one. In this case, 7 channels can be simultaneously OSD-displayed on a single display window. If the number of Rx channels is at least "7", the grid-type EPG may view the next channel information using either the scroll function or the page shift function.

The date cell indicates a date at which the program is received. In this case, the EPG may be composed of several dates. In this embodiment, the EPG may display program information of 8 days.

The program title cell displays titles of programs, which have been received during a predetermined time in association with a predetermined channel. For example, the program title cell may display program title information.

The time list provides reference time information indicating a program reception time. For example, the time list may be configured in units of seconds, minutes, or hours. The EPG displayed on a single screen (i.e., a single OSD) may display program information during a predetermined time.

The current time cell indicates a current time, and indicates current date- and time-information.

The current time indicator is an indicator for indicating a current time on the time list. A program of a cell located at a time zone indicated by the current time indicator can be currently displayed. Either a reserved viewing or a reserved recording of a program of a cell located at a time list zone after the current time indicator can be made available. In this case, prior to a time reserved for the viewing or the recording, the current time indicator may inform the user of a function setup method using the OSD, and may query the user whether to execute the function using the OSD.

A function key for receiving a signal from a user who selects a function capable of being provided will hereinafter be described. For the convenience of description, the function key will hereinafter be referred to as a user interface unit. If the user's selection signal is entered by the function key, a controller controls this entry user's selection signal.

The user can select a variety of input types using an input-type selection menu, for example, a TV broadcast signal, an audio broadcast signal, a data broadcast signal, and a software upgrade signal. In this case, the TV broadcast signal may be displayed to identify a satellite signal, a cable signal, and a terrestrial broadcast signal, respectively. Otherwise, the TV broadcast signal may be displayed as only a TV broadcast signal irrespective of broadcast types. In other words, if the user selects a TV broadcast signal as an input type, the EPG outputs program information received as the TV broadcast signal. If the user selects a data broadcast signal as an input type, the EPG outputs program information received as the data broadcast signal.

The mode selection menu allows the user to freely select a desired one from among a plurality of embodiment modes based on various EPG output formats. In other words, by the mode selection menu, the EPG display mode is changed among grid type, 8-days type, now-and-next type, and single type methods. For example, if the user selects the single-type EPG using the mode-selection menu while the EPG is being displayed in the grid type, the EPG is displayed in the single type.

Also, a program title and a visual indicator are simultaneously displayed on either the EPG display window or a program title cell, so that the visual indicator may inform the user whether a predetermined functions is established or not.

The visual indicator for indicating the above-mentioned established function or program characteristics can be implemented in the form of all kinds of formats. The visual indicator must be distinguished from other indicators in order to be easily recognized by the user. Namely, provided that several indicators can be distinguished in color whereas they have the same shape, they may be used as different function setup indicators and may also be implemented in other shapes as necessary.

In this case, a variety of function setup indicators can be displayed according to this embodiment, for example, a reserved-viewing indicator (See "Reminder icon" in drawings), a reserved-recording indicator (See "Record icon" in drawings), and a recording-status indicator.

A variety of indicators can be displayed to indicate a program character or program characteristics, for example, a pay-per-view (PPV) indicator, a series-program indicator, and a program-viewable age, and a preferred-channel indicator. The above-mentioned indicators have been disclosed for only illustrative purposes, are designed to indicate program's characteristics, and are displayed as visual icons on the EPG.

An input-type icon for visually indicating the input type can be used, and a channel logo for visually identifying channels of a channel list can be displayed.

The above-mentioned description may also be applied to the following other EPG display formats.

FIG. 29 shows an output format of an Electronic Program Guide (EPG) according to another embodiment of the present invention.

Referring to FIG. 29, the EPG provides program information for 1 day, and also provides much more program information for several days. In this case, if the user sequentially moves the time list of FIG. 28, he or she can view all of the program information of the several days. However, the user must directly scroll the time list until a time zone of a desired date is displayed.

Therefore, in order to effectively control the above-mentioned operation, the EPG can be displayed in the 8-days type (hereinafter referred to as "8-days type EPG"). Namely, when the receiver receives program information, stores the received program information, configures the stored program information in the form of an EPG, displays it on the screen, program information of several days may be configured in the form of a single EPG. According to this embodiment, it is assumed that program information of 8 days is displayed. However, it should be noted that 8 days have been disclosed for only illustrative purposes, and one or more days can also be used in this embodiment. For the convenience of description and better understanding of the present invention, it is assumed that the several days are set to 8 days.

The 8-days type enables a user to select channel information, time information, program title information, and several days provided from the EPG. Namely, a date tap for 8 days is displayed on the grid-type EPG. So, if the user selects a desired date, a time zone moves to program information of the selected date.

The above-mentioned date tap enables the user to identify several days provided from the EPG, so that the user can select a desired day using the date tap. It should be noted that there is no limitation in identification contents of the date tap. For example, the date tap can be identified in different ways, for example, "Today 10 Apr", "Wed 11 Apr", "Thur 12 Apr", "Fri 13 Apr", "Sat 14 Apr", "Sun 15 Apr", "Mon 16 Apr", "Tues 17 Apr", as shown in FIG. 29.

In this case, if user-desired program information is tomorrow's program information, the user needs to select the date tap of "Wed 11 Apr". For another example, the above-mentioned date tap may be implemented in "today", "tomorrow", or "the day after tomorrow" format or other formats "1, 2, 3 . . .", instead of directly indicating the date. In this way, the date tap can be implemented with all kinds of user-distinguishable types.

A method for implementing the EPG display format is as follows. A broadcast receiver receives electronic program information, stores the received electronic program information, and displays program information, channel information, and time information on the screen. If a user moves a cursor, and selects a current-date-zone tap and other-date-zone tap, program information of the selected date zone is displayed.

Figure 30:
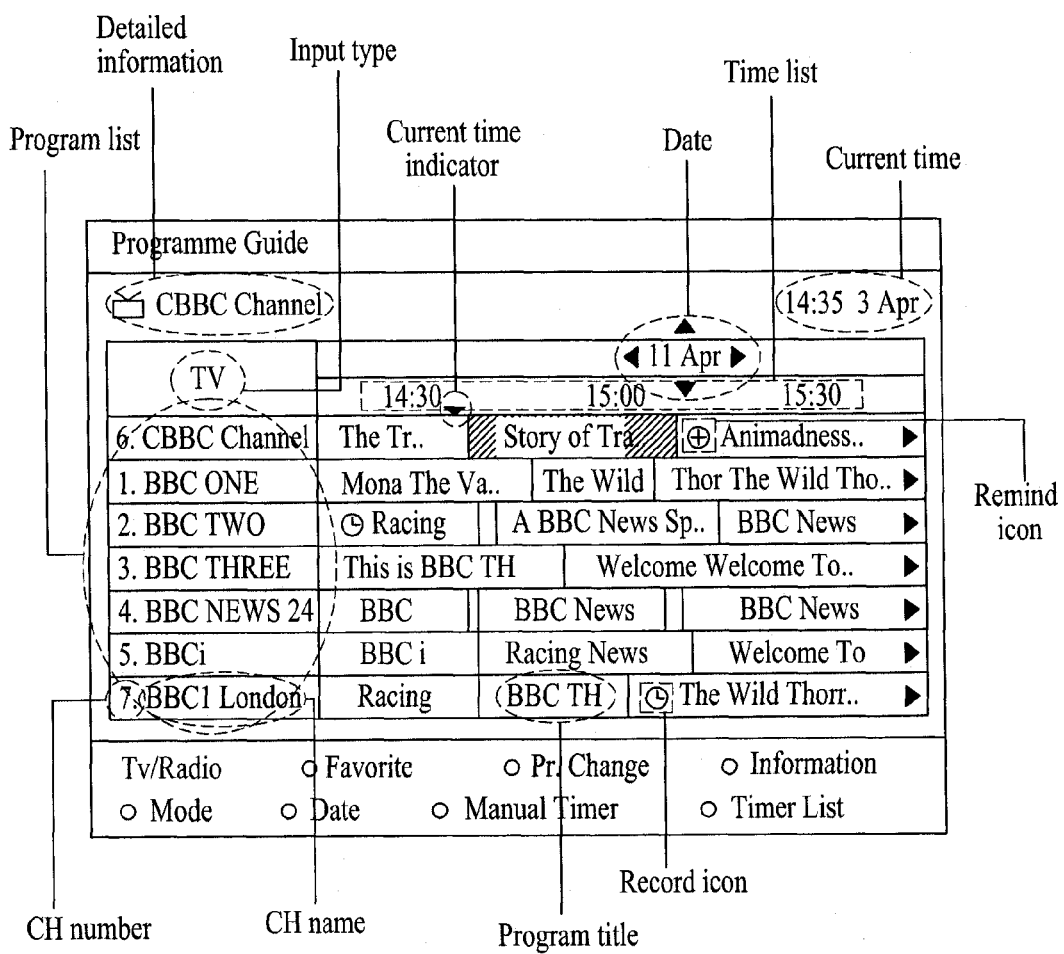
FIG. 30 shows another output format of an Electronic Program Guide (EPG) according to another embodiment of the present invention.

FIG. 30 shows another output format of an Electronic Program Guide (EPG) according to another embodiment of the present invention.

In more detail, FIG. 30 shows an EPG display format which enables a user to easily select a time zone of a desired date, in a similar way to the above-mentioned EPG display format of FIG. 29.

Referring to FIG. 30, the date cell of FIG. 28 includes at least one of a scroll key, right and left keys, and up and down keys. In this case, the user may move a cursor using the scroll key, so that the date area may be shifted.

In a method for implementing the EPG display format, the broadcast receiver receives electronic program information, stores the received electronic program information, and displays program information, channel information, and time information on the screen. If the user moves a cursor to another location so that the date zone is changed, the broadcast receiver outputs program information of the changed date zone.

FIG. 31 shows another output format of an Electronic Program Guide (EPG) according to another embodiment of the present invention.

Referring to FIG. 31, channel information and time information are configured in the form of a two-dimensional shape. A broadcast receiver displays program information on the EPG. In FIG. 31, a time axis of the EPG displays a current-receiving program (NOW) and a next-receiving program (NEXT). Therefore, for the convenience of description, this EPG display format is referred to as a "now-and-next type".

The now-and-next type displays title information of programs contained in the current- and next-time zones. The length of a cell indicating the program title is not proportional to the time. In brief, in the case of the now-and-next type, the EPG is displayed in only NOW and NEXT zones, irrespective of a program's duration time.

The above-mentioned EPG display format will hereinafter be described in detail. The broadcast receiver receives electronic program information, stores the received electronic program information, and displays the electronic program information along with channel information and time information on the screen. In this case, the time information does not indicate detailed time information, and indicates the presence or absence of the next program of a current-receiving program.

FIG. 32 shows another output format of an Electronic Program Guide (EPG) according to another embodiment of the present invention.

Referring to FIG. 32, channel information and time information are configured in the form of a two-dimensional shape. The EPG displays program information, and displays information of only one channel. Namely, differently from the grid-type EPG for displaying program information of several channels, the EPG of FIG. 32 displays information of only one channel. For the convenience of description, this EPG of FIG. 32 is called a single-type EPG.

A channel map for enabling a user to select several channels is displayed. If the user selects a single channel, the EPG displays only 1-channel program information from among an overall time zone, the user moves a cursor to No. 7 channel, only No. 7 channel's program information from among a total time zone is displayed.

In this case, if the user moves a cursor on the grid-type EPG display format of FIG. 28, and selects a specific program title, the single-type EPG may be displayed in a channel including the selected program.

In a method for implementing the above-mentioned single-type EPG of FIG. 32, the broadcast receiver receives electronic program information, stores the received electronic program information, displays the program information along with channel information and program title information on the screen. In this case, if the user selects one of the displayed program titles using the cursor, a single-channel format EPG, which includes the row or column of a sequential program list including the selected title, is displayed.

In this case, the horizontal axis and the vertical axis of a 2-dimensional (2D) shape may be a time area and a channel area, respectively. In this case, the horizontal axis or the vertical axis may be changed according to a screen ratio. For example, in the case of a broadcast receiver equipped with a display on which a vertical length is longer than horizontal axis, the vertical axis may be set to the channel area, and the horizontal axis may be set to the time area. In this embodiment, data of a display including a larger-sized time area may be displayed on a single screen.

The above-mentioned embodiment has been disclosed for only illustrative purposes, the opposite embodiments can also be made available. Namely, in the above-mentioned embodiment, a single channel area becomes longer, detailed program title information of a program assigned to a predetermined time area may be displayed on a single screen.

Figure 33A:
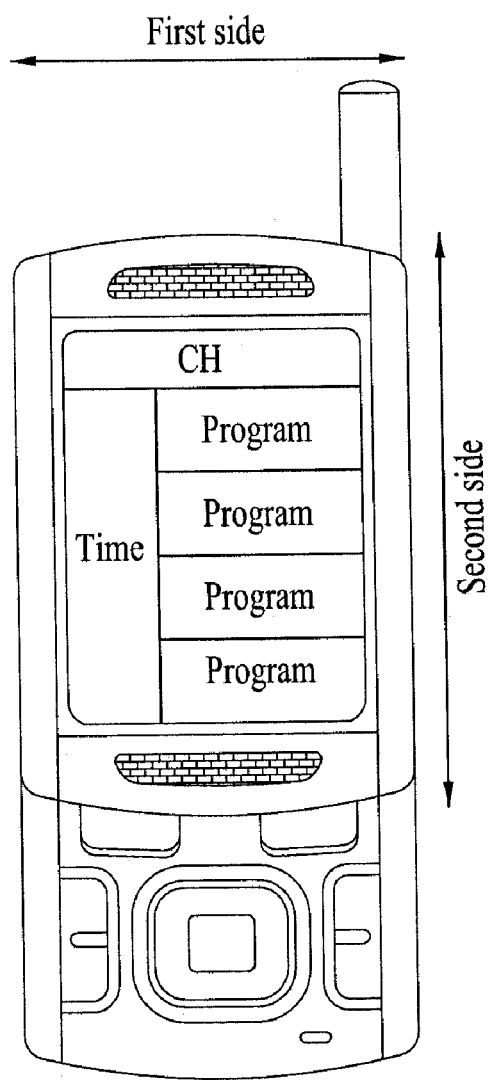
FIG. 33A and FIG. 33B show two-dimensional pivot functions according to an embodiment of the present invention.
Figure 33B:
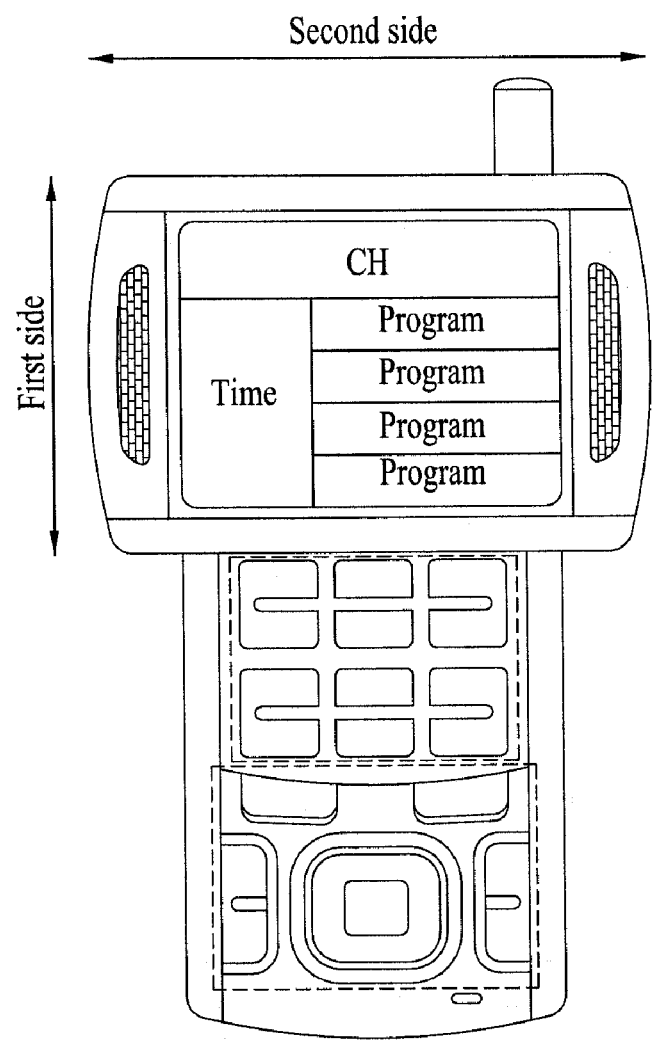

If a pivot function is executed in the above-mentioned 2D structure, the row and column are changeable as shown in FIG. 33A and FIG. 33B, so that the horizontal and vertical areas can be configured.

FIG. 33A and FIG. 33B show two-dimensional pivot functions according to an embodiment of the present invention.

Referring to FIG. 33A, the horizontal axis is set to a single channel area, and the vertical axis is set to a time area, so that program information of a long time area is displayed on a single screen. In this case, if title information of the program becomes longer, the long title information is not displayed on the screen, and the user must scroll the screen using a scroll- or direction-key. In this case, during the display time of a short time area, the user may desire to output program title information on a single screen. In this case, the pivot function may be executed, so that the vertical-and horizontal-configurations are rotated on the basis of a predetermined axis, so that the horizontal and vertical screen configurations are changed. Namely, referring to FIG. 33, a first side and a second side may be a channel area and a time area, respectively. The channel area and the time area are rotated on the basis of a predetermined axis, and the first and second sides are differently configured, such that the EPG screen display can be controlled. In this case, if the pivot function of the first and second sides is executed, the first-side's area and the second-side's area are maintained but the ratio of the first side to the second side may be changed to another ratio. And, another embodiment in which not only the length ratio but also the first=and second-sides' areas area are changed, can also be made available.

Referring to FIG. 33B, the first-side's screen configuration and the second-side's screen configuration on the EPG display format of FIG. 33A are changed to others, such that that the first-side's area configuration and the second-side's area configuration are changed to other configurations.

The first side of FIG. 33A has been assigned to a channel area, and the second side of FIG. 33A has been assigned to a time area, such that program information has been displayed. In FIG. 33B, the second side is assigned to a channel area, and the first side is assigned to the time area, so that program title information of a longer area is displayed on a single screen.

Figure 34A:
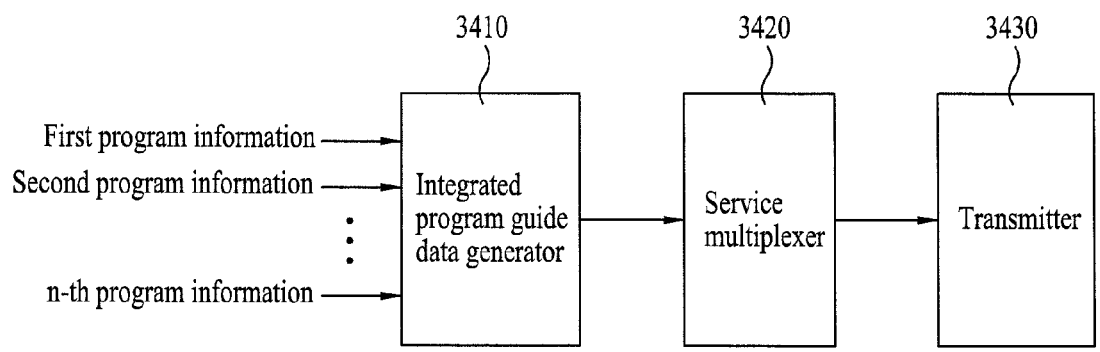
FIG. 34A is a block diagram illustrating a program information transmission system according to the present invention.

FIG. 34A is a block diagram illustrating a transmission system for collecting electronic program information, generating integrated program guide data, processing the integrated program guide data as in mobile service data, and transmitting the processed result.

Referring to FIG. 34A, a program information transmission system according to the present invention includes an integrated program guide data generator 3410, a service multiplexer 3420, and a transmitter 3430.

The integrated program guide data generator 3410 receives electronic program information associated with mobile service data from at least one mobile service data provider, and generates integrated program guide data. The service multiplexer 3420 multiplexes the integrated program guide data. The transmitter 3430 receives integrated program guide data multiplexed by the service multiplexer 3420, and performs mobile transmission of the received data.

An embodiment for generating and transmitting the integrated program guide according to the present invention stores program information of several mobile service data, generates integrated program guide data as the stored program information, and transmits the integrated program guide data. At the above step of transmitting the integrated program guide data, the integrated program guide data may be transmitted from the service multiplexer 3420 to the reception end, or may also be transmitted from the transmitter end 3430 to the reception end.

Program information units of transmission (Tx) programs of several broadcast stations are integrated, and the integrated program guide formed as a single program guide may be transmitted to the reception end. In this case, the reception end collects program information over several channels, extracts the integrated program guide data without integrating the collected program information into a single program guide, and outputs the extracted data.

The integrated program guide data may include broadcast station information, channel information, program information, etc. For example, the broadcast station information may be a broadcast station name, a broadcast station unique number, etc. For example, the channel information may be a channel number, a channel name, etc. For example, the program information may be a program title, a time, a period, a detailed description, etc. The integrated program guide data may include all the information contained in the above-mentioned program guide output formats.

The integrated program guide data generator 3410 receives program information from at least one mobile service data provider (e.g., several broadcast stations).

The integrated program guide data generator 3410 receives program information from a mobile service data provider for transmitting mobile service data in different ways, such that it may generate the integrated program guide. For example, the integrated program guide data generator 3410 receives program information from a mobile communication provider, a mobile service data provider, a wireless Internet provider, a satellite service provider, etc., such that it may generate the integrated program guide data.

In this case, the integrated program guide data generator 3410 can receive program information from the mobile service data provider using all kinds of methods capable of receiving data, e.g., E-mail service and a postal service.

The integrated program guide data generator 3410 may generate integrated program guide data according to the descriptions of FIG. 25 to FIG. 33.

The service multiplexer 3420 is based on the multiplexing method of FIG. 1 and FIG. 2. In this case, the integrated program guide data may be equal to mobile service data of FIG. 1 or FIG. 2, or may be multiplexed with PSI/PSIP information of mobile service data.

The transmitter 3430 is based on the transmitter of FIG. 3 or FIG. 4. Namely, mobile service data packet in which the integrated program guide data is multiplexed is transmitted by the transmission system.

The transmitter 3430 may transmit mobile service data including the integrated program guide data over an additional channel, or may assign an additional PID and transmit the mobile service data via the assigned PID.

Figure 34B:
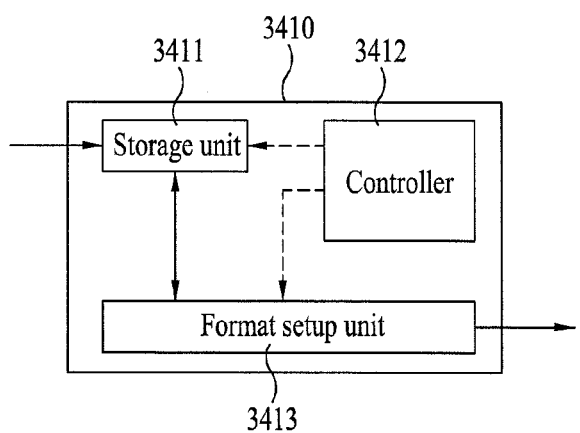
FIG. 34B is a block diagram illustrating an integrated program guide data generator for a program information transmission system according to the present invention.

FIG. 34B is a block diagram illustrating the integrated program guide data generator 3410 according to the present invention.

Referring to FIG. 34B, the integrated program guide data generator 3410 includes a storage unit 3411, a format setup unit 3413, and a controller 3412. The storage unit 3411 stores the collected first program information ~the N-th program information. The format setup unit 3413 integrates the stored program information, and generates the integrated program guide data. The controller 3412 controls the storage unit 3411 and the format setup unit 3413, and controls generation of the integrated program guide data.

The format setup unit 3413 generates a data format of the integrated program guide, and establishes a transmission format.

A method for controlling the storing of mobile service data will hereinafter be described.

There are a variety of methods for storing mobile service data, for example, an immediate-record mode and a reserved-record mode. During the immediate-record mode, currently-received mobile service data is stored. During the reserved-record mode, mobile service data to be received after the current time is stored.

At the immediate-record mode, the recording of the currently-received mobile service data is established. Although the record beginning time point is set to a time before the current time, the immediate-record mode is established.

There are a variety of methods for controlling the storing of mobile service data, for example, a record setup method on a program guide, a method for allowing the user to directly enter a record object and a record time on the manual, and an one-touch recording method. By this one-touch recording method, currently-displayed mobile service data is recorded by a single integrated signal.

For the convenience of description and better understanding of the present invention, the term "mobile service data" has the same meaning as that of the term "program". Namely, it should be noted that the term "program" includes all kinds of data contained in the mobile service data.

In the present invention, the storing of the mobile service data is referred to as "Record".

Figure 35A:
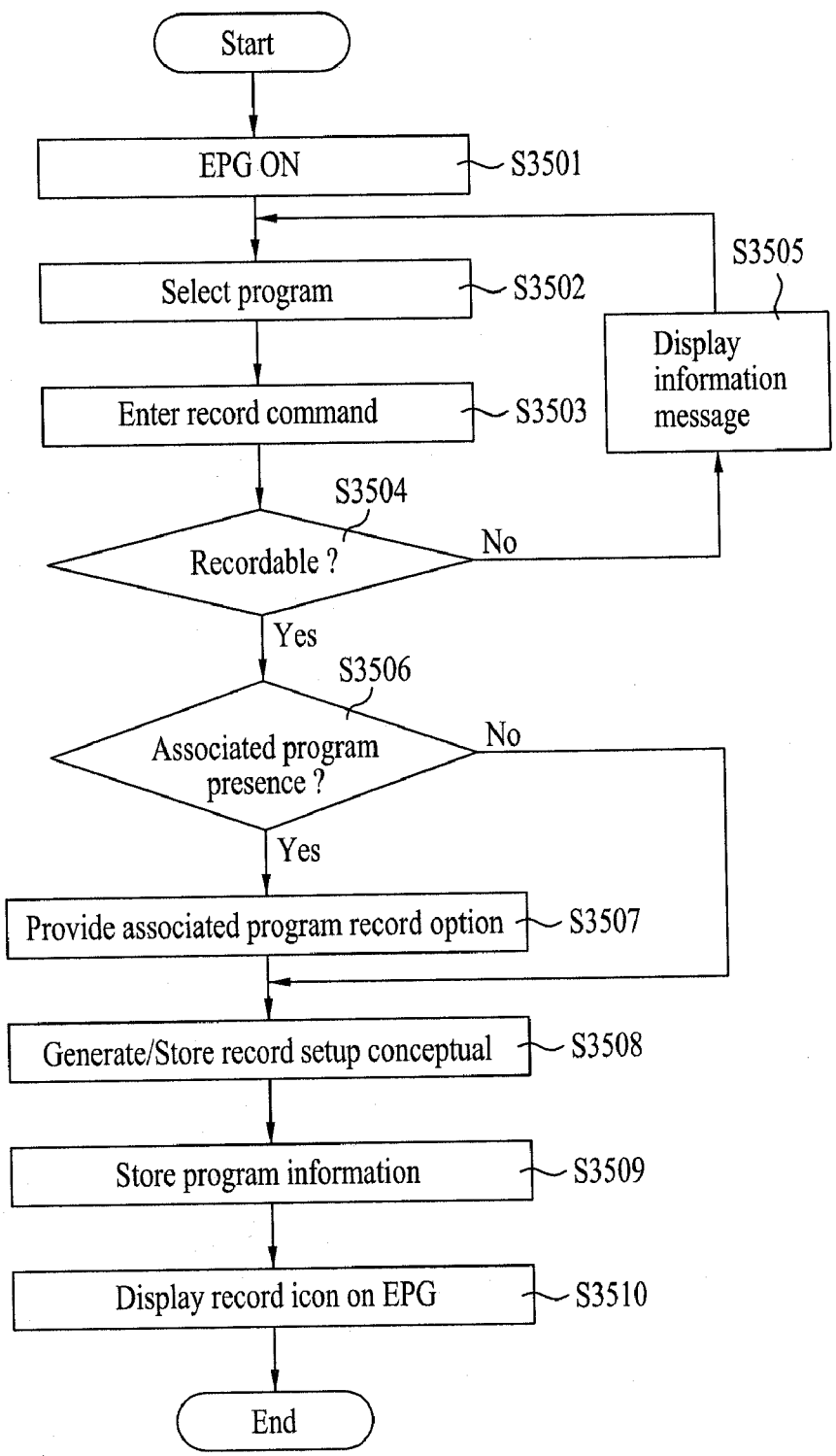
FIG. 35A is a flow chart illustrating a method for establishing a storing of mobile service data according to the present invention.

FIG. 35A is a flow chart illustrating a method for establishing a storing of mobile service data according to the present invention.

The storing setup method for mobile service data displays a program guide of the mobile service data, receives a selection signal of a program to be recorded on the displayed program guide, and establishes the recording of the selected program.

If the program guide output of mobile service data is requested, the program guide is displayed on the screen.

The output process and the output format of the program guide have been disclosed in FIG. 25 to FIG. 33B.

At the step for receiving the program selection signal on the program guide, information specifying a predetermined program is selected by the user on the program guide. The specifying information of the predetermined program may be all kinds of information capable of specifying a program to be stored, for example, a title, a reception (Rx) channel, time information, and a program unique number.

In this case, the selection signal can be entered in various ways. For example, if a cursor moves to a program title cell on the program guide, and a corresponding program title cell is highlighted, this condition may be considered that the selection signal has been entered. If a function selection key of a predetermined program title has been entered, this condition may be considered that the selection signal has been entered.

At the record setup step of the selected program, the record is established using the specifying information of the selected program. In this case, the program-specifying information is a program title, program Rx-channel information, and time information. The time information may be start time and end time information, start time information and duration time information.

The aforementioned record setup method will hereinafter be described with reference to FIG. 35A.

If a program guide is displayed at step S3501, the user selects a program title to be recorded on the program guide at step S3502. And, the user selects a record command for the selected program at step S3503.

In this case, if the user selects currently-received broadcast data, this operation corresponds to the immediate-record mode. If the user selects the following Rx broadcast data after the current time, this operation corresponds to the reserved-record mode.

The record-command input method may be implemented in various ways. If the user selects a desired program title, a record command may be automatically entered, or a record-command selection key is displayed. So, if the record command or the selection key is selected, the reception system determines whether the program can be recorded at step S3504.

If the program can be recorded, the reception system goes to the next step. If the program cannot be recorded, the reception system displays an information message at step S3505.

For example, the reception system determines the presence or absence of a predetermined record program. Namely, the reception system determines whether the record time overlaps with that of another program which has already been determined as a record program. In the case of the overlapped record setup, the system outputs an information message for indicating a non-recordable status. Otherwise, if the same program exists in another time zone, associated information message may be displayed. If associated program exists instead of the same program, an information message is displayed, so that the system can perform the reserved recording.

The system determines a storage space. If the space less than a predetermined amount remains in the storage space, a warning message may be displayed. If the reserved recording is established, and the space for storing the reserved-record setup program is insufficient, the system may display an information message for indicating a non-recordable status. In this case, the space for storing the program is determined by a quality and duration of the received mobile service data. In this case, for example, provided that the received mobile service data can be stored in the storage space on the condition that the quality of the program to be recorded has been reduced from "HD" grade to "SD" grade, the system displays an information message indicating the above-mentioned situation. In this case, the system may display a user interface (UI) for receiving an image-quality adjusting signal.

If the record command is entered, the system determines the presence or absence of a program associated with the selected program at step S3506.

The above-mentioned program associated with the selected program is a series of the same-category programs, a multi-program, and a recommended program. In the multi-program, the same programs are separated from each other and then received. The recommended program is displayed along with the selected program. In addition to the above-mentioned examples, associated program includes all the programs associated with the selected program.

If the presence of the associated program is decided, the system provides the record option of the associated program at step S3507. Namely, as the associated-program record option, the system may display the user interface (UI) for allowing the user to select the recording of the associated program.

By the user interface (UI), the user can set the associated program to an object to be recorded.

If there is no associated program, the system generates program-specifying information of the selected program after the user has decided whether to record the associated program, and stores the program-specifying information at step S3508. The program-specifying information may be program-reception-channel information and program-reception-time information. The time information may be start and end time information, or start time information and duration time information.

In this case, besides the program-specifying information, program-associated information may be established at step S3509. For example, title information, genre information, rating information, and synopsis information may be established at step S3509.

If the record setup is completed, the system displays a specific status indicating whether the record is established on the program guide at step S3510. In this case, the record setup On/Off status may be represented by visual indicators. The visual indicators are differently represented according to the recording setup information, e.g., the independent recording, the series recording, and the repeat-period setup.

Figure 35B:
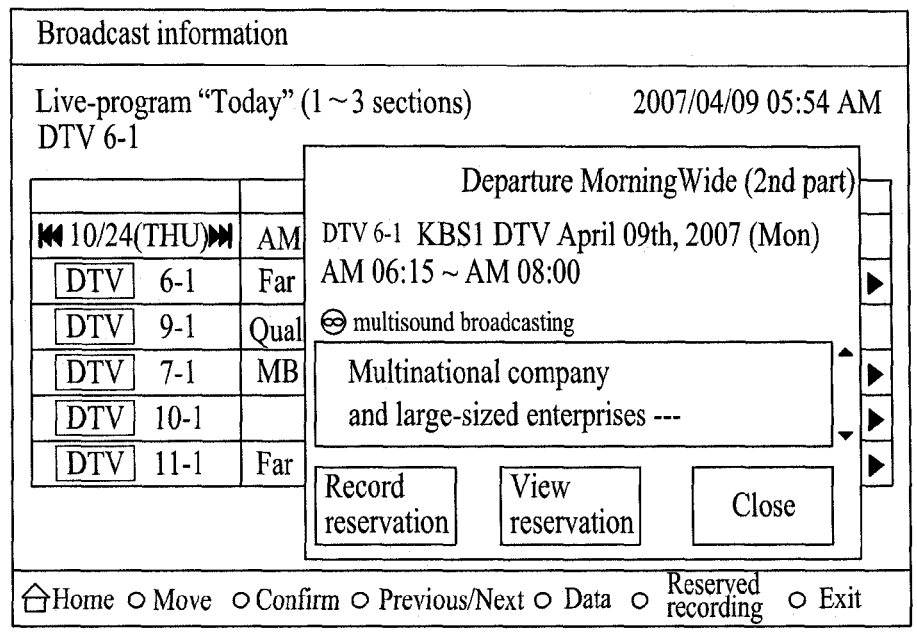
FIG. 35B shows an exemplary record setup image displayed on a program guide according to the present invention.

FIG. 35B shows an exemplary record setup image displayed on a program guide according to the present invention.

Figure 36A:
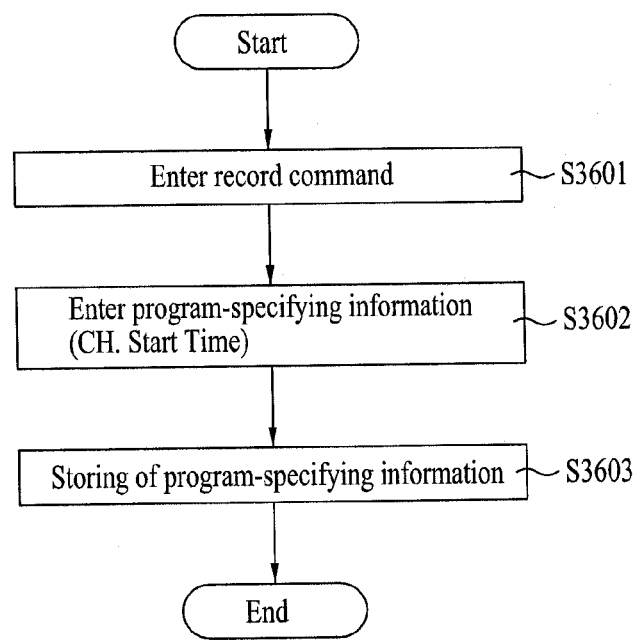
FIG. 36A is a flow chart illustrating a method for establishing the storing of mobile service data according to another embodiment of the present invention.

FIG. 36A is a flow chart illustrating a method for establishing the storing of mobile service data according to another embodiment of the present invention.

The storing setup method for the mobile service data receives a manual-record setup command, receives program-specifying information, and stores the program-specifying information.

At the step of receiving the manual-record setup command, the system outputs a record-function window for setting the record function at step S3601.

Upon receiving the manual-record setup command, the system outputs a user interface (UI) for entering a user signal. By the user interface (UI), the user can enter the program-specifying information at step S3602.

The program-specifying information may be a program title, a program unique number, program Rx channel information, time information, etc. In this case, the time information may be start time information and end time information, or start time information and duration time information.

The program-specifying information may be entered by a character input board, a touchscreen, a video keyboard, or a remote-controller. Besides, all kinds of methods for allowing the user to enter a signal in the receiver can also be made available for the present invention.

The system stores the specified information, so that it completes the record setup process at step S3603.

FIG. 36B shows another record setup image displayed on a program guide according to another embodiment of the present invention.

Figure 37A:
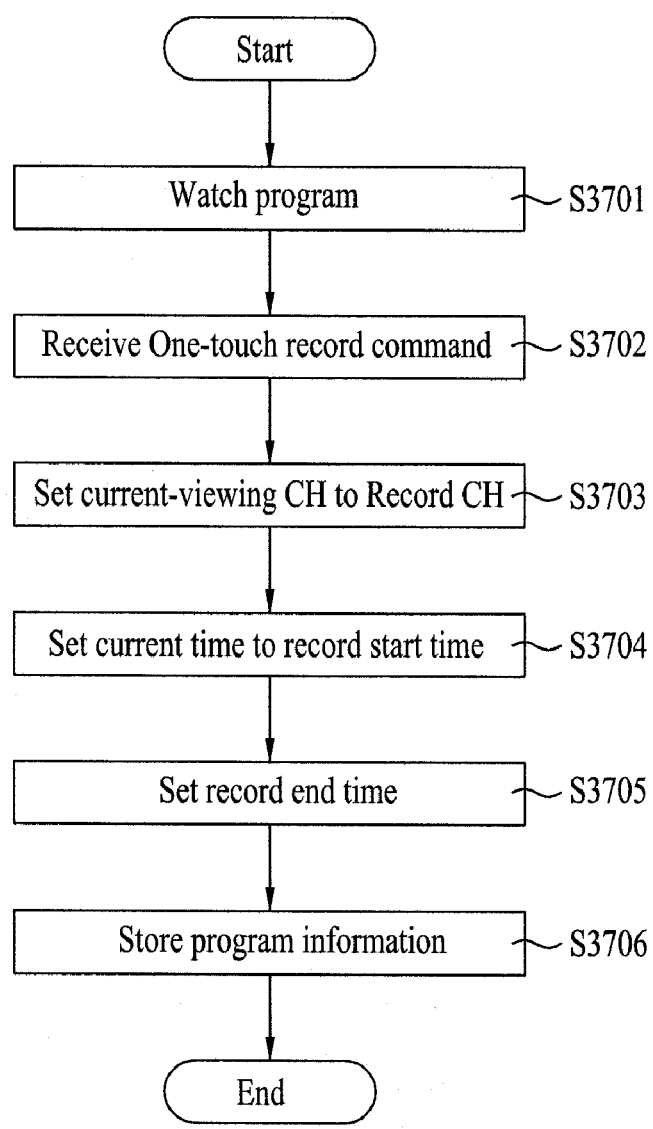
FIG. 37A is a flow chart illustrating a method for establishing the storing of mobile service data according to another embodiment of the present invention.

FIG. 37A is a flow chart illustrating a method for establishing the storing of mobile service data according to another embodiment of the present invention.

The storing setup method for the mobile service data receives a one-touch record command while a user views a program, specifies the program currently provided to the user, and stores the program-specifying information.

While displaying the current Rx program at step S3701, the one-touch record command is entered at step S3702.

The one-touch recording is used to record a current output program when the user selects the record function once.

If the one-touch record command is entered, the current-viewed program is specified.

Therefore, the user can record the record function by entering the key signal once. The system serving as the broadcast receiver can store the currently-viewed program as a record object. The program-specifying information may be a program title, a program unique number, program Rx channel information, and time information. In this case, the time information may be start time information and end time information, or start time information and duration time information.

A channel including the currently-viewed program is set to the record channel at step S3703.

Time information is also established along with the channel information.

A current time is set to a record start time at step S3704, and a record end time is also set at step S3705.

The record end time may be edited during the recording time. For example, although a predetermined time is set as a default time to a record end time, the user can edit a desired end time during the recording time as necessary. Although the current program end time is set to the record end time, the user can edit a desired end time during the recording time as necessary.

In this case, the record end time may be set to a specific time after the lapse of a predetermined time. The end time of a corresponding program may also be set to a record end time. If required, the record end time may not be established, and the recording may continue until the user's record end time is entered.

In this case, besides the program-specifying information, a variety of program information (e.g., title, genre, rating, and synopsis-information of the program) may also be stored in the system at step S3706.

The record setup concept may be changed to another concept via the setup window of FIG. 36B.

Figure 37B:
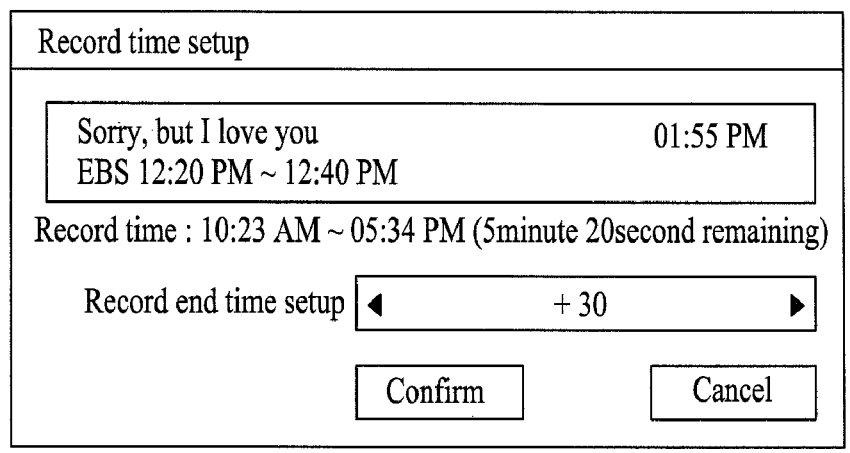
FIG. 37B shows another record setup image displayed on a program guide according to another embodiment of the present invention.

FIG. 37B shows a manual-record setup image displayed on a program guide according to another embodiment of the present invention. For example, the record end time may be selected from . . . −60, −30, −10, 0, +10, +30, +60 . . . by the user.

Figure 38A:
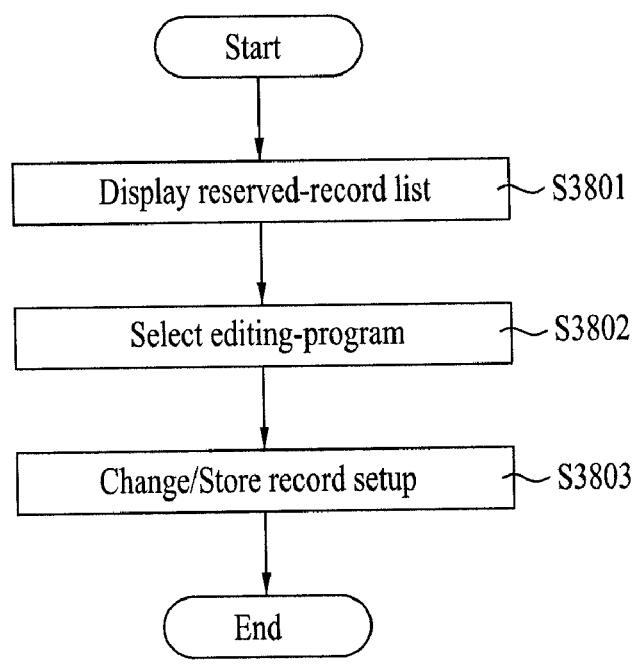
FIG. 38 shows a method for changing a record setup concept of the record setup program according to the present invention.

FIG. 38A is a flow chart illustrating a method for changing the record setup concept of the program of FIG. 35A to FIG. 37A. FIG. 38B shows the display view of the reserved recording list.

Referring to FIG. 38A and FIG. 38B, a method for changing the record setup concept on the reserved-record list will hereinafter be described.

The reception system outputs the reserved-record list at step S3801. The reserved-record list is indicative of the record-object program which has not been completely recorded irrespective of the record time. Namely, the reserved-record list is indicative of a current-recording program or the list of programs to be recorded after the lapse of a current time. If the recording is established on the program guide and the recording for each program title is established, the recording object may be specified as the program title on the reserved-recording list. If the manual-recording is established by the user on the basis of time information, a specific object may be specified as channel information and time information on the reserved-record list.

A signal for selecting the program to be edited is entered on the displayed reserved-record list at step S3802. In this case, the edit-object program is indicative of a record object which is specified by either a program title or channel- and time-information. The record object specified by channel- and time-information may also be specified by the program title.

At the step of receiving the program selection signal, a predetermined program title is selected by the user on the reserved-record list. In this case, the selection signal may be entered in various ways. For example, if a cursor moves to a program title cell on the EPG, and a corresponding program title cell is highlighted, this condition may be considered that the selection signal has been entered. If a function selection key of a predetermined program title has been entered, this condition may be considered that the selection signal has been entered. The above-mentioned examples have been disclosed for only illustrative purposes, and other units for selecting the program to be edited can also be applied to the present invention.

If the record setup concept of the selected program is changed, the reception system stores the changed record setup concept at step S3803.

By the record setup change, the specifying information of the record object is changed. For example, time information of the record-setup object is maintained, but only channel information is changed. For another example, channel information of the record object is maintained, but the time information is changed. Besides, channel information and time information of the record object may be changed.

For another example, the system outputs the user interface (UI) which allows the user to enter a user signal for changing a record setup. By the user interface (UI), the user can change the program-specifying information.

The change of the program-specifying information may be entered by a character input board, a touchscreen, video keyboard, or a remote-controller. Besides, all kinds of methods for allowing the user to enter a signal in the receiver can also be made available for the present invention.

Figure 39:
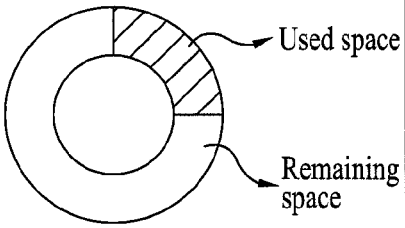
FIG. 39 shows a storage capacity capable of being stored in a storage space according to the present invention.

FIG. 39 shows a storage capacity capable of being stored in a storage space according to the present invention.

Referring to FIG. 39, the reception system (i.e., the receiver) checks a capacity of storage space storing mobile service data, and may inform the user of the checked storage capacity.

In a first embodiment for displaying storable capacity, a total figure indicating a total storage space is divided into a pre-used part and a storable part, so that the pre-used part and the storable part can be visually depicted as shown in FIG. 39. In this case, the figure may be a plane figure or a solid figure, and both of them.

In a second embodiment for displaying storable capacity, a total storage space, the pre-used storage part, or the storage part may be denoted in units of capacity. In this case, the total storable capacity, the pre-used storage space, or the storable capacity can be selectively represented. In this case, in order to allow the user to recognize the storable capacity, a variety of combinations can be used to represent the storage capacity.

In a third embodiment for displaying storable capacity, the total storage space and the storable space can be indicated in units of time. In this case, a time for the total storage space can be selectively indicated. The storable time may be changed to another time according to the record quality. For example, if the image quality is set to "HD" grade, data for 75 hours can be stored. If the image quality is set to "SD" grade, data for 100 hours can be stored. The system outputs the above-mentioned HD and SD recording information, and the user selects a desired recording quality, such that the storage space can be effectively used.

In a fourth embodiment for displaying storable capacity, the total storage space, the pre-used storage space, or the storage space can be denoted by percentages. In this case, the capacity-percentages are combined with each other, the combined result is selectively displayed on the system, such that the user can easily recognize the storable space.

Figure 40:
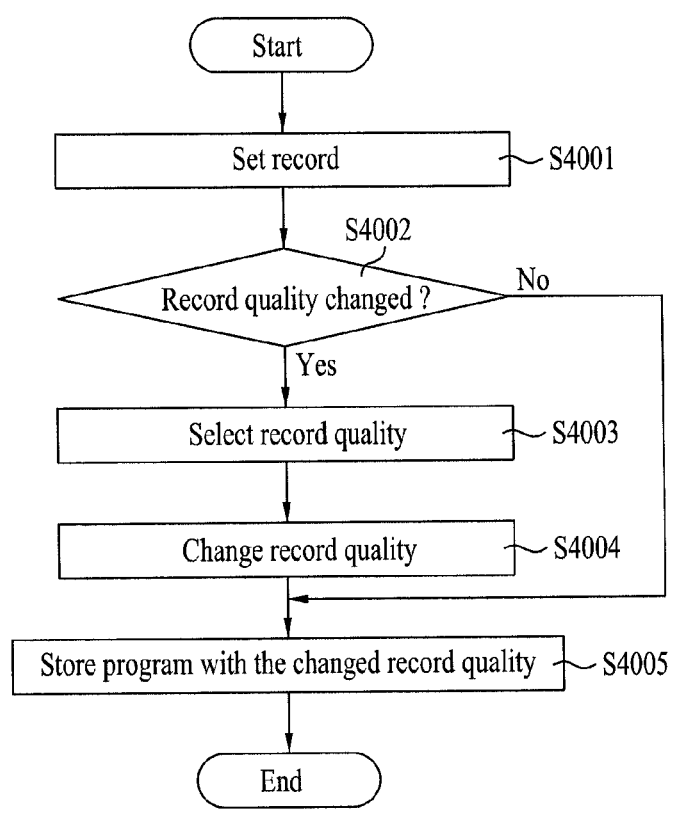
FIG. 40 is a flow chart illustrating a method for changing a record quality of a record setup program according to the present invention.

FIG. 40 is a flow chart illustrating a method for changing a record quality of a record setup program according to the present invention.

Referring to FIG. 40, after the record has been established at step S4001, the system determines whether a recording quality is changed or not at step S4002.

In order to determine whether the recording quality is changed, the system determines whether the user enters a record-quality change selection signal, a record-quality change is pre-established, or a recording space is insufficient.

The user's record-quality change selection signal may be entered by the user interface (UI) for record-quality change selection. In order to effectively use the storage space, the user may select the recording quality.

If the record-quality change is pre-set or pre-established, a current default program to be recorded is not determined by the user, and the record qualities of all programs stored in the receiver are pre-established. This condition is considered to be the pre-setting of the record-quality change.

For example, the record quality may be different in genre, channel, time zone, or specific program information.

In order to change the recording quality to another quality in association with the record space, the system considers the program duration time and the record quality at the record setup mode. If it is determined that the remaining capacity is insufficient, the system outputs a warning message indicating a non-recordable status and cancels the record setup mode. In the case of changing the record quality, if data can be stored in the remaining capacity, the record quality is changed to another quality, so that the data may be stored at the changed record quality.

In addition to the above-mentioned embodiments, the present invention can determine whether an event capable of changing the record quality to another quality exists or not.

If it is determined that the event for changing the record quality has occurred at step S4002, the system changes the record quality to another quality at step S4004.

The system stores the program at the changed record quality at step S4005.

If there is no need to change the record quality, the system stores the record-setup program at step S4005.

Figure 41A:
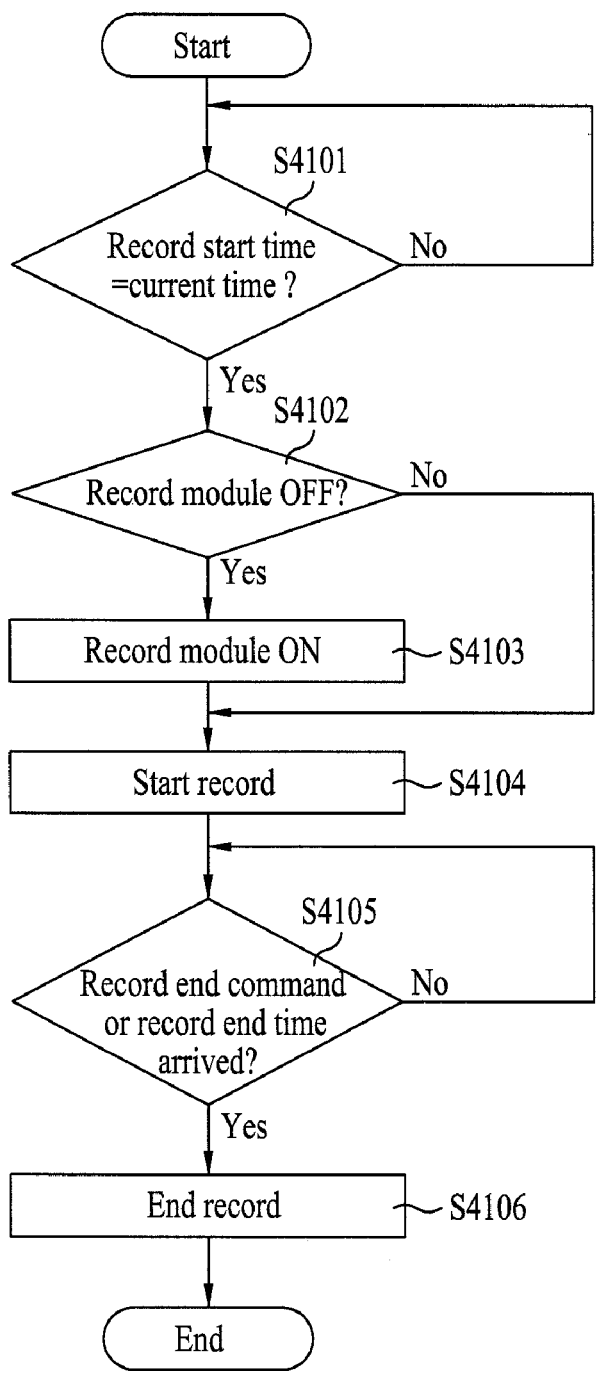
FIG. 41A is a flow chart illustrating a method for recording the record setup program according to the present invention.

FIG. 41A is a flow chart illustrating a method for recording the record setup program according to the present invention.

A method for executing/completing the recording will hereinafter be described with reference to FIG. 41A.

The system compares a record start time with a current time at step S4001, such that it determines whether the recording will begin at the record start time.

If the record start time is set to a specific time after the lapse of the current time, the recording is not executed. If the record start time is earlier than or equal to the current time, the system determines whether the record module is switched off at step S4102.

If it is determined that the record module is switched off, the system starts recording the program at step S4104.

If the record module is switched off, the record module is switched on at step S4103, and starts recording the program at step S4104.

IF the recording begins, a index table for pictures for each program can be generated. By the generation of index table, boundaries of individual pictures to be stored are established. If any index is assigned to each picture, the system can easily move to a specific part when the stored program is reproduced, and a shorter time delay occurs. Also, if any index is assigned to each picture, an X-speed play or X-speed playback (including a quick play mode or a slow play mode) can be easily executed.

The index table may include at least one of picture-type information, frame ID information, and offset information.

The picture-type information may indicate a picture category or a picture type. For example, the picture-type information may be an I-picture, a B-picture, and a P-picture.

The frame ID information may indicate the order of a corresponding picture in all the stored pictures.

The offset information is either a first position of a single stored program file or a distance from a start position of a corresponding segment to a corresponding picture. In this case, the above distance may be indicated by time units, capacity units, physical position information of a storage medium, or logical position information of the storage medium.

The index table includes at least one of "frame_num", "field_pic_flag", "bottom_field_field", "Picture Order Count (POC)", "nal_ref_idc", "IDR identifier", and "Access Unit (AU) delimiter". The "frame_num" indicates a frame number. The "field_pic_flag" indicates whether a picture is a frame picture or a field picture. The "bottom_field_field" indicates whether a field is an upper field or a lower field. The "Picture Order Count (POC)" indicates an output order. The "nal_ref_idc" indicates a reference picture.

While the recording begins and progresses favorably, the record end command may be entered, or the system determines whether a current time reaches the record end time at step S4105.

If the record end command may be entered or the current time reaches the record end time, the recording is terminated at step S4106.

Figure 41B:
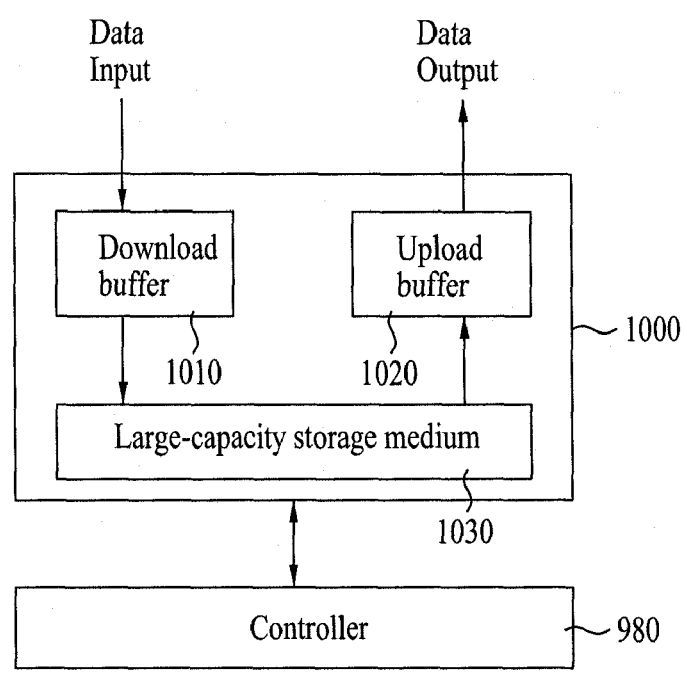
FIG. 41B shows a storage unit according to the present invention.

FIG. 41B shows a storage unit according to the present invention.

Referring to FIG. 41B, the storage unit 1000 includes a download buffer 1010, a large-capacity storage medium 1030, and an upload buffer 1020. The download buffer 1010 temporarily stores input data and then outputs to the large-capacity storage medium 1030. The large-capacity storage medium 1030 stores input data. The upload buffer 1020 temporarily stores data read from the large-capacity storage medium 1030.

In this case, the download buffer 1010 temporarily stores at least one segment, transfers data to the large-capacity storage medium 1030, and stores the data in the large-capacity storage medium 1030.

When reproducing the stored data, the upload buffer 1020 temporarily stores data while the stored data is outputted from the large-capacity storage medium 1030, and outputs the stored data.

If data is temporarily stored in the download buffer 1010 and the upload buffer 1020 during the storing/reproducing time of data, a difference between the Tx/Rx times of data or a difference in speed between Tx/Rx data flows can be compensated.

Figure 42A:
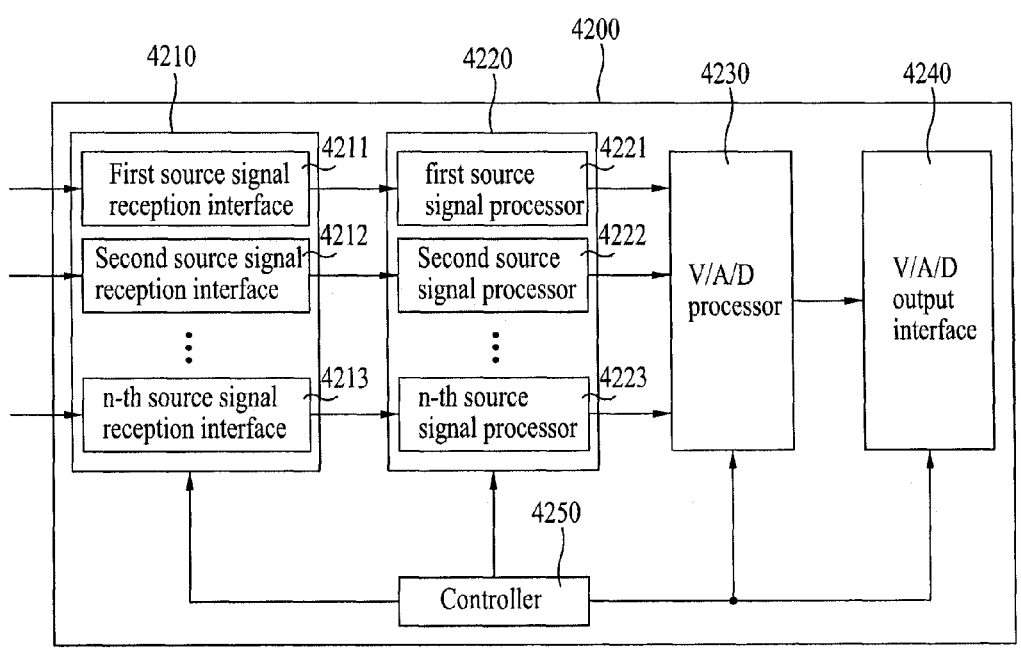
FIG. 42A is a block diagram illustrating an apparatus for receiving data from multi-sources and processing the received data according to the present invention.

FIG. 42A is a block diagram illustrating an apparatus for receiving/processing data from multi-sources according to the present invention.

Referring to FIG. 42A, the multi-source data processing apparatus according to the present invention includes a multi-signal reception interface unit 4210, a multi-source signal processor 4220, a Video/Audio/Data (V/A/D) processor 4230, and a V/A/D output interface unit 4240.

The multi-signal reception interface unit 4210 receives a multi-source signal from multi-sources. The multi-source signal processor 4220 processes the received multi-source signal. The V/A/D processor 4230 separates video, audio, and data signals from the processed multi-source signal, and processes the separated video, audio, and data signals. The V/A/D output interface unit 4240 outputs the video, audio, and data signals to the output unit.

The multi-signal reception interface unit 4210 may include the first source signal reception interface unit the N-th source signal reception interface unit. The multi-source signal may include different kinds of signals. For example, the multi-source signal may be a mobile communication signal, a mobile service data signal, a wireless Internet signal, a satellite broadcast signal, a global positioning signal (GPS) signal, a camera signal, and an external storage device signal, such that the above-mentioned signals of the multi-source signal are received in a single chip, and be processed by the single chip.

In this case, the multi-signal reception interface unit 4210 may directly receive signals, or may receive a signal from a peripheral device, such that the received signals may be processed by the multi-source signal processor 4220.

The multi-source signal processor 4220 processes the multi-source signals received from the multi-source signal reception interface unit 4210, respectively.

In this embodiment of the present invention, it is assumed that a first source signal is a mobile service data signal and a second source signal is a mobile communication signal.

If the multi-source signal processor 4220 receives the mobile service data signal, a transmission end of the first source signal processor performs mobile transmission of the mobile service data signal, such that the inverse-processing of the transmitted mobile service data is performed. Namely, the mobile service data processing of the demodulator of FIG. 22 is applied to the first source signal processor. And, a detailed description of the demodulator of FIG. 22 is shown in FIG. 23 and FIG. 24.

The V/A/D processor 4230 extracts video, audio, and data signals from the output signals of the multi-source signal processor 4220. And, the V/A/D processor 4230 may also perform the output processing of the extracted video, audio, and data signals.

The V/A/D output interface unit 4240 transmits the processed V/A/D signals to the output unit.

Figure 42B:
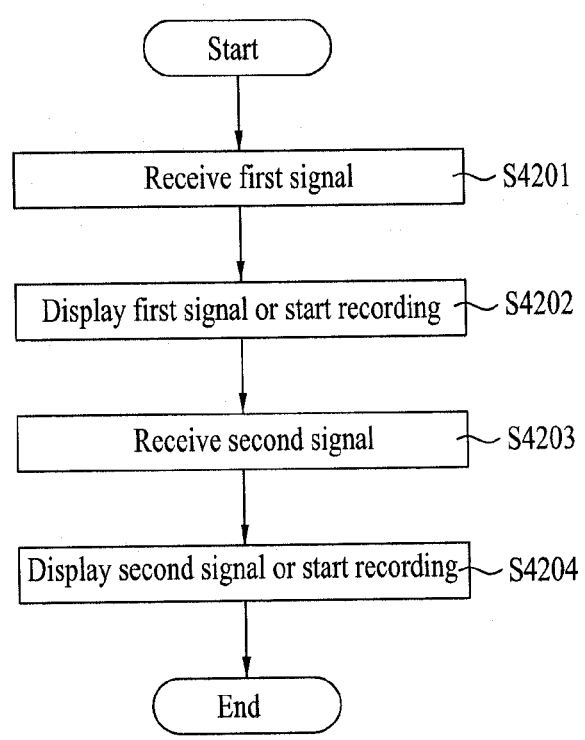
FIG. 42B is a flow chart illustrating a method for controlling the storing of multi-input signals according to the present invention.

FIG. 42B is a flow chart illustrating a method for controlling the storing of multi-input signals according to the present invention.

Referring to FIG. 42B, the reception system receives a first signal at step S4201, starts displaying the first signal at step S4202, receives a second signal at step S4203, and outputs the second signal at step S4204. In this case, the second signal and the first signal may be simultaneously displayed.

The reception system receives a first signal at step S4201, starts displaying the first signal at step S4202, receives a second signal at step S4203, and stores the second signal at step S4204. In this case, the second signal and the first signal may be simultaneously stored and displayed.

The reception system receives a first signal at step S4201, begins to store the first signal at step S4202, receives a second signal at step S4203, and outputs the second signal at step S4204. In this case, the second signal and the first signal may be simultaneously stored and displayed.

The reception system receives a first signal at step S4201, begins to store the first signal at step S4202, receives a second signal at step S4203, and stores the second signal at step S4204. In this case, the second signal and the first signal may be simultaneously stored and displayed.

At least one of the first signal and the second signal may correspond to mobile service data. This mobile service data is formed by the additional coding at a transmission end.

The first signal or the second signal may be a communication signal. For example, a video phone communication signal, or a wireless Internet communication signal may be used as the above communication signal. Namely, the present invention can simultaneously display or store input signals from multi-sources. In this case, the multi-sources may be received in source-input modules. The above-mentioned source input module may be a mobile communication module, a mobile service data Rx module, a wireless Internet module, or a satellite Rx module, etc. These examples have been disclosed for only illustrative purposes, the scope of the present invention may not be limited to only the above-mentioned examples, and can also be applied to other examples as necessary.

In this case, the first signal and the second signal can be simultaneously displayed or stored along with information associated with a corresponding signal.

Figure 42C:
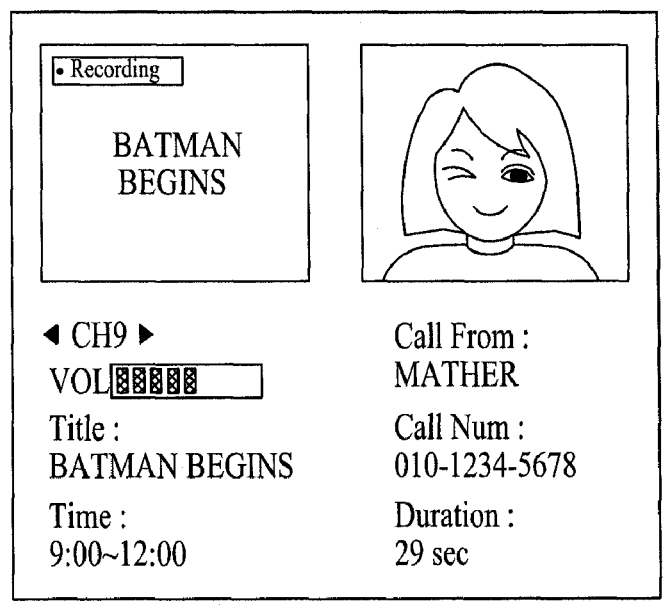
FIG. 42C shows an exemplary image for simultaneously displaying a first signal and a second signal according to the present invention.

FIG. 42C shows an exemplary image for simultaneously displaying a first signal and a second signal according to the present invention.

Referring to FIG. 42C, mobile service data and associated information can be simultaneously displayed, and at the same time a video phone image and its associated information are displayed.

Upon receiving several kinds of signals from multi-sources, the received signals are integrated on a single program guide, so that the integrated program guide for the integrated multi-source signals is displayed. The user can control the displaying or storing of the multi-sources on the integrated program guide.

A method for displaying the integrated program guide for multi-source input signals will hereinafter be described.

Figure 43:
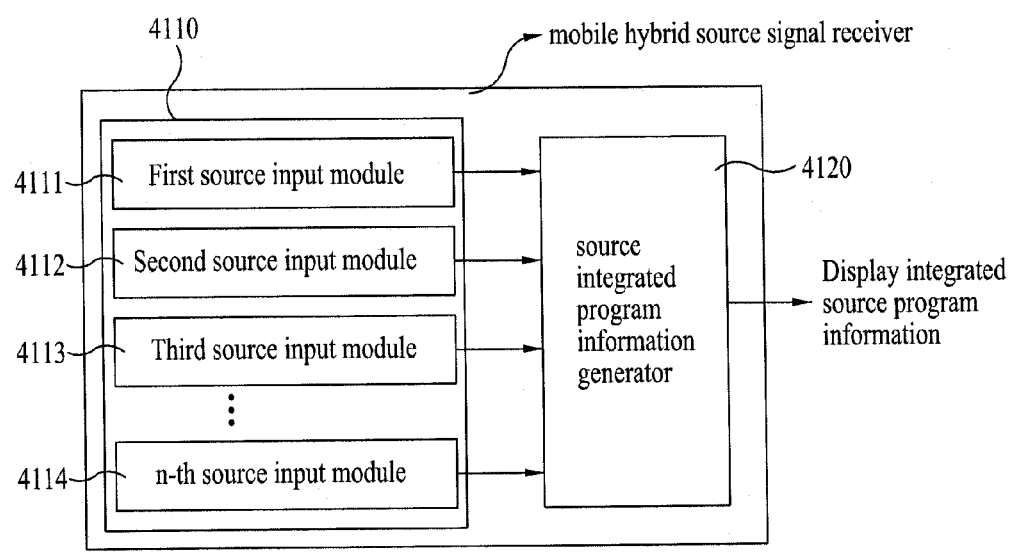
FIG. 43 shows an example of the merging of multi-electronic program information of multi-sources according to the present invention.

FIG. 43 shows an example of the merging of electronic program information of multi-sources according to the present invention.

In FIG. 43, electronic program information of multi-sources received from the mobile service data receiver is merged, so that the merged result is displayed as a single program guide.

The reception system for receiving the hybrid source signal can receive mobile service data over the broadcast network, and can receive a program signal via several input sources (e.g., a satellite network, a mobile Internet network, and mobile communication network). The program information associated with the mobile service data can be received via the several input sources. In this case, if information of Rx-program information received via the several sources is merged so that the merged result is provided on a single program guide, the user can more conveniently select the program.

Referring to FIG. 43, the mobile hybrid source signal receiving unit according to the present invention further includes at least two source input modules and a source-integrated program information generator. The source-integrated program information generator merges at least two source input module with program information received from at least two source input modules, so that it outputs the integrated source program information.

The above-mentioned source input module may be a mobile communication module, a mobile service data Rx module, a wireless Internet module, or a satellite Rx module, etc.

The source input module may be one of a mobile communication module, a mobile service data reception (Rx) module, a wireless Internet module, or a satellite Rx module. These examples have been disclosed for only illustrative purposes, the scope of the present invention may not be limited to only the above-mentioned examples.

The mobile hybrid source signal receiving unit includes a first source input module to an n-th source input module.

The source integrated program information generator 4320 integrates the program information received in the source input module 4310, so that it outputs the integrated source program information.

In this case, the source integrated program information generator 4320 integrates the program information received in the source input module 4310, so that it outputs the integrated source program information.

In this case, the source integrated program information generator 4320 assigns an identifier for identifying a source type to corresponding program information, so that different input signals can be distinguished from each other. Also, source information of the program information is extracted so that a source type can be discriminated.

Figures 44A, 44B:
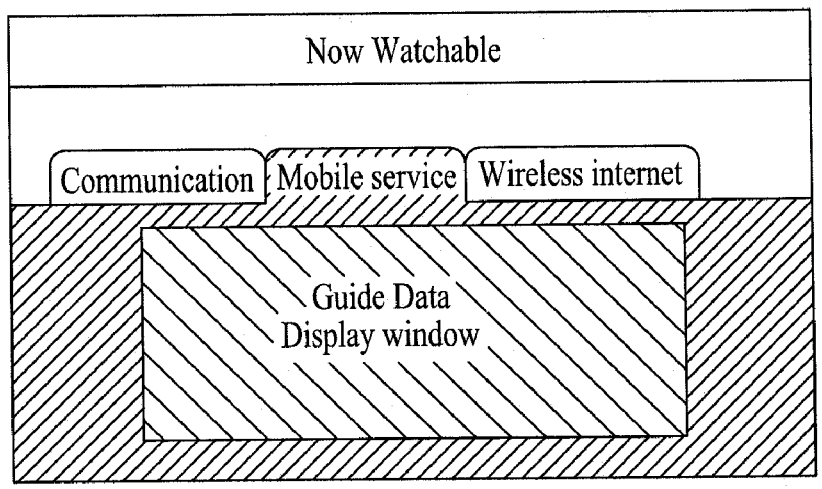
FIG. 44A and FIG. 44B show exemplary output views of integrated source program information according to the present invention.

FIG. 44A and FIG. 44B show output views of the integrated source program information according to the present invention.

Referring to FIG. 44A, in association with currently-received program information, information for identifying a source type and a program list information are displayed. In this case, the display format may be configured in the form of a general program guide.

Referring to FIG. 44B, program information of integrated sources is merged with each other, the merged result is displayed on a single program guide, and only program list information associated with an input source is activated. Namely, if the program information of the single source is displayed, and a user selects other sources, the program information of the selected source is displayed.

FIG. 45 shows an example of the stored list according to the present invention.

Referring to FIG. 45, the list of stored programs (i.e., the stored list) may be displayed on a single UI.

The stored list may indicate the storage space in which the record objects are stored. For example, if the receiver has an internal storage medium and is connected to an external storage medium via a peripheral-device connection interface, the reception system indicates which one of storage mediums includes the stored list.

As can be seen from the stored list, a storage capacity of a storage object is compared with a total storage capacity of the storage medium, and the remaining storage capacity is displayed as shown in FIG. 45.

The stored list may include information of at least one record object. In this case, if all the record objects cannot be displayed on the UI at the same time, they are displayed on different pages. In this case, the page shifting may be executed by a page shift key or a scroll bar.

The stored list includes a record object cell indicating information of at least one record object. Information contained in each record object cell will hereinafter be described.

The record object cell includes identification (ID) information for identifying individual record objects. The ID information may be program title information, storage time area information, image information, or playback status information. The above-mentioned examples of the ID information have been disclosed for only illustrative purposes, and the scope of the ID information of the present invention is not limited to the above-mentioned examples and can also be applied to other examples as necessary.

The record-object cell may include an image information area. The displayed image information may be Rx information or may be generated at the storing mode. The image information may be a still image of an object to be stored, a moving image, or a slideshow-type still image. Each image information may be indicated by a thumbnail image n which a specific frame of video data is represented by a small-sized image less than an original size.

A method for generating the thumbnail image of mobile service data according to the present invention will hereinafter be described.

The record object cell may include record time information. The record time information may indicate a record time. The record time may be indicated by at least one of a date or time.

The record object cell may include record capacity information. In this case, the record capacity may be denoted by capacity units or may be denoted by a record time.

The record object cell may include detailed information of the program. The program detailed information is stored when the received program information is recorded, and is displayed on the record object cell. In this case, the program detailed information may be displayed on the same area as the record object cell, or may also be displayed on another area different from the record object cell. For example, if the object cell to be stored is highlighted, the program detailed information may be displayed on a pop-up window. Otherwise, the display of the stored list is switched off, and a program detailed information window may be displayed on different areas.

The record object cell may include playback status information of the stored program. For example, a first program which has never been reproduced is denoted by 'NEW', a second program which has been completely reproduced is denoted by 'COMPLETE', and a third program which has not been completely reproduced is denoted by 'PART'.

The stored list may include a variety of menu function keys, for example, a play command key or an editing command key of the object program to be stored.

There are a variety of menu functions, for example, playback functions (e.g., a first playback or previous playback), editing functions (e.g., total selection, partial selection, or title change), a move function, a copy function, and a detailed information output function.

A method for generating the thumbnail image according to the present invention will hereinafter be described.

In order to provide the effective concept summary function, the story board, the key-frame generation, the program guide by a video browser, the thumbnail images are used. And, if required, the thumbnail images may be contained in the record object cell of the stored, such that they may be displayed on the stored list.

The thumbnail image is a smaller-sized image of a specific frame of video data. The thumbnail images can be used in various ways. For example, by the thumbnail images, the concept of the recorded program may be summarized into several small-sized pictures, key-frames for the video indexing may be generated, or representative images to be used for the program guide may be generated The method for generating the thumbnail image is classified into a first generation method and a second generation method. According to the first generation method, the coded video frame is decoded, and the decoded video frame is directly reduced. According to the second generation method, a DC value of an I picture is used. The first generation method must decode all the pixels of a corresponding frame, such that it requires a variable-length decoder.

The second generation method does not require the variable-length decoder because the thumbnail images are formed by the DC value of the I-picture, resulting in the implementation of a simplified system structure.

The thumbnail image is a representative small-sized and low-resolution image of an original image, and has implication of all or some parts of video data, such that the user can easily and quickly recognize the concept of the original image. Due to the above-mentioned characteristics of the thumbnail image, a video frame used as the basis of the thumbnail image must not have noise, blank, and overlap part caused by scene transition or shot transition, and must provide the user with correct information of all or some parts of the corresponding video data or frame. Therefore, an unclear image, which is formed by either the camera movement (such as an abrupt zooming) or the blurring of the target object's movement, may not be used as the basis of the thumbnail image.

If the thumbnail image for all I pictures of video data is generated, a large number of thumbnail images are generated, so that the storage medium may have difficulty in storing many thumbnail images. And, when the user searches for his or her desired concept, unnecessary thumbnail images are used, resulting in greater inconvenience of use. The number of thumbnail images displayed on a single screen or a single image is limited, so that it is difficult to effectively implicit or represent all or some parts of video data.

In order to solve the above-mentioned problems, a method for generating a thumbnail image at intervals of a predetermined distance by a user-entered sampling rate may be used.

Besides, a user may decide a specific video section in which a thumbnail image will be formed.

Namely, the thumbnail image may be unconditionally generated for each I picture, or the thumbnail image may be generated at intervals of a predetermined time by a prescribed sampling rate. Besides, the thumbnail image may be generated within the user-defined section.

Figure 46:
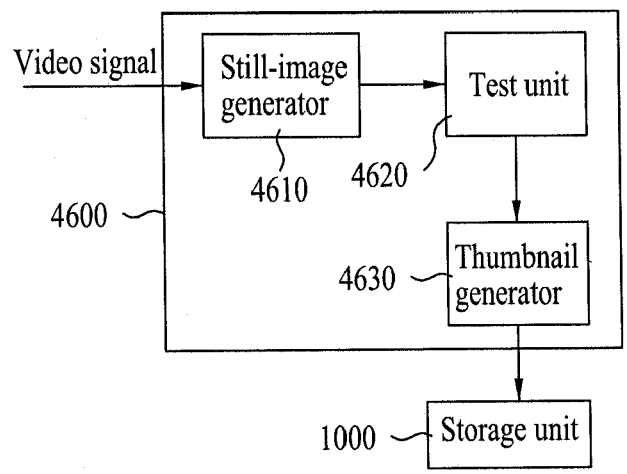
FIG. 46 is a block diagram illustrating a thumbnail image decoder according to the present invention.

FIG. 46 is a block diagram illustrating a thumbnail image decoder according to the present invention.

Referring to FIG. 46, the thumbnail-image decoder 1200 includes a still image generator 5210, a test unit 5220, and a thumbnail generator 5230.

The still image generator 5210 generates either a resized video frame of the received video signal, or a smaller-sized still image of the actual recovery image such as a DC image.

In this case, the thumbnail images may be generated for all I pictures, respectively. The thumbnail images may be generated for the I pictures at intervals of a predetermined time based on a predetermined sampling rate. Otherwise, the thumbnail image for each I picture may be generated in each section.

The test unit 5220 determines whether the small-sized still image formed by the still image generator 5210 can be appropriate for a thumbnail image.

Figure 47:
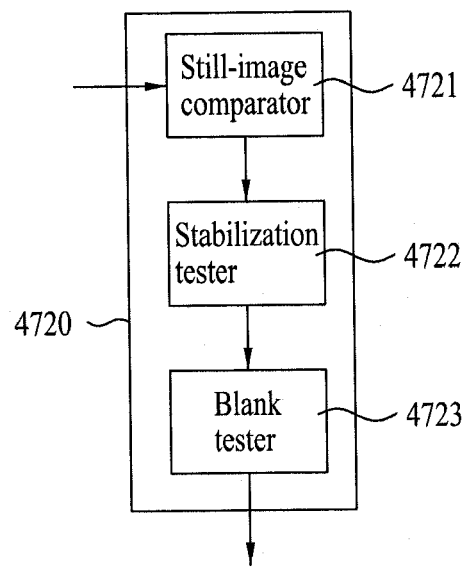
FIG. 47 is a detailed block diagram illustrating a test unit of the thumbnail image decoder according to the present invention.

FIG. 47 is a detailed block diagram illustrating a test unit of the thumbnail image decoder according to the present invention.

The test unit 5220 includes a still-image comparator 5221, a stabilization tester 5222, and a blank tester 5223. The still-image comparator 5221 compares the n-th still image with the (n+1)-th still image. The stabilization tester 5222 determines a stable or unstable status using the comparison result between the two images of the still-image comparator 5221. The blank tester 5223 determines whether an object image is a dark image unrecognizable on the basis of a predetermined value.

In order to determine whether the image is a dark image unrecognizable on the basis of the predetermined value, all pixel values are summed up, an average value of them is calculated, such that the blank tester 5223 compares the average value with a reference value to determine the presence or absence of the dark image.

Figure 48:
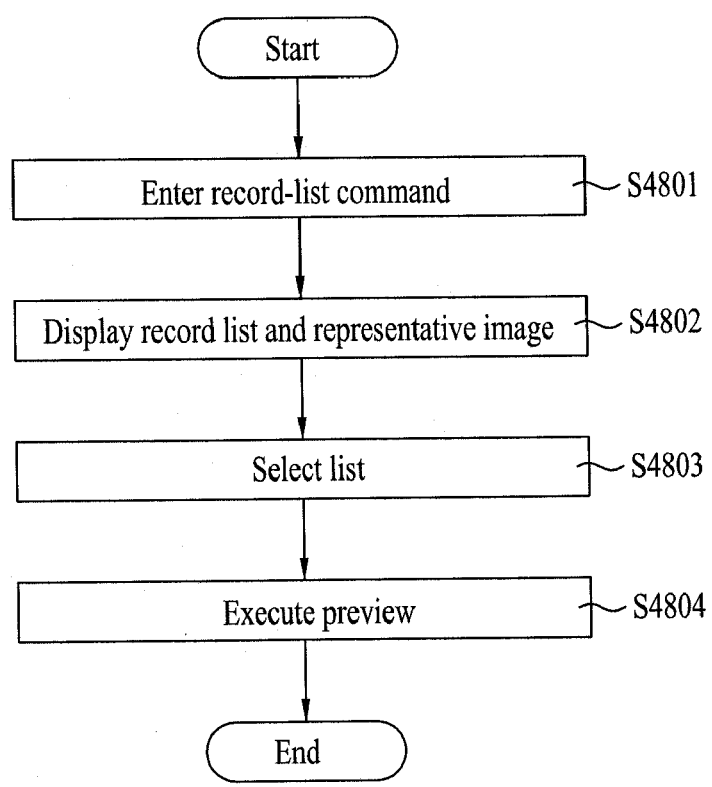
FIG. 48 is a flow chart illustrating a method for executing a preview function on the stored list according to the present invention.

FIG. 48 is a flow chart illustrating a method for executing a preview function on the stored list according to the present invention.

Referring to FIG. 48, according to the preview-function executing method, the reception system outputs the recording list, selects at least one of the recording objects, and performs a preview function of the selected object.

The above output step S5301 of the recording list has already been disclosed in FIG. 45, so that its detailed description will herein be omitted for the convenience of description.

In this case, the record-object cell contained in the recording list may represent the representative image at step S5302. In this case, the representative image may be a thumbnail image of FIG. 46 and FIG. 47, or may be a still image based on a predetermined reference.

At the selecting step S5303 of at least one record object, the record object cell contained in the recording list is activated and selected. In this case, the selection signal may be entered in various ways. For example, if a cursor moves to a program object cell on the program guide, and a corresponding program cell is highlighted, this condition may be considered that the selection signal has been entered. If a function selection key of the record object cell has been entered, this condition may be considered that the selection signal has been entered. And, if the record object cell is highlighted on a touchscreen, this condition may be considered that the selection signal has been entered. However, it should be noted that the above-mentioned examples have been disclosed for only illustrative purposes, but all kinds of units capable of activating the record object cell to be selected can be used in the present invention.

If a predetermined record object cell is selected, the preview function is executed at step S5304. The reception system may display the received preview images, or may display other thumbnail images formed in the receiver.

For example, the thumbnail images of FIG. 46 and FIG. 47 may be displayed in the form of a slideshow, or the received highlighted moving images may be displayed.

The stored program is reduced to a small-sized program smaller than the recovery program, and is then displayed. In this case, the playback speed may be equal to an original recovery speed or an X-speed playback speed.

A method for reproducing the stored mobile service data according to the present invention will hereinafter be described.

Figure 49:
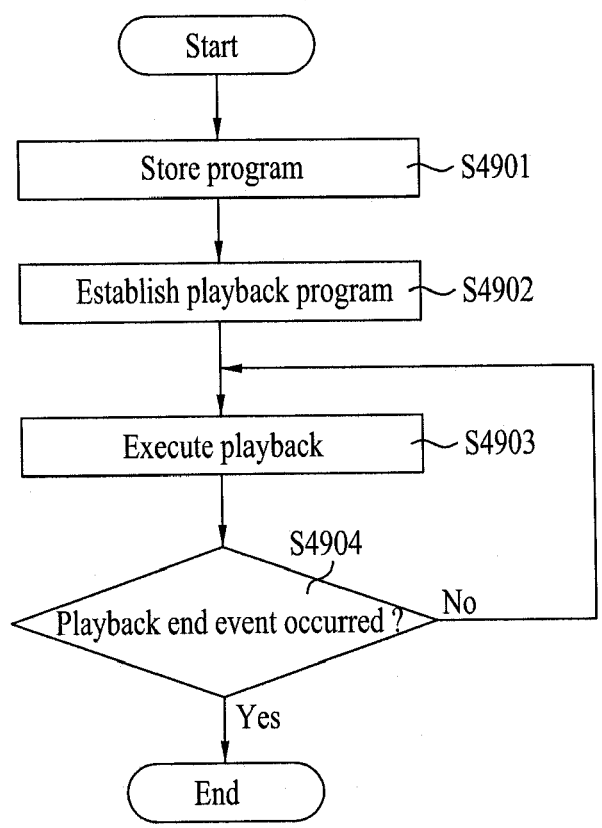
FIG. 49 is a flow chart illustrating a method for reproducing mobile service data according to the present invention.

FIG. 49 is a flow chart illustrating a method for reproducing mobile service data according to the present invention.

Referring to FIG. 49, the method for reproducing the mobile service data includes: storing the received program; selecting a playback of the stored program; and reproducing the selected program.

The storing step S4901 has already been described.

At the playback selecting step S4902, a program to be reproduced is selected from among at least one stored program, so that the program is decided as a playback object.

There are a variety of methods for selecting the stored program, for example, a method for selecting the stored program from the stored list.

There are a variety of methods for establishing a program to be reproduced, for example, a reserved-playback method for reproducing the stored program at a future time after a current time, and an immediate-playback method for reproducing the stored program at a current time.

The reproducing step S4903 reproduces the stored program at a reserved time if a reserved playback has been established. And, if the immediate-playback has been established, the reproducing step S4903 reproduces the immediately-stored program. For example, in order to reproduce the stored program, there may be used a method for uploading a program stored in a storage medium (e.g., HDD) to a buffer, and reproducing the stored program.

After reproducing the program, if it is determined that the playback of the stored program has been completed or the end command has been entered at step S4904, the above-mentioned playback is completed.

FIG. 50A to FIG. 50C show a variety of examples for storing a program and storing the stored program according to the present invention.

Referring to FIG. 50A, audio packets A, video packets V, and data packets D are mixed in demodulated mobile service data, so that a single stream is made as shown in FIG. 50A. Each packet has a predetermined input order.

Referring to FIG. 50B, unnecessary packets are removed from the stream of FIG. 50A, and the remaining packets are downloaded to a storage unit (or a storage medium). In this case, a time stamp corresponding to the input order is also stored in the storage unit. For example, if a data packet from among the stream of FIG. 50A is not stored, the data packet is removed, the time stamp corresponding to the input order is assigned to the remaining audio/video (A/V) packets, so that the time stamp is stored along with the corresponding packets.

When the time stamp and the packets are stored, the index table is generated, so that the generated index table can be stored. This index table has already been described in FIG. 41A.

If the corresponding packets and the time stamp are stored in the storage medium, and then the playback command is selected, a null packet is assigned to a position of the removed data packet of FIG. 50B, such that a single stream is uploaded to a demultiplexer 940. The demultiplexer 940 recognizes the packets in the order of packet inputs, so that the stored stream (stream composed of "AVVVAAVC" packets) of FIG. 50B can be recognized as the stream of "AVVVADD" packets. Therefore, the stream of FIG. 50C is uploaded and reproduced.

Figure 51:
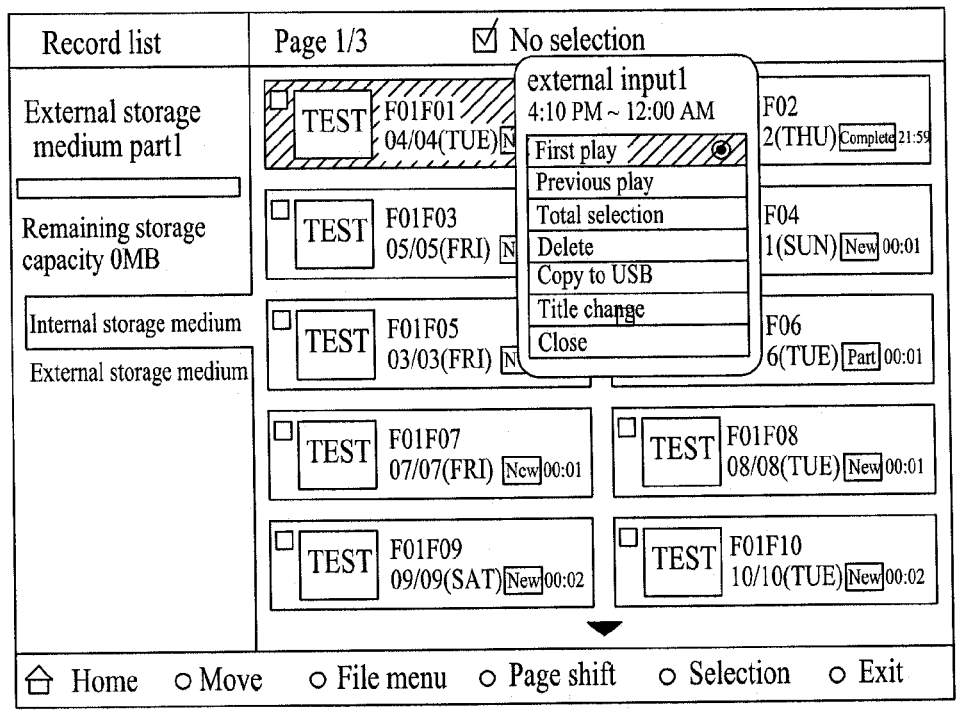
FIG. 51 is a flow chart illustrating a method for storing a program and reproducing the stored program according to the present invention.

FIG. 51 is a flow chart illustrating a method for storing a program and reproducing the stored program according to the present invention.

Referring to FIG. 51, a receiver or reception system selects a program from among the stored list, and selects an option related to a playback. The option related to the playback may be concurrently outputted to the stored list and the option window, or may also be outputted to an additional area. The output of the stored list has already been described with reference to FIG. 45.

The option window related to the playback may include a variety of information of a program, for example, a title and a record time.

A program to be reproduced is at least one. Namely, one program may be selected as a playback object, or more programs may also be selected. The displayed option window is changed according to the number of selected objects.

If a single program is selected as a playback object, option functions related to the playback of a corresponding program may be executed. For example, the option functions related to the playback may be a first play, a previous play, a reserved play, an accelerated-speed (X-speed) play, a repeat play, a bookmark play, a jump play, a summary play, a total selection, a file move, a file delete, a copy to an external storage medium, and an information edit. In this case, the above-mentioned option functions may be placed on the option windows.

The first play function is as follows. If a recorded object is initially reproduced, or the playback of the recorded object has been completed, the first play function begins to reproduce data from the first part of a program corresponding to the recorded object.

The previous play function is as follows. If the playback of data has been suddenly interrupted while the data has been reproduced, the previous play function continues to reproduce data from the suddenly-interrupted part.

The reserved play function is as follows. A time after a current time is set to a predetermined playback time. If a current time reaches the predetermined playback time, the reserved play function reproduces the automatically-stored program.

The total selection function is as follows. The total selection function is designed to reproduce not only the selected program but also all the recorded objects.

If several storage spaces exist, the file move function moves a file from one storage space to another storage space. For example, by the file move function, a file may move from an external storage medium to an internal storage medium, may move from an internal storage medium to an external storage medium, or may from a physical storage medium to another physical storage medium.

The file delete function deletes the selected program from the storage space.

The information edit function changes information of an object, for example, title- and time-information of a program.

If several programs are selected as playback objects, the option function related to the playback between several programs can be executed. For example, there are a variety of option functions related to the playback between several programs, e.g., a continuous play, a reserved play, a selection release, a selection file move, a selection file deletion, and a copy to an external storage medium.

The continuous play function continuously reproduces a plurality of selected programs. If the continuous play function is selected, several programs can be reproduced by only one command.

In association with several programs, the reserved play function sets a time after a current time to a predetermined play time. If a current time reaches the play time, the reserved play function reproduces the automatically-stored program.

The selection release function releases the selection of several programs.

The selection file move function simultaneously deletes the selected programs.

The "Copy to External storage medium" function selects several programs stored in the internal storage medium, and simultaneously copies the selected programs on the external storage medium.

In association with the option functions, a function incapable of being executed is disabled, and the other function capable of being executed is enabled.

Figure 52:
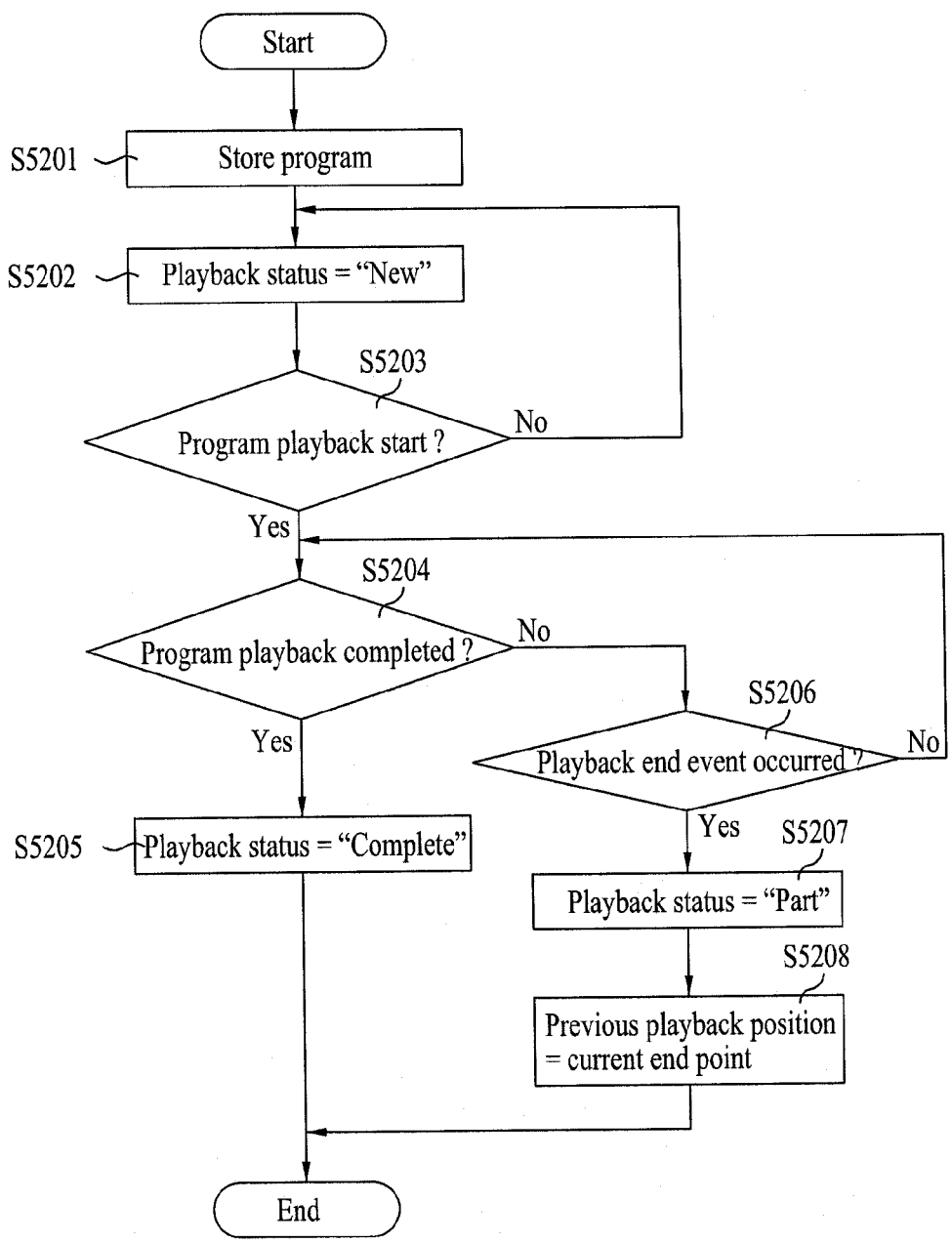
FIG. 52 is a flow chart illustrating a method for establishing a playback status according to one embodiment of the present invention.

FIG. 52 is a flow chart illustrating a method for establishing a playback status according to one embodiment of the present invention.

The playback status establishing method stores the received program, and establishes a playback position related to a playback status of the stored program.

The playback status is a status indicating whether the stored program is reproduced or not. The status may be set to "New", "Complete" or "Part" indicating a data playback status, or may also be set to "First" or "Part" indicating a data playback point.

If the program is stored in the storage medium at step S5201, a playback status is set to "New" at step S5202.

If the playback of data begins at step S5203, and the playback of data is completed, a playback status is set to "Complete" at step S5205.

In this case, the "New" or "Complete" status may be equally set to the "first" status indicating a playback position.

If the playback end event occurs at step S5206 before reproducing the program, the playback status is set to "Part" at step S5207.

The playback status "Part" indicating a playback completion position of the program is set to "Previous playback position" at step S5208.

The playback completion position may be specified by an index table, and be stored. Namely, a picture type of the playback completion time is stored, and information indicating the position of a corresponding picture is stored. For example, if the picture of the playback completion time is an I-type, and a corresponding picture is spaced apart from an initial position by 1800s, a corresponding picture type and position type are stored. If the "previous playback" command is entered, a position of the playback completion part is detected from the stored information (e.g., I-picture, 1800s), so that a playback system begins to reproduce data from the detected position.

In this case, if the playback of data is completed at the B-picture or P-picture instead of the I-picture, the beginning position of the previous playback may be the I-type picture neighboring with a corresponding picture. In this case, the playback may begin at a previous or next I-picture of a corresponding picture, and may begin at the beginning I-picture of a GOP (Group Of Picture) including the corresponding picture. And, the playback may begin at the beginning I-picture of a GOP after the corresponding picture, or may also begin at another I-picture closer to the corresponding picture.

Figure 53:
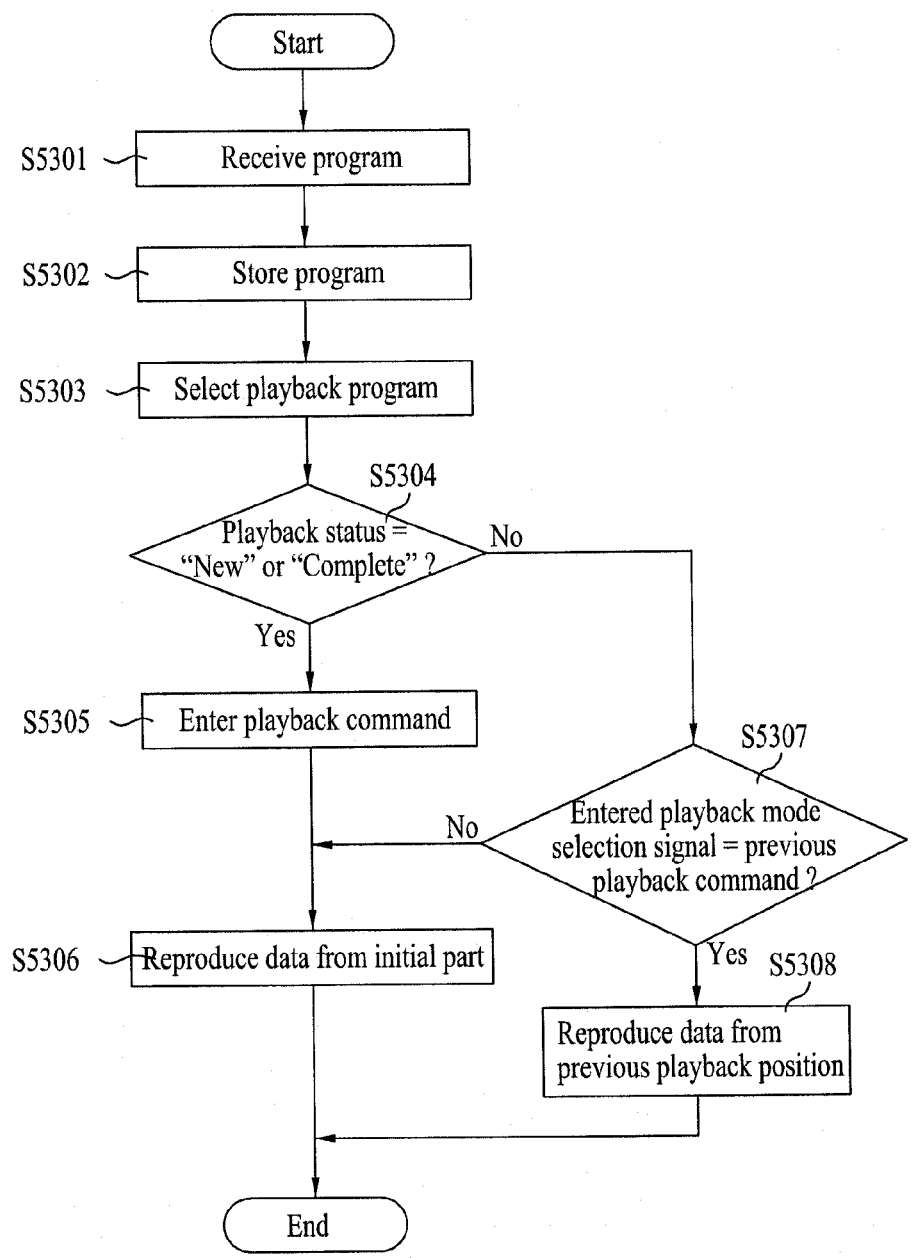
FIG. 53 to FIG. 60 are flow charts illustrating methods for reproducing the stored program according to the present invention.

FIG. 53 is a flow chart illustrating a method for reproducing the stored program according to another embodiment of the present invention.

The stored program may be immediately reproduced, or may be pre-reproduced, as shown in FIG. 53.

The program playback method of FIG. 53 stores the received program, receives a previous playback command for the stored program, and reproduces data from a previous playback position.

Referring to FIG. 53, the program playback method receives the program at step S5301, and stores the program in a storage medium at step S5302.

The program playback method selects a program to be reproduced from among the stored programs at step S5303.

The program playback method determines whether the playback status established in the selected playback program is "New" or "Complete" at step S5304.

If it is determined that the playback status was equal to "New" or "Complete" and the playback command has been entered, the playback system begins to reproduce data from the initial position at step S5306.

If it is determined that the playback status was "Part" instead of "NEW" and "Complete", the playback system receives a playback mode selection signal.

If the entered playback mode selection signal is a previous playback command at step S5307, the playback system reproduces data from the previous playback position at step S5308.

If the entered playback mode selection signal is an immediate playback command at step S5307, the playback system reproduces data from the initial position at step S5306.

Figure 54:
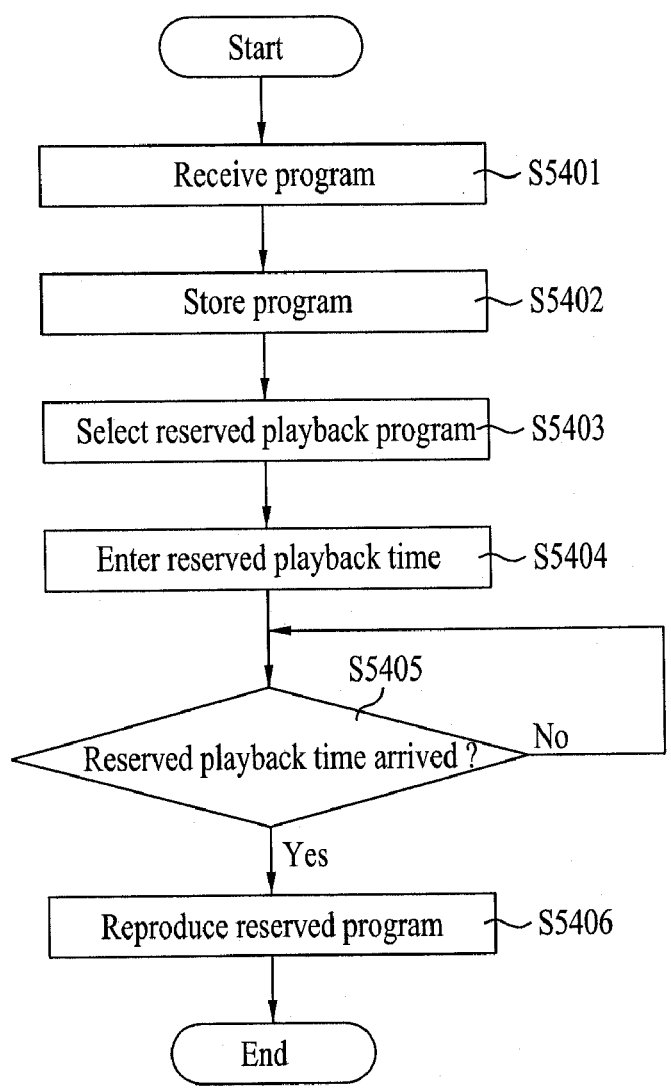

FIG. 54 is a flow chart illustrating a method for reproducing the stored program according to another embodiment of the present invention.

As can be seen from FIG. 54, the stored program may be reproduced at a reserved time.

The program playback method stores the received program, establishes a playback reservation of the stored program, and reproduces the stored program at the reserved time.

The playback system receives the program at step S5401, and stores the received program in the storage medium at step S5402.

The reserved playback program is selected at step S5403. In more detail, a program to be reproduced is selected from the stored programs, and the reserved playback is selected. The program to be reproduced can be selected from the stored list. The playback system selects a program from among the stored list, and may select a reserved playback on the option window.

For the program for a reserved playback, the playback system enters a playback time for the program at step S5404. A user interface (UI) for entering the reserved playback time may be displayed. The reserved time may include date- and time-information, and any information capable of specifying a playback time can be used as the reserved time. The reserved playback time may be entered by a character entry board, touch-screen, video keyboard, or remote-controller of a receiver. Besides, all the methods for allowing a user to enter signals using the receiver can be made available for the present invention.

It is determined whether a current time reaches the reserved playback time at step S5405. If it is determined that the current time has reached the reserved playback time at step S5405, the reserved program is reproduced at step S5406.

Figure 55:
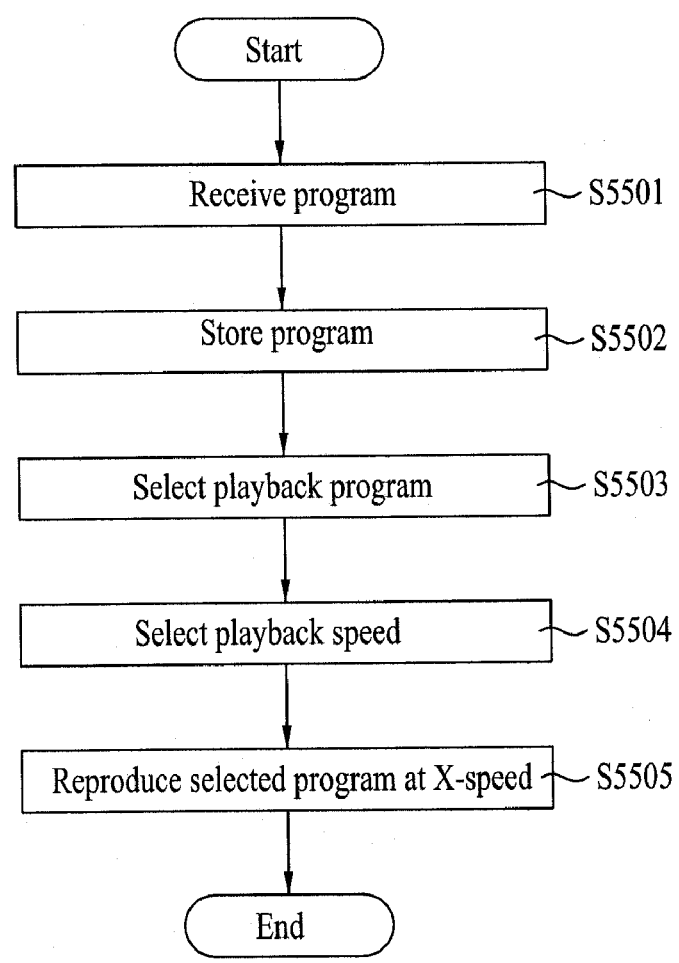

FIG. 55 is a flow chart illustrating a method for reproducing the stored program according to one embodiment of the present invention.

The stored program can be reproduced at an accelerated speed (X-speed) as shown in FIG. 55.

The program playback method of FIG. 55 stores the received program, entering an X-speed selection signal and an X-speed playback signal of the stored program, and reproduces the stored program at an X-speed play mode.

In this case, the X-speed selection signal is entered at a play or playback speed.

In other words, the playback system receives the program at step S5501, and stores the received program in a storage medium at step S5502.

The step S5503 for selecting the X-speed playback program selects a playback program from among the stored programs, and selects an X-speed playback of the selected program. The program to be reproduced may be selected from the stored list. The program is selected from the stored list, and the X-speed playback may be selected from the option window.

In a program associated with the X-speed playback selection, the speed at which data is to be reproduced is entered at step S5504. A user interface (UI) for entering the X-speed data playback can be displayed. A high-speed or a low-speed may be selected as the X-speed. For example, $$\frac{1}{16}X-, \frac{1}{8}X-, \frac{1}{4}X-, \frac{1}{2}X-, 1X-,$$

$$2X-, 4X-, 8X- \text{ or } 16X-\text{speed}$$

may be selected as the X-speed. In this case, the user may enter his or her desired speed, or may select a desired speed from among several X-speeds prescribed in the receiver. Otherwise, the receiver receives a user's entry signal related to the X-speed playback while data is reproduced, so that it may establish the X-speed playback mode. The playback speed may be entered on the option window, or may be entered on a touchscreen, a video keyboard, or a remote-controller. Besides, all kinds of methods capable of allowing the user to enter any signal in the receiver can also be made available for the present invention.

The program is reproduced at a predetermined playback speed at step S5505. In this case, if the X-speed play mode is decided, only video data is reproduced, or video data is synchronized with audio data such that the video data and the audio data can be simultaneously reproduced at the X-speed.

In the case of a quick play mode from among various X-speed play modes, the playback system skips over pictures and outputs the skipped result. In the case of a slow play mode, the playback system outputs the same pictures at a slower speed. In this case, during the quick play mode, the priority is assigned to the I-picture from among the I-, B-, and P-pictures, so that the playback system outputs the I, B, and P pictures according to the above priority.

For example, provided that the playback system outputs 4 frames for a time of 1 second (i.e., is), at 2×-speed play mode, the playback system may output 8 frames for the time of 1 s, or may selectively output 4 frames for the time of 1 s. At the $$\frac{1}{2}X - \text{speed mode},$$

the playback system may output a predetermined number of frames corresponding to the time of 1 s.

Figure 56:
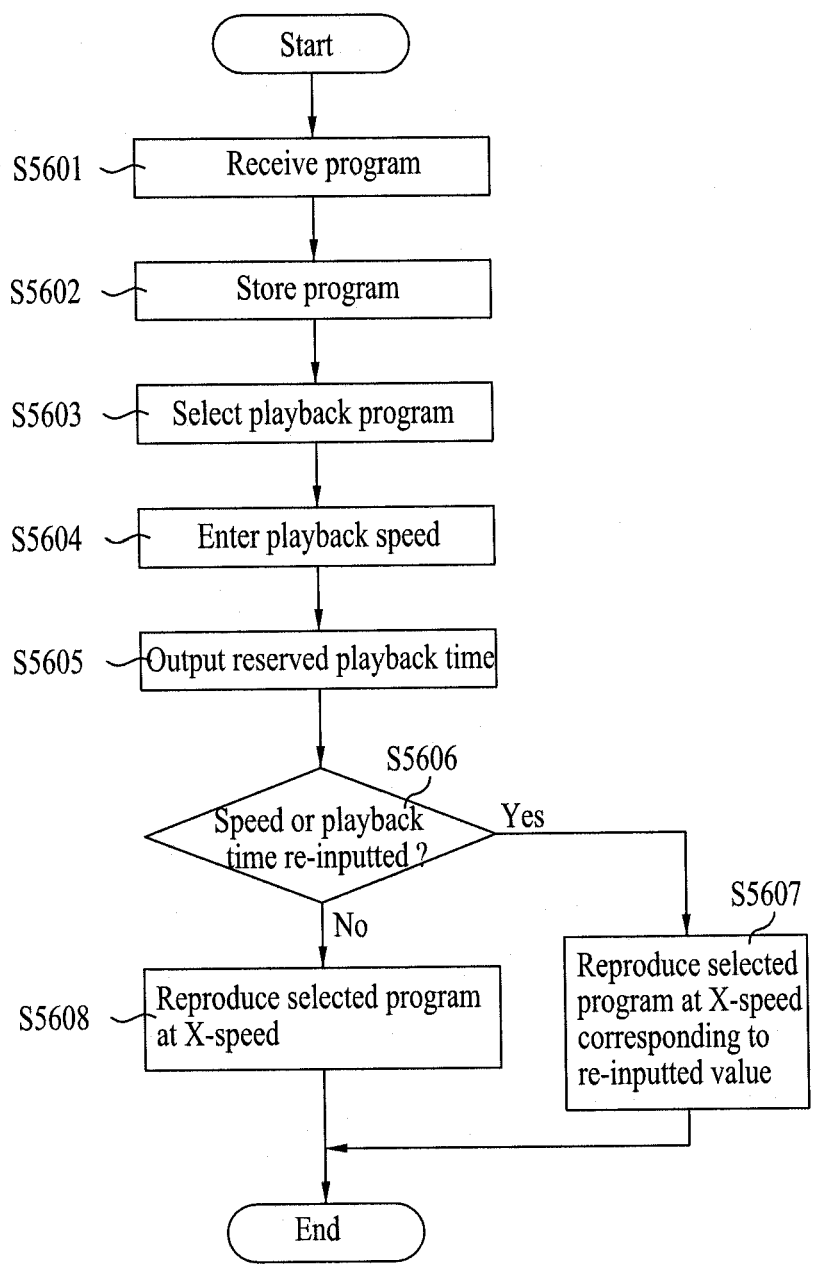

FIG. 56 is a flow chart illustrating a method for reproducing the stored program according to another embodiment of the present invention.

Referring to FIG. 56, the playback system reproduces the stored program at the X-speed.

The program playback method stores the received program, receives a playback speed selection signal and an X-speed playback signal for the stored program, outputs an expected playback end time at the established speed, and reproduces the stored program.

In this case, after outputting the expected end time, the playback system may further include the step of re-entering a playback speed or playback time selection signal.

Namely, the playback system receives the program at step S5601, and stores the received program in the storage medium at step S5602.

The step S5603 for selecting the X-speed playback program is as follows. The playback system selects a program to be reproduced from among the stored programs, selects an X-speed playback of the selected program, and selects a program to be reproduced from among the stored list. The playback system selects a program from among the stored list, and selects an X-speed play mode on the option window.

In a program which must be reproduced at an X-speed, the playback system enters a speed at which data will be reproduced at step S5604. The playback system outputs a user interface (UI) for entering the X-speed playback speed. A high-speed or a low-speed may be selected as the X-speed. For example, $$\frac{1}{16}X-, \frac{1}{8}X-, \frac{1}{4}X-, \frac{1}{2}X-, 1X-,$$

$$2X-, 4X-, 8X- \text{ or } 16X-\text{speed}$$

may be selected as the X-speed. In this case, the user may enter his or her desired speed, or may select a desired speed from among several X-speeds prescribed in the receiver. The playback speed may be entered on the option window, or may be entered on a touchscreen, a video keyboard, or a remote-controller. Besides, all kinds of methods capable of allowing the user to enter any signal in the receiver can also be made available for the present invention.

The playback system outputs an expected end time at the entered playback speed at step S5605. The expected end time may be calculated in consideration of a playback speed and a total playback time. For example, if a total playback time is set to "1 hour", and an X-speed is set to "2×-speed", an expected end time may be longer than 30 minutes. In other words, the expected playback time is 30 minutes.

After outputting the expected end time, the playback system determines whether a user enters a playback speed or re-enters a playback time at step S5604. For example, if the user selects the 2.5×-speed play mode so that an expected end time is 90 minutes, the speed is changed to 2×-speed, or the expected end time of 2 hours may be re-entered.

If there is no re-input data, the playback system executes the X-speed play mode at a first setup value at step S5605. Otherwise, if there is re-input data, the playback system executes the X-speed play mode at a re-input value at step S5606.

Figure 57:
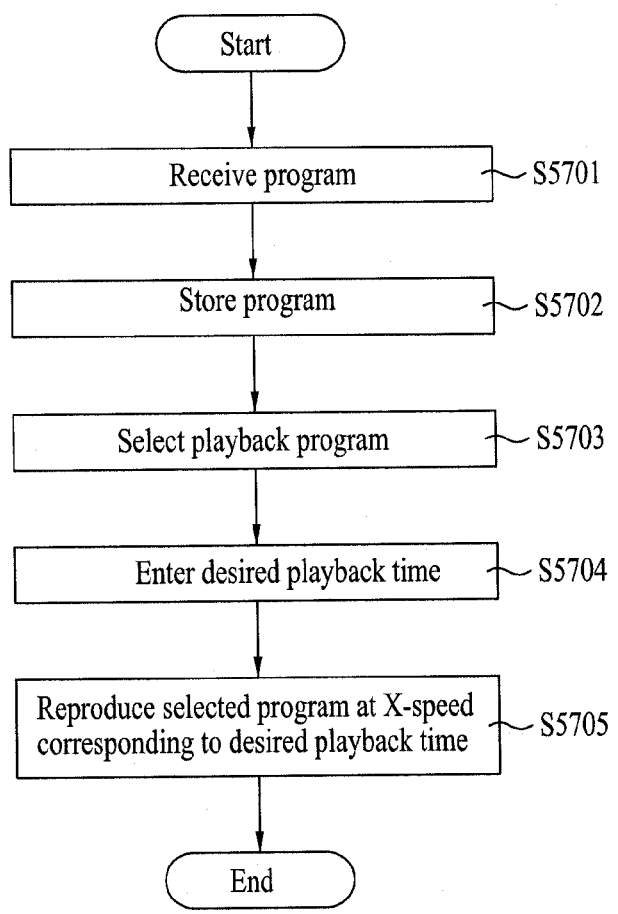

FIG. 57 is a flow chart illustrating a method for reproducing the stored program according to another embodiment of the present invention.

Referring to FIG. 57, the playback system reproduces the stored program at the X-speed.

The program playback method stores the received program, receives an X-speed selection signal and an X-speed playback signal for the stored program, and reproduces the stored program at the established X-speed.

In this case, the X-speed selection signal may be entered as a desired playback speed.

Namely, the playback system receives the program at step S5701, and stores the received program in the storage medium at step S5702.

The step S5703 for selecting the X-speed playback program is as follows. The playback system selects a program to be reproduced from among the stored programs, and selects an X-speed play mode of the selected program. The program to be reproduced can be selected from the stored list. The playback system selects a program from among the stored list, and selects an X-speed play mode on the option window.

In a program which must be reproduced at an X-speed, the playback system enters a desired playback speed at step S5704. The playback system outputs a user interface (UI) for entering a desired playback time. A high-speed or a low-speed may be selected as the X-speed. For example, 1 hour, 1.5 hour, 2 hours, or 3 hours may be selected as a desired playback time. In this case, the user may enter the desired playback time, or may select a desired step from among several playback time steps prescribed in the receiver. The playback time may be entered on the option window, or may be entered on a touchscreen, a video keyboard, or a remote-controller. Besides, all kinds of methods capable of allowing the user to enter any signal in the receiver can also be made available for the present invention.

The playback system reproduces the program during the prescribed desired playback time at step S5705. In this case, if the X-speed play mode is decided, only video data is reproduced, or video data is synchronized with audio data such that the video data and the audio data can be simultaneously reproduced at the X-speed.

In order to reproduce the video data at the X-speed, in the case of a quick play mode from among various X-speed play modes, the playback system skips over pictures and outputs the skipped result. In the case of a slow play mode, the playback system outputs the same pictures at a slower speed. In this case, during the quick play mode, the priority is assigned to the I-picture from among the I-, B-, and P-pictures, so that the playback system outputs the I, B, and P pictures according to the above priority.

Figure 58:
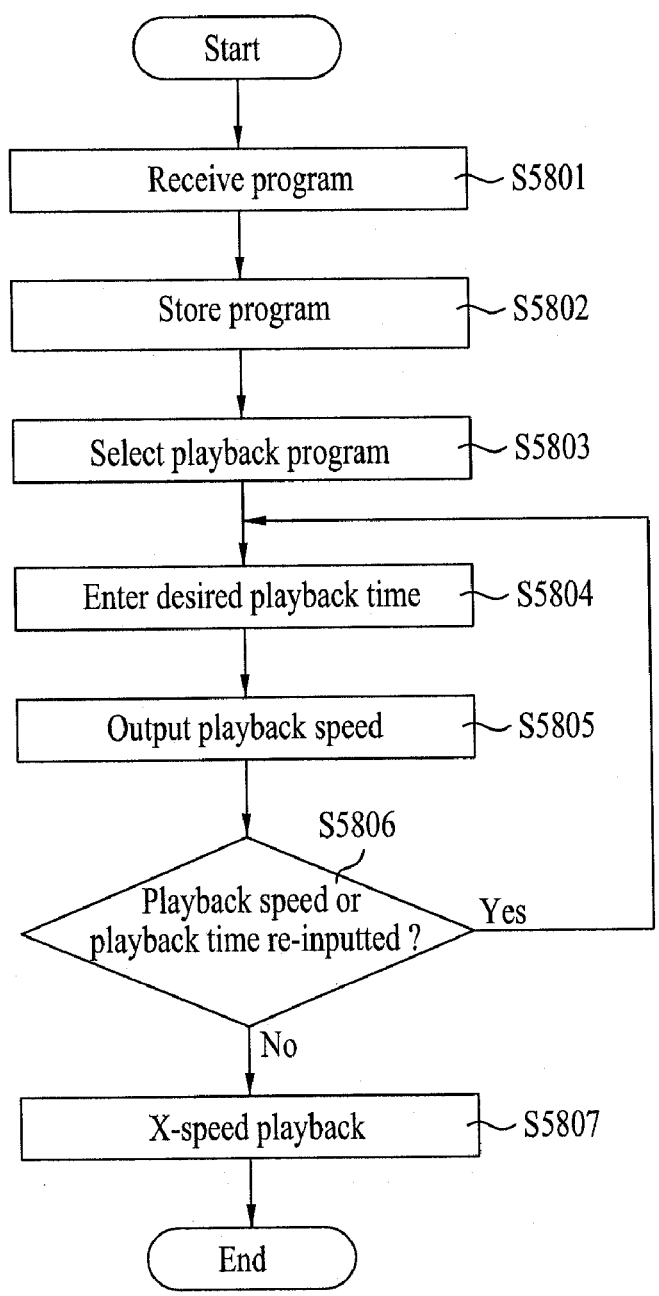

FIG. 58 is a flow chart illustrating a method for reproducing the stored program according to another embodiment of the present invention.

Referring to FIG. 58, the playback system reproduces the stored program at the X-speed.

The program playback method stores the received program, receives a desired playback time selection signal and an X-speed playback signal for the stored program, and reproduces the stored program.

In this case, after outputting the playback speed, the program playback method may further include the step of allowing the user to re-enter a playback speed or a playback time selection signal.

Namely, the playback system receives the program at step S5801, and stores the received program in the storage medium at step S5802.

The step S5803 for selecting the X-speed playback program is as follows. The playback system selects a program to be reproduced from among the stored programs, and selects an X-speed play mode of the selected program. The program to be reproduced can be selected from the stored list. The playback system selects the program from among the stored list, and selects an X-speed play mode on the option window.

In a program which must be reproduced at an X-speed, the playback system enters a desired playback speed at step S5804. The playback system outputs a user interface (UI) for entering a desired playback time. A high-speed or a low-speed may be selected as the X-speed.

The playback system outputs a playback speed corresponding to the user-entry playback time at step S5805. The playback speed can be calculated in consideration of a total playback time and a desired playback time. For example, if a total playback time is 1 hour and a desired playback time is set to 30 minutes, a playback speed may be set to 2×-speed.

After outputting the playback speed, the playback system determines whether the user re-enters a playback speed or a desired playback time at step S5806. For example, if the user selects 2 hours as the desired playback time such that the playback speed is 1.5×-speed, the playback speed may be changed to 2×-speed or the user may re-enter an expected playback time of 90 minutes (1 and half hour).

If there is no re-input data, the playback system executes the X-speed play mode at an initial setup value at step S807. If re-input data exists, the playback system executes the X-speed play mode at the re-input value at step S5807.

Figure 59:
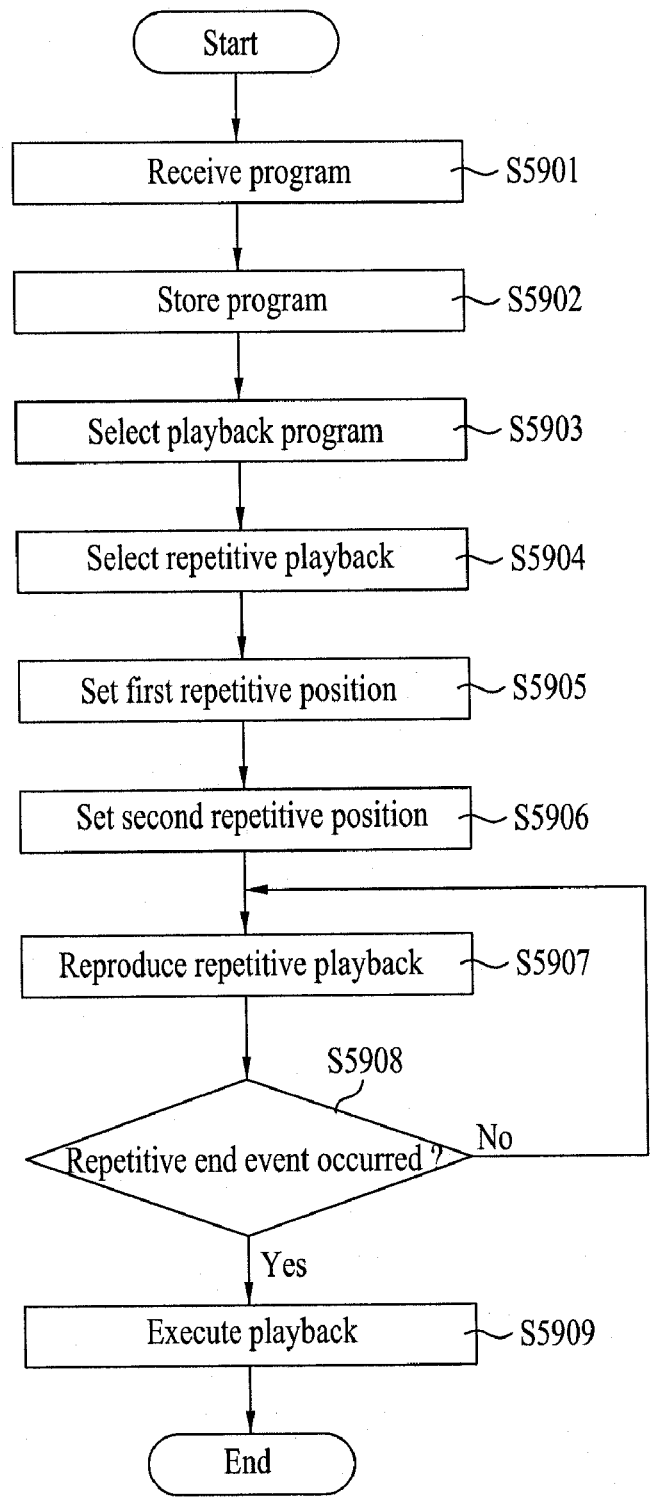

FIG. 59 is a flow chart illustrating a method for reproducing the stored program according to another embodiment of the present invention.

Referring to FIG. 59, the playback system can repeatedly reproduce the stored program.

The program playback method stores the received program, receives a repetitive playback selection signal of the stored program, and repeatedly reproduces the stored program.

Namely, the playback system receives the program at step S5901, and stores the received program in the storage medium at step S5902.

The playback system selects a program to be reproduced from among the stored programs at step S5903.

In this case, the playback system can select the repetitive play mode of the selected program at step S5904. During the repetitive play mode, data of a predetermined section is repeatedly reproduced. In this case, the repeated section may be all or some of a single program, or may be several programs. The predetermined section may be established by either a receiver or a user. There are a variety of repetitive play modes, for example, a fixed-time repetitive play function, a user-defined repetitive play function, a repetitive play function of a single program, and a repetitive play function of several programs.

In this case, while the program is being reproduced, the repetitive play mode may be selected, or the program may be selected such that the repetitive play command can be operated. Namely, the playback system may enter the repetitive play mode command after entering the playback command, or may enter the repetitive play command without entering an additional play command.

For example, the playback system selects a program to be reproduced from among the stored programs, and selects the repetitive play mode. The playback system may select the program to be reproduced from among the stored list. In this case, at the repetitive play mode, a single program may be repeatedly reproduced, or several programs may be repeatedly reproduced. In this case, the playback system may select a program from among the stored list, and may select the repetitive play mode on the option window.

If the repetitive play mode is selected, a first repetitive position is established at step S5905. The playback system establishes a second repetitive position at step S5906 after establishing the first repetitive position. In this case, the first repetitive position is a start- or beginning-position of the repetitive playback section, and the second repetitive position is an end position of the repetitive playback section. Namely, the section from the first repetitive position to the second repetitive position serves as a repetitive playback section.

In this case, the first repetitive position and the second repetitive position may be established by the user, or may be established by the receiver at the repetitive playback selection mode. If a single repetitive position is established, a predetermined time is repeated before or after the established repetitive position, so that another repetitive position may be established.

For example, during the fixed-time repetitive play mode, the user enters a first repetitive position setup signal during the playback time, so that the first repetitive position is established. The playback system sets a predetermined position arranged before or after a predetermined time on the basis of the first repetitive position to the second repetitive position.

During the user-defined repetitive play mode, the user enters the first and second repetitive position setup signals during the playback time, so that the first and second repetitive positions are established.

During the repetitive play mode of the single program, the playback system selects a playback program. If the program repetitive play signal is entered, the program beginning position is set to the first repetitive position, and the program end position is set to the second repetitive position.

During the repetitive play function of several programs, the playback system selects several programs. If a repetitive playback signal of several programs is entered, the playback system sets a start position of a first program to a first repetitive position, and an end position of the last program to a second repetitive position.

The repetitive play mode is executed at the above repetitive position at step S5907. During the repetitive play mode, a data section between the first repetitive position and the second repetitive position is repeatedly reproduced.

It is determined whether the repetitive playback end event occurs at step S5908. If the repetitive playback end event occurs, the playback system goes to a general playback mode so that it continuously reproduces the program at step S5909, and finishes reproducing the program.

If there is no repetitive playback end event, the repetitive playback of the program is continued.

If the repetitive playback end command is entered or the predetermined number of repeated times have been completed, the above-mentioned repetitive playback end event is activated. The repetitive playback end event is not limited to the above-mentioned example, and can also include all the cases of finishing the repetitive playback.

If the repetitive playback is completed, the playback system may complete up to the playback function. However, at a general play mode, the playback system may continuously reproduce the program. In this case, the playback system enters the general play mode, so that a playback start position may be either a predetermined position at which the repetitive playback command is entered, or a first or second repetitive position. If required, the above-mentioned examples can be implemented in different ways.

Figure 60:
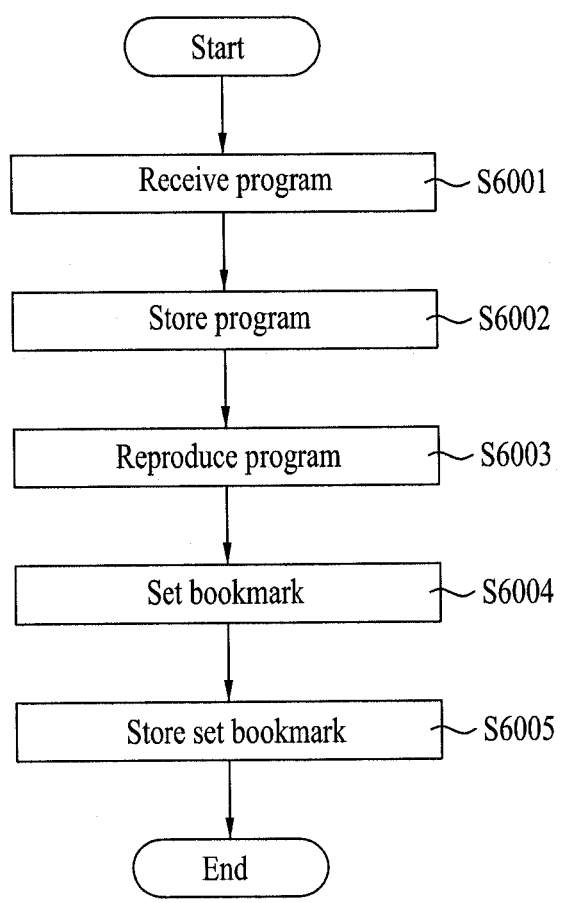

FIG. 60 is a flow chart illustrating a method for reproducing the stored program according to another embodiment of the present invention.

Referring to FIG. 60, the playback system may establish the bookmark during the playback time of the stored program.

The program playback method stores the received program, reproduces the stored program, and establishes the bookmark during the program playback time.

The playback system receives the program at step S6001, and stores the received program in the storage medium at step S6002.

The playback system selects a program to be reproduced from among the stored programs, and reproduces the selected program at step S6003.

If a bookmark setup signal is entered during the playback time of the selected program, the playback system sets a signal input position to a bookmark position at step S6004.

The bookmark position may be specified by the index table. Namely, a picture-type created when a bookmark setup signal is entered is defined, and information indicating the position of a corresponding picture is stored. For example, if a picture corresponding to the playback end time is an I-type, and a corresponding picture is spaced apart from an initial position by a predetermined distance of 1800s, the corresponding picture type and position information are decided as a bookmark position, and at least one bookmark is searched and reproduced.

In this case, if a bookmark setup signal is entered at a B- or P-picture instead of the I-picture, the bookmark setup position may be the I-type picture adjacent to the corresponding picture. In this case, the I-picture located before or after the corresponding picture may be set to the bookmark position. The beginning I-picture of the GOP including the corresponding picture or the other beginning I-picture of another GOP placed after the corresponding picture may be set to a bookmark position. The I-picture more adjacent to the corresponding picture may be set to such a bookmark position.

The established bookmark position is stored at step S6005.

FIG. 61 is a conceptual diagram illustrating an example for displaying at least one bookmark of FIG. 60 according to the present invention.

Referring to FIG. 61, the playback system makes at least one bookmark position in the form of a list, and outputs the list indicating the bookmark position to the user interface (UI).

In this case, the playback system may include information for identifying at least one bookmark.

The bookmark identification information is a minimum amount of information capable of identifying at least one bookmark, and may further include additional information of the at least one bookmark.

For example, a first bookmark 1, a second bookmark 2, and a third bookmark 3 can be displayed. And, a program title of a corresponding bookmark, program information such as a section, bookmark time information of a prescribed position, and thumbnail information indicating prescribed bookmark's image information can be configured in the form of the list.

The system selects a corresponding bookmark from among the above list, and may execute the playback at the selected bookmark position.

Figure 62A:
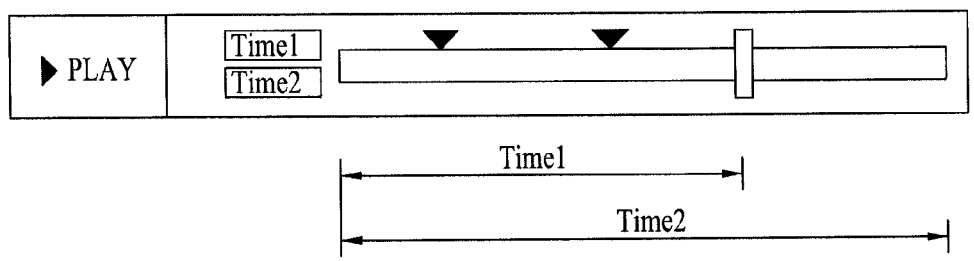
FIG. 62A and FIG. 62B are conceptual diagrams illustrating examples for displaying at least one bookmark of FIG. 60 according to the present invention.
Figure 62B:
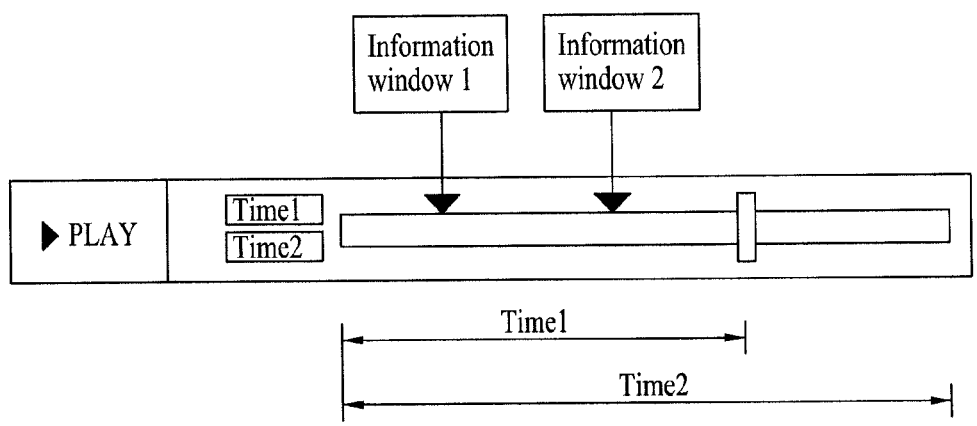

FIG. 62A to FIG. 62B are conceptual diagrams illustrating examples for displaying at least one bookmark of FIG. 60 according to the present invention.

Referring to FIG. 62A, at least one bookmark position is displayed on a progress bar, so that the resultant progress bar is outputted.

The progress bar may indicate a current playback time compared with a total program using time or capacity, etc.

A bookmark setup position on the progress bar is denoted by a visual position indicator. For example, a corresponding setup position may be denoted by an arrow, or may be denoted by a line or figure at a corresponding setup position.

If at least one bookmark has been established, the bookmark can be displayed along with both the visual position indicator and the bookmark identification information. For example, identification information (e.g., the first bookmark, the second bookmark, and the third bookmark) can be displayed.

In response to a progress situation of a playback operation, a progress pointer moves on the progress bar. If the progress pointer moves to a predetermined position, a predetermined position may function as a playback position.

Therefore, the progress pointer moves to the bookmark position, and the bookmark position is used as a playback position, so that the playback of data is executed at the playback position.

Also, the bookmark search playback function can be made available for the present invention. If several bookmarks are established, a current position jumps to a specific bookmark located before or after a playback section, so that the system can reproduce data from the jumped bookmark. For example, during the playback time, the playback system jumps to the second bookmark from among several bookmarks, and reproduces data of the second bookmark. Needless to say, while reproducing the data of the second bookmark, the system jumps to the first or third bookmark, and reproduces data of the jumped bookmark. In this case, if the bookmark playback key is implemented with a single key, the key is implemented with a toggle type, such that a first bookmark 1, a second bookmark 2, a third bookmark 3, a first bookmark 1, and a second bookmark 2, . . . are repeatedly searched and reproduced. Otherwise, if the bookmark playback key is implemented with two keys, the bookmarks are classified in forward and backward directions, and are reproduced in the forward and backward directions.

FIG. 62B shows at least one bookmark prescribed in FIG. 60, and a method for executing the playback function using this bookmark according to another embodiment of the present invention.

Referring to FIG. 62B, at least one bookmark location and its detailed information are displayed on the progress bar.

The detailed information window of a corresponding bookmark is displayed on the bookmark output result, differently from FIG. 62A. In FIG. 62B, the remaining parts other than the above-mentioned difference are equal to those of FIG. 62A.

The detailed information window may be displayed along with the visual position indicator of the progress bar. If a corresponding visual position indicator is selected, the bookmark detailed information window may be displayed as a pop-up window.

For example, the detailed information contained in the bookmark detailed information window may include a program title of a corresponding bookmark, program information such as a section, bookmark time information of a prescribed position, and thumbnail information indicating prescribed bookmark's image information.

Figure 63:
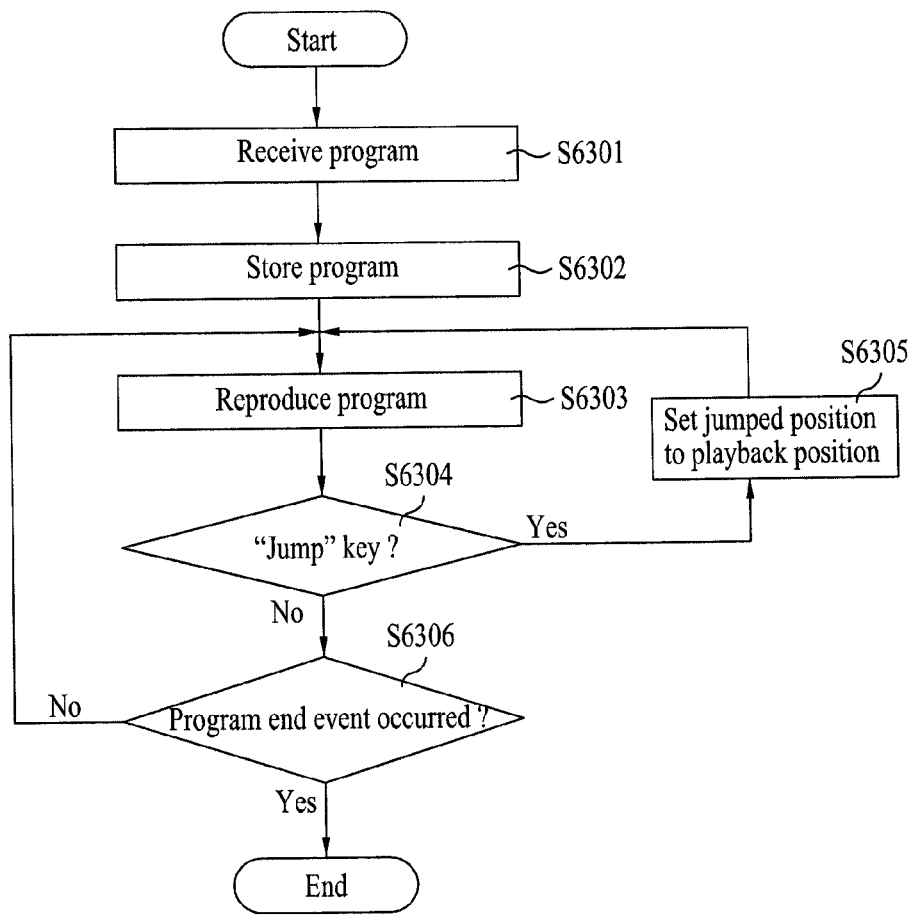
FIG. 63 is a flow chart illustrating a method for reproducing the stored program according to another embodiment of the present invention.

FIG. 63 is a flow chart illustrating a method for reproducing the stored program according to another embodiment of the present invention.

Referring to FIG. 63, the playback system jumps to a predetermined location while reproducing the stored program, and then reproduces data of the jumped position.

The program playback method stores the received program, receives a "Jump Play" signal for the stored program, performs jumping by a predetermined distance, and reproduces data corresponding to the jumped position.

Namely, the "Jump play" function newly establishes a playback position at a predetermined position, and begins to reproduce data at the established position.

The system receives the program at step S6301, and stores the received program in a storage medium at step S6302.

The system selects a program to be reproduced from among the stored programs, and reproduces the selected program at step S6303.

The system determines whether the jump command has been entered at step S6304. If the jump command has been entered, the jumped position is set to a playback position at step S6305.

The system begins to reproduce data from the newly-established playback position. If the program end event has occurred at step S6306, the system finishes reproducing the program.

The jump playback position capable of being established by the jump command will hereinafter be described in detail.

There are a variety of examples capable of executing the jump playback position, e.g., a predetermined-time interval's jump, a bookmark jump, a jump for each program, a jump for each section, and a jump for each group of segment (GOS).

In this case, the jump interval may be set to a Jump to the Front, a Jump to the Back, a Jump to the Head, or a Jump to the End.

If the jump playback position is set to the time interval and is set to the "Jump to the Front", the system forwardly jumps to a specific position located ahead of the predetermined time. If the "Jump to the Back" is determined, the system backwardly jumps to another position located behind the predetermined time. And, if the "Jump to the Head" is determined, the playback system moves a playback point to the beginning part of the program, such that it can reproduce data from the beginning part. If the "Jump to the End" is determined, the system moves a playback point to the program end, such that it can reproduce data from the program end.

If the jump playback position is set to the bookmark interval, in the case of the "Jump to the Front", the system moves to a previous bookmark such that it reproduces data from the previous bookmark. In the case of the "Jump to the Back", the system moves to either the program's initial position or the foremost bookmark, so that it reproduces data from the corresponding position. In the case of the "Jump to the End", the system moves to either the last bookmark or the program's end position, so that it reproduces data from the corresponding position.

If different jump playback positions are assigned to individual programs, at the "Jump to the Front", the playback system moves a playback position to an initial position of a previous program, and reproduces data from the corresponding position. At the "Jump to the Back", the playback system moves a playback position to an initial position of the next program, and reproduces data from the corresponding position. At the "Jump to the Head", the playback system moves to a first program to be reproduced, such that it reproduces the first program. At the "Jump to the End", the playback system goes to the last program to be reproduced, such that it reproduces the last program.

If different playback positions are assigned to individual sections, at the "Jump to the Front", the playback system moves a playback position to an initial position of a previous program, and reproduces data from the corresponding position. At the "Jump to the Back", the playback system moves a playback position to an initial position of the next program, and reproduces data from the corresponding position. At the "Jump to the Head", the playback system moves to a first program to be reproduced, such that it reproduces the first program. At the "Jump to the End", the playback system goes to the last program to be reproduced, such that it reproduces the last program.

If different jump playback positions are assigned to individual sections, at the "Jump to the Front", the playback system moves a playback position to an initial position of the previous section. At the "Jump to the Back", the playback system moves to an initial position of the next section, and reproduces data from the corresponding position. In this case, if a single program includes several section and index information of a corresponding section, the above-mentioned example can be implemented. At the "Jump to the Head", the playback system moves to a first program of the program, such that it reproduces data corresponding to the first program. At the "Jump to the End", the playback system goes to the last program, such that it reproduces the last program.

If different jump playback positions are assigned to individual GOS parts, at the "Jump to the Front", the playback system moves a playback position to an initial position of the previous GOS. At the "Jump to the Back", the playback system moves to an initial position of the next GOS, and reproduces data from the corresponding position. At the "Jump to the Head", the playback system moves to a first GOS, such that it reproduces data of the first GOS. At the "Jump to the End", the playback system goes to the last program, such that it reproduces data of the last GOS.

The term "GOS" is a meaning unit for discriminating between segments, which are different in shot or scene. If the shot or scene is changed to another, the GOS is also changed to another GOS.

In this case, there are a long GOS and a short GOS. If either the shot or the scene is abruptly changed, the short GOS occurs.

If different jump playback positions are assigned to individual GOS parts, the playback system may jump to the previous or next GPS.

Figure 64:
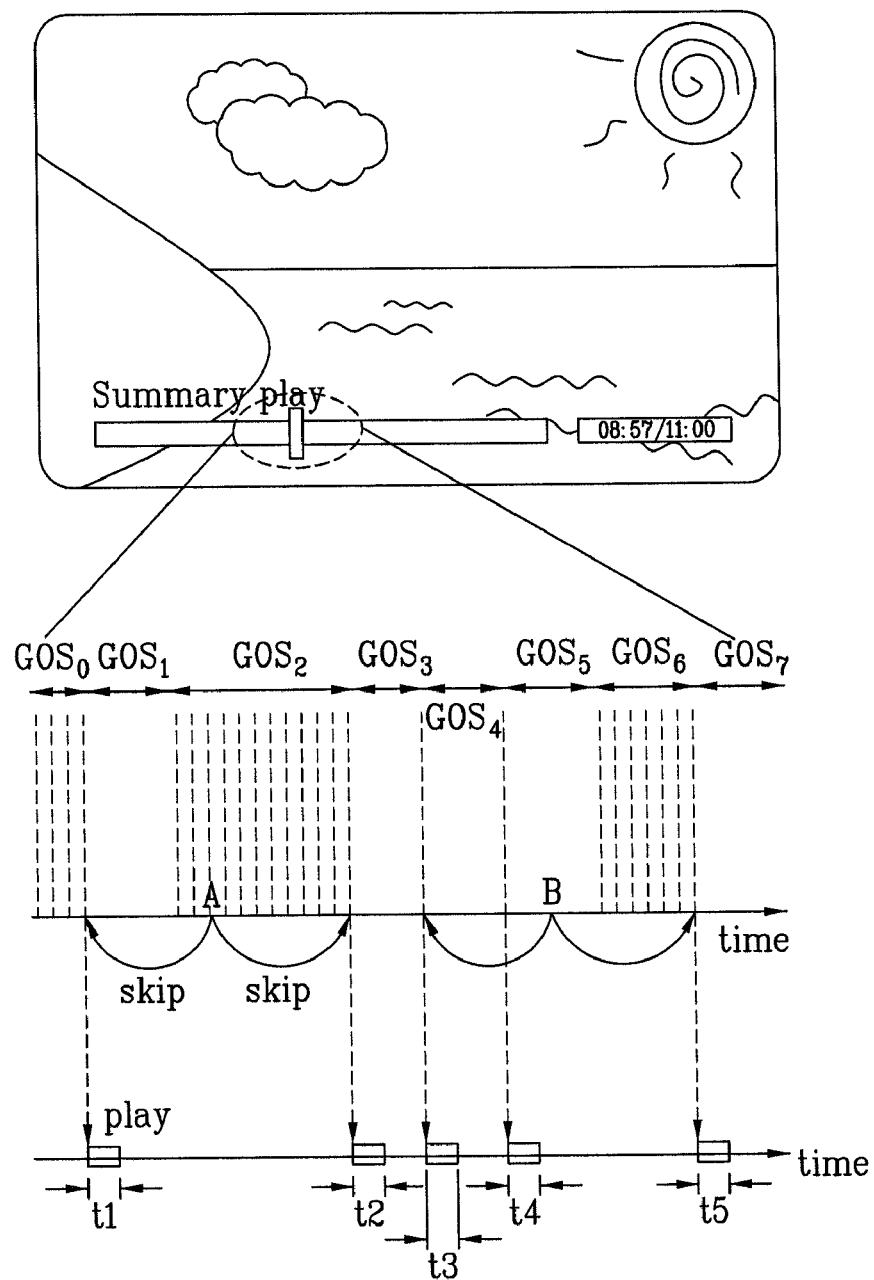
FIG. 64 shows configurations for every GOS according to the present invention.

FIG. 64 shows configurations for every GOS according to the present invention.

In the case of "Jump for each long GOS", i.e., in the case of "Jump from "GOS3" to the front", the playback system jumps to GOS1 instead of GOS2. In the case of "Jump from "GOS3" to the Back", the playback system jumps to GOS4.

Figure 65:
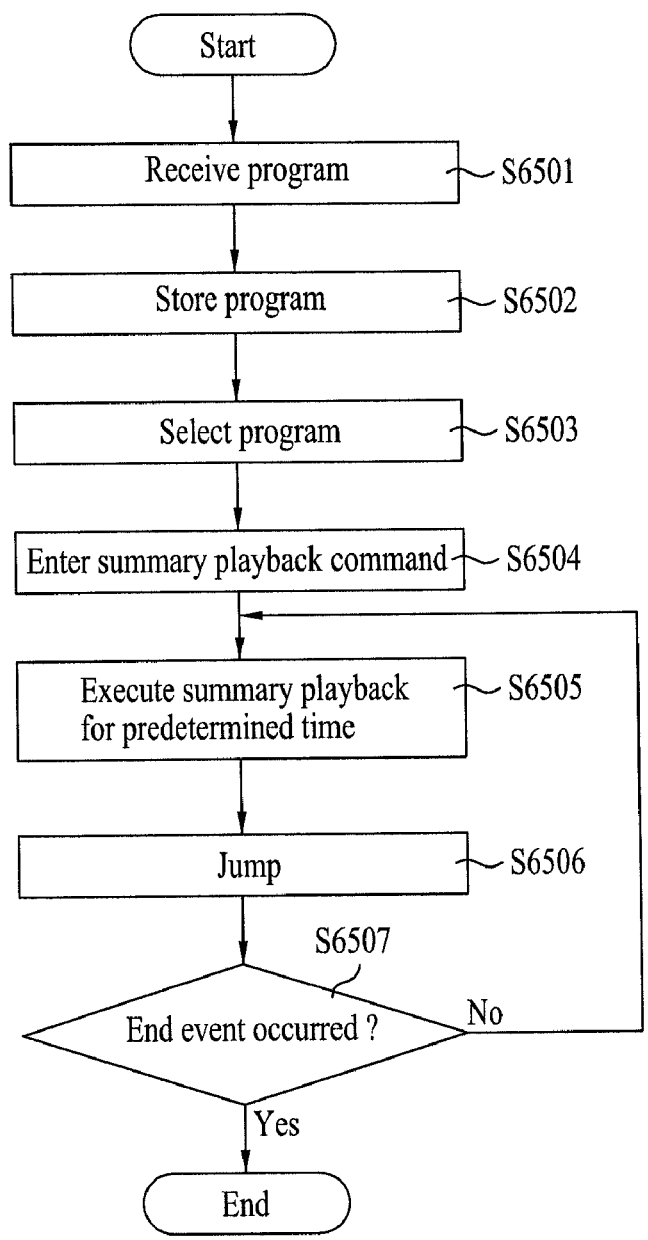
FIG. 65 and FIG. 66 are flow charts illustrating methods for reproducing the stored program according to the present invention.

FIG. 65 is a flow chart illustrating a method for reproducing the stored program according to another embodiment of the present invention.

Referring to FIG. 65, the playback system can execute the summary playback of the stored program.

The method for reproducing the stored program selects the stored program, receives the summary playback selection signal for the stored program, and reproduces the stored program at intervals of a predetermined time.

Namely, the playback program receives the program at step S6501, and stores the received program in a storage medium at step S6502.

The playback program selects a program to be reproduced from among the stored programs at step S6503.

Then, the summary playback command for the selected playback program is entered at step S6504.

The term "summary playback" indicates that the stored program is reproduced during the time shorter than the total playback time. In this case, in order to implement the summary playback method, the summary playback image may be received, the received summary playback image may be displayed, the thumbnail image may be generated, and the thumbnail image may be displayed in the form of a preview image, as previously described above. The above-mentioned embodiment will disclose a method for allowing the receiver to summarize/reproduce the program.

If the summary playback command is entered, the receiver reproduces the stored program during a predetermined time at step S6505. The receiver jumps to a predetermined position, so that it reproduces again the stored program during the predetermined time at step S6506.

In this case, the predetermined time may be a preset time, or may be a user-defined time. Also, a predetermined time may be a fixed time or a variable time. For example, if the predetermined time is fixed to 10 seconds, the receiver reproduces data of the predetermined point during 10 seconds, jumps to a predetermined position, and reproduces data of the jumped position during the 10 seconds. And, if the predetermined time may be variable, for example, if the predetermined time is proportional to the GOS length, the receiver reproduces data of a predetermined GOS during 5 seconds and jumps to the next GOS, and the jumped length is two times the length of a previous GOS, the receiver reproduces data of the predetermined point during 10 seconds, jumps to the next GOS, and reproduces data of the jumped position.

Referring to FIG. 64, t1, t2, t3, t4, or t5 is a predetermined time to be reproduced at a summary playback mode. In this case, if the predetermined time is a fixed time, t1, t2, t3, t4, and t5 are equal to each other. If the predetermined time is a variable time, t1, t2, t3, t4, and t5 are variable. For example, t1, t2, t3, t4, and t5 may be changed in proportion to the GOS length.

The jump playback of FIG. 63 is applied at the jumped position.

Until the program end event is generated at step S6507, the playback for a predetermined time and the jump playback at a predetermined position are repeated. The program end event is activated when the program playback is ended or the summary playback end command is entered.

Figure 66:
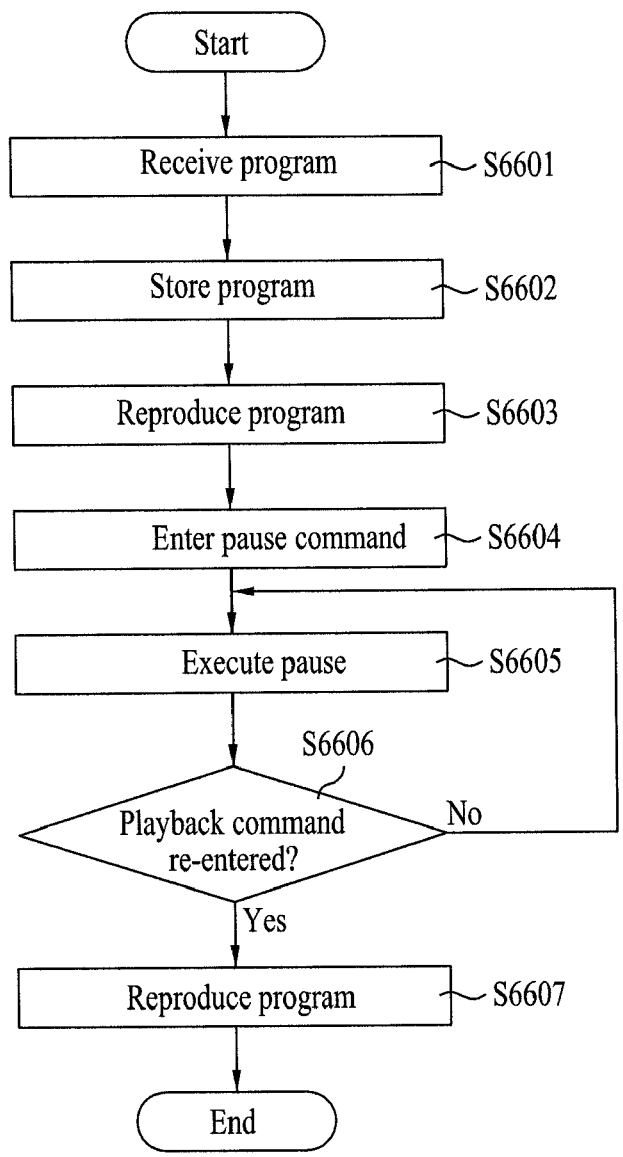

FIG. 66 is a flow chart illustrating a method for reproducing the stored program according to another embodiment of the present invention.

Referring to FIG. 66, the playback system may pause the stored program during the playback mode.

The playback system selects the stored program, reproduces the stored program, receives a pause command of a playback program, and stops reproducing the stored program.

The playback system receives the program at step S6601, and stores the received program in a storage medium at step S6602.

The playback system reproduces the stored program at step S6603.

While reproducing the program, the playback system receives the pause command at step S6604.

The above-mentioned pause command commands the playback system to store the playback-interrupted position, and stops reproducing the program.

When the "Pause" function key is selected or the playback is discontinued due to external factors.

There are a variety of external factors. For example, while a mobile hybrid signal receiver reproduces the stored program, the mobile hybrid signal receiver receives a phone signal, a battery is fully discharged, or other applications are executed. For another example, during the playback time of the record time, the input mode is switched to a broadcast reception mode. Besides, the external factors may include all factors which enable the receiver to stop reproducing the stored program.

Upon receiving the pause command, the playback system enters the pause mode so that it temporarily stops reproducing the program at step S6605. When the program playback is temporarily interrupted, the playback-interrupted position is established and stored. A method for establishing/storing the playback-interrupted position is equal to a method for establishing/storing the bookmark setup position.

There are a variety of methods for activating the pause mode. For example, a screen image captured at the playback-interrupted time is displayed as a still image, or the screen display or screen output may be turned off.

At the pause mode, the audio output may be turned off. In other words, the audio output is switched off, so that the continuous output of the same audio signal is prevented.

In the case where the screen-ON status is maintained at the pause mode, a visual position indicator or status can be displayed on the screen. For example, a "Pause" or "Pause" mark may be displayed as a visual position indicator.

The playback system determines whether a playback command has been re-entered under the pause mode at step S6606. If the playback command has been entered, the playback system reproduces the program at step S6607.

In this case, the playback system begins to reproduce the program at a playback position having been stored at the pause mode.

Figure 67:
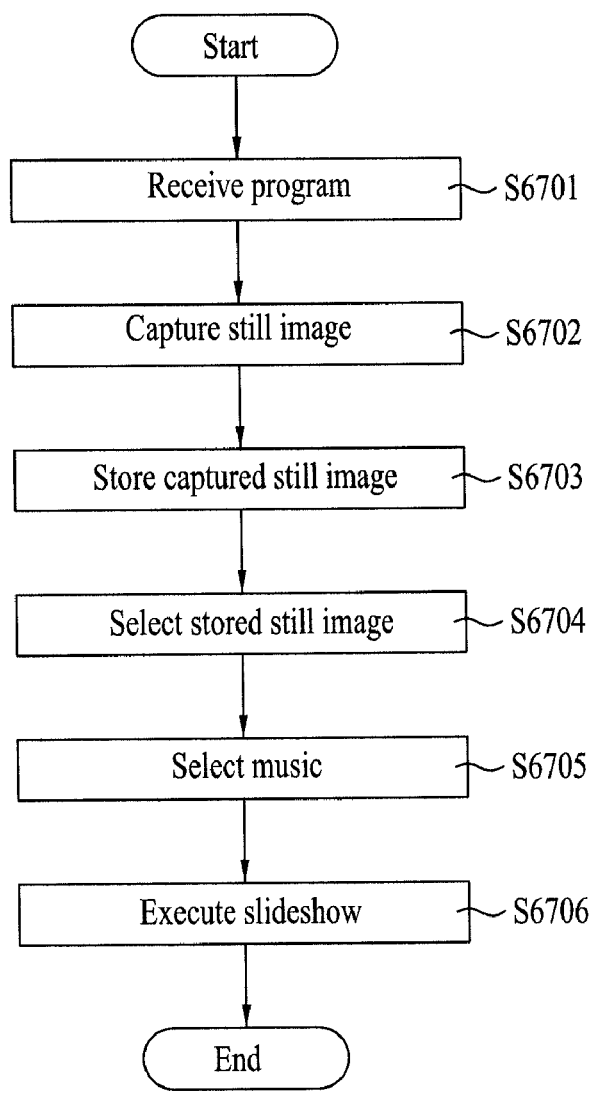
FIG. 67 is a flow chart illustrating a method for reproducing the stored program according to the present invention.

FIG. 67 is a flow chart illustrating a method for reproducing the program according to another embodiment of the present invention.

Referring to FIG. 67, the playback system captures a still image of the received program, and outputs the still image in the form of a slideshow.

The program playback method receives a program, captures the still image of the received program, and stores the captured still image.

In this case, the stored still image may be displayed in the form of a slideshow.

The stored still image may be displayed along with a predetermined music.

The playback system receives the program at step S6701.

Upon receiving a still-image capture signal of the received signal, the playback system captures the image of the received program at step S6702.

The still-image capture signal may be generated by a user, or may be generated by a receiver controller.

For example, if a desired image to be stored is displayed while the user views the program, a still-image capture signal may occur. While the program is reproduced, the above receiver controller may generate the still-image capture signal at intervals of a predetermined time. The captured still image may be displayed according to a predetermined format, or may be used for a preview function or a summary playback. In other words, the images are captured at intervals of a predetermined time, such that the captured images are used to execute either the partial summary playback or the preview function, instead of the playback of all parts of the program.

The playback system stores the captured still image at step S6703.

The playback system selects a still image to be displayed from among the stored still images at step S6704.

The still image to be displayed may be selected from the list of captured still images. The list of captured still image may be displayed, or only titles of the captured images may be displayed.

When the selected still image is displayed, the playback system may also select a music file at step S6705. For example, a music file stored in the playback system may be selected as the above-mentioned music file. For another example, a music file stored in an external memory may also be selected. Also, the music file may be downloaded from a communication module as necessary.

The selected still image may be displayed in the form of a slideshow at step S6706.

According to the slideshow scheme, the still images are displayed at intervals of a predetermined time. For example, if three selection still images exist, i.e., a first still image 1, a second still image 2, and a third still image 3, if a predetermined time interval is 5 seconds, the first still image 1 is displayed for 5 seconds, the second still image 2 is displayed for 5 seconds, and the third still image 3 is displayed for 5 seconds. After displaying the third still image 3, the slideshow output may be completed, and then the first still image 1 may be repeatedly displayed. The predetermined interval of the aforementioned slideshow output may be determined as a default, or may be selected by a user.

In this case, if a music file to be outputted along with the selected still image is selected, the music file is outputted and at the same time that the slideshow is displayed.

Figure 68:
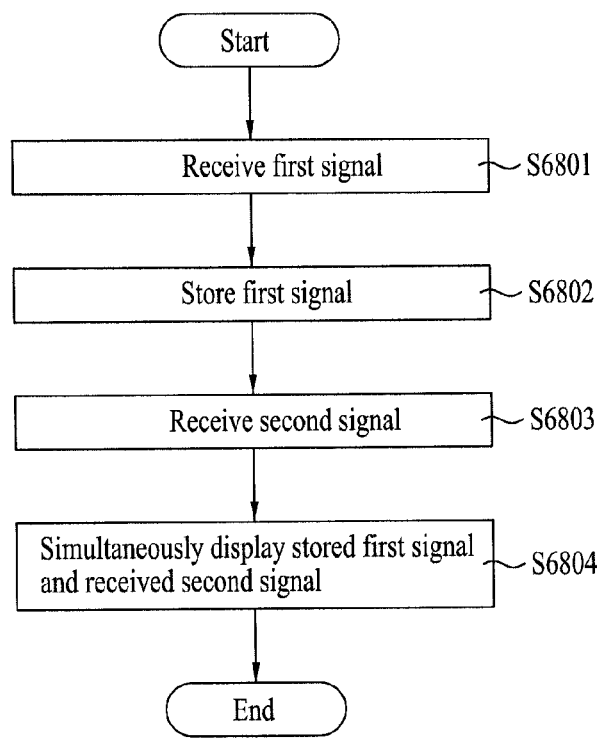
FIG. 68 is a flow chart illustrating a method for reproducing the stored program according to another embodiment of the present invention.

FIG. 68 is a flow chart illustrating a method for reproducing the stored program according to another embodiment of the present invention.

Referring to FIG. 68, the playback system may output the first signal having been stored and the second signal received at the same time.

In order to reproduce the stored program, the playback system receives/stores the first signal, receives the second signal, and simultaneously outputs the first and second signals.

At step S6801 for receiving the first signal, the playback system receives mobile service data. Namely, the playback system receives the program.

The playback system stores the first signal in a storage medium at step 6802.

At step S6803 for receiving the second signal, the second signal may be either mobile service data or a communication signal. For example, a voice phone communication signal, a video phone communication signal, or a wireless Internet communication signal may be used as the second signal at the above step S6803.

At least one of the first signal and the second signal may correspond to mobile service data which has been additionally coded by a transmission end.

The playback system outputs the first signal and the second signal at the same time.

In this case, there is no interruption between the first signal and the second signal. The playback system receives the first signal, and stores it. While the playback system outputs the first signal, it receives the second signal simultaneously while outputting the received second signal.

While the playback system receives/outputs the second signal, it receives/stores the first signal, and may output the first signal and the second signal at the same time.

The playback system receives/stores the first signal. While receiving/displaying the first signal, the playback system may output the first signal and the second signal at the same time.

Input signals from multi-sources may be simultaneously displayed or stored. In this case, the multi-sources may be received in source-input modules, respectively. The source-input modules may be a mobile communication module, a mobile service data reception module, a wireless Internet module, or a satellite reception module. The above-mentioned examples have been disclosed for only illustrative purposes, and the scope of the present invention is not limited to the above-mentioned examples, and other examples are made available for the present invention.

In this case, the first signal or the second signal may be displayed or stored along with associated information of a corresponding signal.

The simultaneous output signals applied to multi-sources may not be limited to the first and second signals, and two or more signals may also be applied to the multi-sources. Therefore, the above-mentioned multi-source signals may be simultaneously displayed on two or more screen windows.

Figure 69A:
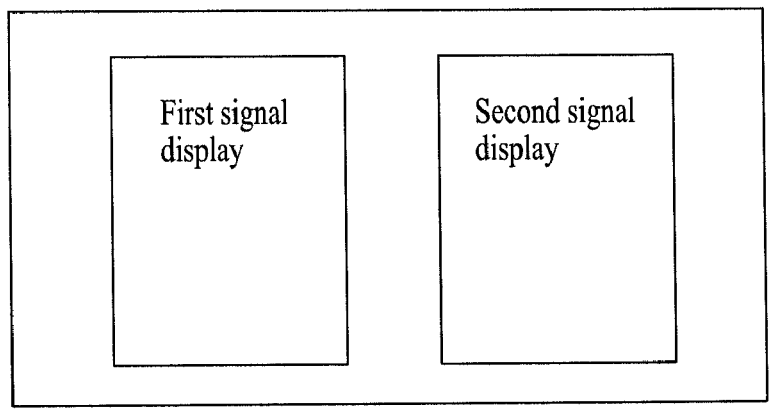
FIG. 69A and FIG. 69B show conceptual diagrams illustrating methods for simultaneously displaying a first signal and a second signal according to the present invention.
Figure 69B:
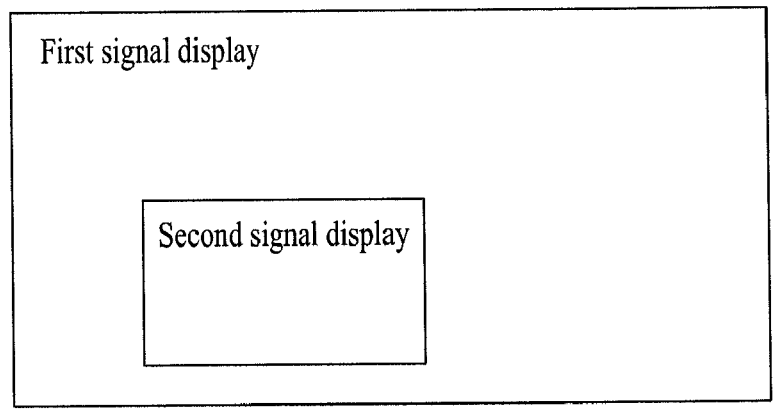

FIG. 69A and FIG. 69B show conceptual diagrams illustrating methods for simultaneously displaying a first signal and a second signal according to the present invention.

Referring to FIG. 69A, the playback system may simultaneously display the first signal and the second signal at different areas.

The first signal and the second signal may be displayed on different multi-windows, respectively.

Referring to FIG. 69B, the display area of the first signal partially overlaps with that of the second signal, so that the first and second signals are simultaneously displayed. In other words, the first and second signals are displayed on a main-image and a sub-image, which are configured in the form of a Picture-In-Picture (PIP). In this case, the size of the sub-image may be changed to another size, and the display position of the sub-image may also be changed to another.

Figure 70:
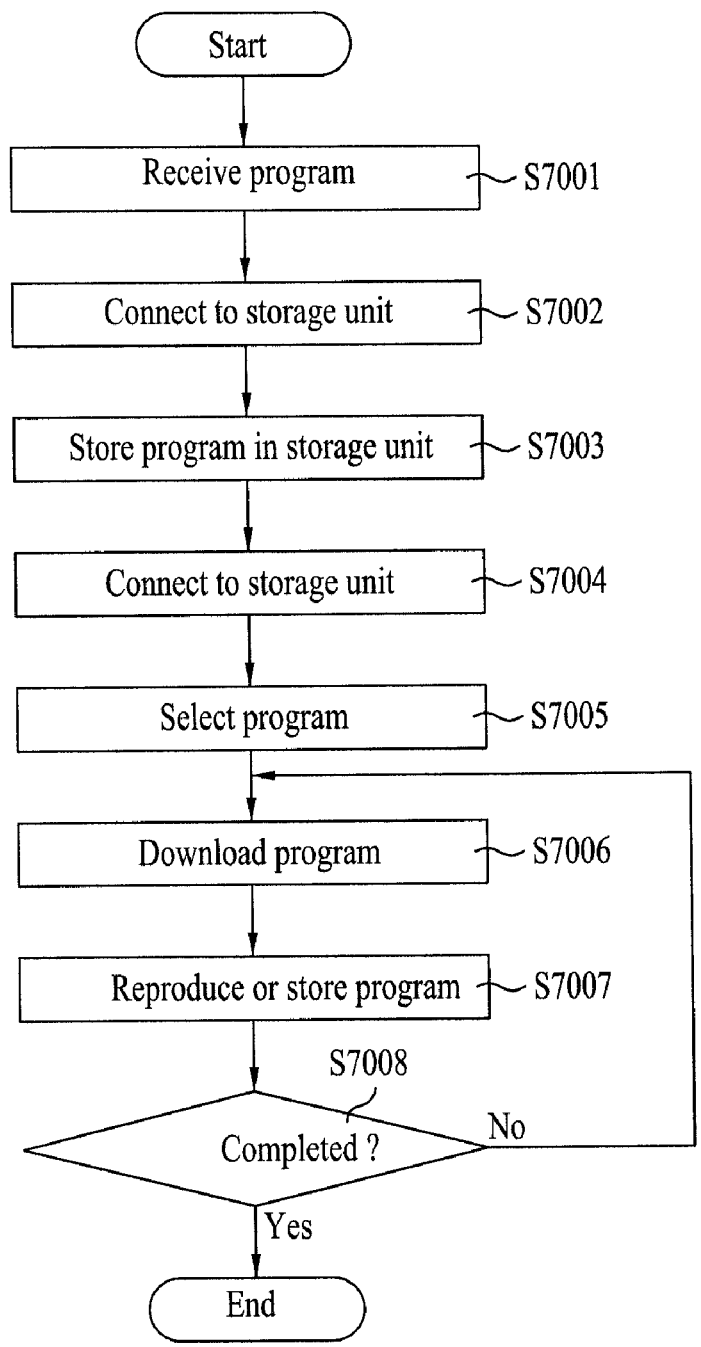
FIG. 70 is a flow chart illustrating a method for reproducing the stored program according to another embodiment of the present invention.

FIG. 70 is a flow chart illustrating a method for reproducing the stored program according to another embodiment of the present invention.

In FIG. 70, according to the method for reproducing the program stored in the storage medium, a storage medium may be an external storage medium or an internal storage medium.

The program playback method selects a program to be reproduced from among the storage medium, receives the selected program, and reproduces the received program.

Namely, the playback system receives the program at step S7001.

The playback system connects the received program to the storage medium at step S7002. In this case, under the condition that the received program is connected to the storage medium, the playback program may receive the program. Namely, there is no interruption before or after either the program reception or the storage-medium connection time.

The storage medium may be connected to the received program via a peripheral-device connection interface or a network protocol. In this case, the network protocol may be a communication module or a wireless Internet module.

The aforementioned storage medium connected to the received program may be an external memory or a network server. For example, an external record device may be a DVD player or a PC.

The playback system stores the program received in the connected storage medium at step S7003.

When the program stored in the storage medium is reproduced, the playback system selects a program to be reproduced from among the programs stored in the storage medium at step S7006.

The programs stored in the storage medium may be outputted in the form of the stored list, or a program to be reproduced may be selected from among the stored list. The preview image or a representative image of the stored program may be displayed, and a program to be reproduced may be selected from among image information.

The playback system receives the selected program at step S7006. In this case, the program may be downloaded from the network server via the network protocol, or may also be downloaded from the external record device via a peripheral-device connection interface.

The received program may be stored in a storage unit contained in the receiver, or the received program may be reproduced at step S7007. Namely, the program stored in an external storage unit is stored in the receiver, the stored program may be reproduced in the future, or the received program may be simultaneously reproduced as necessary.

The playback system determines whether a program-playback end event or a program-storage end event occurs at step S7008. If the end event occurs, the playback or storing of the program is completed.

As described above, the method for receiving/storing mobile service data, and the method for reproducing the stored mobile service data have been described in detail.

A method for storing the received mobile service data, and performing a time-delay playback of the stored mobile service data, and associated embodiment will hereinafter be described. In this present invention, for the convenience of description and better understanding of the present invention, the above-mentioned time-delay playback system is hereinafter referred to as a "time-shift playback system".

The time-shift playback system can be applied to the method for storing/reproducing mobile service data (i.e., program), and embodiments of the present invention can be applied to the time-shift storing/playback methods. For the convenience of description, the same concept as that of the following time-shift storing/playback method will herein be omitted.

Figure 71:
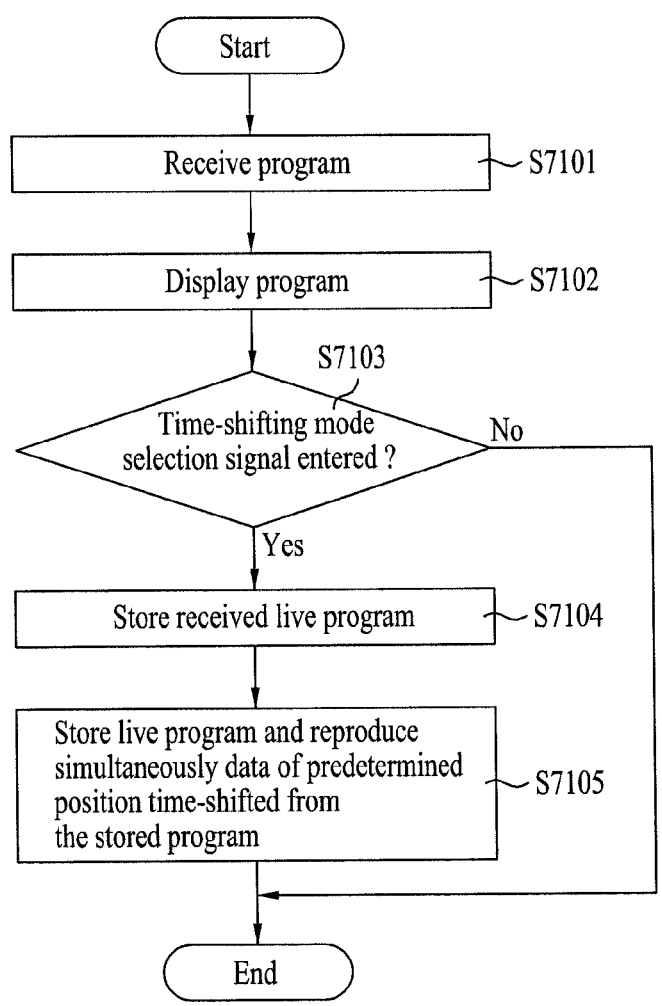
FIG. 71 is a flow chart illustrating a method for storing mobile service data and performing a time-shift playback of the mobile service data according to the present invention.

FIG. 71 is a flow chart illustrating a method for storing mobile service data and performing a time-shift playback of the mobile service data according to the present invention.

Referring to FIG. 71, the broadcast receiver receives mobile service data, receives a time-shift mode selection signal, and stores the received mobile service data and at the same time reproduces a time-shifted predetermined position.

At the step S7103 of receiving the time-shift mode selection signal, the broadcast receiver receives a program storing signal for the time shift. If the receiver is powered on or a channel is selected, a time-shift mode selection signal may be automatically generated. While the program is received and displayed, the time-shift mode selection signal may be entered by the user, or may also be entered by an interrupt signal.

The above step of receiving the time-shift mode selection signal is not limited to before or after the program Rx/Tx (reception/transmission) times. Namely, the time-shift mode selection signal may occur as soon as the power-supply signal is applied to the receiver, or may occur during the program output time.

If the time-shift mode selection signal is entered, the broadcast receiver stores the received program. In this case, the broadcast receiver displays the received program, and at the same time stores the displayed program.

When the received program is stored, and at the same time a time-shifted predetermined position may be stored in the stored program at step S7106. For example, the broadcast receiver stores a currently-received (current Rx) program for the time-shift, and reproduces data of a predetermined position of the stored program, which has been received before the current Rx program, simultaneously while being spaced apart from the Live broadcast program by a predetermined time. In this case, the Live program and the time-shifted program can be displayed at the same time. And, the current time-shifted program and other programs are displayed, and at the same time the time-shifted program can be displayed. For example, the current time-shifted program and the other programs may be simultaneously displayed in the form of a Picture-In-Picture (PIP) scheme composed of main- and sub-images. Otherwise, the current time-shifted program and the other programs may be simultaneously displayed independent of each other.

Figure 72:
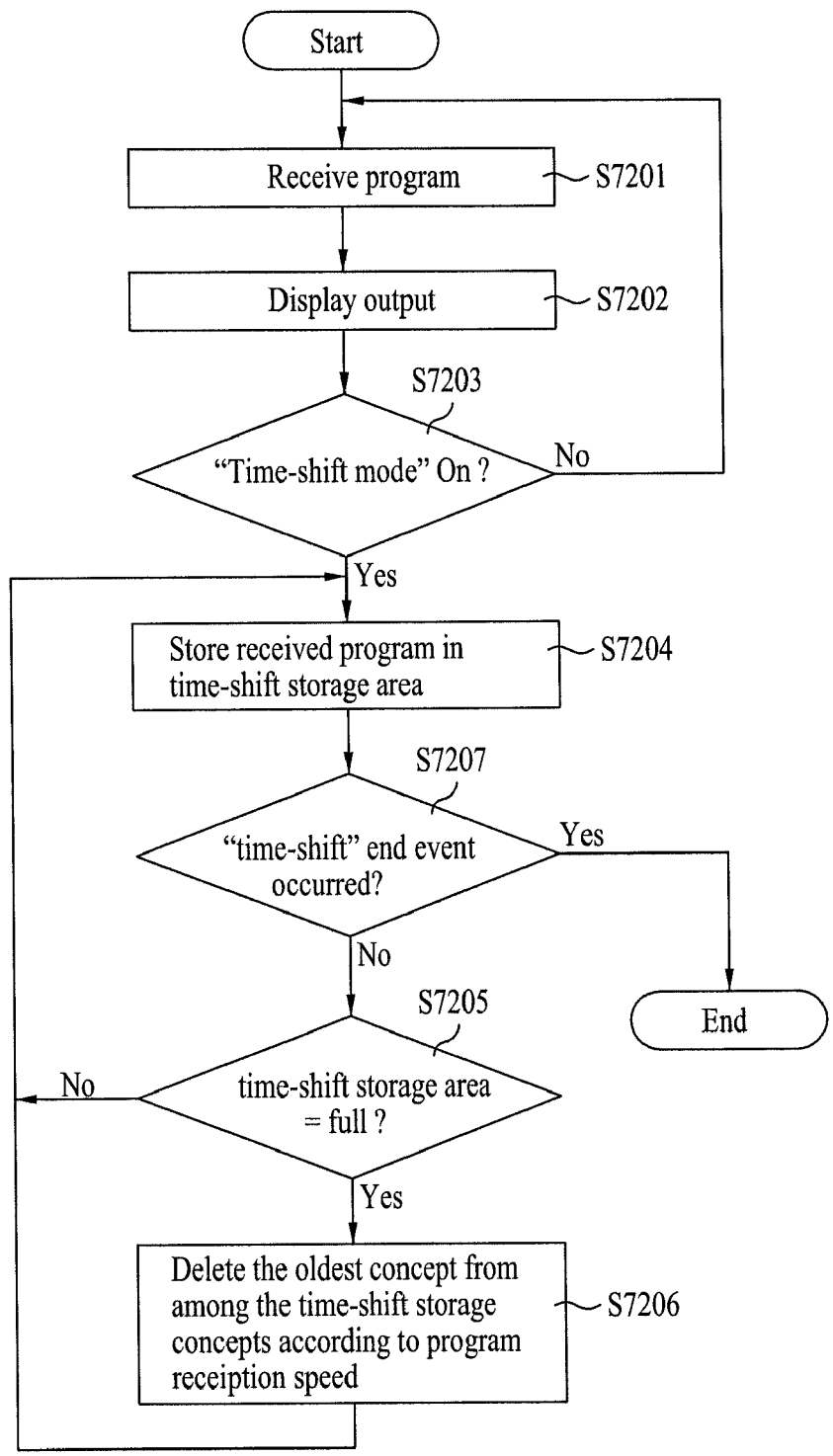
FIG. 72 is a flow chart illustrating a method for storing mobile service data received for a time-shift according to the present invention.

FIG. 72 is a flow chart illustrating a method for storing mobile service data received for a time-shift according to the present invention.

Referring to FIG. 72, the broadcast receiver receives a time-shift mode selection signal, stores the received mobile service data in a time-shift storage area, and deletes the pre-stored data from the time-shift storage area. In this case, in the case of deleting data the pre-stored data from the time-shift storage area, the pre-stored data can be deleted according to the Rx speed of the mobile service data. For example, the storing of the received mobile service data and the deletion of the pre-stored data can be performed at the same time. In this case, the time-shift storage area may be replaced with an external storage medium or an internal storage medium of the receiver.

Namely, the broadcast receiver receives a program including mobile service data at step S7201, processes the received program, and displays the processed result at step S7202.

The broadcast receiver determines whether a time-shift mode is selected or not at step S7203. During the display time of the Rx program, the time-shift mode may be generated when the receiver is powered on, or may be generated by a channel transition. If an external interrupt signal is received while mobile service data is displayed, the time-shift mode may be automatically generated. For example, if a phone call signal is suddenly received while a receiver capable of receiving a phone signal and mobile service data displays the mobile service data, the time-shift mode selection signal may be automatically generated. Namely, if a predetermined mobile service data Rx signal is initially generated or shifted, a time-shift mode selection signal may occur by an interrupt signal. Otherwise, if a user enters a control signal, a time-shift mode selection signal may occur.

If the time-shift mode is not selected, the broadcast receiver receives a program including the mobile service data, and displays the received program.

If the time-shift mode is selected, the broadcast receiver stores the Rx program in the time-shift storage area of the storage medium at step S7204. The broadcast receiver determines whether the time-shift end event occurs at step S7207. If the time-shift end event has not occurred, the broadcast receiver stores the received program in the time-shift storage area.

In the time-shift storage area, the recorded data is separated from general data, so that the recorded data and the general data are stored in different areas. In this case, the time-shift storage area may be a temporary storage area for storing a predetermined storage capacity. For example, provided that the time-shift storage area can store data of two hours, if the time-shift mode selection signal is entered and data of the two hours is stored, the time-shift storage area is full of the data of the two hours. In this case, if data is removed from the time-shift storage area in the order of the oldest data, a currently-received program can be continuously stored in the time-shift storage area.

For this purpose, the broadcast receiver determines whether the time-shift storage area is full of data at step s7205. If it is determined that the time-shift storage area is full of data at step S7205, the broadcast data can delete the oldest data from among the stored data for the time shift function at step S7206. In this case, the oldest data is the first data which has been initially stored in the time-shift storage area. For example, data stored in the head register of the time-shift storage area is deleted, and currently-received mobile service data may be stored in the last register of the time-shift storage area.

When deleting the initially-stored data, the broadcast receiver can delete the oldest data at a deletion speed corresponding to the Rx speed of the current Rx program. If the pre-stored data is deleted from the time-shift storage area at the Rx speed of the mobile service data, the capacity of the time-shift storage area does not affect the storing of the currently-received mobile service data, and the largest number of data units may be stored in the time-shift storage area.

During the above-mentioned process, if the time-shift end event occurs at step S7207, the broadcast receiver terminates the storing process for the time shift.

The time-shift end event may be a time-shift end signal or a receiver power-OFF signal. Besides, all kinds of command control signals for terminating the time-shift function can be used as the time-shift end event.

Figure 73:
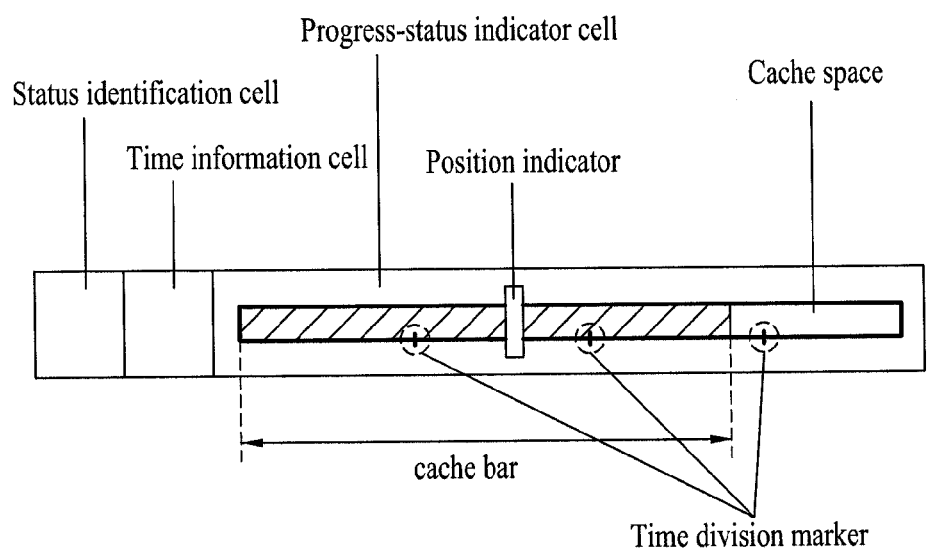
FIG. 73 shows a progress-information OSD according to the present invention.

FIG. 73 shows a progress-information OSD according to the present invention.

Referring to FIG. 73, a progress-information OSD for the current functions may be displayed.

There are a variety of progress-information OSD examples, a status identification cell, a time information cell, and a progress-status indication cell.

The status identification cell includes specific information for identifying status information of a current function. The progress status may be denoted by a visual position indicator, a color, or mode-text information.

Figure 74A:
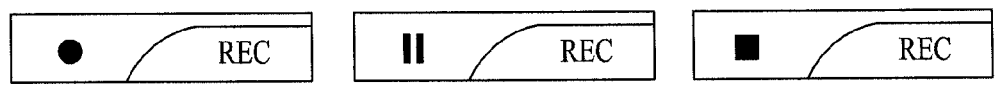
FIG. 74A to FIG. 74D show visual position indicators and mode-text information according to the present invention.
Figure 74B:
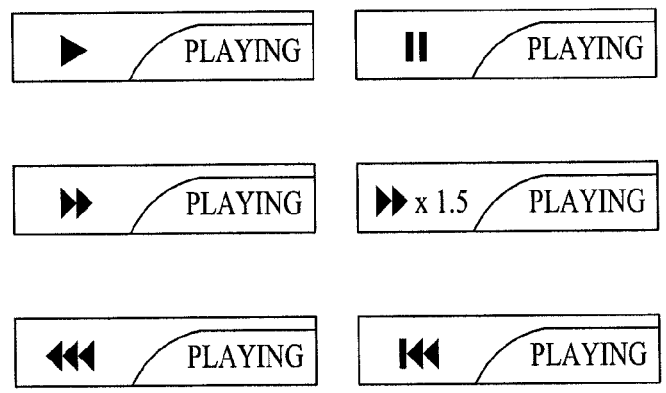
Figure 74C:
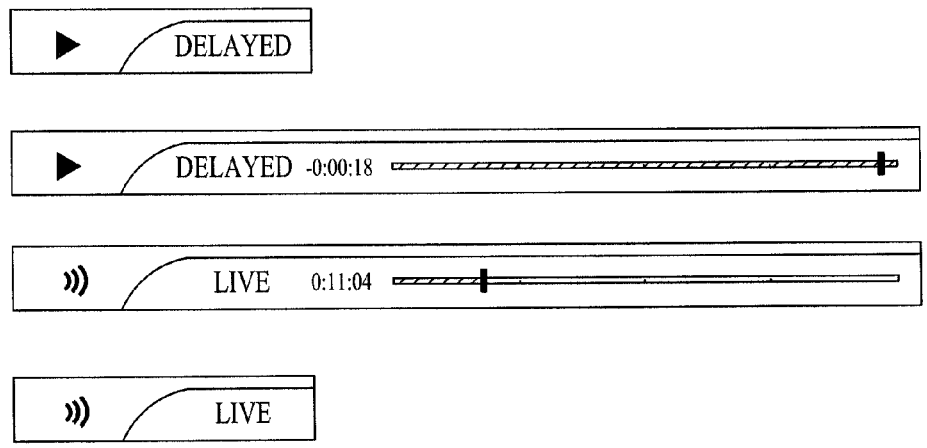

FIG. 74A to FIG. 74C show visual position indicators and mode-text information according to the present invention. For example, as shown in FIG. 74A, a recording mode, a recording-pause mode, and a recording stop mode may be displayed. As shown in FIG. 74B, a playing mode, a playing-pause mode, a backward-playing mode, a forward-playing mode, and an X-speed playing mode may be displayed. As shown in FIG. 74C, a time-shift delayed mode, a time-shift current-storing mode, and a live broadcast output mode may be displayed.

The time information cell includes time information of a current progress status, and may include at least one time. For example, if the program is in the recording mode, a recording progress time may be displayed. Otherwise, if the program is in the playing mode, a playback time of the recorded program and current playback time information of the program may be displayed. If the time-shifted program is displayed during the time-shift function, the broadcast receiver may display record time information of the recorded program and a record time of a currently-received Live program at a predetermined output position. For example, if a current time is 8:30 o'clock, and a predetermined position of the program which has been recorded before 30 minutes is time-shift-reproduced, the broadcast receiver may display "8:00/8:30". If a total time-shift record time of the current Live program is 90 minutes, and data of a predetermined position corresponding to 60 minutes (i.e., before 30 minutes) is time-shift-reproduced, the broadcast receiver displays "1:00/1:30". And, the broadcast receiver may display a difference in time between the time-shift playback and the currently-received/stored program. For example, provided that the program recorded before 1 hour is time-shift-reproduced and the currently-received program is continuously stored, the broadcast receiver may display "−1: 00:00".

The progress-status indication cell may include a cache space equipped with a position indicator indicating a current position.

The above-mentioned progress-status indication cell may indicate a progress bar including a cache bar. The cache space is a total storage capacity, and the cache bar is the currently-stored program's capacity from among the total storage capacity. In this case, the cache space may be indicated in units of capacity, or may also be indicated in units of time.

The cache bar visually indicates the currently-stored capacity status. In this case, the cache bar increases in proportion to the storage status. For example, provided that time-shiftable memory capacity is 2 hours and a current time-shifted time is 1 hour, the cache space is 2 hours, the cache bar is located at a 1-hour position corresponding to the half of the cache space. If the time-shift storing is continuously performed, the cache bar increases in proportion to the time-shift storing time.

The position indicator visually indicates a progress status (such as a current playback) in proportion to a total storage time. For example, provided that the time-shiftable memory capacity is 2 hours, the current time-shifted time is 1 hour, and the user desires to display the program which has been stored before 30 minutes, the cache space is 2 hours and the cache bar is located at 1-hour position corresponding to the half of the cache space. In this case, if the position indicator moves to the 30-minutes position, the cache bar continuously increases in proportion to the time-shift storing, the broadcast receiver performs the time-shift playback from the 30-minutes position indicated by the position indicator, and the position indicator continuously moves in proportion to a playback speed.

The position indicator may be implemented with any one of all kinds of units capable of indicating current status positions. For example, an arrow, a line or a figure may be used as the position indicator. The position indicator is shifted to another position, so that a current record status or a current playback status may be changed to another status. In this case, the position indicator may be directly shifted to another position, or be shifted to another position by a control key. In order to directly shift the position indicator, a touchscreen, a mouse pointer, a remote-controller, or any direction key of the receiver may be used. Needless to say, other signal entry units can also be available for the present invention.

A cache space may include time division markers, each of which divides a cache space into several sections, each of which corresponds to a predetermined time. By the time division marker, the user can relatively and visually recognize a current status. For example, if the cache space is equal to 2-hour capacity and time information is displayed at intervals of 30 minutes, the user can easily move the position indicator to another position, and can easily recognize the relative time.

Figure 74D:
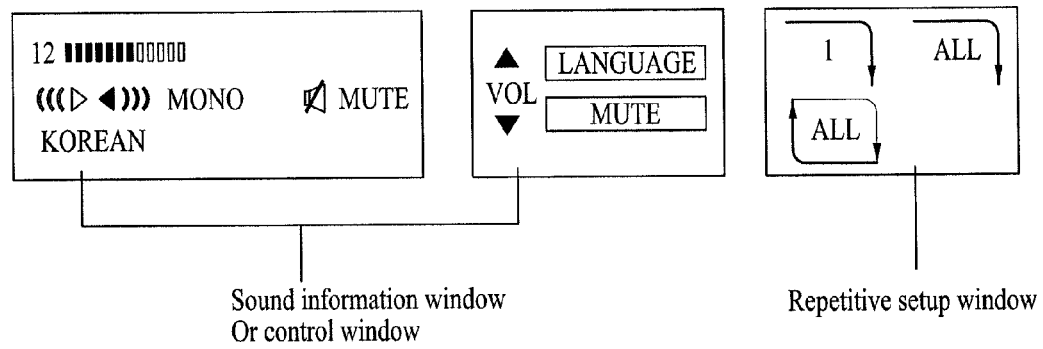

FIG. 74D shows other OSDs capable of being displayed on the screen according to the present invention.

For example, a sound-status indication, a playback-status indication (e.g., a repetition setup), or an output language can be displayed on the images of FIG. 74C.

Figure 75:
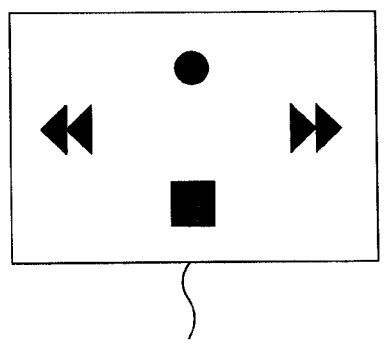
FIG. 75 shows an example of a progress control method according to the present invention.

FIG. 75 shows an example of a progress control according to the present invention.

Referring to FIG. 75, the progress status can be controlled by a direction control key or the other direction control key displayed on the screen.

In this case, when the progress status is controlled by the direction control key, for the convenience of description, the direction control information of FIG. 75 may be displayed on the screen.

If the direction control key of FIG. 75 is directly displayed, the user can directly control the progress status on the touch-screen.

Figure 76:
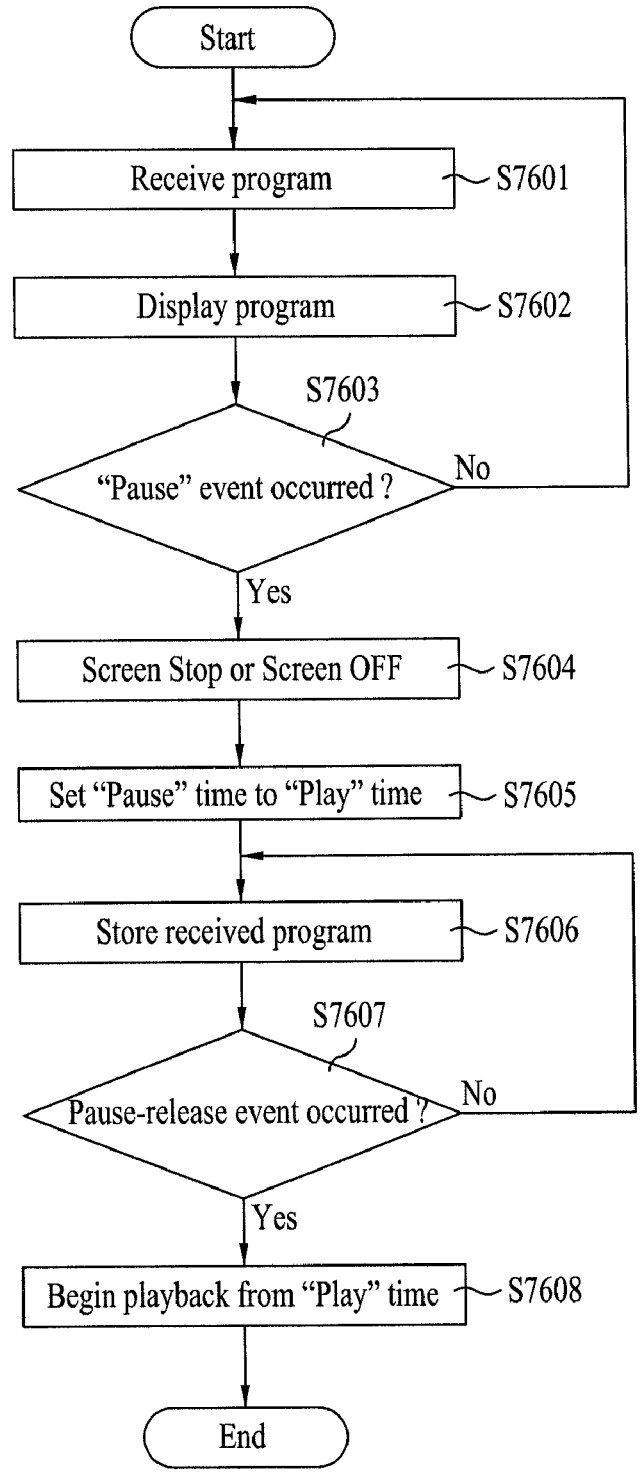
FIG. 76 is a flow chart illustrating a method for storing mobile service data and performing a time-delay playback of the mobile service data according to one embodiment of the present invention.

FIG. 76 is a flow chart illustrating a method for storing mobile service data and performing a time-shift playback of the mobile service data according to one embodiment of the present invention.

Referring to FIG. 76, the method for storing mobile service data and performing the time-shift playback of the mobile service data according to the present invention includes: receiving/displaying mobile service data; if a pause event occurs, storing mobile service data from the pause-event occurrence time; if a pause-event release event occurs, storing currently-received mobile service data, and at the same time reproducing the stored mobile service data from the pause time.

Namely, the broadcast receiver receives a program including mobile service data at step S7601, processes the received program, and displays the processed result at step S7602.

At the above step S7603 of generating the pause event, an unexpected situation incapable of continuously displaying the currently-received program occurs. For example, a user may enter a pause instruction command, or the unexpected situation may be generated by an unexpected interrupt signal. For example, if a phone call is received in a mobile receiver capable of receiving mobile service data and a phone signal while the mobile service data is displaying mobile service data, a pause event may occur. The power-supply unit of the mobile receiver receives an insufficient amount of a power-supply signal, such that the mobile receiver cannot display data whereas it can store the data. And, if the Rx program cannot be displayed due to the execution of other programs, the pause event may also occur. Besides, if other situations incapable of displaying data on the screen occur, pause event has occurred.

If the pause event occurs, the screen display is switched off, or the screen output is powered off at step S7604.

The time at which the pause event occurs is set to a playback time at step S7605. The broadcast receiver stores the Rx program from the above-mentioned time of the pause event. In this case, the Rx program can be stored in the time-shift storage area.

The broadcast receiver determines whether the pause release event occurs at step S7607. If the pause release event may include the entry of a pause release key signal, the entry of a playback signal, and all situations capable of releasing the pause mode.

The broadcast receiver continuously stores the Rx program until receiving the pause release event. Upon receiving the pause release event, the broadcast receiver begins to reproduce the program from the S7605's playback time at step S7608.

Figure 77:
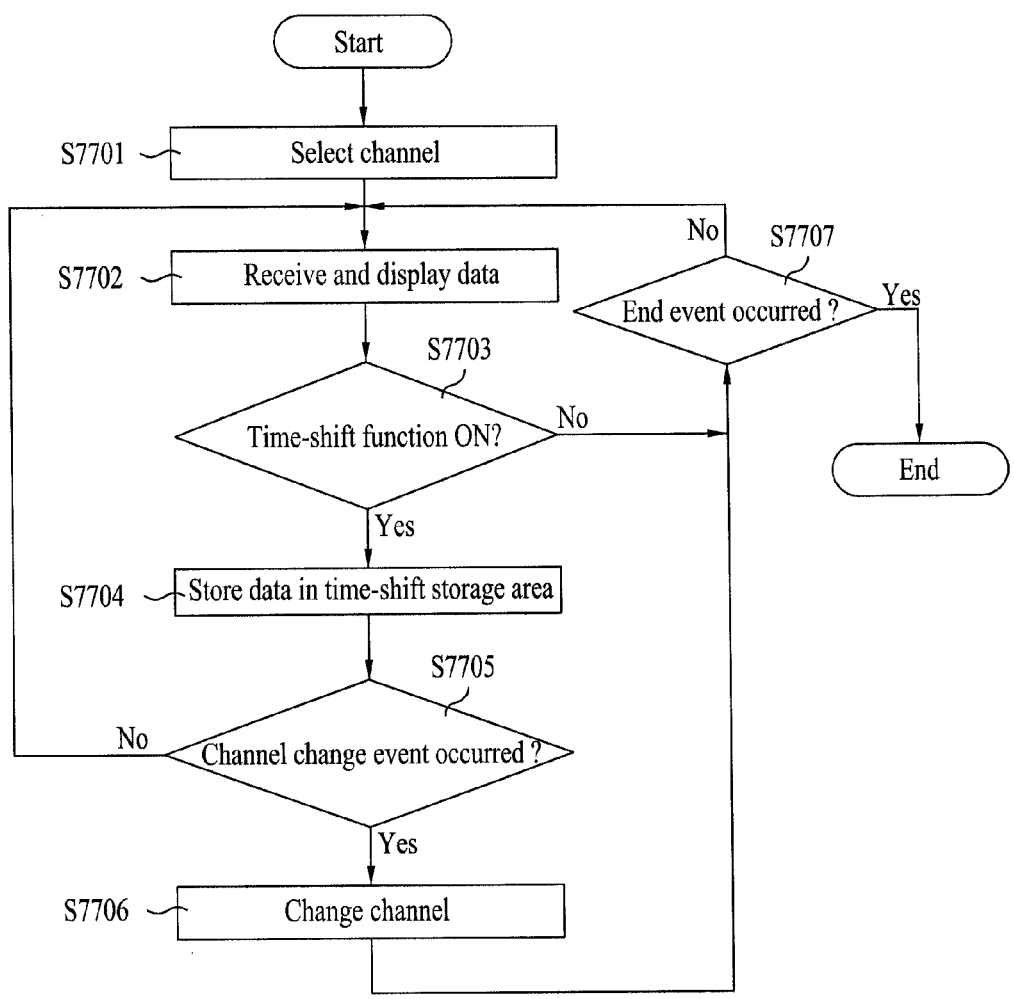
FIG. 77 is a flow chart illustrating a method for storing mobile service data and performing a time-delay playback of the mobile service data according to another embodiment of the present invention.

FIG. 77 is a flow chart illustrating a method for storing mobile service data and performing a time-shift playback of the mobile service data according to another embodiment of the present invention.

Referring to FIG. 77, the broadcast receiver receives mobile service data, receives a time-shift mode selection signal, stores mobile service data, generates a channel transition event, and stores mobile service data received by the channel transition.

Namely, at the step S7701 of receiving the mobile service data, the broadcast receiver selects a channel for transmitting the program including mobile service data, and receives the program over the selected channel.

The broadcast receiver receives mobile service data over the selected channel, and displays the received mobile service data at step S7702.

At the step S7703 of receiving the time-shift mode selection signal, the broadcast receiver receives the time-shift mode selection signal for the time shift. The time-shift mode selection signal may be generated when the receiver is powered on. The time-shift mode selection signal may be automatically generated when a channel is selected. The time-shift mode selection signal may also be entered by the user while the program is received and displayed. Besides, the time-shift mode selection signal may also be entered by an interrupt signal.

Therefore, the above step of receiving the time-shift mode selection signal is not limited to before or after the program Rx/Tx (reception/transmission) times. Namely, the time-shift mode selection signal may occur as soon as the power-supply signal is applied to the receiver, or may occur during the program display time.

If the time-shift mode selection signal is entered, the broadcast receiver stores the received program at step S7704. In this case, the broadcast receiver displays the received program at a Live broadcast mode, and at the same time stores the displayed program.

When the time-shift mode is selected and the time-shift storing is performed, the channel transition event may occur at step S7705. If the channel transition command is entered, it is considered that the channel transition event has been entered. The channel transition command may be entered by character/number input boards of the receiver or channel up/down keys, or may also be selected on the program guide such that the channel transition is made.

If the channel transition command is entered, the channel transition is performed at step S7706. If a current channel is changed to another channel, the broadcast receiver changes a current path for receiving the program to another path, and receives a program of the changed channel via the changed path.

In this case, if the time-shift mode is not switched off at step S7707, the broadcast receiver continuously receives the program of the switched channel after the channel transition, and stores the received program in the time-shift storage area.

If the time-shift end event does not occur, the cache bar displayed on the cache space in the progress-status indication cell of FIG. 73 may continuously increase irrespective of the channel transition.

Figure 78:
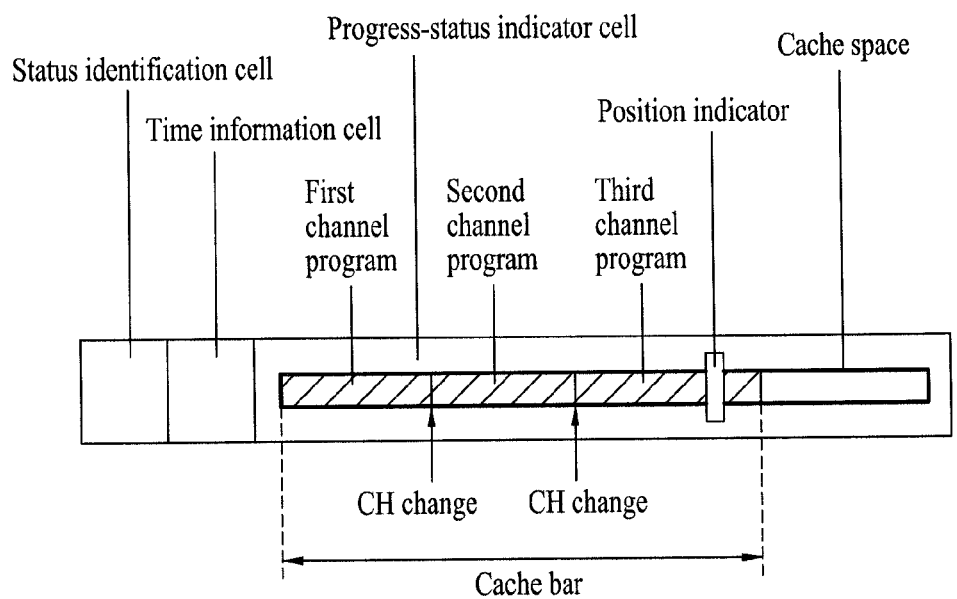
FIG. 78 is a flow chart illustrating a progress-status indication cell if a channel is shifted to another channel during a time shift mode according to the present invention.

FIG. 78 is a flow chart illustrating a progress-status indication cell if a channel is shifted to another channel during a time shift mode according to the present invention.

Referring to FIG. 78, the cache space contained in the progress-status indication cell can display the time-shift storing executed before or after the channel transition in a total storable capacity of the cache space, irrespective of the channel transition.

For example, if the user who views a first channel 1 switches the first channel 1 to a second channel 2, and then switches the second channel 2 to a third channel 3, all programs of the first to third channels 1, 2, and 3 are stored in the storable capacity of the time-shift storage area, and can be indicated on the cache space. In this case, a bookmark may be established at the channel transition time, and the bookmark position may also be indicated on the cache space. In this case, detailed descriptions of the bookmark may also be displayed on the cache space.

Figure 79:
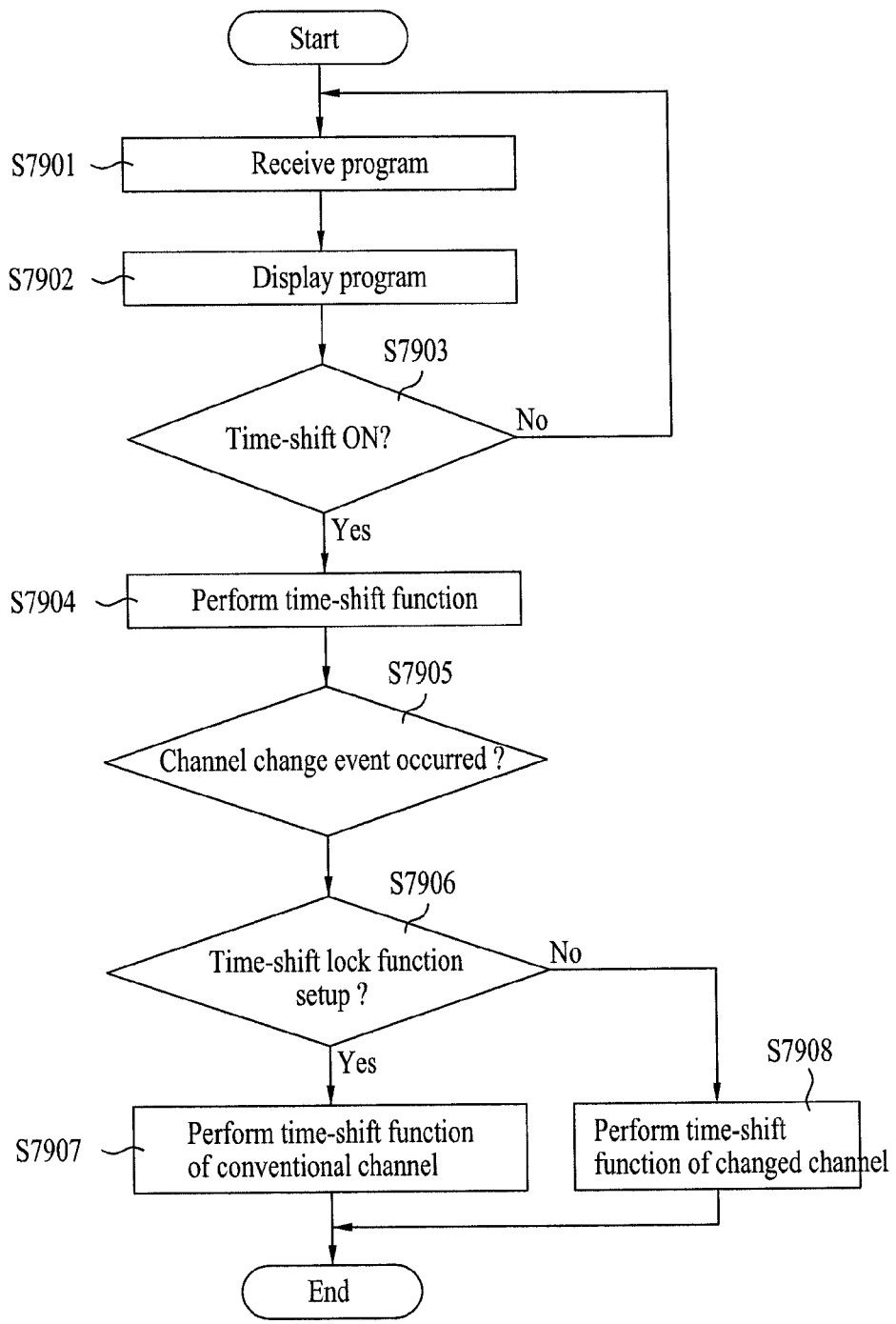
FIG. 79 is a flow chart illustrating a method for storing mobile service data and performing a time-delay playback of the mobile service data according to another embodiment of the present invention.

FIG. 79 is a flow chart illustrating a method for storing mobile service data and performing a time-shift playback of the mobile service data according to another embodiment of the present invention.

Referring to FIG. 79, the broadcast receiver receives mobile service data, receives a time-shift mode selection signal, stores the received mobile service data for the time shift, generates a channel transition event, and stores mobile service data received in a previous channel before the channel transition in order to perform the time shift function.

Namely, the receiver selects a program of a channel including mobile service data at step S7901, processes mobile service data of the selected program, and displays the processed result at step S7902.

The receiver determines whether the time-shift mode selection signal has been entered at step S7903.

If the receiver is powered on or a channel is selected, a time-shift mode selection signal may be automatically generated. While the program is received and displayed, the time-shift mode selection signal may be entered by the user, or may also be entered by an interrupt signal.

The above step of receiving the time-shift mode selection signal is not limited to before or after the program Rx/Tx (reception/transmission) times. Namely, the time-shift mode selection signal may occur as soon as the power-supply signal is applied to the receiver, or may occur during the program output time. If the time-shift mode selection signal is entered, the broadcast receiver according to the embodiment of the present invention switches on the time-shift mode.

If the time-shift mode selection signal is entered, the broadcast receiver executes the time-shift function, and stores the received program in the time-shift area at step S7904. In this case, the broadcast receiver displays the received program at a Live broadcast mode, and at the same time stores the displayed program.

When the time-shift mode is selected and the time-shift storing is performed, the channel transition event may occur at step S7905. If the channel transition command is entered, it is considered that the channel transition event has been entered. The channel transition command may be entered by character/number input boards of the receiver or channel up/down keys, or may also be selected on the program guide such that the channel transition is made. If the channel transition command is entered, the channel transition is performed. If a current channel is changed to another channel, the broadcast receiver changes a current path for receiving the program to another path, and receives a program of the changed channel via the changed path.

In this case, if the time-shift mode is not switched off and the time-shift lock function is established at step S7906, the broadcast receiver continuously receives the program of a conventional channel after the channel transition, and stores the received program in the time-shift storage area at step S7907.

However, if the time-shift lock function is not established at step S7906, the broadcast receiver receives a program of the transition channel, and stores the received program in the time-shift storage area at step S7908.

If the time-shift end event does not occur, the cache bar displayed on the cache space in the progress-status indication cell of FIG. 73 may continuously increase irrespective of the channel transition.

Next, various embodiments associated with a multi-display for displaying several windows on a single image or a single screen will hereinafter be described. In this case, at least one window from among several windows may display the time-shift program. At least one window from among several windows may display a time-shift program, a live broadcast program, a program received from peripheral connection devices, or input signals from other sources (e.g., video phone communication signals). The above multi-display may display main- and sub-images using a Picture-In-Picture (PIP) or Picture-Out-Picture (POP) function, or may display independent images using a double-window function.

Figure 80:
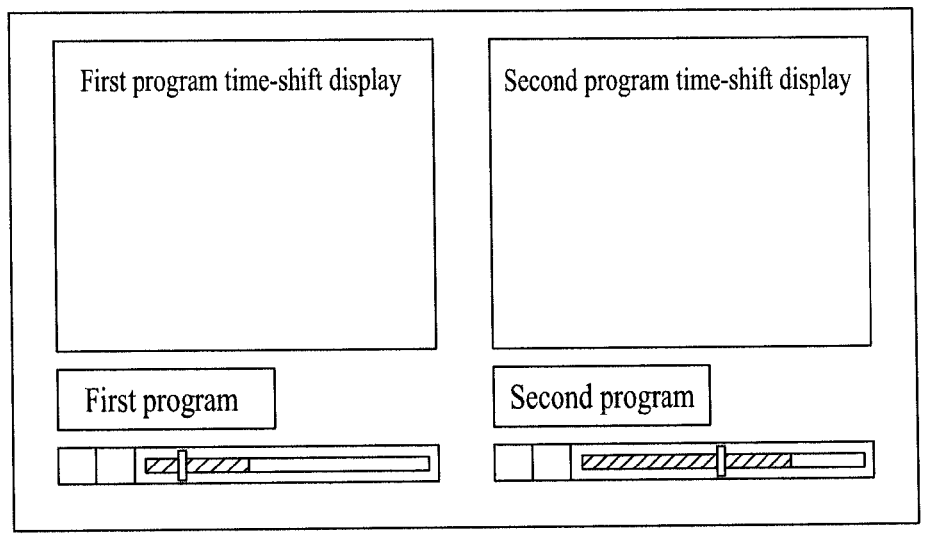
FIG. 80 is a conceptual diagram illustrating a method for multiple-performing a time-shift storing and a time-delay playback on several programs according to the present invention.

FIG. 80 is a conceptual diagram illustrating a method for multiple-performing a time-shift storing and a time-shift playback on several programs according to the present invention.

Referring to FIG. 80, the broadcast receiver receives a first program, and stores the first program in a time-shift storage area. The broadcast receiver reads a first program located at a predetermined position, which is spaced apart from a live Rx signal of the first program by a predetermined time, from the time-shift storage area, and reproduces the read first program.

Simultaneously, the broadcast receiver receives a second program, and stores the second program in the time-shift storage area. The broadcast receiver reads a second program located at a predetermined position, which is spaced apart from a live Rx signal of the second program by a predetermined time, from the time-shift storage area, and reproduces the read first program.

In this case, the first and second programs are simultaneously reproduced. Namely, the time-shift storing/reproducing operations of the first and second programs can be performed in a multi-mode. And, the broadcast receiver can simultaneously display the progress-status OSD of the first program and the progress-status OSD of the second program. And, the broadcast receiver can also display additional explanations of individual displayed programs.

The broadcast receiver can control the time-shift playback of each screen on each progress-status OSD.

Figure 81:
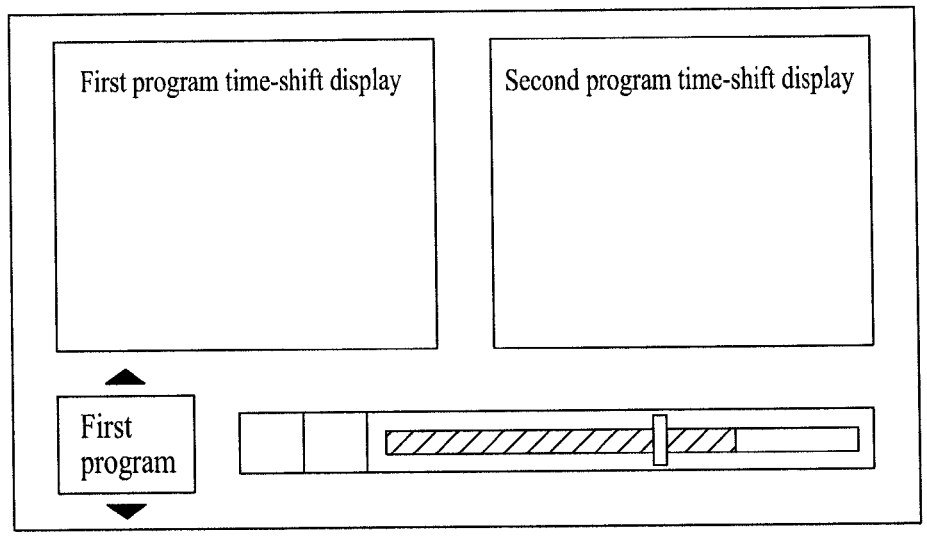
FIG. 81 is a conceptual diagram illustrating a method for multiple-performing a time-shift storing and a time-delay playback on several programs according to the present invention.

FIG. 81 is a conceptual diagram illustrating a method for multiple-performing a time-shift storing and a time-shift playback on several programs according to the present invention.

The progress-status OSD output format of FIG. 81 is different from that of FIG. 80. In more detail, the embodiment of FIG. 80 simultaneously displays the progress-status OSDs on individual display screens, but the embodiment of FIG. 81 does not simultaneously display the progress-status OSDs on individual display screens. In other words, the embodiment of FIG. 81 can select only the progress-status OSD, so that the broadcast receiver can display only the progress-status OSD of the screen to be controlled. For example, a direction key is contained in the information window for identifying the progress-status OSD, so that the broadcast receiver can select the progress-status OSD by the control of the direction key. Otherwise, the user may change the progress-status OSD display to another display using the selection key (e.g., a number board) for selecting the progress-status OSD.

Figure 82:
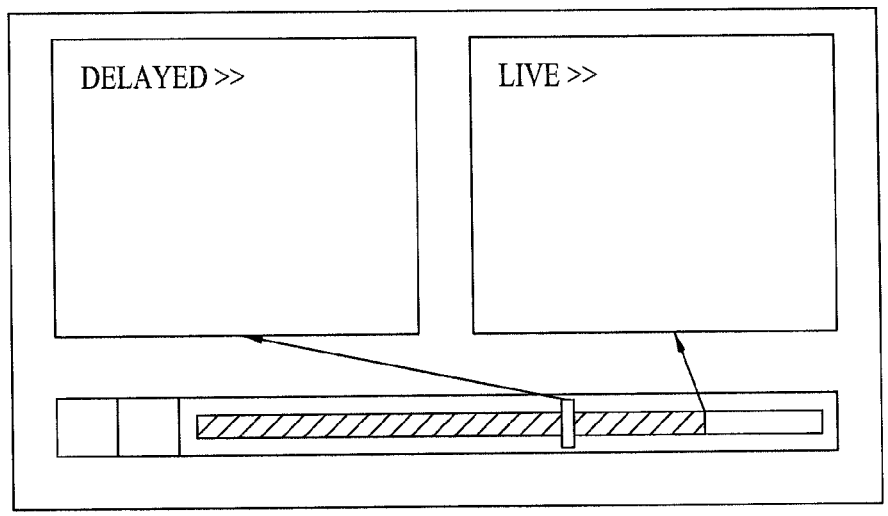
FIG. 82 is a conceptual diagram illustrating a method for simultaneously displaying a time-shifted image and a current-received live image of a single program according to the present invention.

FIG. 82 is a conceptual diagram illustrating a method for simultaneously displaying a time-shifted image and a current-received live image of a single program according to the present invention.

Referring to FIG. 82, the time-shifted playback image and the currently-received Live broadcast image are displayed under a multi-mode. In this case, the multi-display can be controlled on a single progress-status OSD. The above progress-status OSD has been disclosed for only illustrative purposes, and may include all kinds of entry methods capable of controlling the progress statuses.

In another embodiment, the broadcast receiver displays the time-shifted programs on a single image associated with different programs, and displays other programs on other images under a Live broadcast mode.

Namely, the time-shift playback image and the currently-received Live image of the same program can be simultaneously displayed on the multi-images. Different programs are displayed on the multi-images, but only one image is configured in the form of a time-shifted image.

Figure 83:
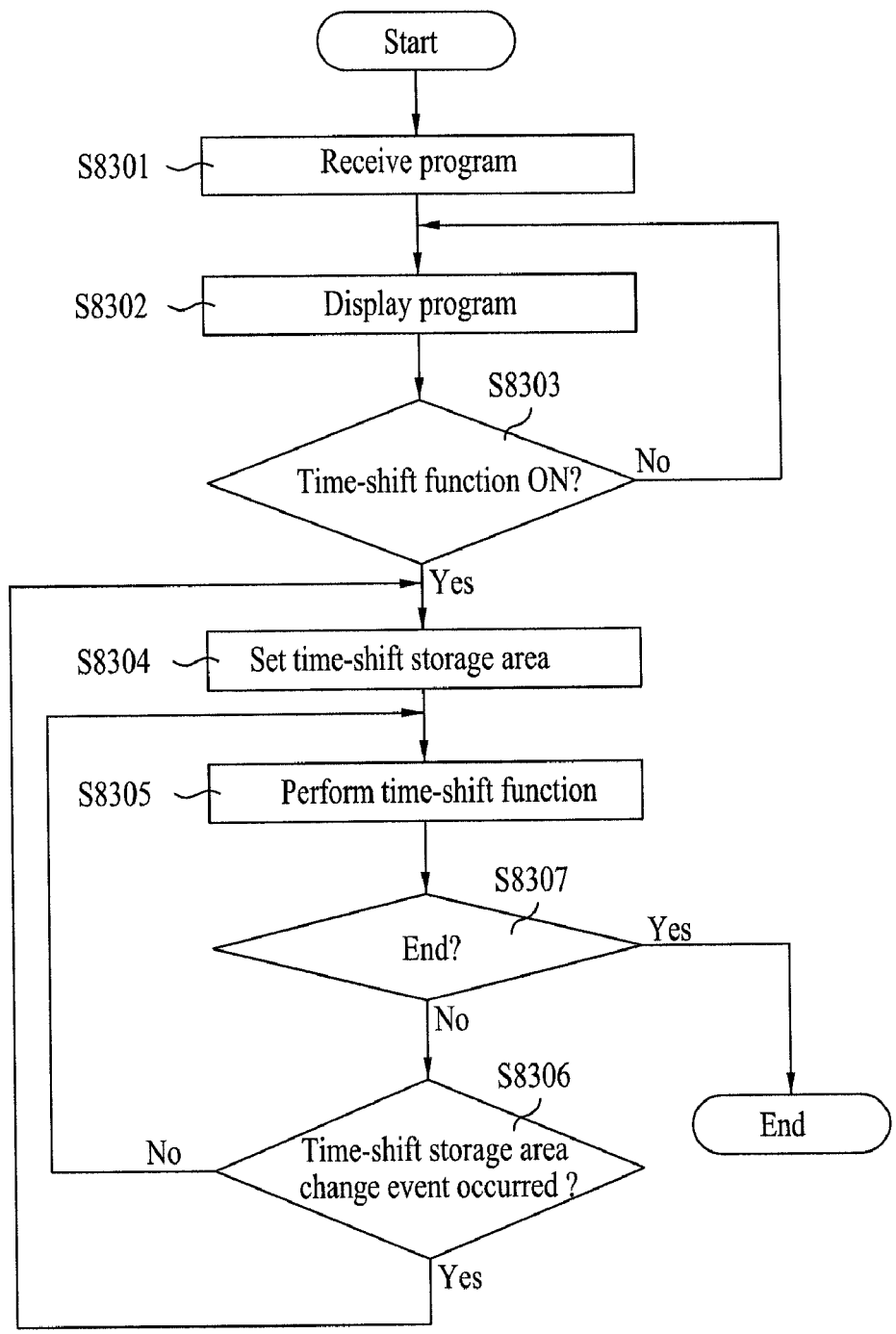
FIG. 83 is a flow chart illustrating a method for storing mobile service data and performing a time-delay playback of the mobile service data according to another embodiment of the present invention.

FIG. 83 is a flow chart illustrating a method for storing mobile service data and performing a time-shift playback of the mobile service data according to another embodiment of the present invention.

Referring to FIG. 83, the broadcast receiver receives mobile service data, receives a time-shift mode selection signal, establishes a time-shift storage area, and stores the received mobile service data in the time-shift storage area.

Namely, the broadcast receiver receives the mobile service data at step S8301, processes the received mobile service data, and displays the processed result at step S8302.

If the time-shift mode selection signal is entered at step S8303, the broadcast receiver may establish the time-shift storage area at step S8304.

The time-shift storage area is separated from a semipermanent storage area, so that it is used as a temporary storage area. In this case, irrespective of a redundant space of the semipermanent storage area, if data is time-shift-stored in a presetting (or predetermined) time-shift storage area, and the time-shift storage area is full of the data, the stored data is deleted, and newly-received data is stored in the time-shift storage area. However, if there is an additional storage area other than the above predetermined time-shift storage area, this additional storage area may also be allocated to the time-shift storage area. In this case, much more data can be time-shift-stored.

The time-shift storage area may be established by the user, or may also be established by the controller of the receiver as necessary.

The user establishes the time-shift storage area, and decides it. In this case, in order to establish the time-shift storage area, a variety of units can be used, for example, time, capacity, or percentage. For example, if the time-shift storage area is set to 2 hours, the user may set the time-shift storage area to 1 hour or 5 hours.

The controller of the receiver determines the redundant capacity of the storage space other than the time-shift storage area, and flexibly determines the time-shift storage area according to the determined result. For example, if the time-shift storage area is set to 2 hours and the redundant storage space of 100 hours exists in the semipermanent storage space, the controller may set the time-shift storage area within the range of 100 hours.

At the above step of establishing the time-shift storage area, the time-shift storage area may be decided before the time-shift mode selection signal is entered. Namely, the establishing of the time-shift storage area is not limited to before or after the time-shift mode selection signal is entered.

If the time-shift storage area is established at step S8304, the broadcast receiver executes the time-shift function, so that it stores the currently-received program in the time-shift storage area at step S8305.

If the time-shift storage area change event occurs at step S8306, the broadcast receiver re-establishes the time-shift storage area, and performs the time-shift function. For example, the user re-enters the time-shift storage area setup signal or an unexpected change occurs in the semipermanent storage space. In this case, the redundant storage space of the semipermanent storage space may be increased or reduced, so that the time-shift storage area is re-established and the time-shift function is executed. In this case, if the redundant space of the semipermanent storage space is further set to the time-shift storage area, then the broadcast receiver may perform the time-shift storing.

In another embodiment, provided that data is additionally stored in the semipermanent storage space while the semipermanent storage space is being used as the time-shift storage area, and the redundant space of the semipermanent storage space becomes insufficient, the priority is assigned to either of the original-purposed storing usage of the semipermanent storage space and the time-shift storing usage, so that the time-shift storage area may also be established at a position of the priority. For example, if the priority is assigned to the time-shift storage usage, the time-shift storage area is maintained although the original-purposed data storage space has insufficient redundant space, and the broadcast receiver prevents other data from being stored in the time-shift storage area. In this case, due to the time-shift storage area, the broadcast receiver may display a message indicating that data cannot be stored in the semipermanent storage space. If the priority is assigned to the original-purposed storing usage of the semipermanent storage space, and the original-purposed data storage area has an insufficient redundant space, the time-shift storage area may be reduced.

If the time-shift end event occurs or the playback end event occurs at step S8307, the time-shift execution is completed. Namely, the received program is not stored in the time-shift storage area and is not reproduced.

Figure 84:
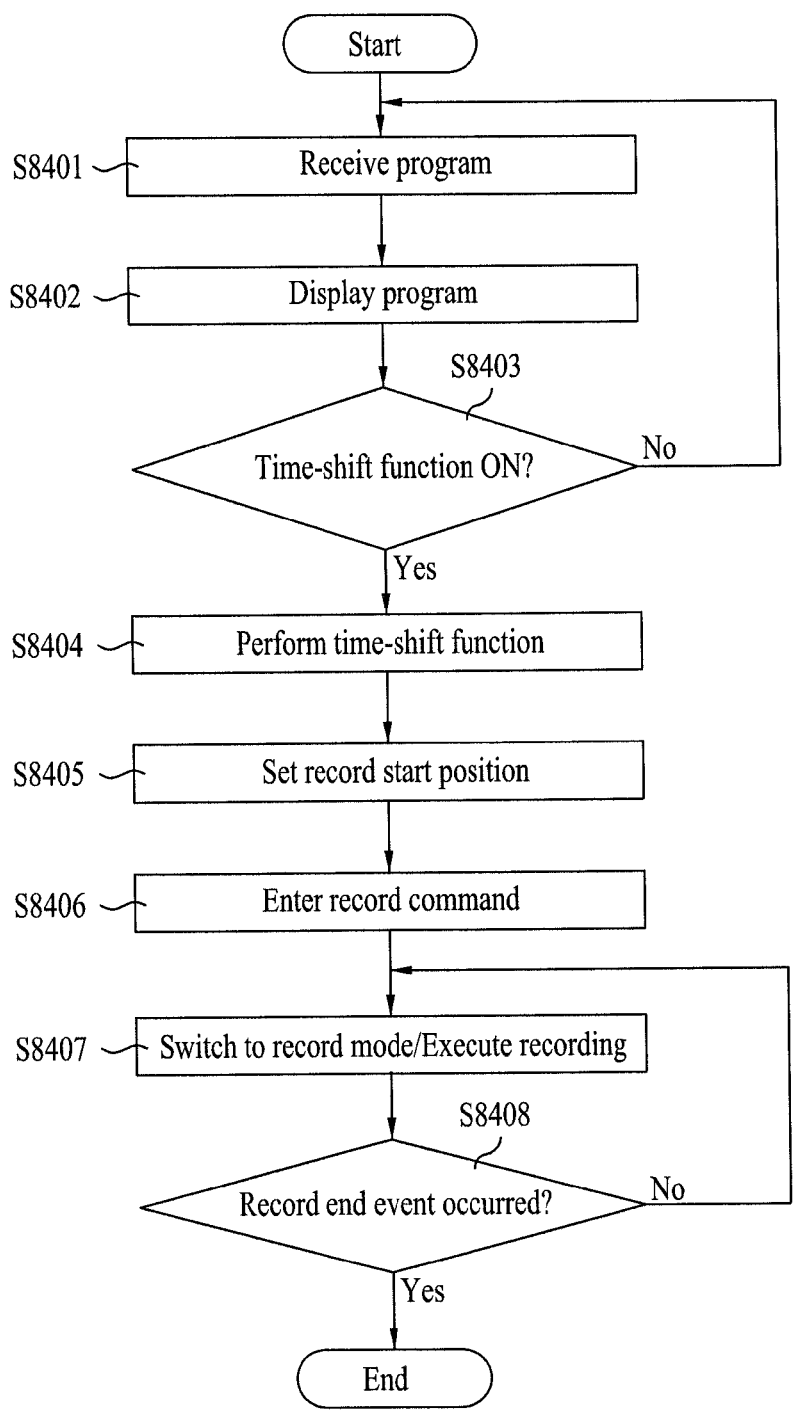
FIG. 84 is a flow chart illustrating a method for storing mobile service data and performing a time-delay playback of the mobile service data according to another embodiment of the present invention.

FIG. 84 is a flow chart illustrating a method for storing mobile service data and performing a time-shift playback of the mobile service data according to another embodiment of the present invention.

Referring to FIG. 84, the broadcast receiver receives mobile service data, time-shift-stores the received mobile service data, and moves the time-shift-stored mobile service data into the semipermanent storage area.

In this case, a predetermined position from among the time-shift-stored mobile service data is established, so that the mobile service data stored from the predetermined position can be shifted to the semipermanent storage area. The stored mobile service data ranging from the predetermined position to the current time-shift-stored position is shifted to the semipermanent storage area. The broadcast receiver may continuously store the currently-received mobile service data in the semipermanent storage area.

The broadcast receiver receives a program including mobile service data at step S8401, processes mobile service data of the Rx program, and displays the processed result at step S8402.

If the time-shift mode selection signal is entered, the broadcast receiver performs the time-shift function at step S8403. Namely, the broadcast receiver stores the Rx program in the time-shift storage area from the time at which the time-shift mode selection signal has been entered.

In this case, the program stored in the time-shift area is not semipermanently stored, but is temporarily stored. If the time-shift storage area is full of data, the above program is deleted. Therefore, the user may move the time-shift-stored program to the semipermanent storage area, and may continuously record it.

For this purposes, the broadcast receiver establishes the record start position at step S8405. The record start position may be established by a control signal as necessary. This control signal may be entered on the progress-information OSD, may be displayed on a control window so that it is directly entered by the user on the control window, or may be entered by a control key. In this embodiment, the record start position may be established within the progress-status indication cell on the progress-information OSD. For example, the user may move the position indicator on the cache space to determine the record start position.

If the program record command is entered at step S8406, the time-shift-stored program from the record start position to the current position is shifted to the semipermanent storage area, and the currently-received program is stored in the semipermanent storage area at step S8407.

If the record end event occurs at step S8408, the recording is completed. The record end event is activated when the record stop command is entered, is activated when a corresponding program is completed, or is activated when the receiver is powered off.

Figure 85:
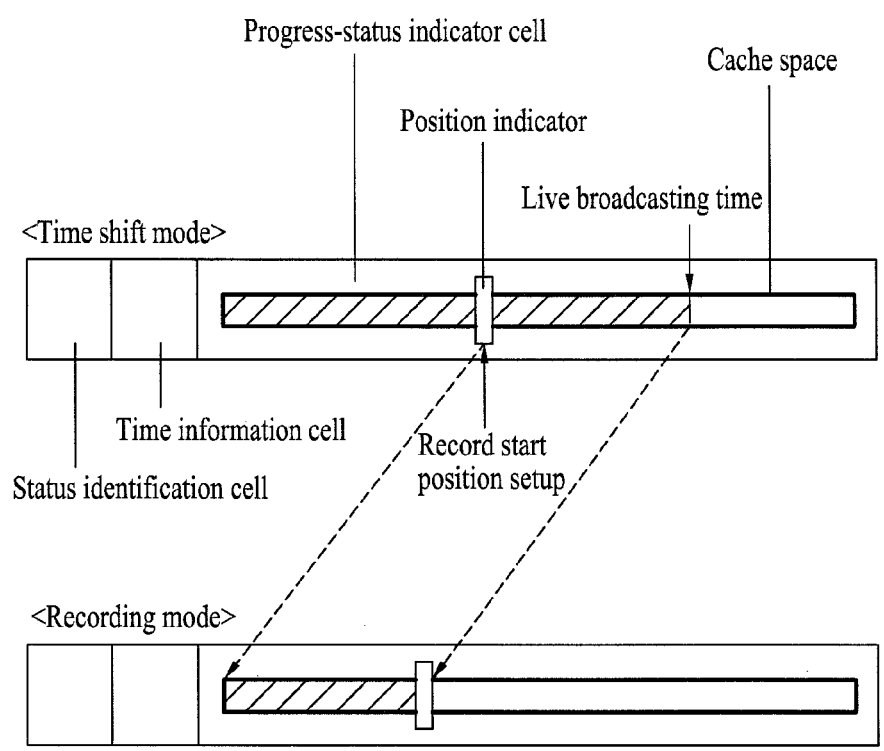
FIG. 85 shows a progress-information OSD for recognizing functions of FIG. 84 according to the present invention.

FIG. 85 shows a progress-information OSD for recognizing functions of FIG. 84 according to the present invention.

Referring to FIG. 85, the broadcast receiver establishes the record start position using the position indicator on the progress-information OSD under the time-shift mode. If the record function is executed, the progress-information OSD is shifted to the recording mode, so that the recording mode is displayed.

The progress-information OSD of the recording mode may indicate the storage capacity ranging from the record start position to the current program Rx position on the cache bar. If the currently-received program is continuously recorded, the cache bar increases in proportion to the recording speed.

Figure 86:
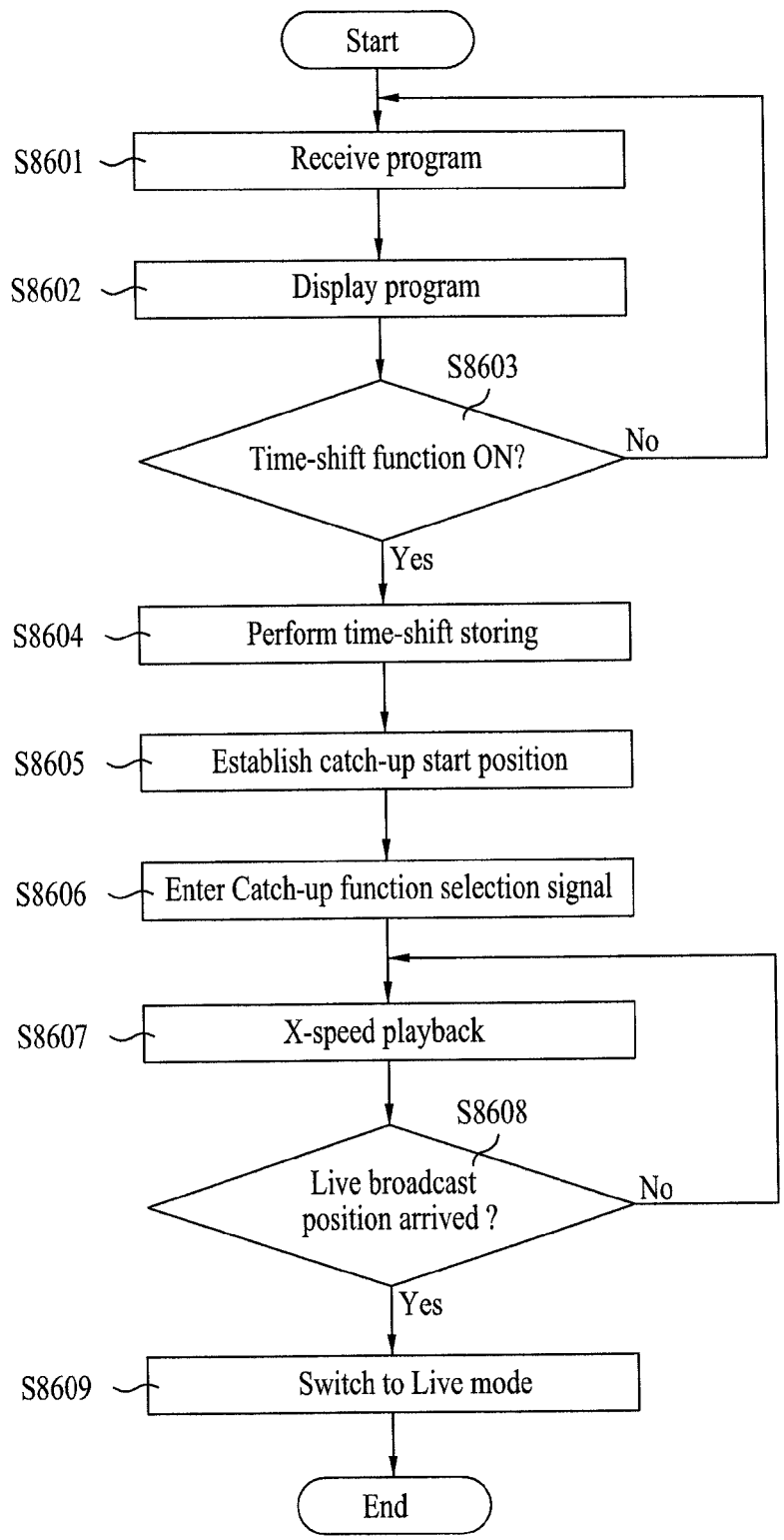
FIG. 86 is a flow chart illustrating a method for storing mobile service data and performing a time-delay playback of the mobile service data according to another embodiment of the present invention.

FIG. 86 is a flow chart illustrating a method for storing mobile service data and performing a time-shift playback of the mobile service data according to another embodiment of the present invention.

Referring to FIG. 86, the broadcast receiver receives mobile service data, receives a time-shift mode selection signal, time-shift-stores the received mobile service data, establishes a catch-up start position, and receives a catch-up function selection signal from the catch-up start position.

In this case, if the catch-up function selection signal is entered, the broadcast receiver performs an X-speed playback until a current position reaches a Live position. If the current position reaches the Live position, the broadcast receiver may display the live broadcast signals.

Namely, the broadcast receiver receives a program including mobile service data at step S8601, processes the mobile service data of the received program, and displays the processed result at step S8602.

During the display time of the mobile service data, if the time-shift mode selection signal is entered at step S8303, the broadcast receiver stores the mobile service data of the received program in the time-shift storage area at step S8604.

The above step of receiving/outputting the mobile service data and the above step of receiving the time-shift mode selection signal are not limited to before or after the Rx/Tx (reception/transmission) times. Namely, the above Rx/Tx step and the step of receiving the time-shift mode selection signal may be performed in either order.

In this case, the received program is stored in the time-shift storage area, and the time-shift-stored program can be reproduced from a predetermined position spaced apart from the currently-received live program by a predetermined time. In this case, if the time-shift playback from the predetermined position is performed, the live program is also continuously received, such that a time delay from the time-shifted position to the live position is continuously maintained. In this case, the user commands the broadcast receiver to quickly reproduce data until a current position reaches the live broadcast program, so that he or she catches up the live broadcast program. Thereafter, the user can view the live broadcast program. The above-mentioned function that data is quickly reproduced in the range from a predetermined position to the live broadcast program position is called a "catch-up function".

After the time-shift storing is executed, the broadcast receiver establishes the catch-up start position at which the catch-up function will begin at step S8605. The catch-up position may be established by a control signal.

This control signal may be entered on the progress-information OSD, may be displayed on a control window so that it is directly entered by the user on the control window, or may be entered by a control key. In this embodiment, the catch-up start position may be established on the progress-information OSD, and a detailed description thereof will hereinafter be described with reference to FIG. 87.

After the catch-up start position is established, the catch-up function selection signal is entered at step S8606. In this case, while the broadcast receiver performs the time-shift playback from the predetermined position, it may perform the catch-up function from the playback time. In this case, the playback time may be used as the catch-up start position.

If the catch-up function selection signal is entered, the broadcast receiver performs a quick play mode (i.e., X-speed playback) until a current time reaches the live program Rx time at step S8607. If the quick play mode (i.e., X-speed playback) is executed, the playback speed is faster than the Rx speed of the current live program, so that the playback time point can catch up the live program time point. In this case, the X-speed playback speed for the catch-up function may be differently determined according to a variety of setup conditions.

For example, an X-speed of the X-speed play mode may be determined as a default value, or may be decided by the user. If the catch-up playback time is entered, the X-speed may be determined in consideration of the time-shift and the catch-up playback time.

For example, if the user selects a 2×-speed, the time-shift-stored program is reproduced at the 2×-speed, so that the broadcast receiver can catch up the live program Rx time at a predetermined time. In this case, the user determines a playback X-speed for catching up the live program and enters the determined playback X-speed in the broadcast receiver.

For another example, if the time delay (or the time shift) from the catch-up start position to the live program Rx time is 1 hour, and the user enters the 1 hour as the catch-up playback time, the 2×-speed is decided such that the broadcast receiver can catch up the live program after the lapse of the 1 hour. In this case, the user decides a catch-up playback time for the live program, instead of a playback X-speed, and enters the decided catch-up playback time.

In this way, if the X-speed playback is performed, the broadcast receiver can catch up the live program at a predetermined time.

If it is determined that a current position reaches the live program Rx position at step S8608, the broadcast receiver is switched to a live program display mode at step S8609. Thereafter, the broadcast receiver displays the currently-received program. If the time-shift function is not switched off, the received program can be continuously stored in the time-shift storage area.

Figure 87:
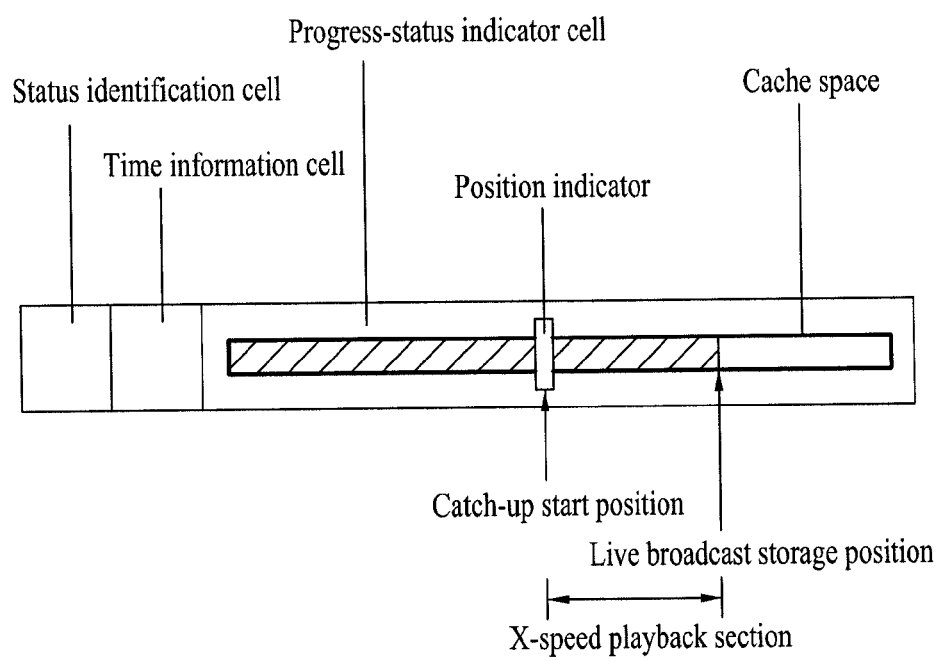
FIG. 87 shows a progress-information OSD for recognizing functions of FIG. 86 according to the present invention.

FIG. 87 shows a progress-information OSD for recognizing functions of FIG. 86 according to the present invention.

Referring to FIG. 87, the catch-up start position is established as a position indicator on the progress-information OSD, so that the catch-up function can be executed.

In this case, the range from the catch-up start position to the live program storing position is set to the X-speed playback section. The live program storage position continuously increases in proportion to the cache bar. If the X-speed playback is executed in the X-speed playback section, the time delay from the catch-up start position to the live program storing position is gradually reduced.

Figure 88:
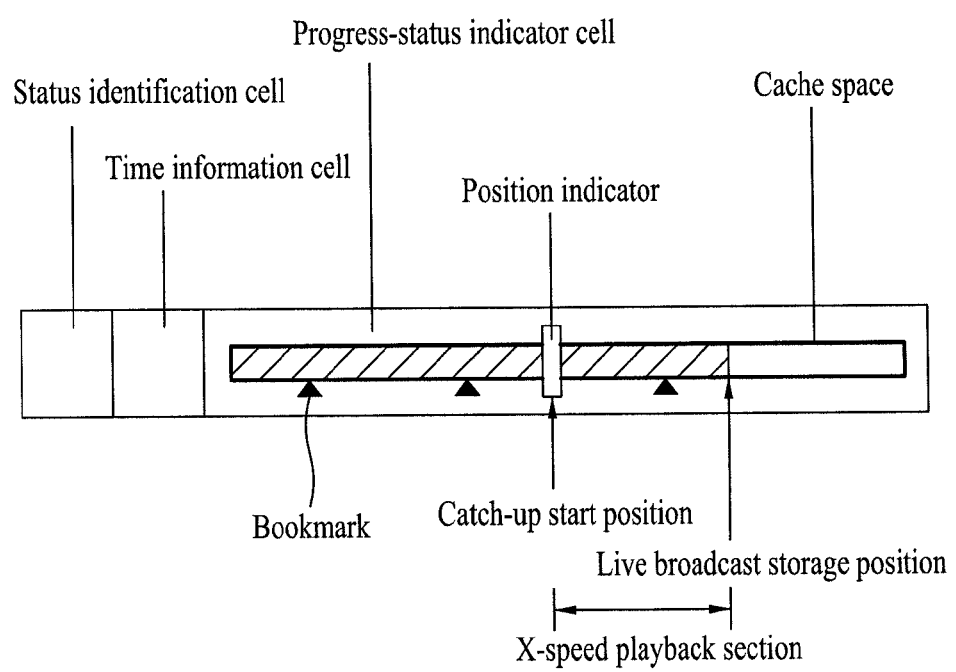
FIG. 88 shows a progress-information OSD according to one embodiment of the present invention.

FIG. 88 shows a progress-information OSD according to one embodiment of the present invention.

Referring to FIG. 88, if channel transition occurs or the received broadcast program is changed to another during the time-shift storing process, i.e., if a predetermined change event occurs during the time-shift storing process, the broadcast receiver may display the above-mentioned situation (i.e., the predetermined change event). For the convenience of description, this embodiment of the present invention provides a method for establishing a bookmark at a predetermined change event position.

The cache bar of the cache space increases in proportion to the program Rx speed according to the progress of the time-shift storing. In this case, if a predetermined change event occurs, a bookmark can be established at a position at which the concept stored on the cache bar is changed. The method for establishing the bookmark has already been described.

If the bookmark is established, this bookmark is displayed on the progress-status indication cell, the user selects the bookmark and moves a position indicator to the corresponding position, so that the broadcast receiver reproduces data of the moved position.

Figure 89:
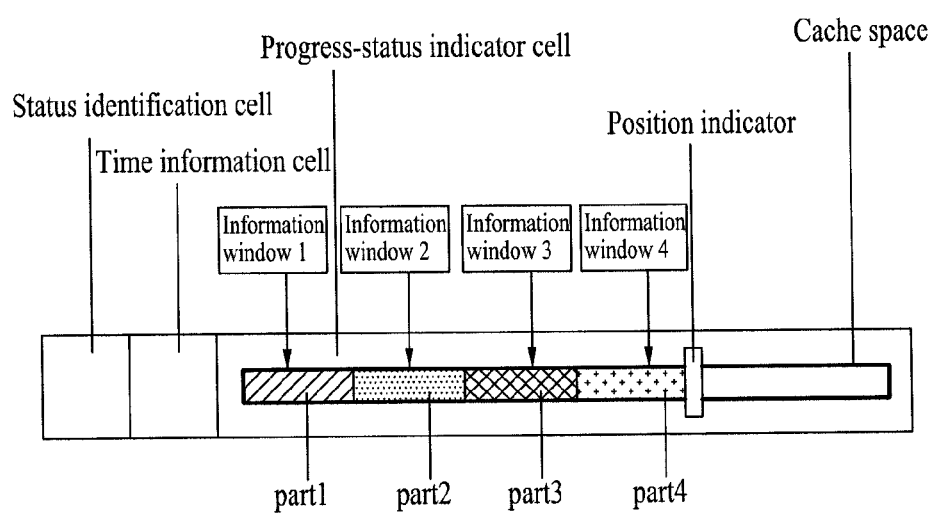
FIG. 89 shows a progress-information OSD according to one embodiment of the present invention.

FIG. 89 shows a progress-information OSD according to one embodiment of the present invention.

Referring to FIG. 89, if channel transition occurs or the received broadcast program is changed to another during the time-shift storing process, i.e., if a predetermined change event occurs during the time-shift storing process, the broadcast receiver may display the above-mentioned situation (i.e., the predetermined change event). For the convenience of description, if the predetermined change event occurs, this embodiment of the present invention classifies individual events, and displays the classified events on the cache bar. For example, text data may be displayed in various ways (e.g., ch1, ch5, ch7 . . . , program1, program2, program3 . . . , part1, part2, part3) or may be displayed in different colors on the cache bar. Otherwise, information windows for describing individual events may be displayed on the cache bar. In this case, individual information windows may be simultaneously displayed. If a corresponding area is selected, the information window of the selected area may be displayed as a pop-up window.

Figure 90A:
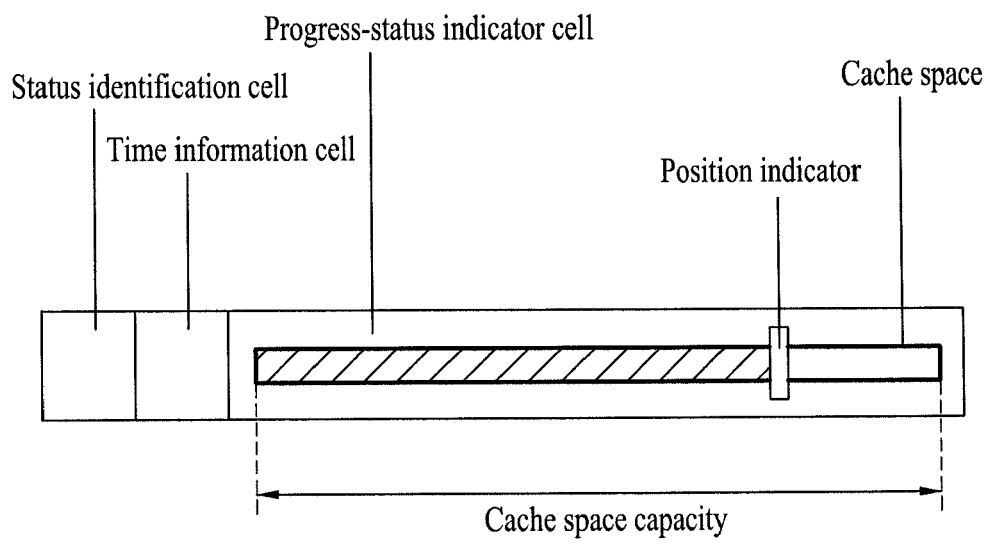
FIG. 90A and FIG. 90B show a progress-information OSD according to another embodiment of the present invention and show exemplary display formats of progress-information OSD according to the present invention.
Figure 90B:
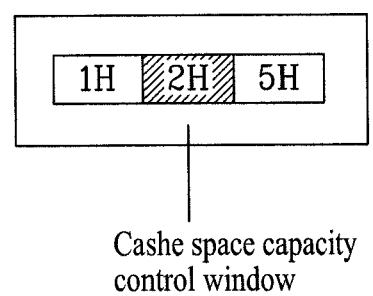

FIG. 90A and FIG. 90B show progress-information OSD display formats according to another embodiment of the present invention.

FIG. 90A shows a cache-space capacity on the progress-information OSD, and FIG. 90B shows a cache-space capacity control window.

Referring to FIG. 90A, the cache space contained in the progress-status indication cell indicates the time-shift storing corresponding to the predetermined capacity. In this case, the cache space capacity may be a total capacity of the time-shift storage area or some parts of the time-shift storage area.

Referring to FIG. 90B, the cache space capacity can be changed to another capacity. For example, the user can enter a control signal on the capacity control window of FIG. 90B. If the cache-space capacity is the total time-shift storage area, all parts of the time-shift storage area can be controlled. Otherwise, if the cache-space capacity is some parts of the time-shift storage area, capacity displayed on the cache space can be controlled.

As apparent from the above description, in the case of using the digital broadcast system and the data processing method according to the present invention, when mobile service data and PSI/PSIP information associated with the mobile service data are transmitted over a channel, the digital broadcast system has very resistant to errors and is easily compatible with conventional receivers.

The digital broadcast system can normally receive mobile service data packet without any errors over a poor channel which has lots of ghosts and noises.

The digital broadcast system inserts known data at a specific location of a data region, and performs signal transmission, thereby increasing the reception performance under a high-variation channel environment.

The digital broadcast system multiplexes the mobile service data packet to main service data according to a burst structure, thereby reducing the power of receiving system.

The digital broadcast system can be more effectively used for mobile phones or mobile receivers, channel conditions of which are excessively changed and are weak resistances to noise.

The digital broadcast system stores mobile service data without any errors, reproduces the stored mobile service data, and performs the time-shift storing and the time-shift playback.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

It should be noted that most terminology disclosed in the present invention is defined in consideration of functions of the present invention, and can be differently determined according to intention of those skilled in the art or usual practices. Therefore, it is preferable that the above-mentioned terminology be understood on the basis of all contents disclosed in the present invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for receiving a broadcast signal, the method comprising:
    receiving a broadcast signal carrying a transmission frame, wherein a collection of data groups is carried within specific time periods in the transmission frame, each of the data groups including known data sequences, signaling information and mobile service data, wherein the broadcast signal includes a plurality of portions of a Reed-Solomon (RS) frame;
    demodulating the received broadcast signal;
    gathering the plurality of portions of the RS frame to build the RS frame including RS parity bytes which are added at a bottom of each column of a payload of the RS frame by performing RS encoding for each column, cyclic redundancy checksum (CRC) bytes which are added at a right end of each row of the payload of the RS frame and the mobile service data, and decoding the RS frame, wherein a size of the payload of the RS frame is 187 by N bytes, and wherein N corresponds to a length of each row of the RS frame; and
    storing the decoded mobile service data, and performing a time-shift playback of the stored mobile service data.

2. The method according to claim 1, wherein the receiving of the broadcast signal is implemented by selective reception of multiplexed main service data and the mobile service data.

3. The method according to claim 1, wherein demodulating the received broadcast signal includes:
    performing at least one of carrier recovery, timing recovery, and channel equalization on the received mobile service data using the known data sequences in the data groups.

4. The method according to claim 1, wherein performing the time-shift playback includes:
    entering a time-shift mode selection signal;
    setting a time-shift storage area when the time-shift mode selection signal is entered;
    storing the decoded mobile service data in the time-shift storage area; and
    reproducing the stored mobile service data from a predetermined position of the time-shift storage area.

5. The method according to claim 4, further comprising:
    displaying a time-shifted mobile service program and the currently received live mobile service program, simultaneously.

6. The method according to claim 4, further comprising:
    deleting from the oldest data among the mobile service data stored in the time-shift storage area, when the time-shift storage area is full.

7. The method according to claim 4, wherein the time-shift storage area is allocated additionally by user's selection.

8. The method according to claim 7, wherein the allocating unit of the time-shift storage area is at least one of time, capacity, and percentage.

9. An apparatus for receiving a broadcast signal, the apparatus comprising:
    a signal receiving unit for receiving a broadcast signal carrying a transmission frame, wherein a collection of data groups is carried within specific time periods in the transmission frame, each of the data groups including known data sequences, signaling information and mobile service data, wherein the broadcast signal includes a plurality of portions of a Reed-Solomon (RS) frame;
    a demodulating unit for demodulating the received broadcast signal;

a Reed-Solomon (RS) frame decoder for gathering the plurality of portions of the RS frame to build the RS frame including RS parity bytes which are added at a bottom of each column of a payload of the RS frame by performing RS encoding for each column, cyclic redundancy checksum (CRC) bytes which are added at a right end of each row of the payload of the RS frame and the mobile service data, and decoding the RS frame, wherein a size of the payload of the RS frame is 187 by N bytes, and wherein N corresponds to a length of each row of the RS frame; and a controller for storing the decoded mobile service data, and performing a time-shift playback of the stored mobile service data.

10. The apparatus according to claim 9, wherein the signal receiving unit receives main service data and the mobile service data within the specific time periods in which the mobile service data and main service data are multiplexed.

11. The apparatus according to claim 9, wherein the demodulating unit performs at least one of carrier recovery, timing recovery, and channel equalization on the received broadcast signal using the known data sequences in the data groups.

12. The apparatus according to claim 9, further comprising:
a peripheral-device connection interface for storing the mobile service data in a external storage medium upon receiving a control signal from the controller, and is connected to the external storage medium.

13. The apparatus according to claim 9, wherein the controller sets a time-shift storage area when a time-shift mode selection signal is entered, stores the decoded mobile service data in the time-shift storage area, and reproduces the stored mobile service data from a predetermined position of the time-shift storage area.

14. The apparatus according to claim 9, wherein the controller displays a time-shifted mobile service program and the currently received live mobile service program, simultaneously.

15. The apparatus according to claim 9, wherein the controller deletes from the oldest data among the mobile service data stored in the time-shift storage area when the time-shift storage area is full.

16. The apparatus according to claim 15, wherein the time-shift storage area is allocated additionally by user's selection.

17. The apparatus according to claim 15, wherein the allocating unit of the time-shift storage area is at least one of time, capacity, and percentage.

18. The apparatus according to claim 9, wherein the controller displays a progress-status indication OSD, wherein playback of the stored mobile service data is controlled on the progress-status indication OSD.

19. A method for receiving a broadcast signal, the method comprising:
receiving a broadcast signal carrying a transmission frame, wherein a collection of data groups is carried within specific time periods in the transmission frame, each of the data groups including known data sequences, signaling information and mobile service data, wherein the broadcast signal includes a plurality of portions of a Reed-Solomon (RS) frame, wherein the collection of data groups carries the mobile service data encoded through the Reed-Solomon (RS) frame, wherein a size of a payload of the RS frame is 187 by N bytes, and wherein N corresponds to a length of each row of the RS frame;

demodulating the received broadcast signal; and gathering the plurality of portions of the RS frame to build the RS frame including RS parity bytes which are added at a bottom of each column of the payload of the RS frame by performing RS encoding for each column, cyclic redundancy checksum (CRC) bytes which are added at a right end of each row of the payload of the RS frame and the mobile service data, and decoding the RS frame.

* * * * *